US008700347B2

(12) United States Patent
Spanier et al.

(10) Patent No.: US 8,700,347 B2
(45) **Date of Patent: *Apr. 15, 2014**

(54) INTELLIGENT ELECTRONIC DEVICE WITH ENHANCED POWER QUALITY MONITORING AND COMMUNICATIONS CAPABILITY

(75) Inventors: Joseph Spanier, Brooklyn, NY (US); Andrew J. Werner, Wading River, NY (US); Frederick B. Slota, Lake Ronkonkoma, NY (US); Hai Zhu, Glen Cove, NY (US); Wei Wang, Mahwah, NJ (US); Dulciane Siqueira da Silva, Recife (BR); Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/479,916

(22) Filed: May 24, 2012

(65) Prior Publication Data

US 2013/0158918 A1 Jun. 20, 2013

Related U.S. Application Data

(63) Continuation of application No. 12/075,690, filed on Mar. 13, 2008, now Pat. No. 8,190,381.

(60) Provisional application No. 60/921,651, filed on Apr. 3, 2007.

(51) Int. Cl.

| | |
|---|---|
| ***G01R 21/00*** | (2006.01) |
| ***G01R 21/06*** | (2006.01) |
| ***G01R 19/00*** | (2006.01) |

(52) U.S. Cl.
USPC .................. 702/60; 702/62; 702/63; 702/64; 702/66; 702/69

(58) Field of Classification Search
USPC .............................. 702/60, 62–64, 66, 67, 69
See application file for complete search history.

(56) References Cited

U.S. PATENT DOCUMENTS

| | | | |
|---|---|---|---|
| 2,435,753 | A | 2/1948 | Richter et al. |
| 2,606,943 | A | 8/1952 | Barker |
| 2,883,255 | A | 4/1959 | Anderson |
| 2,987,704 | A | 6/1961 | Gimpel et al. |
| 3,142,820 | A | 7/1964 | Daniels |
| 3,166,726 | A | 1/1965 | Jensen et al. |

(Continued)

OTHER PUBLICATIONS

7700 Ion 3-Phase Power Meter, Analyzer and Controller, pp. 1-8, Nov. 30, 2000.

(Continued)

*Primary Examiner* — Janet Suglo
(74) *Attorney, Agent, or Firm* — Gerald E. Hespos; Michael J. Porco; Matthew T. Hespos

(57) ABSTRACT

An intelligent electronic device IED has enhanced power quality and communications capabilities. The IED can perform energy analysis by waveform capture, detect transient on the front-end voltage input channels and provide revenue measurements. The IED splits and distributes the front-end input channels into separate circuits for scaling and processing by dedicated processors for specific applications by the IED. Front-end voltage input channels are split and distributed into separate circuits for transient detection, waveform capture analysis and revenue measurement, respectively. Front-end current channels are split and distributed into separate circuits for waveform capture analysis and revenue measurement, respectively.

18 Claims, 164 Drawing Sheets

(56) References Cited

U.S. PATENT DOCUMENTS

| | | | |
|---|---|---|---|
| 3,453,540 | A | 7/1969 | Dusheck |
| 3,467,864 | A | 9/1969 | Vander Plaats |
| 3,504,164 | A | 3/1970 | Farrell et al. |
| 3,824,441 | A | 7/1974 | Heyman et al. |
| 4,246,623 | A | 1/1981 | Sun |
| 4,466,071 | A | 8/1984 | Russell, Jr. |
| 4,884,021 | A | 11/1989 | Hammond et al. |
| 4,958,640 | A | 9/1990 | Logan |
| 4,996,646 | A | 2/1991 | Farrington |
| 5,014,229 | A | 5/1991 | Mofachern |
| 5,166,887 | A | 11/1992 | Farrington et al. |
| 5,170,360 | A | 12/1992 | Porter et al. |
| 5,185,705 | A | 2/1993 | Farrington |
| 5,212,441 | A | 5/1993 | McEachern et al. |
| 5,224,054 | A | 6/1993 | Wallis |
| 5,233,538 | A | 8/1993 | Wallis |
| 5,237,511 | A | 8/1993 | Caird et al. |
| 5,298,854 | A | 3/1994 | McEachern et al. |
| 5,298,855 | A | 3/1994 | McEachern et al. |
| 5,298,856 | A | 3/1994 | McEachern et al. |
| 5,298,859 | A | 3/1994 | McEachern et al. |
| 5,298,885 | A | 3/1994 | McEachern et al. |
| 5,298,888 | A | 3/1994 | McEachern et al. |
| 5,300,924 | A | 4/1994 | McEachern et al. |
| 5,302,890 | A | 4/1994 | McEachern et al. |
| 5,307,009 | A | 4/1994 | McEachern et al. |
| 5,315,527 | A | 5/1994 | Beckwith |
| 5,347,464 | A | 9/1994 | McEachern et al. |
| 5,475,628 | A | 12/1995 | Adams et al. |
| 5,544,064 | A | 8/1996 | Beckwith |
| 5,559,719 | A | 9/1996 | Johnson et al. |
| 5,574,654 | A | 11/1996 | Bingham et al. |
| 5,581,173 | A | 12/1996 | Yalla et al. |
| 5,706,204 | A | 1/1998 | Cox et al. |
| 5,764,523 | A | 6/1998 | Yoshinaga et al. |
| 5,774,366 | A | 6/1998 | Beckwith |
| 5,819,203 | A | 10/1998 | Moore et al. |
| 5,822,165 | A | 10/1998 | Moran |
| 5,832,210 | A | 11/1998 | Akiyama et al. |
| 5,899,960 | A | 5/1999 | Moore et al. |
| 5,994,892 | A | 11/1999 | Turino et al. |
| 6,018,690 | A | 1/2000 | Saito et al. |
| 6,038,516 | A | 3/2000 | Alexander et al. |
| 6,098,175 | A | 8/2000 | Lee |
| 6,157,329 | A | 12/2000 | Lee et al. |
| 6,167,329 | A | 12/2000 | Engel et al. |
| 6,195,614 | B1 | 2/2001 | Kochan |
| 6,289,267 | B1 | 9/2001 | Alexander et al. |
| 6,415,244 | B1 | 7/2002 | Dickens et al. |
| 6,493,644 | B1 | 12/2002 | Jonker et al. |
| 6,519,537 | B1 | 2/2003 | Yang |
| 6,528,957 | B1 | 3/2003 | Luchaco |
| 6,615,147 | B1 | 9/2003 | Jonker et al. |
| 6,636,030 | B1 | 10/2003 | Rose et al. |
| 6,671,654 | B1 | 12/2003 | Forth et al. |
| 6,717,394 | B2 | 4/2004 | Elms |
| 6,735,535 | B1 | 5/2004 | Kagan et al. |
| 6,751,563 | B2 | 6/2004 | Spanier et al. |
| 6,792,364 | B2 | 9/2004 | Jonker et al. |
| 6,842,707 | B2 | 1/2005 | Raichle et al. |
| 6,944,555 | B2 | 9/2005 | Blackett et al. |
| 6,957,158 | B1 | 10/2005 | Hancock et al. |
| 6,961,641 | B1 | 11/2005 | Forth et al. |
| 7,006,934 | B2 | 2/2006 | Jonker et al. |
| 7,010,438 | B2 | 3/2006 | Hancock et al. |
| 7,072,779 | B2 | 7/2006 | Hancock et al. |
| 7,126,493 | B2 | 10/2006 | Junker et al. |
| 7,337,081 | B1 | 2/2008 | Kagan |
| 7,342,507 | B2 | 3/2008 | Jonker et al. |
| 7,436,687 | B2 | 10/2008 | Patel |
| 7,444,454 | B2 | 10/2008 | Yancey et al. |
| 7,511,468 | B2 | 3/2009 | McEachern et al. |
| 7,514,907 | B2 | 4/2009 | Rajda et al. |
| 7,616,656 | B2 | 11/2009 | Wang et al. |
| 7,761,910 | B2 | 7/2010 | Ransom et al. |
| 7,899,630 | B2 | 3/2011 | Kagan |
| 7,916,060 | B2 | 3/2011 | Zhu et al. |
| 7,962,298 | B2 | 6/2011 | Przydatek et al. |
| 8,269,482 | B2 | 9/2012 | Banhegyesi |
| 2002/0032535 | A1 | 3/2002 | Alexander et al. |
| 2002/0129342 | A1 | 9/2002 | Kil et al. |
| 2002/0169570 | A1 | 11/2002 | Spanier et al. |
| 2003/0014200 | A1 | 1/2003 | Jonker et al. |
| 2003/0178982 | A1 | 9/2003 | Elms |
| 2003/0187550 | A1 | 10/2003 | Wilson et al. |
| 2004/0172207 | A1 | 9/2004 | Hancock et al. |
| 2004/0193329 | A1 | 9/2004 | Ransom et al. |
| 2005/0027464 | A1 | 2/2005 | Jonker et al. |
| 2005/0060110 | A1 | 3/2005 | Jones et al. |
| 2005/0093571 | A1 | 5/2005 | Suaris et al. |
| 2005/0187725 | A1 | 8/2005 | Cox |
| 2005/0273280 | A1 | 12/2005 | Cox |
| 2006/0052958 | A1 | 3/2006 | Hancock et al. |
| 2006/0066456 | A1 | 3/2006 | Jonker et al. |
| 2006/0083260 | A1 | 4/2006 | Wang et al. |
| 2006/0145890 | A1 | 7/2006 | Junker et al. |
| 2006/0161360 | A1 | 7/2006 | Yao et al. |
| 2006/0267560 | A1 | 11/2006 | Rajda et al. |
| 2007/0067119 | A1 | 3/2007 | Loewen et al. |
| 2007/0067121 | A1 | 3/2007 | Przydatek et al. |
| 2007/0096765 | A1 | 5/2007 | Kagan |
| 2007/0096942 | A1 | 5/2007 | Kagan et al. |
| 2008/0086222 | A1 | 4/2008 | Kagan |
| 2008/0147334 | A1 | 6/2008 | Kagan |
| 2008/0172192 | A1 | 7/2008 | Banhegyesi |
| 2008/0215264 | A1 | 9/2008 | Spanier et al. |
| 2008/0234957 | A1 | 9/2008 | Banhegyesi et al. |
| 2008/0235355 | A1 | 9/2008 | Spanier et al. |
| 2008/0238406 | A1 | 10/2008 | Banhegyesi |
| 2008/0238713 | A1 | 10/2008 | Banhegyesi et al. |
| 2009/0012728 | A1 | 1/2009 | Spanier et al. |
| 2009/0096654 | A1 | 4/2009 | Zhu et al. |
| 2009/0228224 | A1 | 9/2009 | Spanier et al. |
| 2010/0054276 | A1 | 3/2010 | Wang et al. |
| 2010/0324845 | A1 | 12/2010 | Spanier et al. |
| 2011/0040809 | A1 | 2/2011 | Spanier et al. |

OTHER PUBLICATIONS

ION Technology, 7500 ION High Visibility 3-Phase Energy & Power Quality Meter, Power Measurement, specification, pp. 1-8, revision date Mar. 21, 2000.

ION Technology, 7500 ION 7600 ION High Visibility Energy & Power Quality Compliance Meters, Power Measurement, specification, pp. 1-8, revision date Nov. 30, 2000.

User's Installation & Operation and User's Programming Manual. The Futura Series, Electro Industries, pp. 1-64, Copyright 1995.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Performance Power Meter & Data Acquisition Node, Electro Industries/Gauge Tech., Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

PowerLogic Series 4000 Circuit Monitors, pp. 1-4; Document #3020HO0601; Jan. 2006.

ION7550/ion7650 PowerLogic power-monitoring units, Technical data sheets, Copyright 2006 Schneider Electric.

IEC 61000-4-15: Electromagnetic compatibility (EMC) Part 4: Testing and measuring techniques, Section 15: Flickermeter—Functional and design specifications; CENELEC—European Committee for Electrotechnical Standardization; Apr. 1998.

| | | | |
|---|---|---|---|
| FIG.6A | FIG.6B | FIG.6C | FIG.6D |
| FIG.6E | FIG.6F | FIG.6G | |

| | | | |
|---|---|---|---|
| FIG.7A | FIG.7B | FIG.7C | FIG.7D |
| FIG.7E | FIG.7F | FIG.7G | FIG.7H |

| | | | |
|---|---|---|---|
| FIG.8A | FIG.8B | FIG.8C | FIG.8D |
| FIG.8E | FIG.8F | FIG.8G | |

| | |
|---|---|
| FIG.9A | FIG.9B |
| FIG.9C | FIG.9D |
| FIG.9E | FIG.9F |

| | | | |
|---|---|---|---|
| FIG.10A | FIG.10B | FIG.10C | FIG.10D |
| FIG.10E | FIG.10F | | |

| FIG.11A | FIG.11B | FIG.11C | FIG.11D |
|---|---|---|---|
| FIG.11E | FIG.11F | FIG.11G | |

| | | |
|---|---|---|
| FIG.13A | FIG.13B | FIG.13C |
| FIG.13D | FIG.13E | FIG.13F |

| FIG.14A | FIG.14B | FIG.14C | FIG.14D | FIG.14E |
|---|---|---|---|---|

| | | | |
|---|---|---|---|
| FIG.15A | FIG.15B | FIG.15C | FIG.15D |
| FIG.15E | FIG.15F | FIG.15G | |

| | | | |
|---|---|---|---|
| FIG. 17A | FIG. 17B | FIG. 17C | FIG. 17D |
| | FIG. 17E | FIG. 17F | FIG. 17G |

| | | |
|---|---|---|
| FIG.21A | FIG.21B | FIG.21C |
| FIG.21D | FIG.21E | FIG.21F |

| FIG.23A | FIG.23B | FIG.23C | FIG.23D |
|---|---|---|---|

U4
RX_ISO2
CTRL0_ISO2
TX_ISO2
MAX3082ESA

GND-ISO2
C5
R11
R10
R13
+5V-ISO_2
LED2:A
Use Lightpipe and Led (See Parts list)
GND-ISO2
U5
Vcc
Gnd
8
7
6
5
1
2
3
4
VIO_5
Use Lightpipe and Led (See Parts list)
LED1:B
+5V-ISO

R14
R12
BRS485_2_RTS
BRS485_2_TXD
VIO_5
R6
R5
C2
DGND

| FIG.25A | FIG.25B | FIG.25C |
|---|---|---|

| | | | |
|---|---|---|---|
| FIG.26A | FIG.26B | FIG.26C | |
| FIG.26D | FIG.26E | FIG.26F | FIG.26G |

| | | | |
|---|---|---|---|
| FIG.29A | FIG.29B | FIG.29C | FIG.29D |
| FIG.29E | FIG.29F | FIG.29G | FIG.29H |

| FIG.30A | FIG.30B | FIG.30C | FIG.30D |
|---|---|---|---|
| FIG.30E | FIG.30F | FIG.30G | |

INTELLIGENT ELECTRONIC DEVICE WITH ENHANCED POWER QUALITY MONITORING AND COMMUNICATIONS CAPABILITY

PRIORITY

This application is a continuation application of U.S. application Ser. No. 12/075,690, filed Mar. 13, 2008, which claims priority to an application entitled "INTELLIGENT ELECTRONIC DEVICE WITH ENHANCED POWER QUALITY MONITORING AND COMMUNICATIONS CAPABILITIES" filed in the United States Patent and Trademark Office on Apr. 3, 2007 and assigned Ser. No. 60/921,651, the contents of which are hereby incorporated by reference.

BACKGROUND

1. Field

The present disclosure relates generally to an Intelligent Electronic Device ("IED") that is versatile and robust to permit accurate measurements. In particular, the present disclosure relates to an IED having enhanced power quality monitoring and control capabilities and a communications system for faster and more accurate processing of revenue and waveform analysis.

SUMMARY

An intelligent electronic device (IED) having enhanced power quality and communications capabilities is provided.

According to one aspect, the IED comprises at least one input voltage and current channel (e.g., voltage phases and currents, Va, Vb, Vc, Vn, Vx, Ia, Ib, Ic, In), at least one sensor for sensing the at least one input voltage and current channel, at least one analog to digital converter, at least one Universal Serial Bus (USB) channel, at least one serial and at least one Ethernet communication channel, and a processing system including at least one central processing unit or host processor (CPU) or at least one digital signal processor (DSP), said processor having firmware dedicated to receiving and processing the digitized signals output from the at least one A/D converter.

The IED further comprises a graphical, backlit LCD display, a volatile memory and a non-volatile memory for storing captured waveform samples from at least one analog to digital converter. The non-volatile memory includes a compact Flash device. The system is expandable so that additional processors and A/D converters and dual port memory can be added to convert and process and communicate data of at least one additional application.

According to another aspect, a preferred circuit structure of the IED facilitates the splitting and distribution of front-end voltage and current input channels into separate circuit paths. The split input channel voltages and currents are then scaled and processed by dedicated processors or processing functions within the IED to be provided as input signals to applications within the IED (e.g., power quality and energy analysis by waveform capture, transient detection on front-end voltage input channels, and providing revenue measurements).

According to a related aspect, the aforementioned circuit paths comprise at least one analog to digital (A/D) converter, said A/D converter being dedicated to converting at least one of the analog signals to a digitized signal; at least one processor coupled to the at least one A/D converter, each processor having firmware dedicated to receiving and processing the digitized signals output from the A/D converters; a communications gateway coupled to the at least one processor, thus enabling processors to communicate between each other.

According to yet another aspect, a transient measurement circuit of the IED is provided for performing transient detection (e.g., measuring transient voltage spikes) on front-end AC voltage input channels, in accordance with one application (e.g., measure transient signals at or above 1 MHz frequency for at least one of the voltage phase inputs).

According to one aspect, a circuit board construction of the IED is designed in such a way to prevent the introduction of crosstalk from waveform capture and revenue measurement circuits to enable faster and more sensitive measurements by the transient measurement circuit. In a related aspect, a method of reducing crosstalk between the transient capture circuit and waveform capture and revenue measurement circuits is provided. The method including: laying out each circuit in a separate location of a printed circuit board; and configuring each trace in each circuit to a preferred width so that each part of one of the circuits does not overlap or lay in close approximation with a part of another circuit. Further, each trace is separated from another by a preferred distance preferably in a range of between about 8 mils to about 20 mil or greater thereby reducing noise between the circuits on the printed circuit board. The printed circuit board has a top layer, a bottom layer and one or more middle layers and the traces for the transient detection circuit are placed on one of the one or more mid-level layers separate from whichever layers traces for the waveform capture circuit are placed and traces for the revenue measurement circuit are placed.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a graphical backlit display, a processing system including a volatile memory and a non-volatile memory for storing captured waveform samples from at least one of said at least one analog to digital converter, means for detecting and measuring transients on said AC voltage input channels, and means for generating power measurements, means for determining an overall power quality, means for measuring a harmonic magnitude of individual harmonics of one of the AC voltage or input channels, means for measuring voltage fluctuations from one of said AC voltage input channels, means for measuring voltage flicker; and means for providing a communication output using Ethernet TCP/IP protocol.

According to one aspect, an IED having enhanced power quality and communications capabilities comprises at least one input channel for receiving AC voltages and currents; at least one sensor for sensing the at least one input voltage and current channel; at least one analog to digital converter for outputting digitized signals, including but not limited to samples for transient detection; a graphical backlit display; a processing system including a volatile memory and a non-volatile memory for storing captured waveform samples from at least one of said at least one analog to digital converter; means for detecting and measuring transients on said AC voltage input channels; and a field programmable gate array configured to function with analog to digital converters.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a graphical backlit display and a field programmable gate array configured to detect and capture transient waveforms.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a graphical backlit display, and a field programmable gate array configured to process transient waveforms. Said processing of said transient waveforms by said field programmable gate array comprises receiving waveform data at said field programmable gate array from at least one input channel in waveform sample intervals; identifying a largest transient value occurring during each waveform sample interval; converting the transient and waveform data into separate serial data streams, and time synchronizing the separate serial data streams; and passing the identified largest transient value during each waveform sample interval together with said received waveform data to at least one central processing unit and at least one digital signal processor.

According to one aspect, an IED having enhanced power quality and communications capabilities comprises at least one input channel for receiving AC voltages and currents, wherein at least two of said channels are dedicated channels, a first dedicated channel dedicated to waveform data output from a waveform capture circuit, and second dedicated channel dedicated to transient A/D data output from a transient detection circuit; at least one sensor for sensing the at least one input voltage and current channel; at least one analog to digital converter for outputting digitized signals; a graphical backlit display; and a field programmable gate array configured to incorporate at least one dual port memory to facilitate communications and for transferring data between multiple processors. Said field programmable gate array further to include at least two high-speed serial ports.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a graphical backlit display and a field programmable gate array configured to perform programmable logic to facilitate sampling of said at least one analog to digital converter.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a processing system including a graphical, backlit LCD display, and a field programmable gate array operatively coupled to said at least one analog to digital converter transient waveforms; means for measuring a harmonic magnitude of individual harmonics of at least one of the AC voltage or input channels, means for measuring voltage fluctuations from one of said AC voltage input channels, means for measuring voltage flicker; and means for providing a communication output using Ethernet TCP/IP protocol. An example of voltage flicker would be defined by IEC 61000-4-15 or IEC868. It is contemplated that voltage flicker could also include other methods or algorithms for measuring voltage flicker. Generally, the purpose of measuring voltage flicker is to determine if flickering of lights is annoying to human eyes. If so, the IED would determine that the flicker is out of tolerance. Many different formats of tolerance values may be used to determine flicker, and as such they would be contemplated herein.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a processing system including a graphical, backlit LCD display, means for detecting and measuring voltage transients, and means for generating power measurements, wherein said means uses a lower dynamic range than said means for detecting and measuring transients on said AC voltage input channels.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, a processing system including a graphical, backlit LCD display, and means for determining an overall power quality, wherein such means comprises measuring a total harmonic distortion of one of said voltage and current input channels.

According to one aspect, an IED having enhanced power quality and communications capabilities comprises at least one input channels for receiving AC voltages and currents, at least one sensor for sensing the at least one input voltage and current channel, a processing system, at least one analog to digital converter, and at least one additional dedicated signal processor and analog to digital converter.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, at least one central processing unit, a graphical backlit display, and a field programmable gate array configured to assume processing tasks, including but not limited to: programming the field programmable gate array to perform common processor functions, normally associated with any one of said central processing unit and/or at least one digital signal processor; said field programmable gate array further configured to route data between said at least one input voltage and current channel to said at least one central processing unit and/or at least one digital signal processor. Said routing further comprises incorporating a frame counter into data blocks transmitted from the field programmable gate array to said at least one central processing unit and said at least one digital signal processor, wherein the frame counter is incremented in each transmitted data block, and comparing a currently received frame counter value with a previously received frame counter value, and determining if said currently received frame counter value is incrementally greater than said previously received frame counter.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, at least one central processing unit, a graphical backlit display, and a field programmable gate array configured to receive and execute program updates, wherein said updates are directed to new functionality to be incorporated into said IED in addition to originally intended functionality.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, at least one central processing unit, a graphical backlit display, and a field programmable gate array configured to perform load balancing. Said load balancing further comprises: routing data in part to said at least one central processing unit and routing data in part to said at least one digital signal processor to load balance calculations otherwise performed by at least one central processing unit or said at least one digital signal processor in isolation. Said load balancing further comprises configuring the field programmable gate array as an array of configurable memory blocks, each of said memory blocks being capable of supporting a dedicated processor or multiple dedicated processors, to create processor expansion. Said array of configurable memory blocks are configured as one of a RAM memory, a ROM memory, a First-in-First-out memory or a Dual Port memory.

According to one aspect, an IED having enhanced power quality and communications capabilities comprises at least one input channel for receiving AC voltages and currents, at least one sensor for sensing the at least one input voltage and current channel, at least one analog to digital converter for outputting digitized signals, at least one processing system, a graphical backlit display, and a field programmable gate array; wherein the processing system is configured to send and receive emails, which may contain incorporated or attached data.

BRIEF DESCRIPTION OF THE DRAWINGS

Other aspects will become readily apparent from the foregoing description and accompanying drawings in which.

DETAILED DESCRIPTION OF THE PREFERRED EMBODIMENTS

Figure 1A:
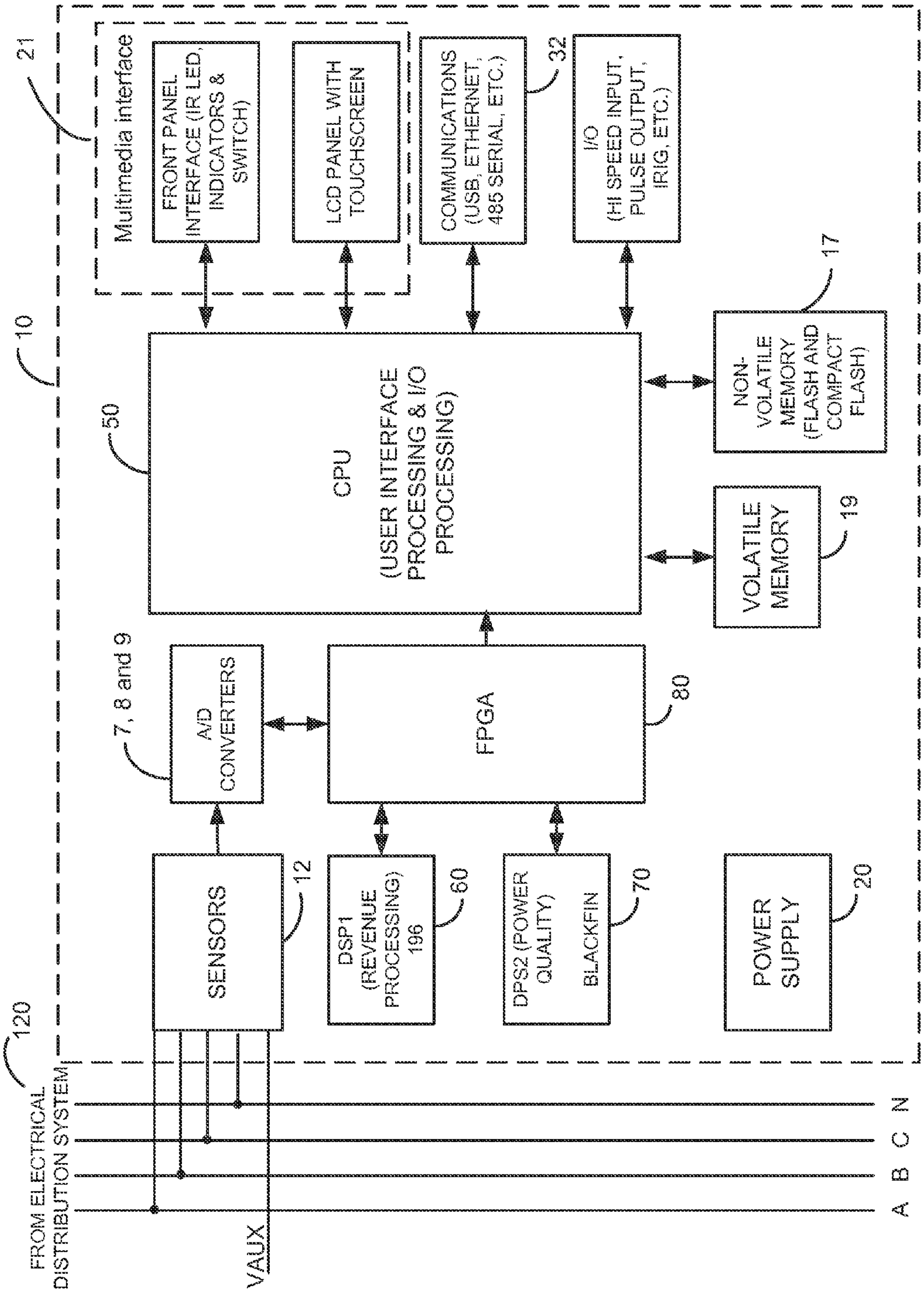
FIG. 1A is a block diagram of an Intelligent Electronic Device (IED) in accordance with one embodiment of the present disclosure.

Reference will now be made to figures wherein like structures will be provided with like reference designations. It is understood that the drawings are diagrammatic and schematic representations of presently preferred embodiments of the present disclosure, and are not limiting of the present disclosure nor are they necessarily drawn to scale. The word "exemplary" is used herein to mean "serving as an example, instance, or illustration". Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

The detailed description is divided into six sections.

In the first section, a general overview of an intelligent electronic device ("IED") is provided.

In the second section, a circuit structure of an intelligent electronic device ("IED") is described comprising three circuit paths, according to an embodiment. A transient detection circuit path for measuring voltage transients, a waveform measurement circuit path for measuring Vae, Vbe, Vce, Vne, Vauxe, Ia, Ib, Ic, In and a revenue measurement circuit path for measuring Vae, Vbe, Vce, Vne, Ia, Ib, Ic and In.

In the third section, a circuit board construction of the IED is described for preventing the introduction of crosstalk from waveform capture and revenue measurement circuits to enable faster and more sensitive measurements by the transient measurement circuit.

In the fourth section, the use of an FPGA for routing signals in the IED is described. Furthermore, the use of a dual port memory within the FPGA for minimizing the use of discrete components is described.

In the fifth section, techniques for measuring and determining power quality with an IED in accordance with the present disclosure is described.

In the sixth section, the use of an IED of the present disclosure as a circuit protection device is described.

Section I—General Overview of an IED

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

The present disclosure describes an intelligent electronic device (IED), e.g., a power meter, configured to split and distribute front end voltage and current input channels, carrying front end voltages and currents, into separate circuit paths (revenue measurement circuit path, transient detection and measurement circuit path, and a waveform measurement circuit path) for the purpose of scaling and processing the front end voltages and currents by dedicated processors or processing functions. The scaled and processed voltages and currents are then used as input to various applications implemented in the IED.

FIG. 1A is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1A includes sensors 12 coupled to various phases A, B, C of an electrical distribution system 120, analog-to-digital (A/D) converters 7, 8, 9, including inputs coupled to the sensor 12 outputs, a power supply 20, a volatile memory 19, an non-volatile memory 17, a multimedia user interface 21, and a processing system that includes at least one central processing unit (CPU) 50 (or host processor) and one or more digital signal processors, two of which are shown, i.e., DSP1 60 and DSP2 70. The IED 10 also includes a Field Programmable Gate Array (FPGA) 80 which performs a number of functions, including, but not limited to, acting as a communications gateway for routing data between the various processors 50, 60, 70, receiving data from the A/D converters 7, 8, 9, performing transient detection and capture and performing memory decoding for CPU 50 and the DSP processor 60. The FPGA 80 is internally comprised of two dual port memories to facilitate the various functions, as will be described further below.

The sensors 12 sense electrical parameters, e.g., voltage and current, on incoming lines, (i.e., phase A, phase B, phase C), from an electrical power distribution system.

A/D converters 7, 8, 9 are respectively configured to convert an analog voltage or current signal to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 7, 8 and 9 (see FIGS. 2A and 2B) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other well-known or envisioned programmable logic device or processor in place of the FPGA 80. In some embodiments, the digital samples, which are output from the A/D converters 7, 8, 9 are sent directly to the CPU 50 or DSP processors 60, 70, effectively bypassing the FPGA 80 as a communications gateway.

The power supply 20 provides power to each component of the IED 10. Preferably, the power supply 20 is a transformer with its primary windings coupled to the incoming power distribution lines and having windings to provide a nominal voltage, e.g., 5VDC, +12VDC and −12VDC, at its secondary windings. In other embodiments, power may be supplied from an independent power source to the power supply 20. For example, power may be supplied from a different electrical circuit or an uninterruptible power supply (UPS).

In one embodiment, the power supply 20 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 21 is shown coupled to the CPU 50 in FIG. 1 for interacting with a user and for communicating events, such as alarms and instructions to the user. The multimedia user interface 21 preferably includes a display for providing visual indications to the user. The display may be embodied as a touch screen, a liquid crystal display (LCD), LED number segments, individual light bulbs or any combination. The display may provide information to the user in the form of alphanumeric lines, computer-generated graphics, videos, animations, etc. The multimedia user interface 21 further includes a speaker or audible output means for audibly producing instructions, alarms, data, etc. The speaker is directly or indirectly coupled to the CPU 50 via a digital-to-analog converter (D/A) for converting digital audio files stored in a memory, e.g., non-volatile memory 17 or volatile memory 19, to analog signals playable by the speaker. An exemplary interface is disclosed and described in commonly owned co-pending U.S. application Ser. No. 11/589,381, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 may communicate to a server or other computing device via a communication network. The IED 10 may be connected to a communications network, e.g., the Internet, by any known means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any known network that couples computers to enable various modes of communication via network messages. Furthermore, the server will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 10 further comprises a volatile memory 19 and a non-volatile memory 17. In addition to storing audio and/or video files, volatile memory 19 will store the sensed and generated data for further processing and for retrieval when called upon to be displayed at the IED 10 or from a remote location. The volatile memory 19 includes memory such as but not limited to: random access memory (RAM), FRAM, Flash, or other volatile or non-volatile storage. The volatile memory will work with the at least one processor and the non-volatile memory will also be used to store data for later retrieval. Such non-volatile memory may include permanently affixed memory or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 will include a communication device 32 for enabling communications between the IED 10, and a remote terminal unit, programmable logic controller and other computing devices, microprocessors, a desktop computer, laptop computer, other meter modules, etc. The communication device 32 may be a modem, network interface card (NIC), wireless transceiver, etc. The communication device 32 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, Fiber Optic, Fiber Optic over Ethernet, and the appropriate communication port configuration. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

In an additional embodiment, the IED will also have the capability of not only digitizing the sensed at least one voltage or current waveform, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonic magnitudes, harmonic phase angles, symmetrical components, phasor analysis, and phase imbalances. Using the harmonics, the IED 10 will also calculate dangerous heating conditions and can provide harmonic transformer derating based on harmonics found in the current waveform. Harmonics will be calculated using a Fourier Transform analysis based on digital samples from the IED A/D converters. The Fourier Transform will provide both harmonic magnitude and phase angles for each harmonic to at least the 128th order, or generally under Nyquist, half the sampling speed. Note there may be other techniques utilized to calculate harmonics. These techniques would be contemplated as part of this disclosure.

In a further embodiment, the IED will execute an email client and will send emails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein. Additionally, emails can be sent by the IED to transfer data to other computers or IEDs. Such data could include data logs, waveform records, kWh usage, etc. The email feature can also be used to provide maintenance information, such as IED firmware versions, failure alerts, user configured alerts, or other such information. It is also anticipated in this application that emails can be sent to the IED, including above mentioned data and also to include maintenance items such as firmware upgrades, new programmable settings, new user configured requirements, or other such information that may be desired to be stored or incorporated into or a part of said IED.

The techniques of the present disclosure can be used to automatically maintain program data and provide field wide updates upon which IED firmware and/or software can be upgraded. An event command can be issued by a user, on a schedule or by digital communication that will trigger the IED to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and microinstruction code. The various processes and functions described herein may either be part of the microinstruction code or part of an application program (or a combination thereof), which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Section II—Circuit Path Division within the IED

Figure 1B:
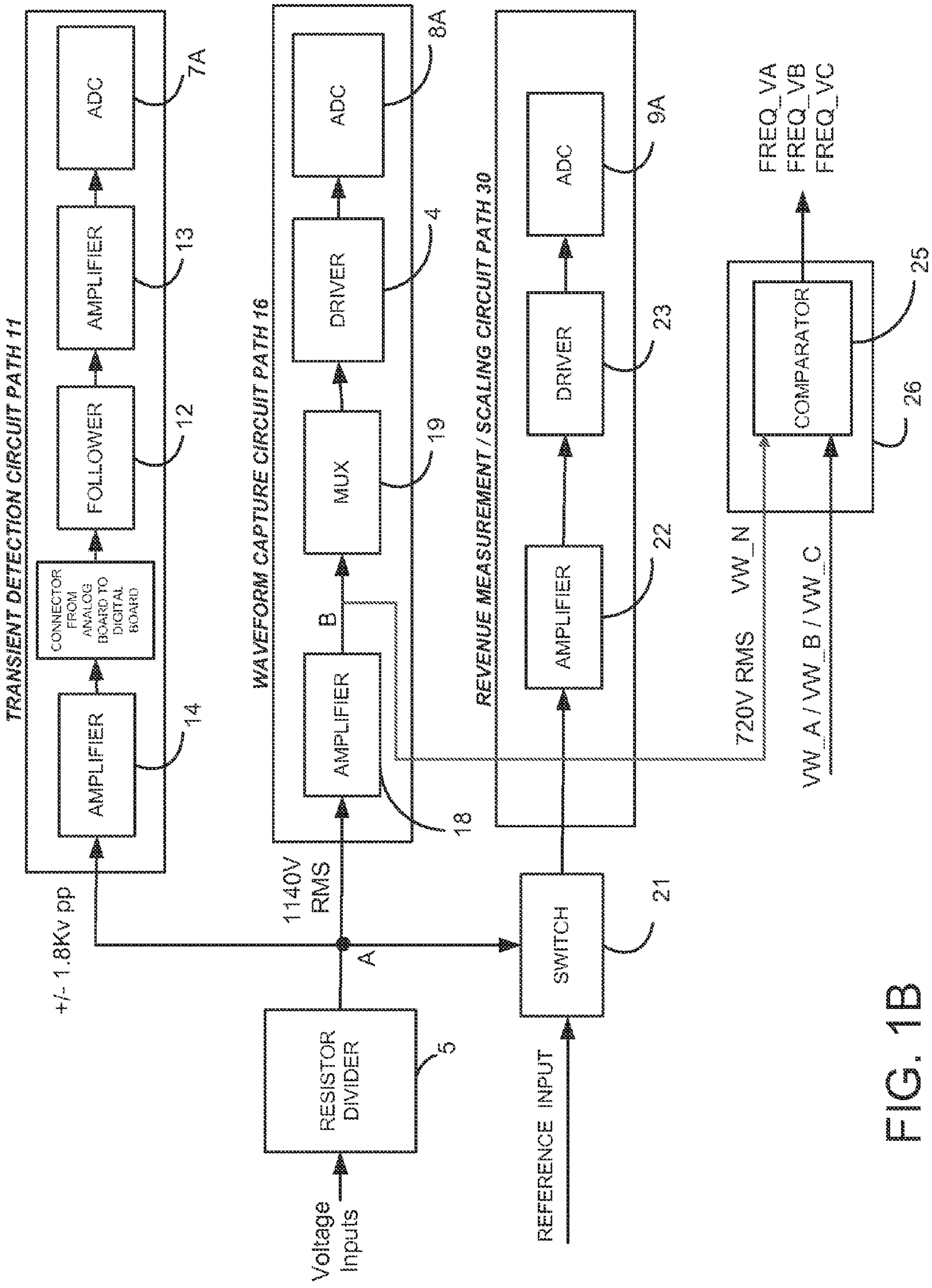
FIG. 1B is a block diagram illustrating how front end voltage input channels are distributed to dedicated circuits to be scaled for processing by a particular IED application in accordance with one embodiment of the present disclosure.

Referring now to FIG. 1B there is shown a block diagram of a circuit illustrating how front end voltage input channels are distributed to dedicated circuit paths, e.g.,: transient detection 11, waveform capture 16, and billing measurement 30, to be scaled for processing by particular IED applications in accordance with one embodiment of the present disclosure.

In operation, voltage channels are applied to an input of a resistance divider 5 of the circuit. The resistance divider 5 reduces potential high voltage levels of the voltage channels to allow for proper handling by the various circuits. The resistance divider 5 provides a reduced voltage level, which is then split at Point "A" into three circuit paths, transient detection 11, waveform capture 16, and billing measurement 30, to be scaled for processing by particular IED applications in accordance with embodiments of the present disclosure. It should be understood that the number of circuit paths used could vary depending on the number of particular IED applications that are intended to be performed.

The three circuit paths 11, 16 and 30 shown in FIG. 1B correspond to respective applications of the IED 10 including; transient capture/scaling circuit, associated with path 11, waveform capture, associated with path 16 and revenue measurement, associated with path 30.

Transient Capture/Scaling Circuit Path 11

A transient signal conditioning and analog to digital conversion path 11, referred to hereafter as the transient capture/scaling circuit path 11, is configured to perform signal conditioning and scaling operations on the electrical distribution system 120 three-phase input voltage channels Va, Vb, Vc to enable the detection and measurement of transients on the conditioned/scaled input voltage channels by a transient measurement circuit, to be described below.

Because the transient capture/scaling circuit path 11 performs signal conditioning and scaling on a three-phase input voltage channel, i.e., Va, Vb, Vc, the circuitry is duplicated for each voltage phase, Va, Vb, Vc and Vn (neutral).

The transient capture/scaling circuit path 11 singles out high-speed voltage events on the conditioned/scaled input voltage channels that would otherwise be missed by the waveform capture analog-to-digital converters (ADCs) 8*a* of the waveform capture circuit 16. The transient capture/scaling circuit path 11 is converting at a relatively low bit resolution, but at high speed. This will enable the meter to capture a wide dynamic range of very high-speed signals. This is opposed to the waveform capture circuit in which the bit resolution of the A/D converters is high. Standard technology does not allow for high resolution and high-speed conversion. Thus, by utilizing both paths, the meter will be able to record accurate power measurements and capture high-speed transients.

The transient capture/scaling circuit path 11 includes four circuit elements as shown in FIG. 1B, a first amplifier 14 having a unit gain, a follower 12, a second amplifier 13 and an A/D converter 7*a*. Scaling and offset operations are performed by the combination of the first amplifier 14, follower 12 and the second amplifier 13. The scaled and offset voltages, output from the second amplifier 13, are supplied to the dedicated A/D converter 7*a*, which outputs a digitized/scaled output voltage to FPGA 80 (See FIG. 1A).

The first amplifier 14 applies a gain adjustment to the input voltage channels, Va, Vb and Vc. The gain adjustment is set to provide an output-amplified voltage in an acceptable range of the A/D converter 7*a*.

The follower 12 separates the gain stages and the offset of the first and second amplifiers 13, 14. In other words, the follower 12 provides isolation between the first and second amplifiers 13, 14 to allow each amplifier 13, 14 to be independently adjusted. Without follower 12, a change in offsetting would adversely affect the gain of the previous stage, i.e., the gain provided from amplifier 14.

The second amplifier 13 offsets the transient voltage, which is supplied from the amplifier 13 as input to the A/D converter 7*a*. This is required in that the A/D converter 7*a* only accepts a unipolar input voltage in the range of 0 to 2 volts.

The A/D converter 7*a* is representative of a block of A/D converters. The A/D converter 7*a* receives conditioned/scaled transient voltages Va, Vb, Vc and Vn as input and outputs a digitized/scaled output voltage. It is noted that transient voltages are only measured on Vn in a phase-to-neutral measurement mode. In a phase-to-phase measurement mode, phase-to-phase transients do not use Vn as an input.

The transient capture/scaling circuit path 11 is capable of scaling a wide range of input voltages on the voltage channel inputs, Va, Vb, Vc. By way of example, the transient capture/scaling circuit path 11 can scale input voltages of ±1800 volts peak to peak. It should be appreciated that the actual voltage dynamic range of the transient capture/scaling circuit path 11 can be modified as per customer specifications. It should be noted that the transient capture/scaling circuit path 11 is configured to handle peak-to-peak voltages.

The transient capture/scaling circuit path 11 has a very high bandwidth, on the order of 10 MHz, that can be clocked at 50 MHz or greater. The combination of the transient scaling circuit's scaling capabilities (for over ranging voltage), high bandwidth and very high sample rate make possible accurate measurement and capture of the high speed transient without distorting the transient characteristics.

In one embodiment of the transient capture/scaling circuit path 11, the amplifier 14 preferably reduces gain in accordance with a ratio of 1 to 5.53. In one embodiment of the transient capture/scaling circuit path, the amplifier 13 preferably provides a voltage shift of 1.65 volts. It is understood that the afore-mentioned amplifier gains and voltage offsets are provided only by way of example and not limitation, in that the gains and offsets may vary as desired for appropriate scaling of the input voltage channels.

An exemplary operation of the transient capture/scaling circuit path 11 is now described. In operation, an input channel voltage range of ±1800 peak-to-peak volts is reduced by a resistor divider 5. Reduction is from ±1800 peak to peak volts to ±5.5 peak-to-peak volts. In one embodiment, the amplifier 14 of transient capture/scaling circuit path 11 has a gain of 1/5.53 (i.e., 0.18). A positive offset voltage of 1.00 volts is added to the signal output of amplifier 14 to ensure that the output voltage of amplifier 13 is always positive. For example, a +/−5.5 peak-to-peak volt input to amplifier 14 results in an output voltage in the range of +/−0.997 volts, which ensures that the output voltage of amplifier 13 will be positive.

Amplifier 13 provides an offset voltage of 1.00 v so that an output range of Amplifier 13 is in the range of 0.00446v to +1.9954v, to be provided as input to the A/D converter 7A. It should be appreciated that the aforementioned voltage scaling operations, described above, are needed for the high speed A/D converter 7A.

One non-limiting circuit component that can be used for A/D converter 7*a* is a low power, 8 bit, 20 MHz to 60 MHz A/D converter. One representative component having these attributes is the ADC 08060, which is commercially available from National Semiconductor, Santa Clara, Calif. It should be understood, however, that the IED 10 of the present disclosure is not limited to any particular component for performing A/D conversion.

The transient capture/scaling circuit path 11, described above, is necessary to scale down the input voltage channels so that the input voltage to the A/D converter 7, which may be implemented as an ADC 08060 converter or any suitable alternative having a low power input requirement, is met. Use of the ADC 08060 component or any suitable alternative guarantees that a high speed sampling rate, on the order of 50 MHz or greater will be possible for making transient measurements, including making impulse transient measurements, on the scaled down input voltage channels.

Waveform Capture/Scaling Circuit Path 16

Similar to that described above for the transient capture/scaling circuit path 11, waveform capture/scaling circuit path 16 receives a three-phase power input. Accordingly, the circuitry 16 is duplicated for each voltage phase, Va, Vb, Vc and Vn (neutral) of the three-phase power input. The waveform capture scaling circuit path 16 is further duplicated for an auxiliary input, Vx.

The waveform capture scaling circuit 16 is provided with a scaled input voltage signal from the resistor divider 5, which is common to all paths (i.e., transient capture/scaling circuit path 11, waveform capture circuitry path 16 and billing circuitry path 30). The scaled input voltage signal is supplied as input to amplifier 18, which isolates the multiplexer 19 from the transient capture/scaling circuit path 11 and billing circuitry path 30 by amplifier 18.

The waveform capture circuit 16 receives several channels at input amplifier 18 for scaling. Some of the scaled channels, which are output from the amplifier 18, at point "B", are then provided as input to a multiplexer 19. That is, not all input channels go the multiplexer 19. Because the A/D converter 8A is limited to six channels, the following signal pairs are multiplexed: Va or Vx, Vc or Vb, Ia or Ib. Channels, Vn, In and Ic go directly from the amplifier to the driver 4. The multiplexer 19 multiplexes the scaled channels for the A/D converter 8A that is dedicated to the waveform capture scaling circuit 16.

The multiplexed signals, which are output from multiplexer 19, are provided as input to the driver 4, which is followed by the A/D converter 8A. It is noted that the A/D converter 8A is actually comprised of a block of A/D converters. More particularly, A/D converter 8A is a multi-channel A/D converter for converting both voltage and current inputs. To allow for conversion of all of the channels, the multiplexer 19 selects from among the various inputs and a conversion is performed in two steps.

From the A/D converter 8A, the input channels go into the FPGA 80 (see FIG. 1A) to the DSP Processor 70. The DSP Processor 70 provides digital signal processing and the waveform analysis is focused on seeing more of the signal even though accuracy is reduced as there is more interest in quality of power and not accuracy. Thus while both A/D converters for the waveform scaling analysis circuit 16 and for the billing measure circuit path 30 each have 16 bit resolution, there is a difference in the range of input for the revenue A/D converter 9 (A/D converter 9 is a block of A/D converters that includes at least one A/D converter) and for the waveform capture A/D converter 8A due to the difference in the scaling input for each of these two converters. So the range of input of both the A/D revenue converter 9 and the A/D waveform capture converter 8 are different from each other.

Zero Crossing Circuit 26

With continued reference to FIG. 1B, there is shown a zero crossing circuit 26, which may be connected to the waveform, capture circuit 16 in certain embodiments. The zero crossing circuit 26 is only applicable to input voltage channels Va, Vb, Vc and Vx (auxiliary voltage input).

The operation of the zero crossing circuit 26 of FIG. 1B is as follows, according to one embodiment. The input voltage channels, which contain both fundamental and harmonic sinusoidal signals, after amplification in amplifier 18, are fed into a comparator 25. The comparator 25 produces a high output when the input is positive, and a low output when the signal is negative, thus transforming the input signal into a pulse train which transitions at each zero crossing.

The output of comparator 25 is fed into whichever processor includes the firmware for processing the zero crossing application. This could be the CPU 50 (Host Processor) or DSP Processor 70 or DSP Processor 60 or FPGA 80.

Frequency computation is performed using the output of comparator 25. The processor detects the time of each transition, and computes the duration between each transition. The presence of harmonics in the signal is such that the durations might significantly differ from that expected from the pure fundamental. Durations that are significantly shorter or longer than expected are ignored; durations that fall within acceptable limits are counted and accumulated. Periodically, the accumulated duration is divided by the count of durations, giving an average duration, from the inverse of which the average frequency can be computed.

Sampling and computations can occur in one of two ways, based on the frequency computation. In situations where a fixed sample rate is used, computations are based on the number of samples that would be taken over the period of the computed frequency; as the frequency varies, the number of samples in a cycle varies, while maintaining a fixed sample rate. Alternatively, in situations where synchronous sampling is needed, the sample period is computed as the desired fraction of the period of the computed frequency; as the frequency varies, the sample rate varies while maintaining a fixed number of samples per cycle.

Calibration

There are two calibrations that are performed to properly calibrate the IED 10 of the present disclosure. A Factory calibration and a Reference calibration. The Reference calibration is part of an auto-calibration feature of the IED 10.

Factory Calibration

The factory calibration feature calibrates the IED 10 to a very accurate reference voltage from an external source. An exemplary reference voltage is the Model 8000 or 8100 precision power and energy calibrator commercially available from Rotek Instrument Corp. of Waltham, Mass. These calibrators provide a highly stable 3-phase voltage, current and power source. It should be understood, however, that the present disclosure is not limited to any particular external reference voltage source.

Reference Calibration

Figure 1C:
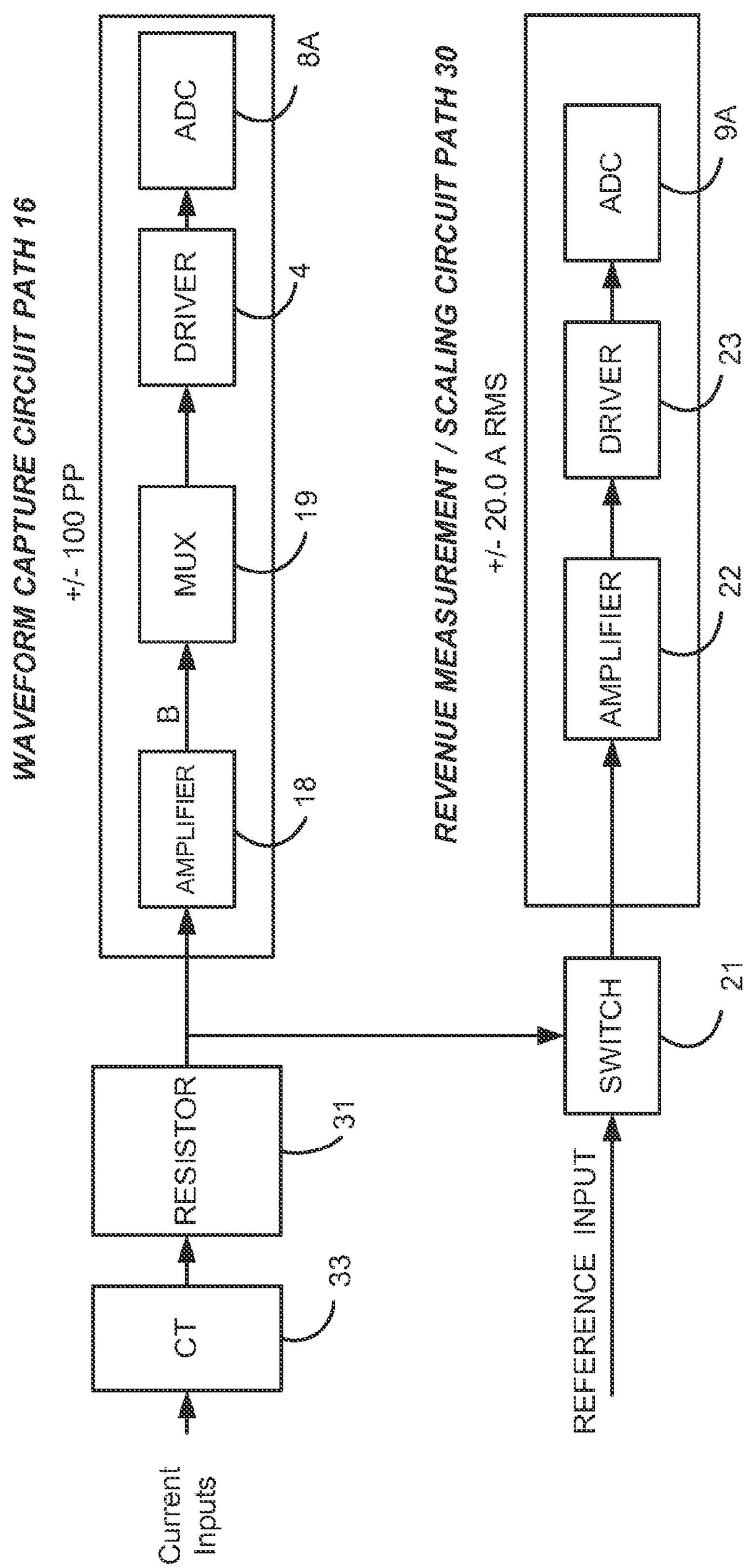
FIG. 1C is a block diagram illustrating how front end current input channels are distributed to dedicated circuits to be scaled for processing by a particular IED application in accordance with one embodiment of the present disclosure.

The Reference calibration uses a fixed set of reference voltages, which are selectable via calibration switch 21 (as shown in FIGS. 1B and 1C). The fixed set of reference voltages are measured and compared to an expected value. If there is a discrepancy between a reference voltage and an expected value, an update to the Reference gain correction factor and offset are calculated by the applicable processor. In normal operation, the currently stored Reference gain correction factor and offset are used with calibration switch 21 in the "non-calibration" position to normalize/correct all incoming samples.

As described above, the Reference calibration is part of an auto-calibration feature of the IED 10. Auto-calibration refers to a set of Reference calibrations that are automatically performed based upon temperature changes and/or an interval of elapsed time from the last auto-calibration. For example, when an auto-calibration is triggered by temperature and/or a time interval, a processor, such as DSP processor 60, for example, directs reference voltages to be supplied to the system via calibration switch 21. In other words, switch 21 is automatically switched from a non-calibration position to a calibration position. During an auto-calibration, a recheck of the reference voltage measurement are made. If it is determined that the reference voltage measurements, as measured by the processor, have changed due to analog circuitry drift, a new Reference gain factor and offset are calculated by the processor and stored for use in normalizing future incoming samples in the non-calibration mode.

It should be appreciated that a reference calibration is always performed, for the first time, during a Factory calibration so that all sample measurements are normalized to the updated Reference gain factor and offset correction factor. The Factory calibration inputs a very accurate reference voltage such as a three-phase 120 voltage/current source using an external source. The processor measures the voltage/current readings and based upon any discrepancy between the expected voltages and currents, calculates a Factory gain factor, which is stored by processor and is used to produce fully calibrated measurements. The processing of measurements of the IED use both the Reference gain and offset factors along with the Factory gain factor to produce calibrated measurements. To maintain the accuracy the auto-calibration corrects for drift due to temperature drift and component aging.

Revenue Measurement/Scaling Circuit Path 30

The revenue measurement/scaling circuit path 30 is operable to measure input voltage phases: Va, Vb, Vc and Vn (see FIG. 1B) and input current channels Ia, Ib, Ic and In. (see FIG. 1C).

Revenue measure circuit path 30 is comprised of a calibration switch 21, an amplifier 22, a driver 23 and A/D converter 9A in FIG. 1B (A/D converter 9B in FIG. 1C).

Scaling Operations of Path 30

In a scaling operation, the CPU 50 (or DSP processor) switches the calibration switch 21, via the FPGA 80 (see FIG. 1B) to measure the board reference voltages. In the case where the measured value of the board reference voltage has varied, a new gain and offset factor in the CPU 50 (or DSP processor) are calculated which are used to normalize and maintain accurate reading of the input channels.

In normal operation, after the input signals are selected by the processor via calibration switch 21 in the revenue measurement circuit/scaling circuit 30, the input signals are fed into an amplifier 22 preferably having a gain of 1.5913 for scaling purposes, according to one embodiment. The scaled and amplified input signals, output from the amplifier 22, are then provided as input to a driver 23 before being input into an A/D converter 9A.

FIG. 1C is a block diagram illustrating how front-end current input channels are distributed to dedicated circuits to be scaled for processing by revenue measurement and waveform capture analysis circuit paths. Input current channels, (Ia, Ib, Ic and In), are input into a current transformer, CT 33, collectively labeled "current inputs" in FIG. 1C. The output of the current transformer, CT 33, is supplied to a resistor 31. At the output of the resistor 31, the current channels are then split into two circuit paths. A waveform capture/analysis circuit path 16 for performing waveform capture analysis and a revenue measurement/scaling circuit path 30 for performing revenue measurement.

In the waveform capture/analysis circuit path 16, the current channels are scaled in an amplifier 18, whose output is provided as input to a multiplexer 19, driver 13, and A/D converter 8A (dedicated to waveform capture analysis), respectively. In one embodiment, the output of the dedicated A/D converter 8*a* is supplied, via FPGA 80 (see FIG. 1A), to a DSP processor 70 (see FIG. 1A) dedicated to waveform capture analysis. The FPGA 80 clocks the A/D converter 7, as described above with reference to the input voltage channels (see FIG. 1B).

With reference now to the revenue measurement/scaling circuit path 30 of FIG. 1C, the input current channels go into the calibration switch 21. A DSP processor (or at least one CPU 50) places the calibration switch 21 in a "normal" mode so that the input currents pass through the calibration switch 21 without modification.

Scaling Feature

The auto-calibration feature provides the scaling and offsetting for the revenue measurement/scaling circuit path 30 to maximize accuracy. The auto-calibration feature operates as follows. The CPU 50 (or DSP processor 70 or DSP processor 60) (see FIG. 1A) switches the calibration switch 21, via the FPGA 80, so that it checks the board reference currents that may have varied from their initial factory calibration. A correction factor in the CPU 50 (or DSP Processor 70 or DSP processor 60) is adjusted for any variations in the board reference currents from their initial settings for an accurate reading of the input channels.

This auto-calibration feature can be used in combination with the transient detection measurement circuit so it is possible to have both highly accurate revenue measurement and high bandwidth transient detection and capture concurrently in the IED 10 of the present disclosure.

The auto-calibration feature can perform a check to see if there is a need to adjust the Reference gain and offset factors periodically. The check can be performed, for example, every twelve minutes. In addition, the auto-calibration feature is temperature dependent and adjusts the Reference gain and offset factors for changes of internal temperature and/or ambient temperature or any other desired temperature threshold. One non-limiting illustrative example is for re-calibration for changes of 1 degree to 1.5 degrees.

The output of the calibration switch 21 is fed into an amplifier 22 preferably having a gain of 1.5913 for scaling purposes, according to one embodiment, followed by a driver 23 before being supplied to a dedicated A/D converter 9A (or 9B). The output of the A/D converter 9A (or 9B) is supplied to a processor with embedded firmware programmed to perform steps associated with a revenue measurement application. In the various embodiments, the processor can be either the CPU 50 or a DSP processor (e.g., DSP 60 or 70) or both the CPU 50 and a DSP processor. The revenue measurements are received and processed via the FPGA 80 which acts as a communications gateway via its dual port memory to an applicable processor.

Figure 2A:
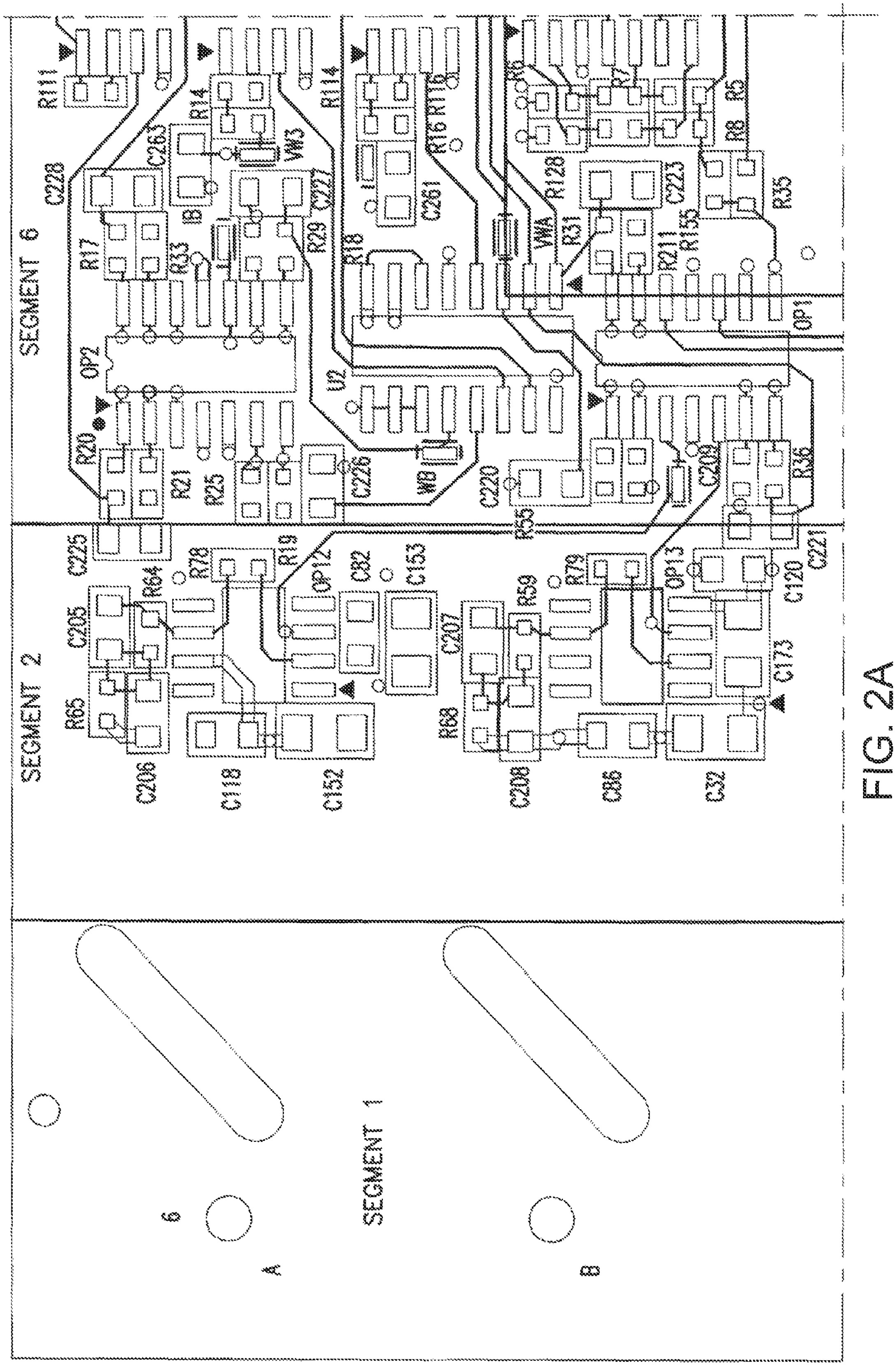
FIG. 2 illustrates how FIGS. 2A, 2B, 2C, 2D, 2E, and 2F would fit together in order to form a single view of an exemplary layout of a top layer of a printed circuit board for an IED showing how the analog circuits dedicated to particular applications are separated from each other in their own respective segments to reduce the possibility of noise in accordance with one embodiment of the present disclosure.
Figure 2B:
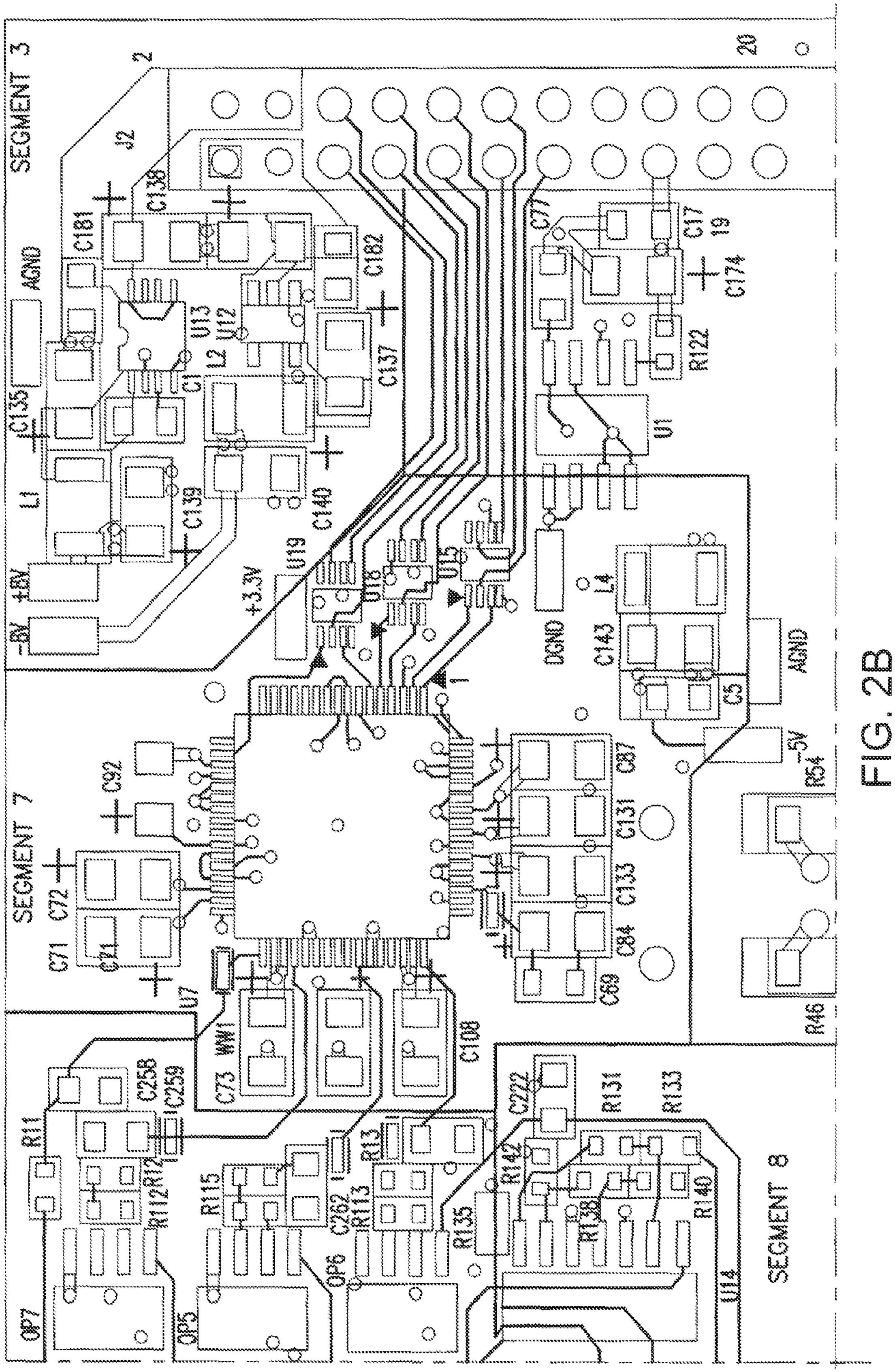
Figure 2C:
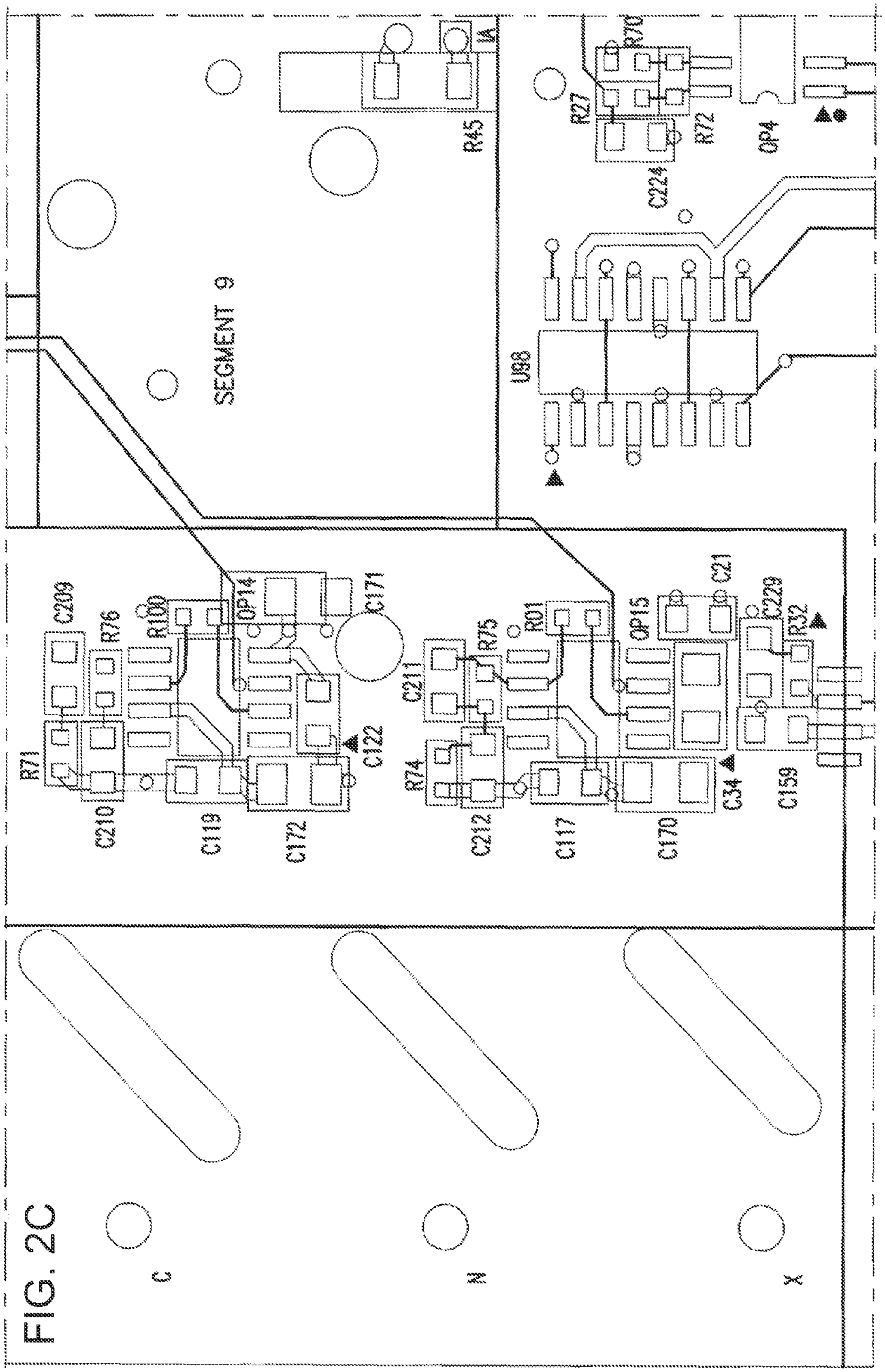
Figure 2D:
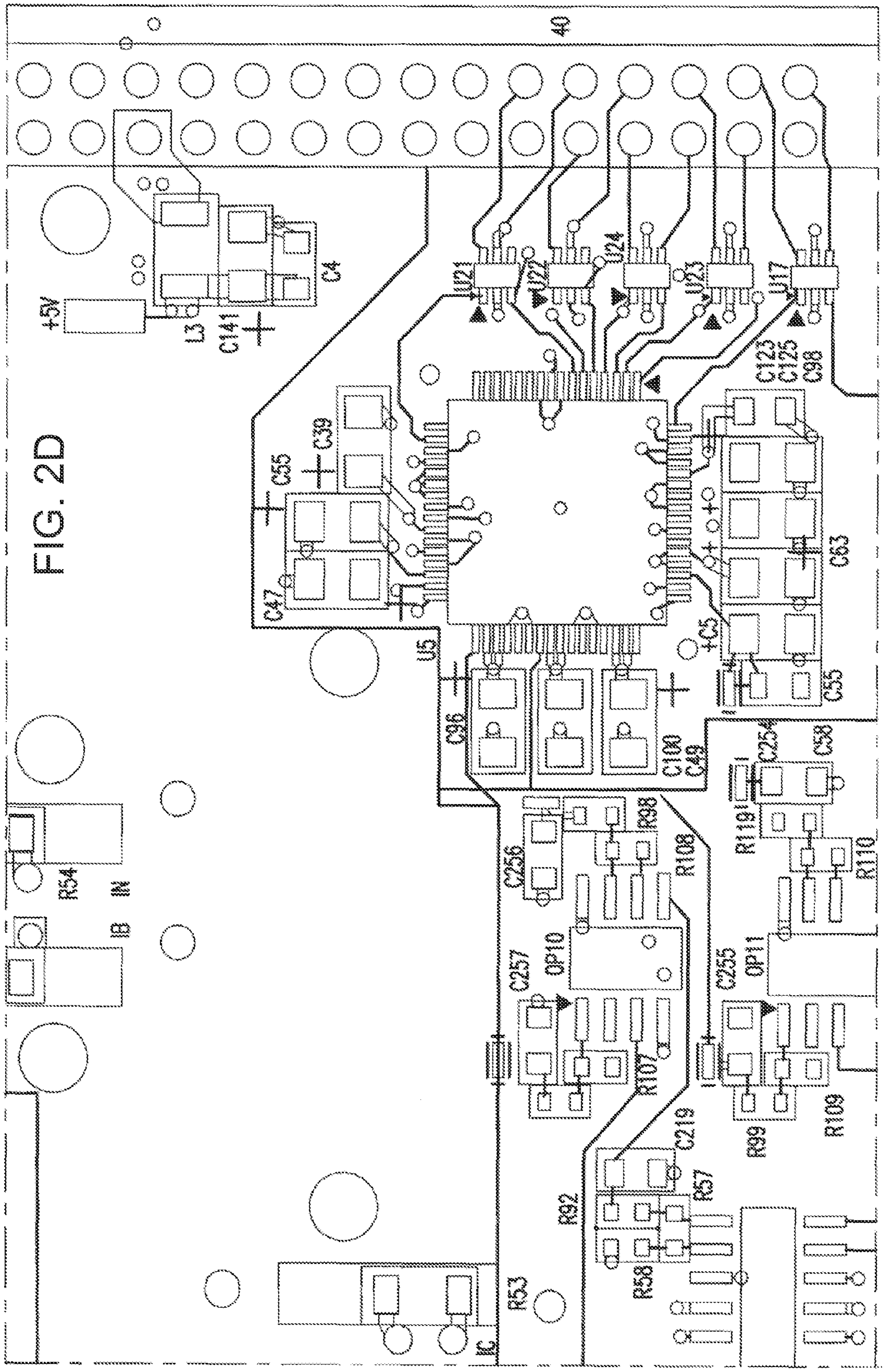
Figure 2E:
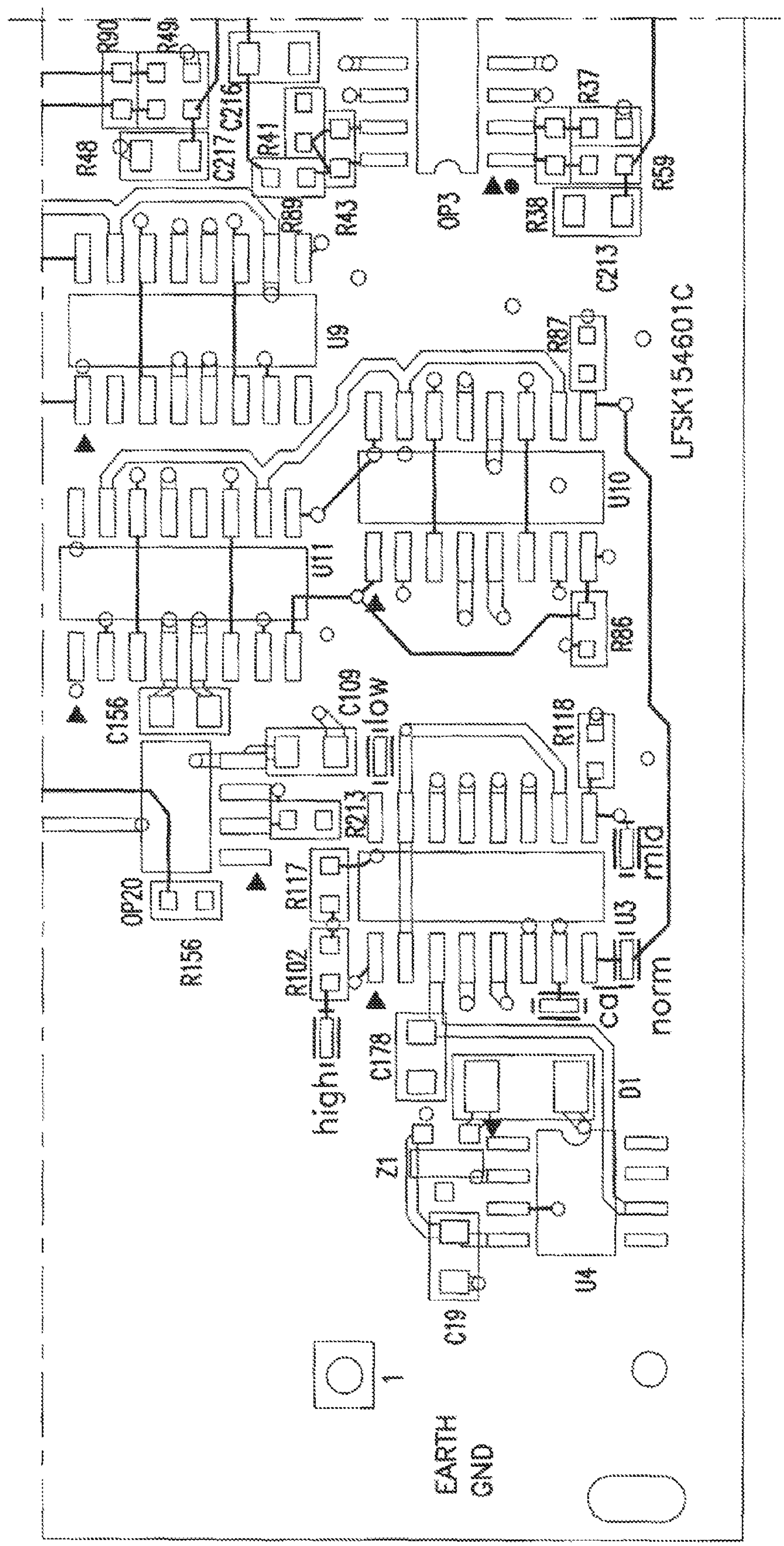
Figure 2F:
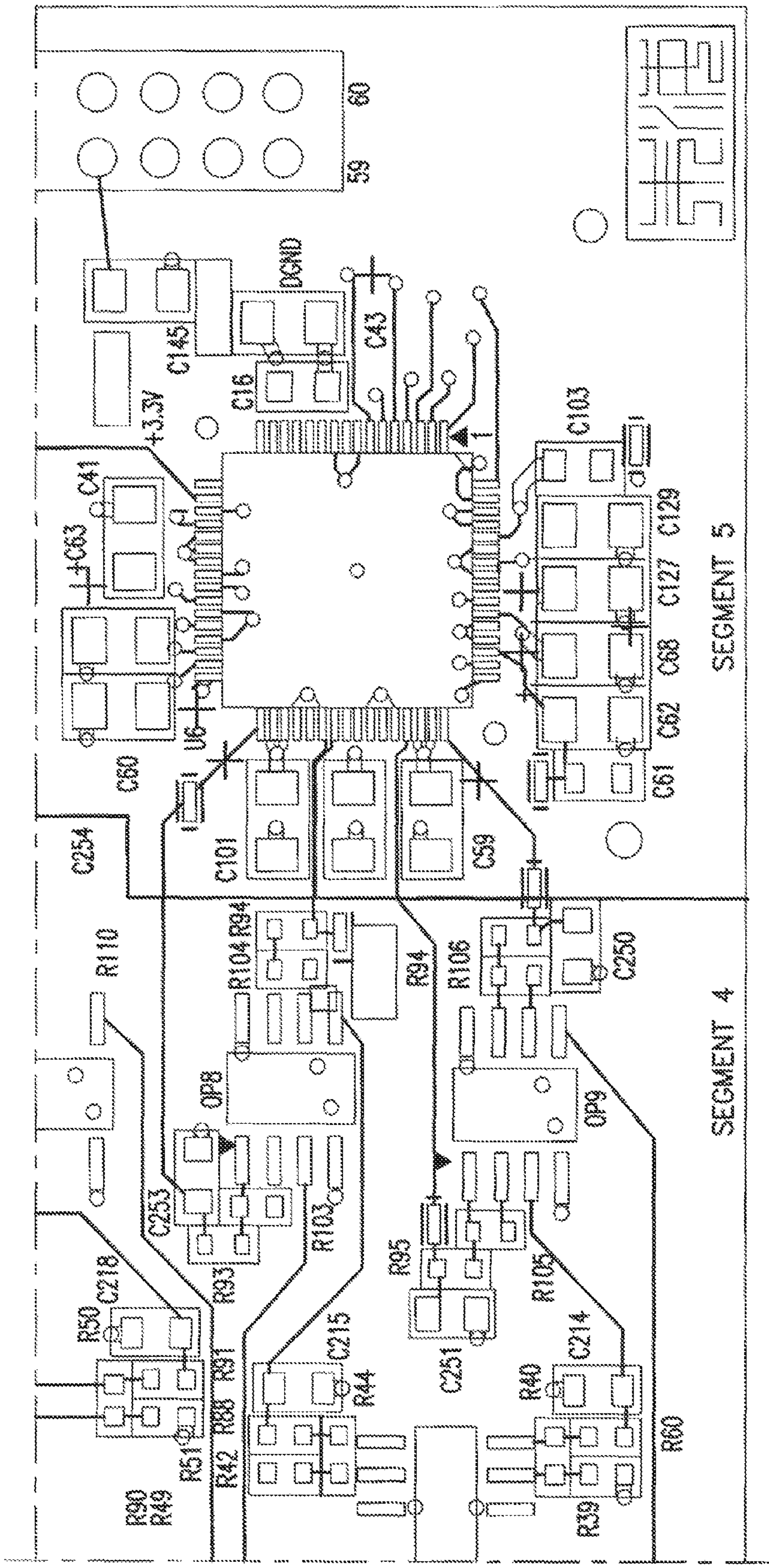
Figure 2:
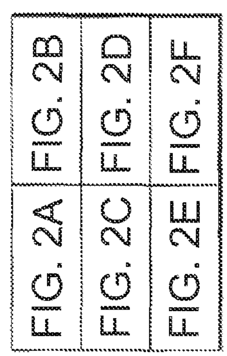

The operations described above, directed to scaling and conditioning of the input channels, prior to the input signals being supplied to their respective A/D converters is performed mostly on the analog circuitry of the analog board, as shown in FIG. 2.

Section III—Removing or Isolating Noise

Noise Reduction

FIG. 2, including FIGS. 2A-2F is a schematic diagram for illustrating a circuit layout for reducing crosstalk. FIG. 2 illustrates a top layer of the printed circuit board in which the discrete components for the analog circuitry of the analog board are mounted. As seen in FIG. 2, each of the circuits are laid out and partitioned into their respective segments. In particular, the transient measurement circuit resides in segment 2, separated from the waveform measurement circuit, which resides in segment 6, separated from the revenue measurement circuit, which resides in segment 4.

In addition to each circuit being laid out and partitioned into their own segments, each trace in each circuit is dimensioned to have a certain width such as preferably but not limited to 8 mils. A trace is a segment of a route, e.g., a layout of wiring, for a PC (printed circuit) board. The spacing between traces is preferably in a range of between 8 mils to 20 mils to reduce the possibility of noise such as coupling noise. The circuits are laid out on the PCB so that each part of one of the circuits does not overlap or lay in close approximation with a part of another one of the circuits. In this way, crosstalk between said circuits on the PCB is reduced.

The described layout and design configuration, and trace thickness, serves to reduce the possibility of noise between the transient detection components and the other circuits (i.e., the waveform measurement circuit 16 and the revenue measurement circuit 30). By reducing noise between the various circuits, each circuit operates over a greater dynamic range and provides more accurate data. In particular, by reducing noise between the transient measurement circuit 16 and the other circuits, the transient measurement circuit 16 will be impervious to spurious triggering and provide fast and more sensitive measurement of the transients and higher quality data, which contributes to a better analysis of the transients.

The PCB is preferably configured as a six-layer board with a top layer, a bottom layer and four intermediate layers (mid 1-mid 4). The PCB is preferably formed from three boards glued together, each board having two surfaces so that when glued together there are six layers.

The top layer is organized according to the various segments and contains both the analog components and the traces connecting the components within each segment.

The segments of the top layer, shown in FIG. 2 include—

- segment 1 for the input channels;
- segment 2 for the transient detection circuit;
- segment 3 for the power circuitry for the power for all circuits;
- segment 4 the revenue measurement circuit;
- segment 5 for the A/D converter;
- segment 6 for the waveform capture circuit;
- segment 7 for the A/D converter for the waveform capture circuit;
- segment 8 for the zero crossing circuit; and
- segment 9 for at least one or more current transformers (CT).

The bottom layer of the PCB includes capacitors and resistors mounted thereon for the circuitry of the IED 10.

There are four intermediate layers—mid 1, mid 2, mid 3 and mid 4. The fourth intermediate layer, mid 4, includes the traces for only the transient detection circuit. These traces connect the transient detection circuit to other circuitry. It is noted that no other traces for any other analog circuits, (e.g. traces for the waveform capture circuit and revenue measurement circuit) are permitted on the fourth intermediate layer, mid 4. This ensures a reduction in the possibility of noise from and to the transient detection traces from the traces of the other analog circuits.

Section IV—Field Programmable Gate Array (FPGA)

The FPGA of the present disclosure is a complex device, which is capable of performing numerous functions. Among the many functions performed by the FPGA, are four primary functions: 1) transient detection and capture 2) load balancing, 3) assuming the processing tasks of one or more other processors 4) acting as a communications gateway to route data between one or more other processors and from the A/D converters (i.e., revenue A/D's, waveform A/D's 9A and transient A/D's 7A, as shown in FIGS. 1B and 1C).

In a preferred configuration, the FPGA includes one or more internal Dual Port Memories to facilitate the FPGA acting as a communications gateway, to be described further below.

Figure 3A:
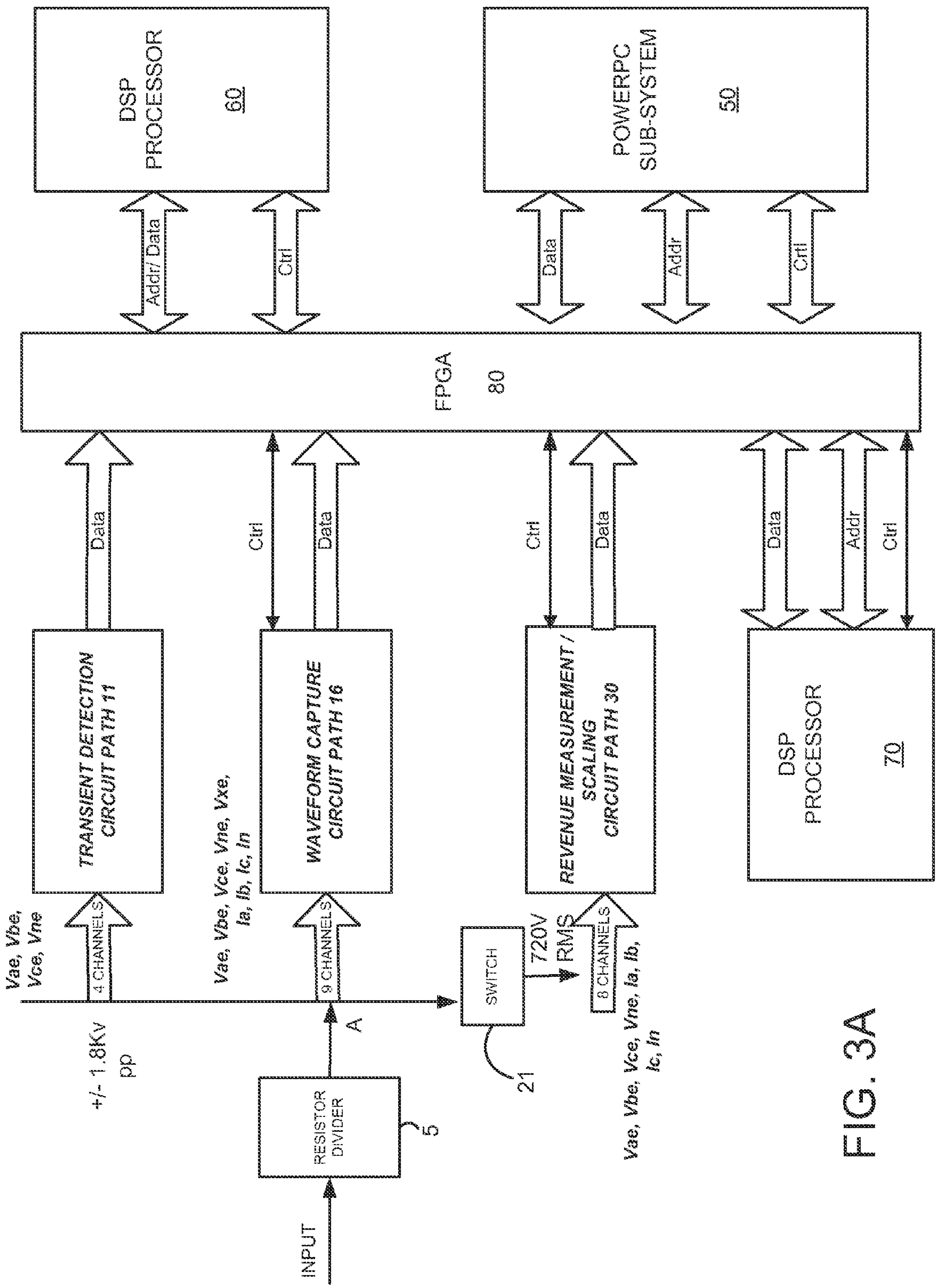
FIG. 3A is a block diagram of a digital system FPGA interface illustrating how various digitized voltage and current channels may be input to various circuit paths of the IED for implementing various power meter applications in accordance with an embodiment of the present disclosure.

In a preferred configuration, the FPGA is operatively coupled to at least one A/D converter. Operatively coupled is defined herein as being directly or indirectly coupled to a component or indirectly through other components, connectors or sub-subsystems Referring now to FIG. 3A, various channels may be input to each of the three circuit paths 11, 16, 30. For example, four channels of voltage (Vaet,Vbet,Vcet,Vnet) are input to the transient detection circuit path 11, four voltage channels ((Vaeb,Vbeb,Vceb and Vneb) are input to the zero crossing circuit 26, four voltage channels (Vaeb,Vbeb,Vzceb,Vneb) and four current channels (iab,ibb,icb,inb) are input to the revenue measurement/scaling circuit path 30. Nine channels of voltage and current (Vaep,Vbep,Vcep,Vxp,Vnep,iap,ibp,icp,inp) are input to the waveform capture circuit path 16. It should be understood that the number of input channels may change in different applications and that the number of input channels shown in FIG. 3A is intended as one non-limiting illustrative example The voltage and current channels associated with the A/D transient detection circuit 11 path and waveform capture circuit paths 16 are clocked into the FPGA 80. This is performed via an internal master clock within the FPGA 80 which generates at least one subordinate clock. For example, in one embodiment, one subordinate clock is generated from the internal master clock of the FPGA 80 to clock the A/D 7A outputs from the transient detection circuit path 11 into the FPGA 80. A second subordinate clock is generated by the FPGA 80 to clock the A/D 8A outputs from the waveform capture circuit path 16 into the FPGA 80.

Unlike the A/D transient detection circuit 11 path and waveform capture circuit paths 16, the revenue measurement/scaling circuit path 30 does not operate under clock control of the FPGA 80. Instead, the revenue measurement/scaling circuit path 30 operates by generating a start conversion signal to the FPGA 80 and then checking for an appropriate time to pull data, independent of any clocking mechanism.

(1) FPGA—Load Balancing

The FPGA 80 is capable of performing load balancing. That is, in the case where it required to perform one or more sophisticated calculations, for example, data may be directed (routed) by the FPGA 80 to one or more of the processors 50, 60 and 70 to balance memory and processing requirements. Since the FPGA 80 a field programmable device, a new logical program can be loaded into the FPGA 80 through its interface thus creating new additional functionality not contemplated before. This allows the physical circuit design to be modified after the metering device is assembled.

In accordance with another aspect of load balancing, the FPGA 80 may be constructed as an array of configurable memory blocks, each block being capable of supporting a dedicated processor. For example, in one embodiment, the FPGA 80 may be constructed as N memory blocks, 1, 2, . . . . N, each block supporting an associated processor, 1, 2 . . . , N. The flexibility of such a configuration facilitates processor expansion. That is, in the event more processors are required than those described above, for example, processors 50, 60 and 70, supported by memory blocks 1, 2 and 3, it is envisioned that the unused memory blocks, 4, 5, . . . . N, are capable of supporting additional processors as they are required. In another embodiment, it is also contemplated to dedicate more than one memory block to a single processor or to multiple processors. For example, processor A could have memory blocks 1 and 2 associated with it. In this manner, processor A could simultaneously communicate data to processor B, with the data being of a different data type in each of the respective memory blocks.

(2) FPGA—Assume Processing Tasks

In addition to performing load balancing and acting as a switching mechanism, the FPGA 80 is capable of assuming the processing tasks of one or more of the processors 50, 60 and 70. That is, the FPGA 80 provides a capability to remove and/or change one or more of the processors 50, 60 and 70. In addition, in some embodiments, the FPGA 80 can be programmed to perform common processor functions, such as those typically associated with any one of processors 50, 60 or 70 and combinations thereof. A processor or even multiple processors can be embedded in the FPGA to assume additional processing functions or replace any one of processors 50, 60 or 70 and combinations thereof. In general, the FPGA 80 may be capable of performing any desired processing function as required. For example, it is contemplated to implement digital signal processing functions in the FPGA 80. In this case, the FPGA 80 may store the data results of such signal processing functions in an internal configurable memory to be eventually communicated to one the processors 50, 60 or 70.

(3) FPGA—Transient Detection and Capture

Referring again to FIG. 3A, the four input voltage channels (Vaet, Vbet, Vcet and Vnet) are converted to digital form by A/D transient module 7A (see FIG. 2*a*). Transient detection and capture is performed by FPGA 80 and the waveform capture circuit path 16. The FPGA receives output data from ADC circuit 8*a* (see FIG. 1C path 16) and processes the received data to identify the largest transient (peak) value occurring during each waveform sample interval, according to one embodiment. Upon determining the largest transient (e.g., peak) value in each waveform sample interval, the transient value is passed from the FPGA 80, to DSP 70 along with the waveform voltage and currents measured by the A/D 9 waveform. To pass the transient and waveform data to DSP 70, the FPGA 80 inputs transient and waveform parallel data from the ADC, and concurrently converts the transient and waveform parallel data to two separate serial data streams which are synchronized together by FPGA 80 so that the transient data stream is correctly associated in time with the waveform data stream. In one embodiment, the two serial data streams are clocked at 20 MHz into two of the serial channels of DSP 70 for further processing. DSP 70 receives the serial transient data stream from FPGA 80, which contains both the transient peak data values and the duration of each of the transients. DSP 70 scales transient value and replaces the waveform sample value with the peak transient value, which occurred during the current waveform sample interval so that the transient is embedded in the waveform capture and synchronized to it. This operation is performed for each waveform sample, which is coincident with a transient. DSP 70 passes the combined transient and waveform samples to Processor 50 via the embedded Dual Port memory in FPGA 80 along with the values of largest negative and positive transients that occurred during the captured cycle and there durations.

(4) FPGA—Communications Gateway

Referring again to FIG. 3A, there is illustrated a block diagram of a digital system FPGA interface for illustrating how the FPGA 80 acts as a communications gateway (i.e., interface) for directing various digitized voltage and current signal channels to appropriate circuit paths of the power meter to implement various power meter applications.

As shown in FIG. 3A, four input voltage channels (Vaet, Vbet, Vcet and Vnet) are supplied as input to the A/D transient detection circuit path 11. The A/D transient detection circuit path 11 is clock synchronized with the FPGA 80.

In one embodiment, the voltage and current channels can be supplied directly to one of the processors 50, 60, 70, dedicated to processing the voltage and current channels. In other embodiments, the voltage and current channels may be supplied to the Field Programmable Gate Array 80 (FPGA), acting as a communications gateway, directing the input voltage and current channels to multiple processors to concurrently process the voltage and current channels. In one embodiment, each processor 50, 60, 70 may be assigned a dedicated processing function. For example, DSP 60 may be dedicated to billing/revenue, DSP 70 may be dedicated to waveform and transient analysis, CPU 50 may perform post-processing functions for both DSP 60 and DSP 70 and most of the I/O functions.

(5) FPGA—Communications Integrity

With continued reference to FIG. 3A, DSP 70 interfaces to the FPGA 80 via a data channel, an address channel and a control "Ctrl" channel. In operation, data is received by the FPGA 80 from any one of the transient detection circuit path 11, waveform capture circuit path 16, and revenue measurement scaling circuit path 30. The FPGA 80, acting in the capacity of a communications gateway, as described above, streams the received data to one or more of the processors 50, 60 and 70, depending upon the application. In the case of processor 70, data is streamed from the FPGA 80 to DSP processor 70 via one or more serial communications channels. Data integrity of the communicated serial data stream is achieved by utilizing an error detecting technique. It is noted that without some form of data integrity, should the serial data stream become skewed by only one "bit" time, all of the data the FPGA 80 transfers to DSP processor 70 will be incorrect and remain incorrect. In one embodiment, to guarantee the data integrity of each block of transmitted data, the last sequence of 16 bits of data is regarded as a 16-bit frame counter that is incremented for each frame of data that is communicated from the FPGA 80 to DSP processor 70. To validate the data, DSP processor 70 reads the 16-bit frame counter and compares it to the most recently received 16-bit frame counter (i.e., the frame counter received as part of the previously received data block). If the current 16 bit frame counter is one greater than the most recently received 16 bit frame counter, DSP processor 70 knows that the transfer is correct and that data bits have not been shifted. In this case, it is assured that there are no clocking errors and that the positioning of the data block within the frame is correct. Otherwise, if the comparison fails DSP 70 forces FPGA 80 to resynchronize so that data integrity can be restored.

In addition to the data integrity scheme described above, checksums are embedded in each of the data blocks that are transferred between the various processors 50, 60, 70 via the FPGA 80 dual port memories, to verify data integrity.

With continued reference to FIG. 3A, in one embodiment, an interlocking interrupt scheme is used between DSP processor 70 and CPU 50, whereby the FPGA 80, acting in the capacity of a communications gateway, continuously checks for overlap. Overlap is defined herein as having a second interrupt generated by DSP 70 via FPGA 80 before getting an acknowledgement from CPU 50 for the previous interrupt. This would indicate that DSP 70 has overwritten the data in the Dual Port memory before CPU 50 was able to process it. In the event an overlap occurs, it can be inferred that data processing is no longer being performed in real time as intended and that data is being lost. In this case, the FPGA 80 generates an error flag to CPU 50 indicating that an overlap condition has occurred. When an overlap condition has occurred CPU 50 will perform a reset to re-initialize the system.

In one embodiment, DSP processor 70 continuously checks to see if all of the data blocks, transmitted from FPGA 80, via the serial communications channel, have been transmitted in one of its processing cycles. Each processing cycle of the DSP 70 are performed over a fixed interval and each block of data that the DSP 70 transmits to CPU 50 via the Dual Port memory is acknowledged by the CPU 50. If the DSP 70 "runs" out of time before it can send all its data blocks for the present processing cycle it sets an error flag to CPU 50 to indicate an error condition has occurred. Similarly CPU 50 is sent a message by DSP 70 with the number of data blocks that DSP 70 is about to transfer. CPU 50 keeps a count of the number of data blocks that it has received if the count is incorrect or if DSP 70 reports an error as described above, CPU 50 will perform a reset to re-initialize the system.

In one embodiment, the compact flash storage 17 (see FIG. 1A) utilizes error detection and correction codes to achieve a high degree of data integrity.

Figure 3B:
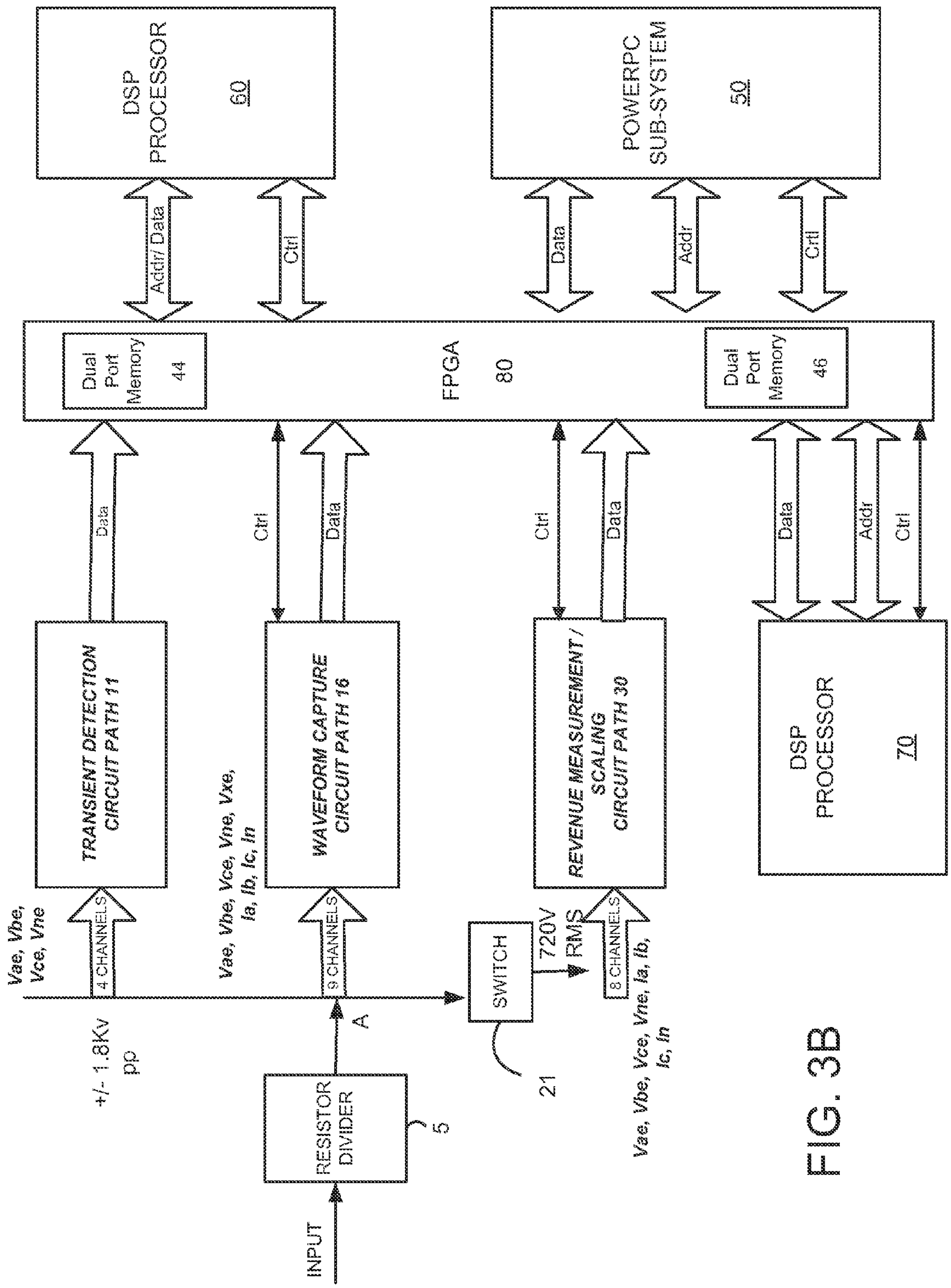
FIG. 3B is a block diagram of a digital system FPGA interface illustrating how various digitized voltage and current channels may be input to various circuit paths of the IED for implementing various power meter applications in accordance with another embodiment of the present disclosure.

Referring now to FIG. 3B, there is shown the FPGA 80 of FIG. 3A further including two dual port memories 44, 46. Dual port memory cells are important in that they enable simultaneous accesses from two ports, versus a signal port memory cell in which data reads and writes are performed via a single port. As used herein, the dual port memories 44, 46 flexibly allow the various processors 50, 60, 70 to transfer data there-between. In one embodiment, the dual port memories 44, 46 are used to communicate data, processed by the various processors, 60, 70 to the PowerPC sub-system 50. The PowerPC sub-system 50 may utilize the data for any number of purposes, including, for example, data logging and display (for I/O).

In one application involving the dual port memories 44, 46, the DSP Processor 70 completes a computation cycle and at the end of the cycle, writes the data into the dual port memory 46. Then, the DSP 70 sends an interrupt directly to the CPU subsystem 50. A similar process occurs for data processed by the transient detection circuit path 11, the waveform capture circuit path 16 and the revenue measurement circuit path 30. That is, data from each of these circuit paths is transferred via the FPGA to an appropriate processor 50, 60, 70 so that all raw sensor data routing is controlled by the FPGA. In some embodiments the FPGA may perform some pre-processing on the data before routing the data to a processor. The processors then output their data to one or the other dual port memories 44, 46 to be eventually transferred for further processing to one of the processors 50, 60.

In one embodiment, FPGA 80 includes high-speed serial ports (i.e., 20 MHz) and four (4) channels. Two of the channels are dedicated. One channel is dedicated to Waveform A/D data; output from the waveform capture circuit path 16 and another channel is dedicated to transient A/D data output from the transient detection circuit Path 11. The data that has been serialized by FPGA 80 is transferred to DSP 70 for processing and the written to dual port memory 46, which receives the afore-mentioned data and makes the data available to any one of the processors 50, 60, 70.

It should be understood that while the FPGA 80 may be configured to include one or more dual port memories, as described above, by way of example and not limitation, it is contemplated, in various embodiments, to configure memory blocks of the FPGA 80 as any one of a RAM memory, ROM memory, First-in-First-Out Memory or Dual Port memory.

Section V—Power Quality Measurements

The IED of the present disclosure can compute a calibrated VPN (phase to neutral) or VPP (phase to phase) voltage RMS from VPE (phase to earth) and VNE (neutral to earth) signals sampled relative to the Earth's potential. The desired voltage signal can be produced by subtracting the received channels, VPN=VPE−VNE. Calibration involves removing (by adding or subtracting) an offset (o, p) and scaling (multiplying or dividing) by a gain (g, h) to produce a sampled signal congruent with the original input signal. RMS is the Root-Mean-Square value of a signal, the square root of an arithmetic mean (average of n values) of squared values. Properly combined, one representation of this formula is:

$$V_{AN} = \sqrt{\frac{\sum_{n} (g(V_{AE} - o) - h(V_{NE} - p))^2}{n}}$$

Implementation of the computation in this arrangement is comparatively inefficient, in that many computations involving constants (−o, −p, g*, h*) are performed n times, and that computational precision can either be increased, forcing the use of large numbers (requiring increased memory for storage and increased time to manipulate), or be degraded, increasing the uncertainty. However, a mathematical rearrangement can be carried out on the above formula, producing an equivalent computation that can be carried out more efficiently, decreasing the effort needed to produce similar or superior results. That representation is:

$$V_{AN} = \sqrt{g^2\left(\frac{\sum_n V_{AE}^2 - 2o\sum_n V_{AE}}{n} + o^2\right) - 2gh\left(\frac{\sum_n V_{AE}V_{NE} - o\sum_n V_{NE} - p\sum_n V_{AE}}{n} + op\right) + h^2\left(\frac{\sum_n V_{NE}^2 - 2p\sum_n V_{NE}}{n} + p^2\right)}$$

Implementation of the computation in this arrangement can be accomplished with more efficiency and precision. All involvement of constants has been shifted to single steps, removed from the need to be applied n times each. This savings in computation can then be partially utilized to perform slower but more precise applications of the gains and Square Root. The result is a value of equal or higher precision in equal or lesser time.

These calculations are preferably software implemented by at least one processor such as the CPU 50 or at least one of the DSP Processors 60, 70 or at least one FPGA 80.

Figure 4:
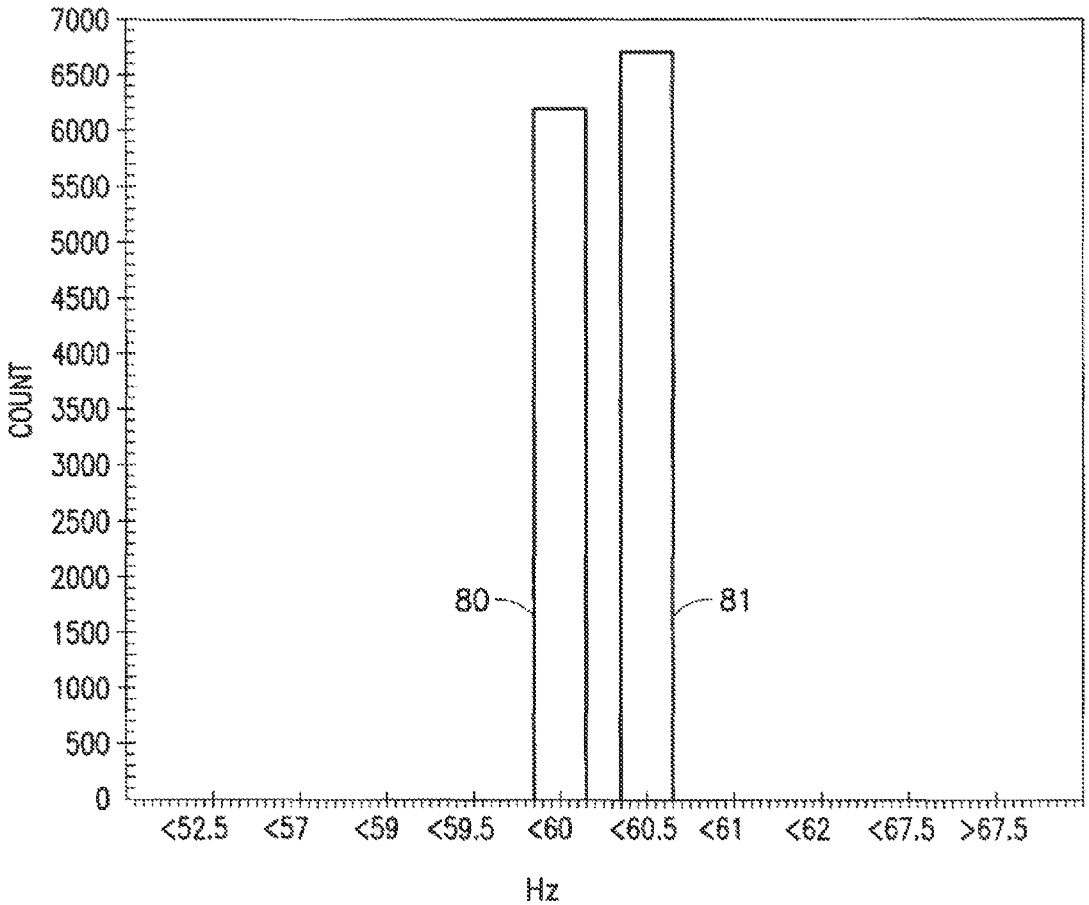
FIG. 4 is a graph illustrating the measurement of power quality, and in this example the power quality measurement is frequency fluctuations, using bins to measure a count of the power quality event within a user defined time period in accordance with this feature of the IED of the present disclosure.
Figure 5:
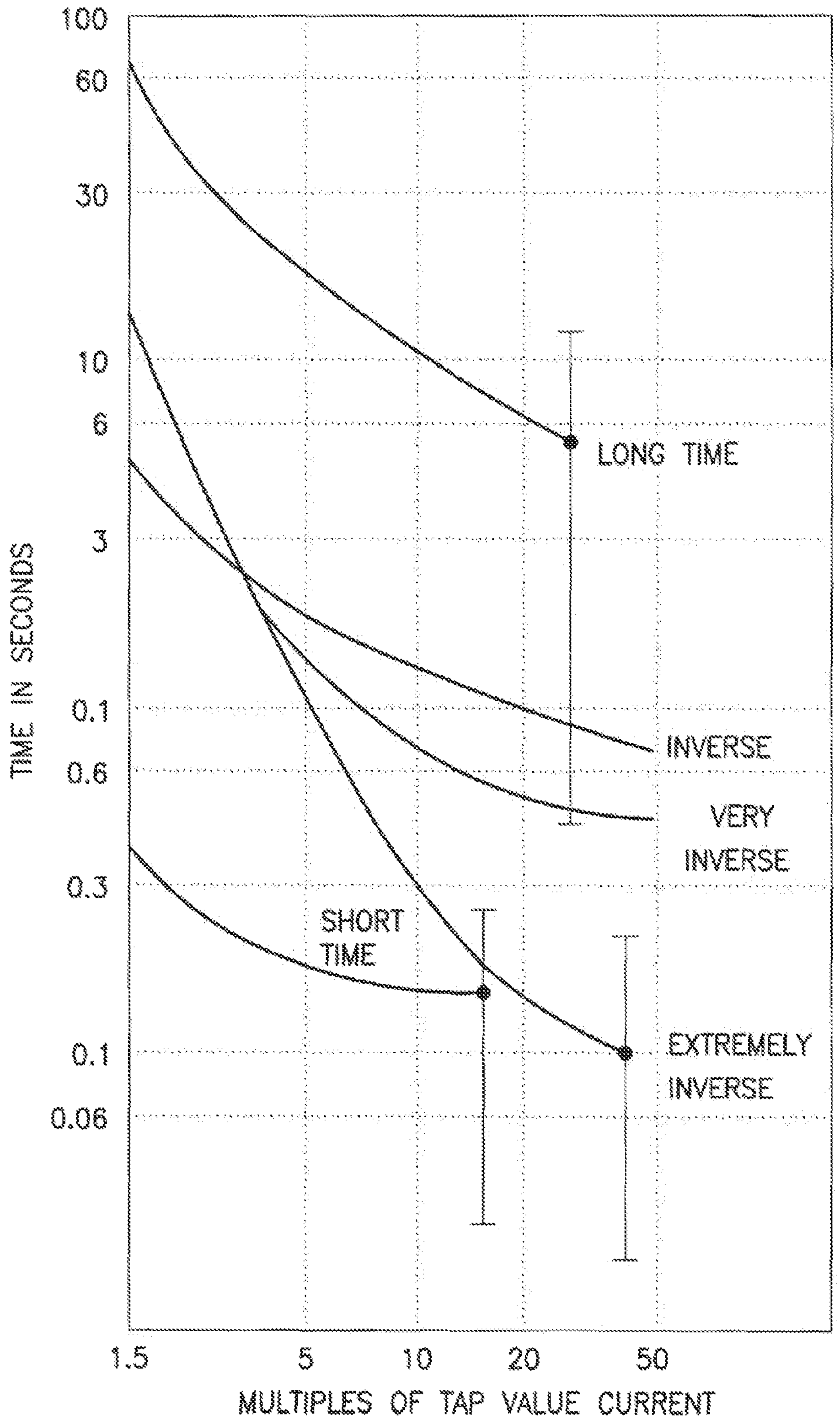
FIG. 5 is a graph illustrating time over current curves in connection with a protective relay feature of the IED of the present disclosure.

The IED of the present disclosure can be used to measure the power quality in any one or more or all of several ways. The at least one CPU 50 or DSP processor 70 can be programmed with certain parameters to implement such measurements of power quality which can be implemented in firmware (e.g., embedded software written to be executed by the CPU or at least one DSP Processor) within the at least one CPU 50 or DSP Processor 70 or by software programming for the at least one CPU 50 or DSP Processor 70. The different techniques for measuring power quality with the IED of the present disclosure are described below. Each of these techniques is implemented by the IED of the present disclosure by firmware in the at least one CPU 50 or DSP processor 70. In the at least one CPU 50 or DSP processor 70, a series of bins are used to store a count of the number of power quality events within a user-defined period of time. These bins can be by way of illustrative, non-limiting example registers of a RAM. These bins can be for a range of values for one parameter such as frequency or voltage by way of illustrative non-limiting example provide the acceptable range for testing the input signals within a specified period of time for the IED. In this way, it can be determined if the measurements are within acceptable parameters for power quality complying with government requirements and/or user needs. FIG. 4 illustrates an example of frequency bins for when the IED of the present disclosure measures for frequency fluctuations. The IED of the present disclosure can measure frequency fluctuations. The nominal frequency of the supply voltage by way of illustrative and non-limiting example is 60 Hertz (Hz). Under normal operating conditions, the mean value of the fundamental frequency of the supply voltage can be measured over a set time interval such as by way of illustrative, non-limiting example over 10 seconds and is within a specified range such as, by way of an illustrative, non-limiting example as shown in FIG. 4, 60 Hz+−2% (58.8−61.2 Hz) for preferably a majority of the week—by way of illustrative, non-limiting example 95% of the week, and within a specified range of by way of illustrative non-limiting example +−60 Hz+−15% for a specified percentage of the week by way of illustrative, non-limiting example 100%. For this example in FIG. 4, the bins can be set in a specified range of the mean value of the fundamental frequency of the supply voltage frequencies—in this illustrative example the range for passing this test for power quality of this example can be within 2 percent of 60 Hz so the frequency bins 80, 81 would be between 58.8 Hz and 61.2 Hz for 95% of a 10 second intervals during the week of the test. If the frequency is not within this range for at least as this long, then the IED of the present disclosure has determined that this power quality test has failed. These values can be programmed into the at least one CPU 50 or DSP processor 60.

The IED of the present disclosure can measure the total harmonic distortion (THD). Under normal operating conditions, the total harmonic distortion of the nominal supply voltage will be less than or equal to a certain percentage of the nominal supply voltage such as by way of non-limiting illustrative example 8 percent of the nominal supply voltage and including up to harmonics of a high order such as by way of non-limiting example the $40^{th}$ order. In this non-limiting illustrative example, the bins can be set in a range of the specified percentage of the THD—in this illustrative example less than or equal to 8% so that if the THD is greater than 8%, the IED of the present disclosure has determined that this power test has failed.

The IED of the present disclosure can measure harmonic magnitude. Under normal operating conditions a mean value RMS (Root Mean Square) of each individual harmonic will be less than or equal to a set of values stored in the at least one CPU or processor memory for a percentage of the week such as by way of illustrative, non-limiting example 95% of the week a mean value RMS (Root Mean Square) of each individual harmonic. For this test, the bins can be set in a specified range of the mean value of the fundamental frequency of the supply voltage frequencies—in this illustrative example the range for passing this test for power quality can be within 2 percent of 60 Hz so the frequency bins would be between 58.8 Hz and 61.2 Hz for a specified period of 95% within 10 seconds. If the frequency is below or above this range than the IED of the present disclosure has determined that this frequency has failed this power quality test. These values can be programmed into the at least one CPU 50 or DSP processor 60.

The IED of the present disclosure can measure fast voltage fluctuations. Under normal operating conditions a fast voltage fluctuation will not exceed a specified voltage, by way of illustration in a non-limiting example 120 volts+−5% (114 volts-126 volts). In this illustrated, non-limiting example fast voltage fluctuations of up to 120 volts+−10% (108 volts-132 volts) are permitted several times a day. For this test the bins can be set in a specified range of voltages—in this illustrative, non-limiting example the range of voltage is 120 volts+−5% or from 114 volts through 126 Volts for a total count of less then 25 per week. If the voltage falls below or above this range than the IED of the present disclosure has determined that the voltage has failed this power quality test.

The IED of the present disclosure can measure low speed voltage fluctuations. Under normal operating conditions, excluding voltage interruptions, the average of the supply voltage can be measured over a set time interval such as by way of illustrative, non-limiting example 10 minutes and is expected to remain within a specified range such as by way of illustrative, non-limiting example 120 volts+−10% (108 volts-132 volts) for preferably a majority of the week—by way of illustrative, non-limiting example 95% of the week. For this test the bins can be set in a specified range of voltages—in this illustrative, non-limiting example the range of voltage is of 120 volts+−10% or from 108 volts through 132 Volts for passing this test for at least 95% of the week. If the voltage falls below or above this range than the IED of the present disclosure has determined that the voltage has failed this power quality test. These values can be programmed into the at least one CPU 50 or DSP processor 70.

The IED of the present disclosure can measure Flicker. Flicker is the sensation experienced by the human visual system when it is subjected to changes occurring in the illumination intensity of light sources. Flicker can be caused by voltage variations that are caused by variable loads, such as arc furnaces, laser pointers and microwave ovens. Flicker is defined in the IEC specification IEC 61000-4-15 which is incorporated by reference thereto. For the IED of the present disclosure under normal operating conditions, the long term Flicker severity can be caused by voltages fluctuations which are less than a specified amount by way of illustration non limiting example of less than 1 for a specified period of time by way of an illustrative non limiting example for 95% of a week. For this test, the bins can be set in a specified range of Flicker severity—in this illustrative, non-limiting example the range of long term Flicker severity due to voltage fluctuations being less than 1 for a specified period of 95% of a week to pass this power quality test. If the flicker severity is less than 1 for less than 95% of the week the IED of the present disclosure has determined that the long-term Flicker severity has failed this power quality test. These values can be programmed into the at least one CPU or DSP processor.

Another feature of the IED of the present disclosure is the envelope type waveform trigger. Based upon the appearance of the waveform, envelope waveform trigger determines if any anomalies exist in the waveform that may distort the waveform signal. This feature is preferably implemented by firmware in at least one CPU 50 or a DSP processor such as by way of non-limiting illustrative example the DSP processor 70. This feature tests voltage samples to detect for capacitance switching events. It permits a trigger to be generated when the scaled and conditioned input voltages are sampled and exceed upper or lower voltage thresholds that dynamically change according to the samples in the previous cycle. If this occurs, the voltages are recorded as exceeding these threshold levels. This feature operates as follows:

An AC voltage signal is a sinusoidal signal. Under normal conditions, a signal sample of this AC voltage signal will repeat itself in the next cycle. Thus by sampling at a time T1 for voltage sample Vt1, and then sampling at time T2 for voltage sample Vt2, where time T2 is 1 cycle after T1, then the absolute value of (Vt2−Vt1) should be less than a certain number, e.g., a threshold or a set parameter in the firmware of the at least one CPU or DSP Processor, during normal conditions. This number is the set threshold voltage.

In other words, a user can define two positive threshold values, Vth1, Vth2, then if the signal satisfies this condition, there will be no trigger on the envelope type waveshape.

$$Vt1-Vth1<Vt2<Vt1+Vth2$$

Otherwise, the envelope type waveform shape trigger will be triggered in the IED of the present disclosure alerting the user that a threshold value has been exceeded.

This feature is implemented by firmware in the at least one processor such as the DSP processor 70 as follows: The DSP Processor has a 256*16=4096 samples circular buffer in its Synchronous Dynamic Random Access Memory (SDRAM) and after collecting 256 new samples, the DSP Processor 70 executes a task. This task will first find what is the current frequency and period, such as 60 Hz, then 1024 samples per cycle, then by looking back 1024 samples from the current 256 samples, find out the corresponding 256 samples in the previous cycle, then comparing each sample, if one of them is not satisfied in Equation 1, then set flag, but the final report is updated with a half cycle finished point, that means clearing the flag at the index of the half cycle finished point.

For example, inside 256 samples, index 70 is the half cycle finish point, the before testing flag (in the circular buffer) is set at zero, and after comparing a sample of 0 to 70, the flag is set to 1, then trigger report is generated for a flag indication of 1, but the flag is cleared back to 0 after completing of the comparison of the 70 samples and before beginning the next comparison of samples 71 to 255.

Other techniques can be used to determine wave shape anomalies. Another preferred embodiment of the IED of the present disclosure would be to collect one cycle's worth of samples by the said analog to digital converters and conduct a Fourier transform on each of said cycles of samples. Using this technique, the user can trigger a waveform recording when any of the harmonic magnitudes or components are above a user defined threshold. The user can also allow the trigger to capture a waveform record if the percentage of total harmonic distortion is above a prescribed threshold. In this preferred embodiment of the IED of the present disclosure, the Fast Fourier Transform (FFT) is utilized. The FFT is an efficient algorithm to compute the discrete Fourier transform (DFT) and its inverse. Let x0, . . . , xN−1 be complex numbers. The DFT is defined by the formula $$X_k = \sum_{n=0}^{N-1} x_n e^{-\frac{2\pi i}{N}nk}$$

k=0, . . . , N−1.

Evaluating these sums directly would take $O(N^2)$ arithmetical operations. An FFT is an algorithm to compute the same result in only O(N log N) operations. In general, such algorithms depend upon the factorization of N, but (contrary to popular misconception) there are O(N log N) FFTs for all N, even prime N.

Many FFT algorithms only depend on the fact that $e^{2\pi i/N}$ is a primitive root of unity, and thus can be applied to analogous transforms over any finite field, such as number-theoretic transforms.

Since the inverse DFT is the same as the DFT, but with the opposite sign in the exponent and a 1/N factor, any FFT algorithm can easily be adapted for it as well.

In the power measurements for the IED of the present disclosure, xn represents data samples, n is the index number represents different sampling points, increase with time passed by. Xk represents the Kth order harmonics components in the frequency domain. N represents how many samples used to do the DFT calculation.

The technique to use harmonics distortion to determine wave-shape trigger is explained as follows: The CPU 50 or at least one DSP Processor 70 collects 128 points of samples in each cycle of interested voltage input, they are x0, x1, x2, . . . , x126, x127. do N=128 points FFT on them, finally it will output 64 points complex number Y0, Y1, . . . Y63, (after combined the negative frequency part with positive frequency part from X0, X1, . . . X127), Y0 represents DC component, Y1 represents fundamental, Y2, Y3, . . . , Yk, . . . , Y62, Y63 represents kth order harmonic components.

$$Y_k=r_k(\cos\phi_k+i\sin\phi_k)\ k=0, 1, \ldots, 63$$

Then the firmware in the CPU 50 or at least DSP Processor 70 does this computation $$A = r_1$$

$$B = \sqrt{\sum_{n=2}^{63} r_n^2}$$

And this one $$P = \frac{B}{A} = \frac{\sqrt{\sum_{n=2}^{63} r_n^2}}{r_1}$$

Where P is the percentage of total harmonic distortion.

When the percentage of total harmonic distortion is above a prescribed threshold, the IED of the present disclosure flags the wave-shape trigger.

An additional embodiment would be to collect one cycle worth of samples by the said analog to digital converters and conduct an extrapolation from the previous two samples to the currently analyzed sample. Thus, each sample would be stored in the said RAM. The processor would then start from the end of the cycle and analyzing the best sample first and working backwards until each sample is analyzed. The analysis includes plotting the slope of the two previous sample's magnitude and interpolating what the next sample's magnitude based on assuming a sine wave. If the sample falls outside the user programmable boundaries, then the waveform would be recorded or flag the wave shape trigger.

An illustrative, non-limiting example in the IED of the present disclosure employing the use of linear interpolation is using two previous sample, xi-2, xi-1 to calculate an expectation number, yi=2*xi-1−xi-2;

The difference between yi, the expectation number, and the current sample xi, will be di=yi−xi.

Note these are operative examples of methods that can be used to determine whether the waveform appearance is in correct.

Another feature of the IED of the present disclosure is the rate of change feature. This feature tests the current RMS values of the scaled and conditioned current inputs. Again, this feature is implemented by firmware within at least one DSP Processor or the CPU of the IED and by way of non-limiting illustrative example the processor can be the DSP Processor 70 that triggers on a rate of change, which is defined as the ratio of the present RMS value and the previous RMS value. If the rate of change is above the threshold, then it triggers alerting the user that the rate of change has been exceeded.

For example, at time point T1, current Ia RMS value is updated as ia1, at T2, which is half cycle after T1, current Ia RMS value is updated with a new value ia2, the change of rate is defined as $$Cia=ia2/ia1;$$

If Cia is larger than threshold Cia, this event will be triggered.

Section VI—Circuit Protection Function

The IED of the present disclosure also includes the ability to operate as a circuit protection device. This feature utilizes the CPU 50 or at least one DSP Processor 70 to run the embedded software allowing the IED, in addition to measuring revenue energy readings and calculating power quality as discussed above, to trigger internal relay outputs (with the at least one CPU 50 or DSP 70 (see FIG. 1A) when an alarm condition exists on the power system requiring a circuit breaker to trip and remove current flow from the circuit. Using internal relays outputs, one or more outputs are connected to a trip coil of a protective circuit breaker that is placed in line with the flowing current. This trip coil then triggers the circuit breaker mechanism to open the power system circuit thus shutting off the flow of current through the power system and thus protecting the power system from faults, short circuits, unstable voltage, reverse power, or other such dangerous, destructive or undesirable conditions.

The IED calculates protective conditions by using, but not limited to, samples generated by the waveform portion of said IED 16 (see FIGS. 1B and 1C). In the at least one CPU 50 or Processor 70, embedded software is written to collect the waveform samples, filter said samples obtaining fundamental values (if user desired), conduct an RMS or obtain a value if fundamental only on a user defined value of samples, typically one cycle or one half of one cycle of waveform records. The said RMS or fundamental values include but are not limited to Voltage, Current, Frequency and directional Power. The said embedded software also to compares the magnitude value to a known chart or table which is user defined signifying magnitude and duration of an alarm condition. Often these charts or tables are based on curves which vary in time duration as the magnitude increases as to whether an event is harmful to a circuit. These types of trigger events are contemplated by this disclosure. Once the user defined value exceeded said for the user defined time period, the at least one CPU or Processor will activate an on-board dry contact relay by energizing an I/O pin of said CPU or Processor which is operatively connected to the on-board relay. The relay, by non-limiting example, is a 9 amp, latching mechanical nature relay which is mounted to the IED PC board and connected or coupled to a trip coil of a circuit breaker. When energized, this trip coil interrupts the primary current flow of the circuit being monitored. When the relay is activated by the said CPU or processor in said IED, it will cause the circuit breaker trip coil to trigger the circuit breaker to open and protect the circuit from any harmful current or voltage flowing through the line. The purpose and benefit of this feature is that a user will be able to use said IED for circuit interruption benefits as well as monitoring and metering applications.

To protect a circuit, it is desirable to apply and set the IED to provide maximum sensitivity to faults and undesirable conditions, but to avoid their operation on all permissible or tolerable conditions. Both failure to operate and incorrect operation, can result in major system upsets involving increased equipment damage, increased personnel hazards, and possible long interruption of service. These stringent requirements with high potential consequences tend to result in conservative efforts toward protection.

The instantaneous overcurrent alarm will always have a "tap" or "pickup" setting. These terms are interchangeable. The tap value is the amount of current it takes to get the unit to just barely operate. The instantaneous element is intended to operate with no intentional time delay, although there will be some small delay to make sure the element is secure against false operation. Some applications require a short definite time delay after the element is picked up, before the output relay is operated. The operation of the element is still instantaneous but a definite time is added creating a conflict in terminology; instantaneous with definite time delay.

Time overcurrent alarm closely resembles fuse characteristics; at some level of sustained current the fuse will eventually melt. However, the higher the current above minimum melt, the faster the fuse will melt.

As the IED of the present disclosure may be typically used in a distribution application, speed would be slightly less important than if it were used in transmission where system stability issues require faster fault clearing times. Customers will always request that they want the device to be as fast as possible, but never want to be asked to explain an unwanted operation because the relay made a “trip” decision based on just one or two data samples. Thus, the programmable trip time will be based on programmable settings configured by a user or by the firmware engineer dependent on the desired sensitivity required of the IED for the specific application.

The IED utilizing CPU 50 or DSP 70 will sample said voltage and current signals using said analog to digital converters and filter said samples to create fundamental values of current and voltage signals. Said fundamental value filtering can be determined using a wide variety of digital processing techniques including fourier transforms, digital filters etc. It is also contemplated that such filtering can be conducted using analog filtering techniques. Harmonics often give the relay false information and are seldom needed, and thus filtered out when utilized to protect circuits.

Many of the trip conditions are intended to operate with no intentional time delay, such as instantaneous overcurrent. The IED will support instantaneous trip condition by comparing RMS values generated by the CPU 50 or DSP 70. Fast operation is desirable but should not come at the expense of security. The decision that a trip condition is above pickup setting should not be made on one or two samples being above pickup.

A second technique used with instantaneous trip conditions acknowledges that when the sampled value is several times pickup setting there is more confidence that the current is real and one can trip with less sampling. This results in faster trip times at higher current values. Thus, the IED will analyze the waveform samples using the embedded firmware in one of said CPU 50 or DSP 70 to determine if the said condition exists and thus generate a trip signal.

Instantaneous Overcurrent is required operate within 1.5 cycles at 5 times pickup. The IED will achieve this result by subtracting the operating time of the output relay (probably 4-8 ms) One still has in excess of 1 cycle to make a decision on pickup, which should allow for a secure sampling method.

The IED will be capable of also tripping the said relay for time overcurrent which always includes a time delay, by definition. Time to trip becomes shorter as the current increases above pickup, therefore the timing is to be integrated over time to allow for changes in current after the relay begins timing.

The IED will also utilize trip conditions for voltage and power which are often specified to operate within 5 cycles, which allows an even more secure sampling technique.

Figure 6A:
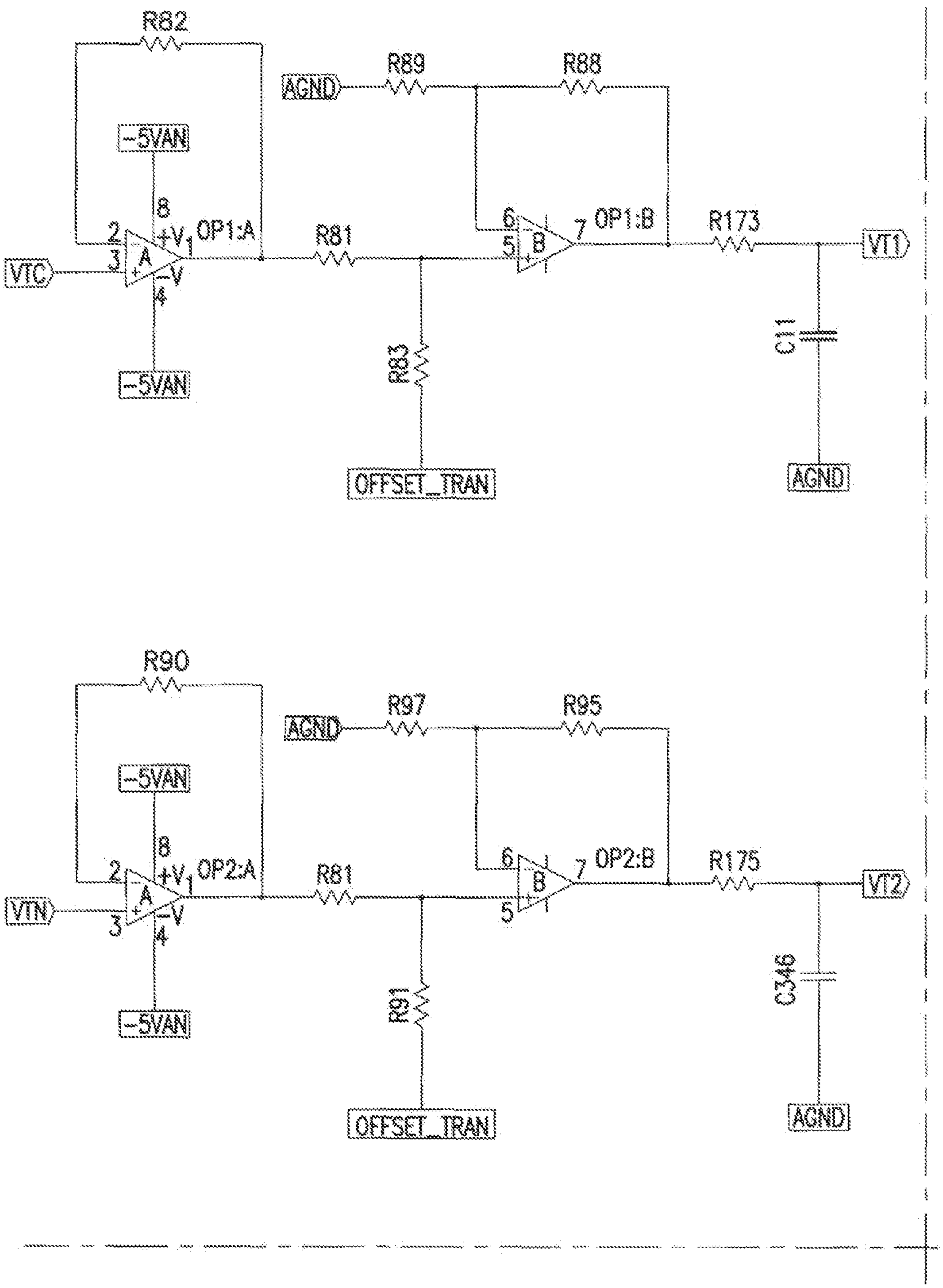
FIGS. 6A-6B is a schematic diagram showing some of the transient input signals buffered for conditioning and scaling before input to A/D converters.

Referring to FIGS. 6A-*through* 30G which show the schematics of the Intelligent Electronic Device of the present disclosure which is described as follows:

The digital board of the IED of the present disclosure is described with reference to FIG. 6A through FIG. 17G.

Figure 6B:
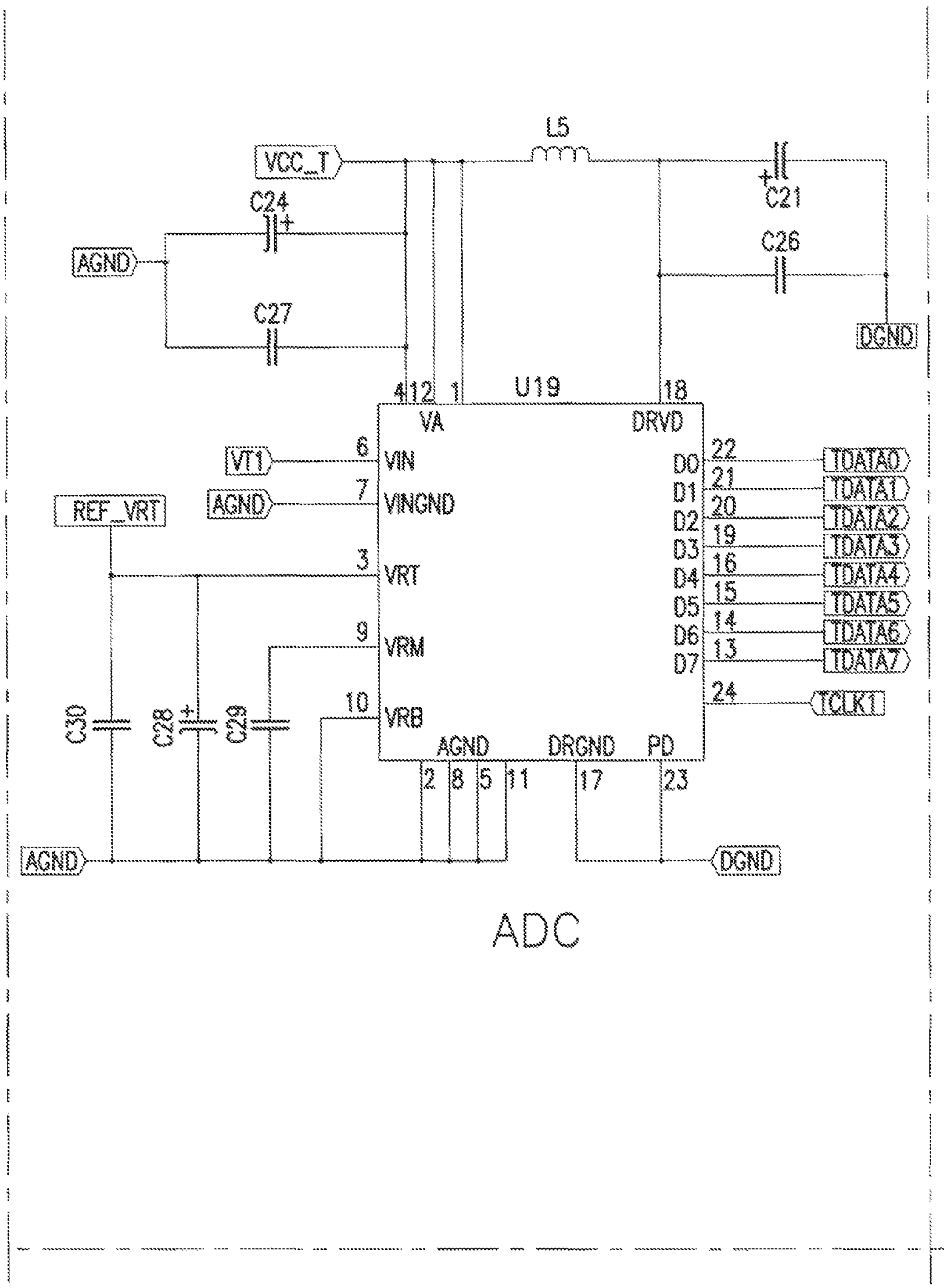

FIGS. 6A-6B shows a high-speed A/D converter (ADC), which converts voltage transients from one of the voltage input channels at a rate of 50 MHz. Also shown are multiple voltage input channels, e.g., VTC, VTN, buffered for conditioning and scaling by high-speed op amps used to process the transient voltages, which are converted by a high-speed analog to digital (A/D) converter (ADC), also shown.

Figure 6C:
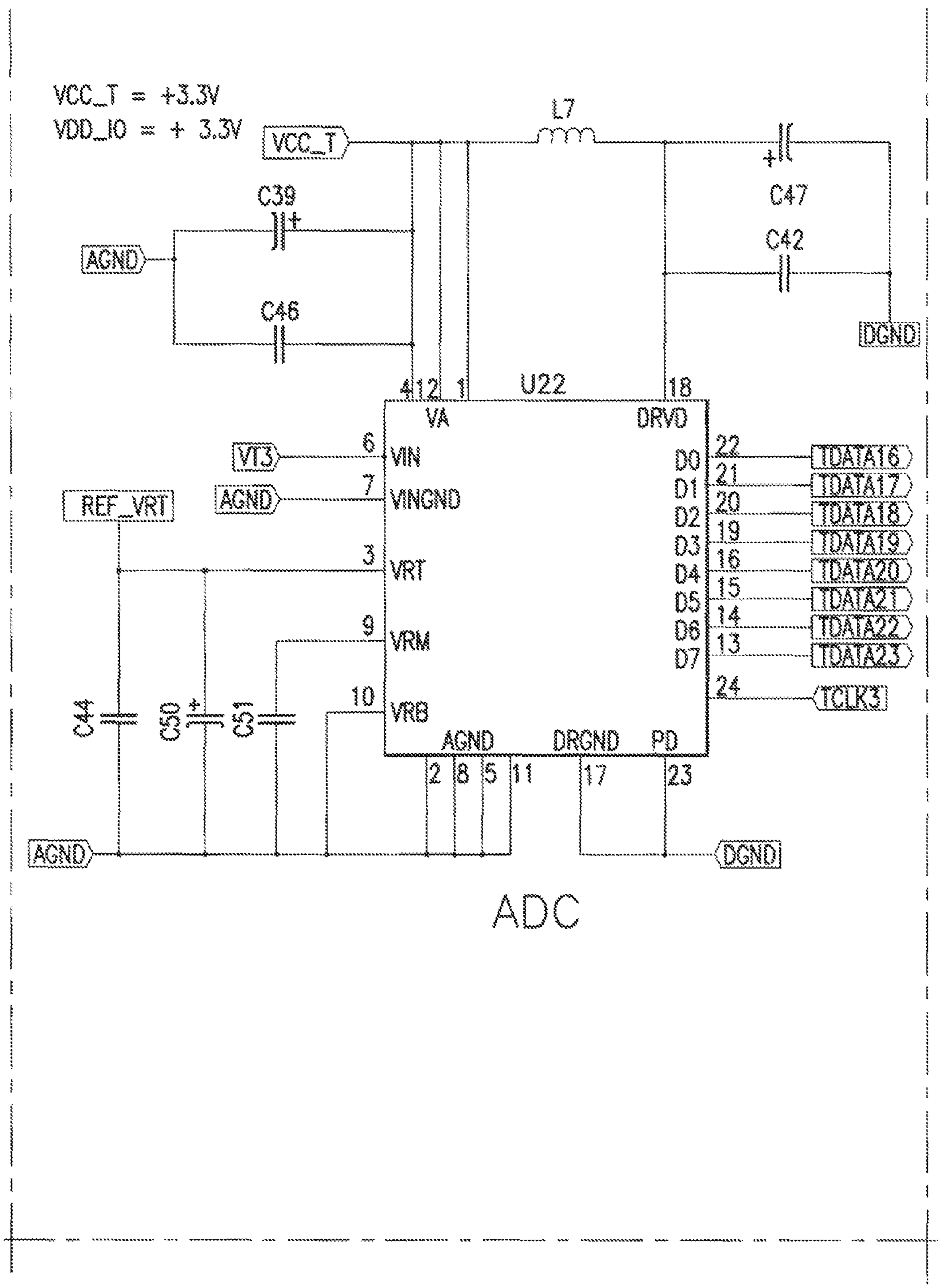
FIGS. 6C-6D is a schematic diagram showing additional transient input signals buffered for conditioning and scaling before input to transient A/D converters and shows the clock buffer for the transient A/D converters.
Figure 6D:
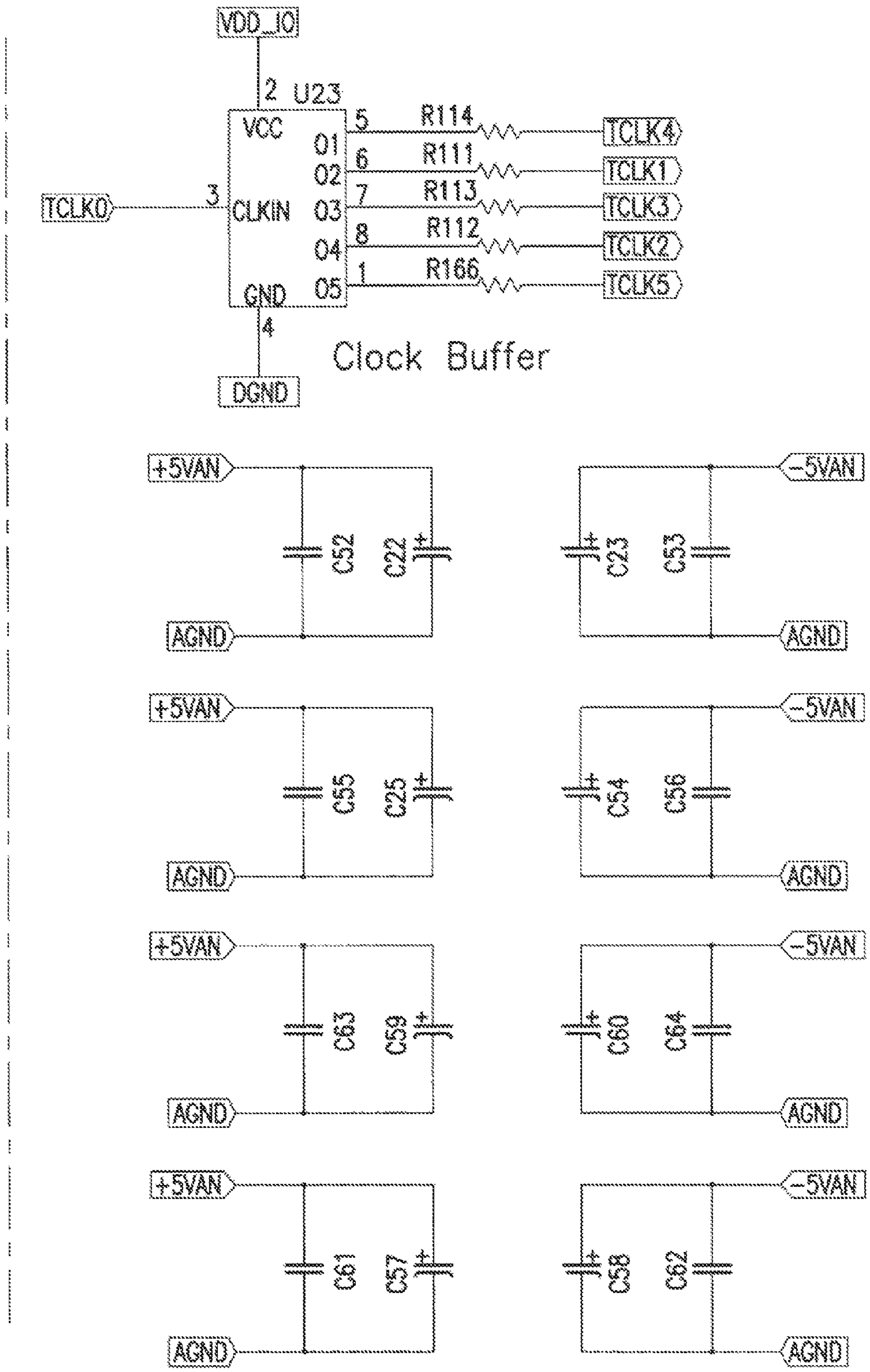

FIGS. 6C-6D shows an additional high-speed A/D converter (ADC), which converts voltage transients from one of the voltage input channels at a rate of 50 MHz. It also shows the clock buffer used to maintain integrity of the high-speed clock used for the transient A/D converters, and additionally used to provide optimum routing of the clock signals to all of the transient A/D converters.

Figure 6E:
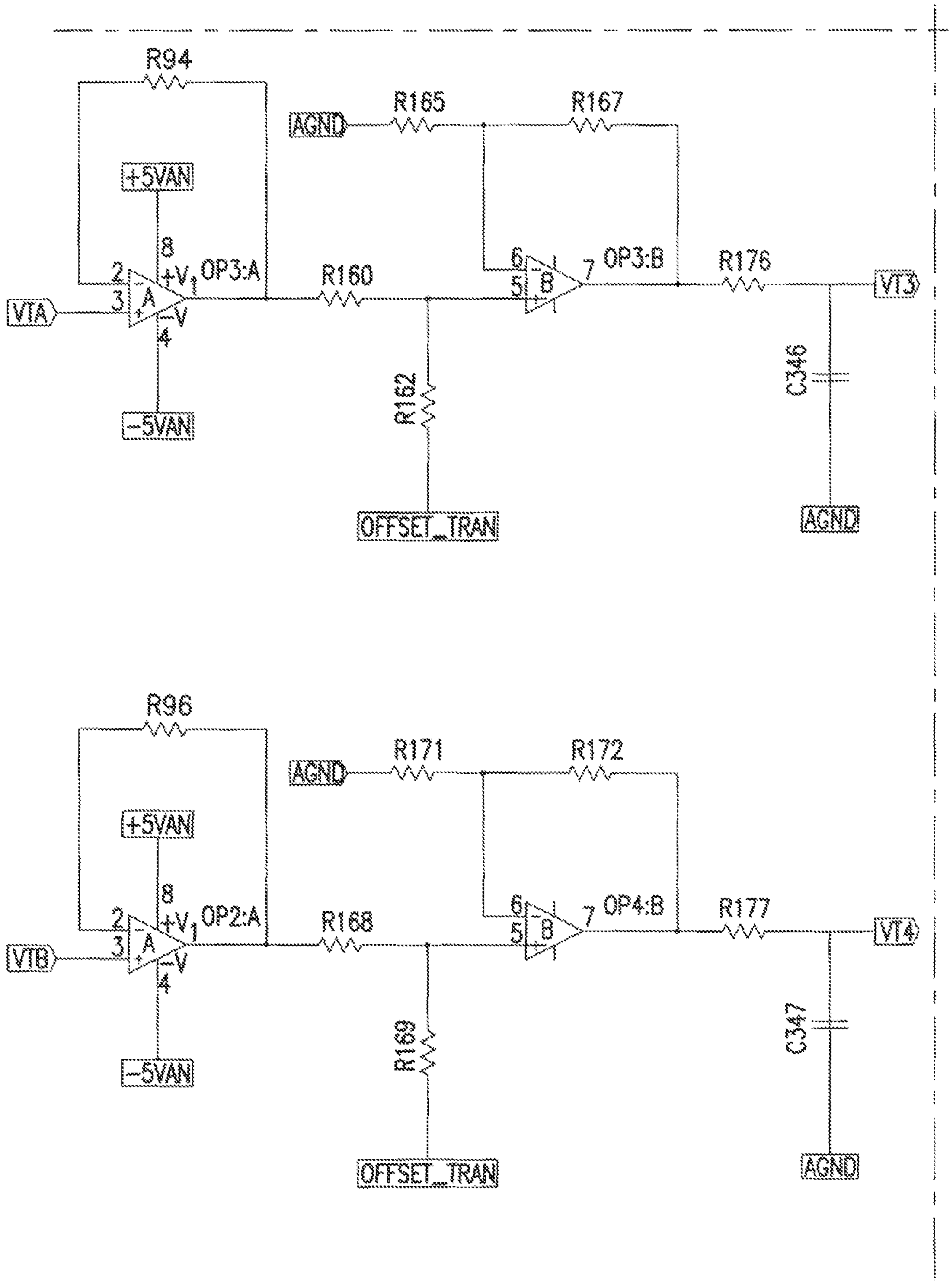
FIGS. 6E-6F is a schematic diagram showing some of the transient input signals buffered for conditioning and scaling before input to A/D converters.
Figure 6F:
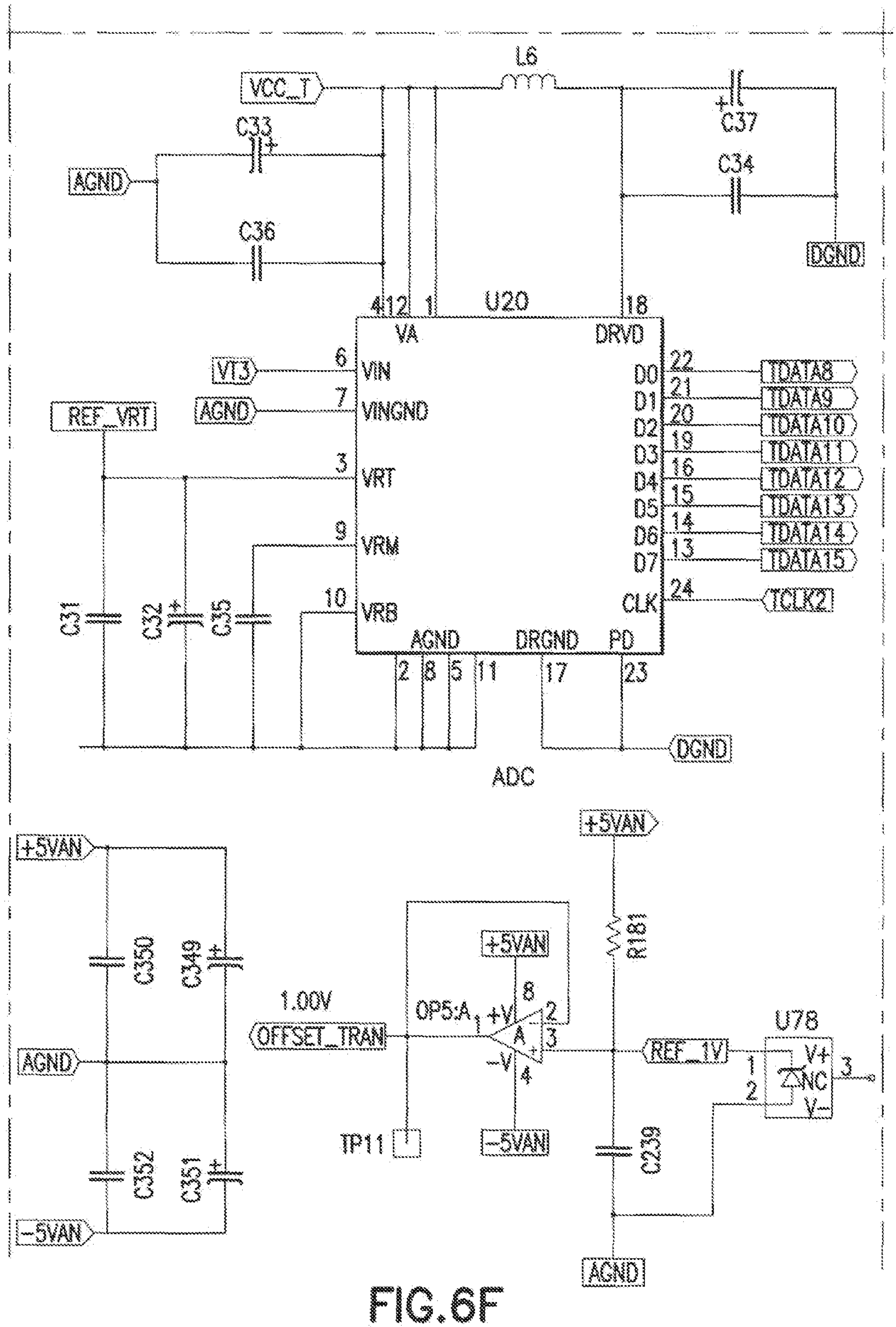
Figures 6, 6G:
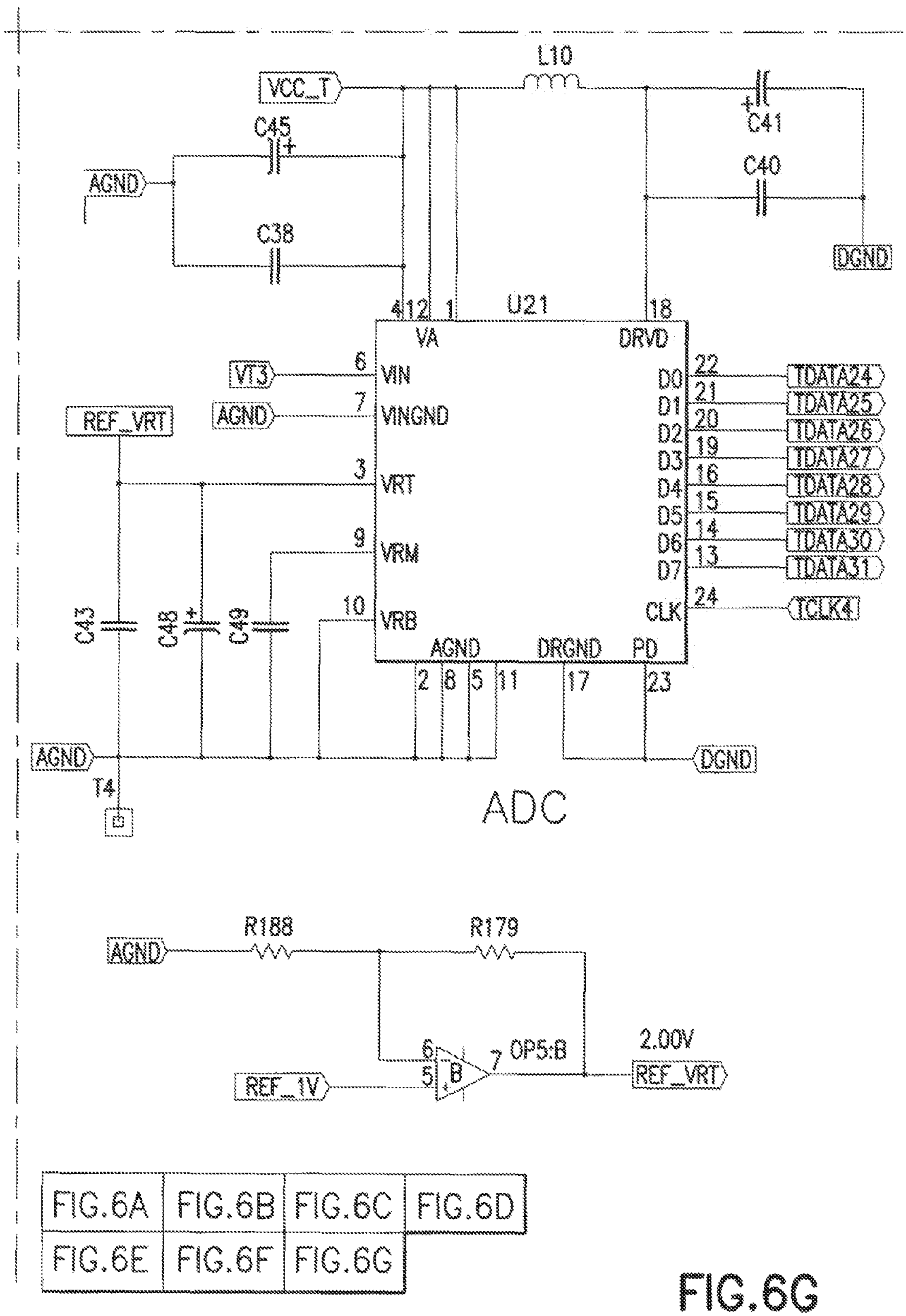
FIG. 6G is a schematic diagram showing more transient input signals buffered for conditioning and scaling before input to A/D converters and shows decoupling capacitors and has a reference voltage for the transient A/D converters and a reference voltage used for offsetting the transient signal properly before going to the transient A/D converters.

FIG. 6G shows an additional A/D converter (ADC), which converts voltage transients from one of the voltage input channels at a rate of 50 MHz; and voltage decoupling capacitors used to reduce noise. It also shows a reference voltage used to properly bias all of the A/D converters, and a portion of the reference voltage circuitry used for correctly offsetting the transient signal prior to A/D conversion.

FIGS. 6E-6F shows multiple voltage input channels, e.g., VTA, VTB, buffered for conditioning and scaling by high-speed op amps used to process the transient voltages, which are converted by a high-speed A/D converter (ADC). Also shown is an offset used to properly offset the transient op amps circuitry so that the input voltage signal matches the A/D converter input voltage range.

Figure 7A:
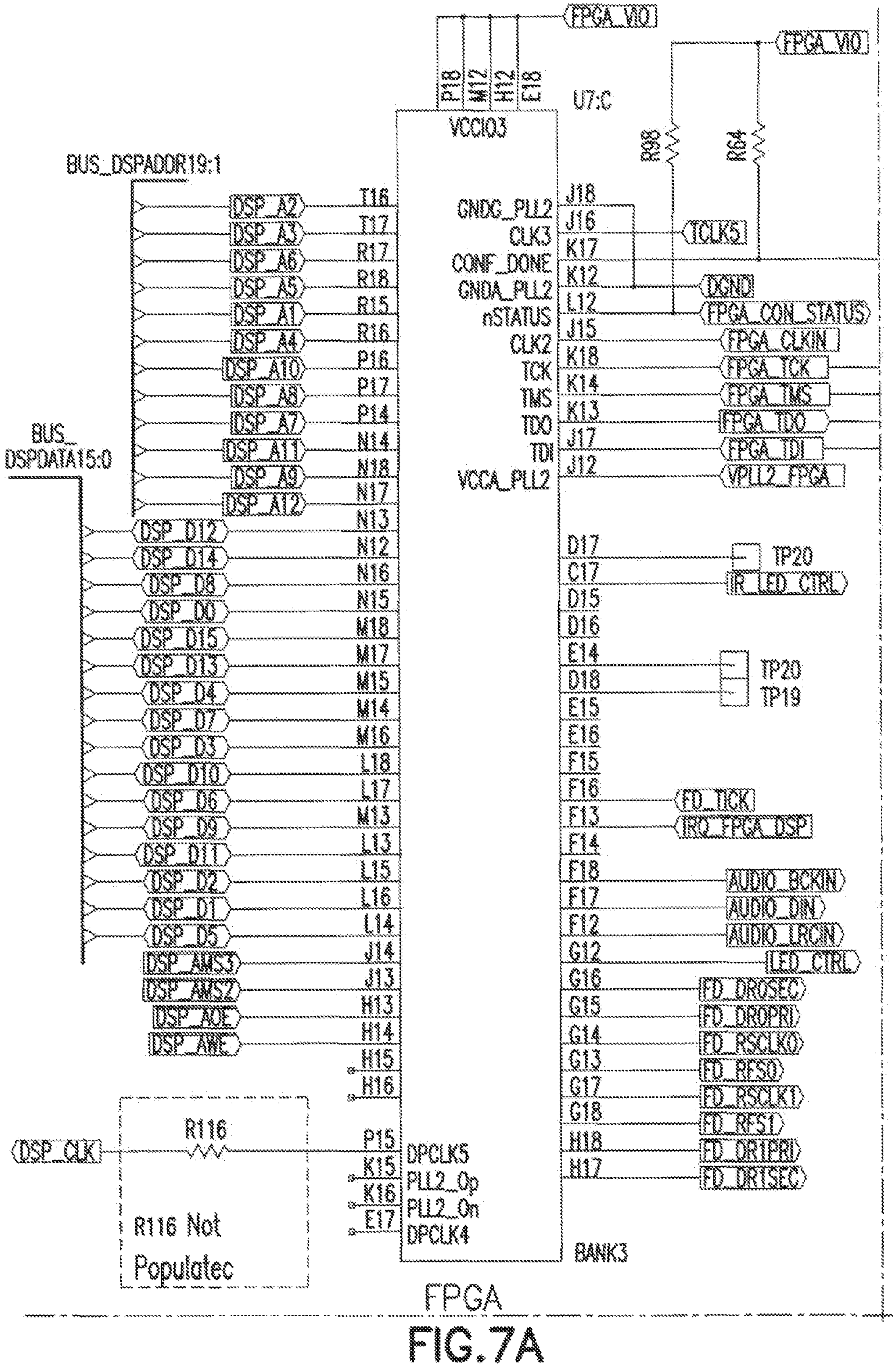
FIGS. 7A-7B is a schematic diagram showing a section of the Programmable Logic Device and the header used to program the FPGA and is a schematic diagram showing the waveform capture sampling oscillator.
Figure 7B:
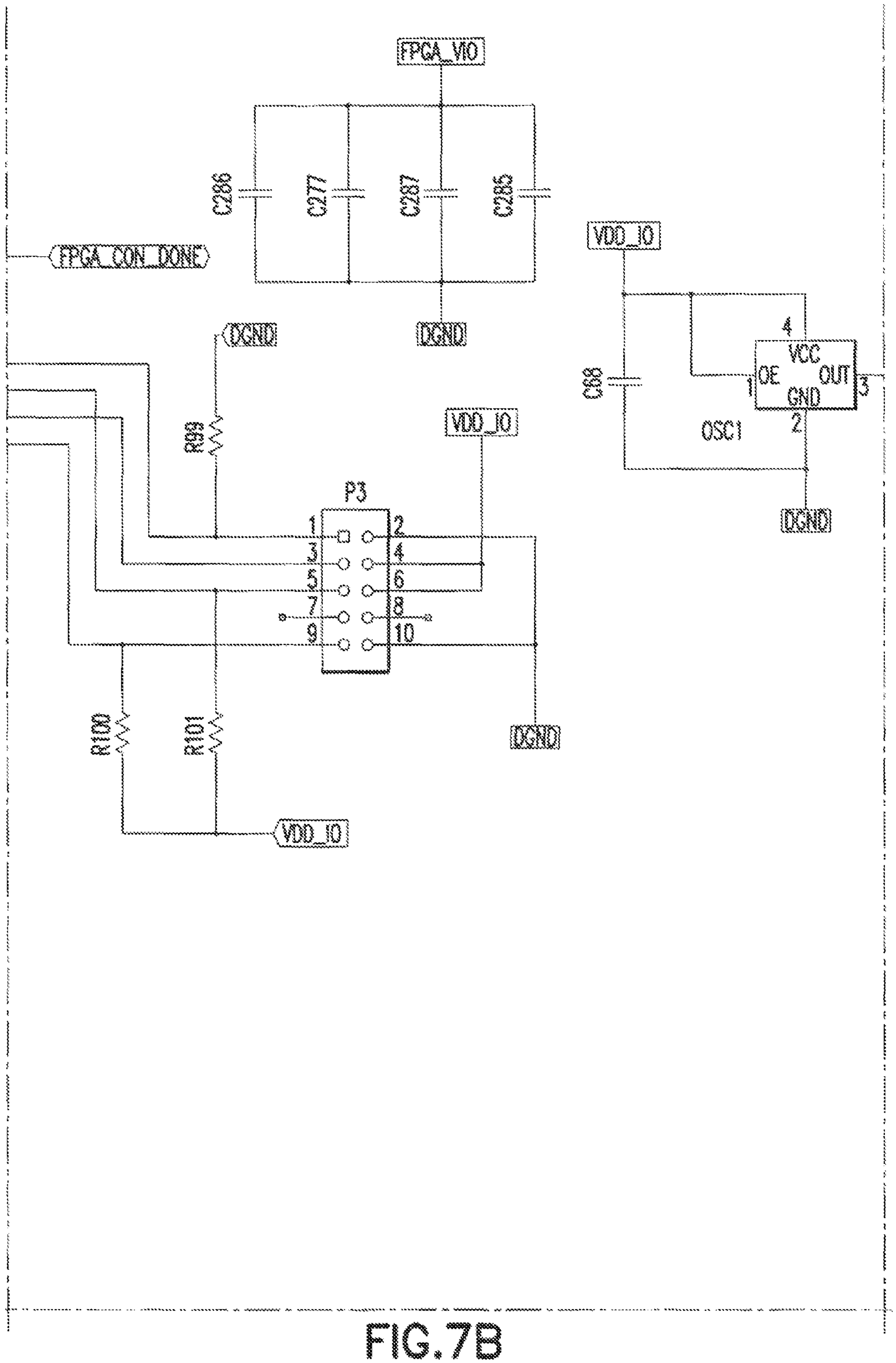

FIGS. 7A-7B shows a section of the Field Programmable Gate Array (FPGA) 80, with the interface used to program FPGA 80 from a host processor, such as CPU 50. This interface allows the CPU 50 to update and add new functionality, such as new algorithms and processing capabilities to the IED via reconfiguration of FPGA 80. This new processing capability allows FPGA 80 to assume new processing tasks, in addition to its originally intended functionality. Reconfiguration of FPGA 80 can also be used for load balancing by routing data to available processor resources, and also allows re-allocation of memory resources associated with each external processor, and FPGA's 80 internal processing requirements. Reconfiguration of FPGA 80 also allows us to configure each of the memory blocks allocated as one of the following types: RAM memory, ROM memory, First-in-First-Out memory, or Dual Port memory. Also shown is an external header that provides an external method to program FPGA 80. Also shown is the waveform capture sampling oscillator, from which is derived the sampling clock for all waveform capture for power quality analysis, including harmonics, magnitude, flicker, and voltage sags and swells. Also shown is the DSP interface to FPGA 80, giving access to the dual port memory to facilitate communications between processing elements. Also shown is the FPGA 80 transient data output to DSP 70 via a high-speed serial channel interface; and waveform data output to DSP 70 via a second high-speed channel interface. This waveform data is comprised of voltage and current input samples used for power quality analysis. The A/D conversion of both the transient and waveform samples is under the control of FPGA 80, which reads the results from the transient and waveform ADCs and converts them into separate serial data streams. FPGA 80 also time synchronizes the transient and waveform data serial streams so that they are time-correlated. The synchronization mechanism is the waveform-sampling clock already mentioned. In addition FPGA 80 incorporates a frame counter, which embeds a frame count into each data block of the data serial streams. The frame-counter is incremented for each block of data, so that when the serial data is received by DSP 70 it can test the integrity of the data transfer by verifying that it is receiving sequential frame counts. If the integrity is compromised, DSP 70 will force a re-synchronization of the serial data streams. Also shown are the FPGA 80 outputs for audio generation; and the decoded LED signal that is used to control the front panel LEDs and the control for the polarity of the Infrared circuitry, both of which are decoded by FPGA 80.

Figure 7C:
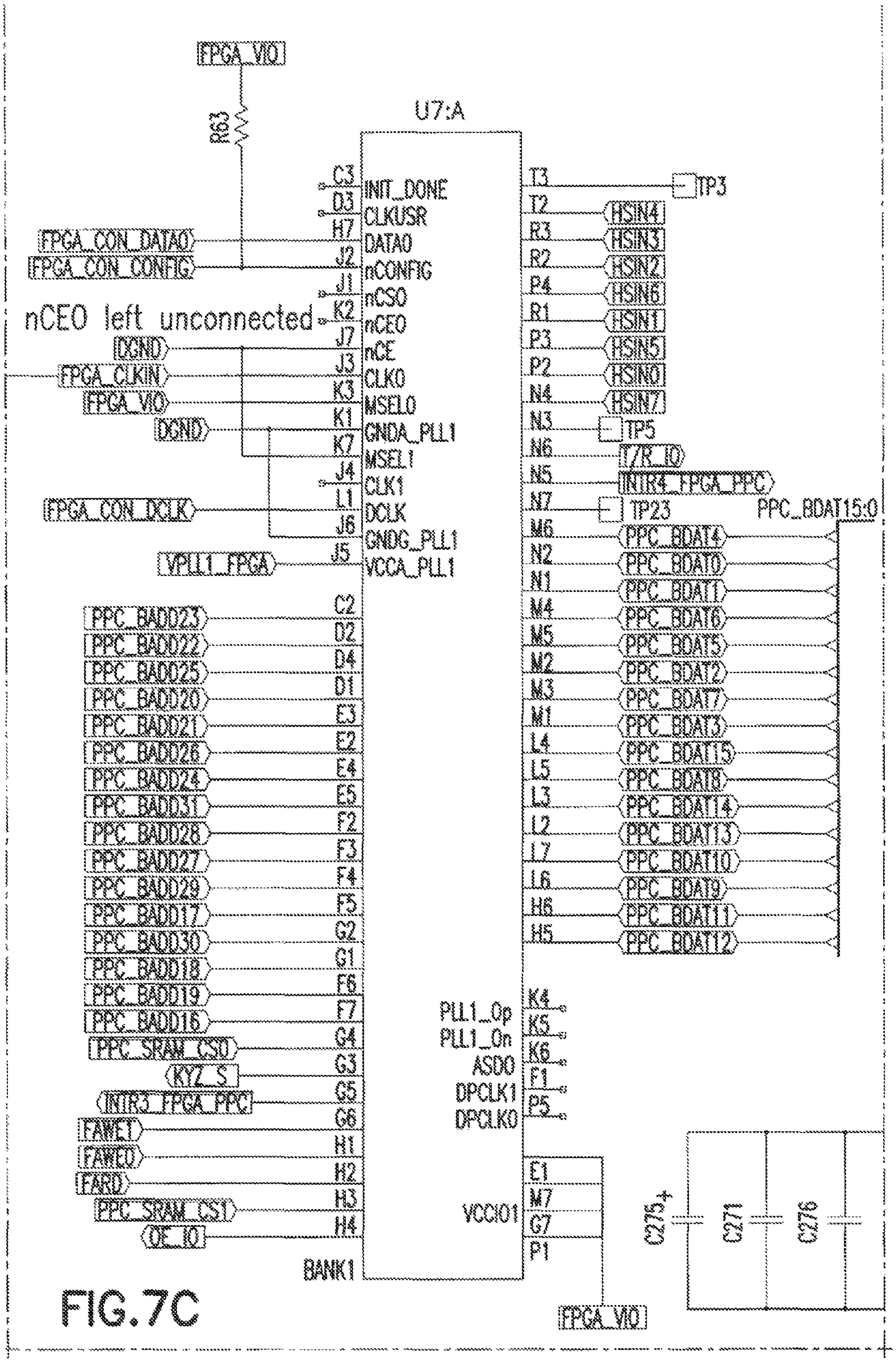
FIGS. 7C-7D is a schematic diagram showing I/O signals to the FPGA and voltage inputs to the FPGA and the majority of the signals between the CPU and the FPGA.
Figure 7D:
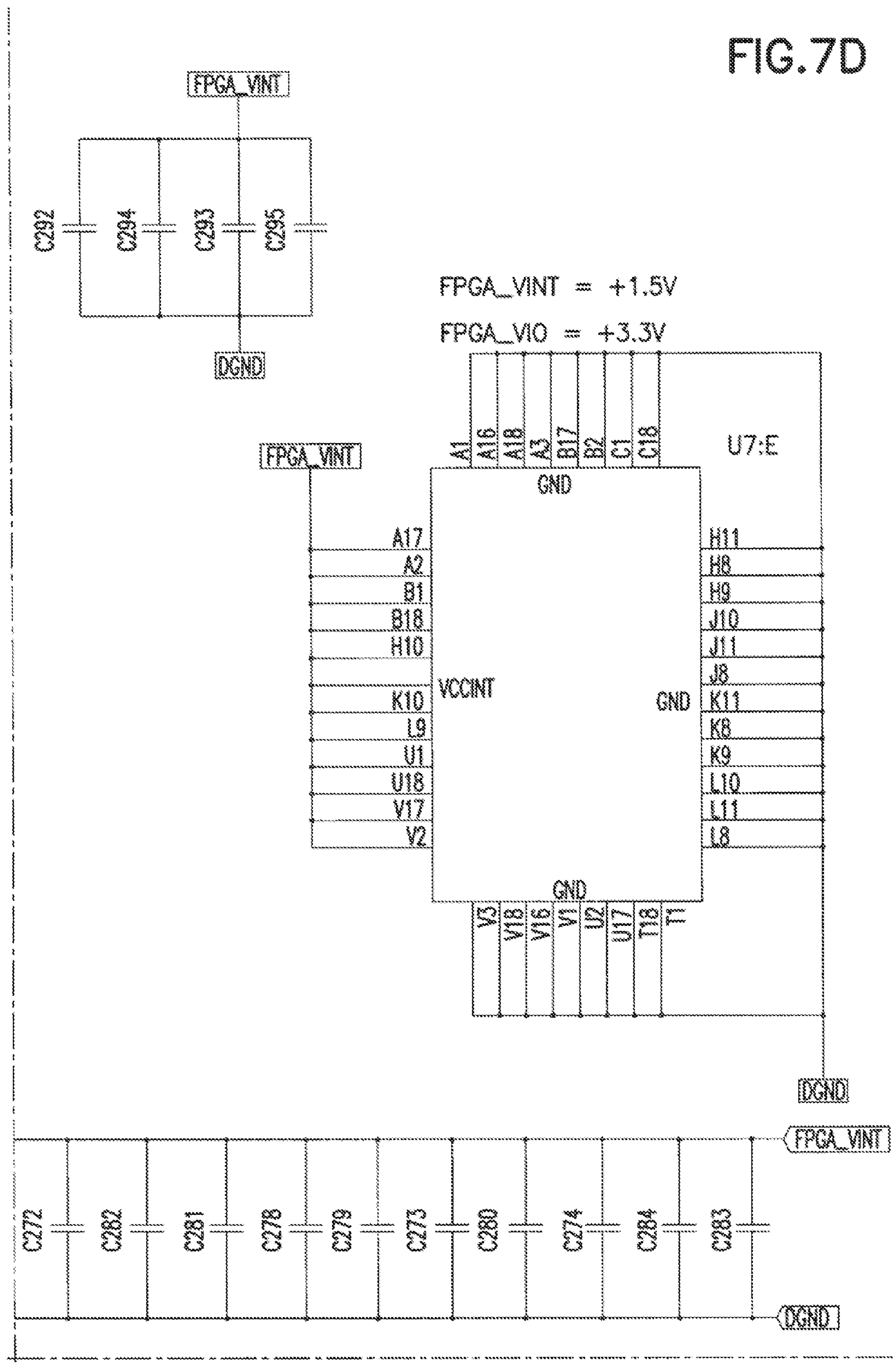

FIGS. 7C-7D shows the FPGA 80 to CPU 50 interface, including the address and data lines. This interface gives CPU 50 access to the dual port memory to facilitate communications between processing elements. CPU 50 communicates with DSP 70 and DSP 60 via the dual port memory. Also shown are the High-Speed Digital Inputs to FPGA 80, the voltage decoupling capacitors used to reduce noise, and a voltage regulator used to supply power to FPGA 80.

Figure 7E:
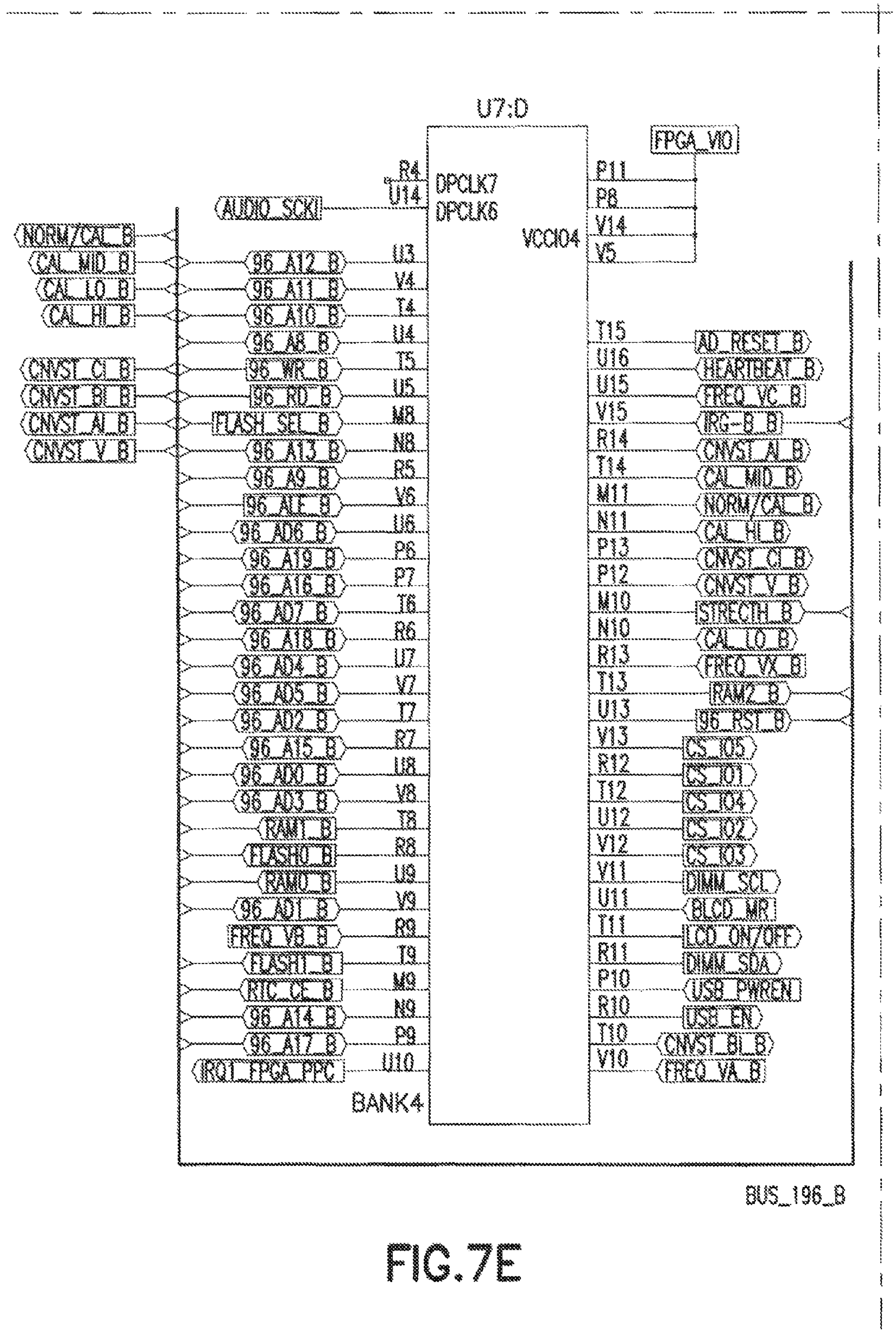
FIG. 7E-7F is a schematic diagram showing the DSP Processor 60 interfaces to the FPGA and also the control signals to the analog board and control lines for all I/O cards.
Figure 7F:
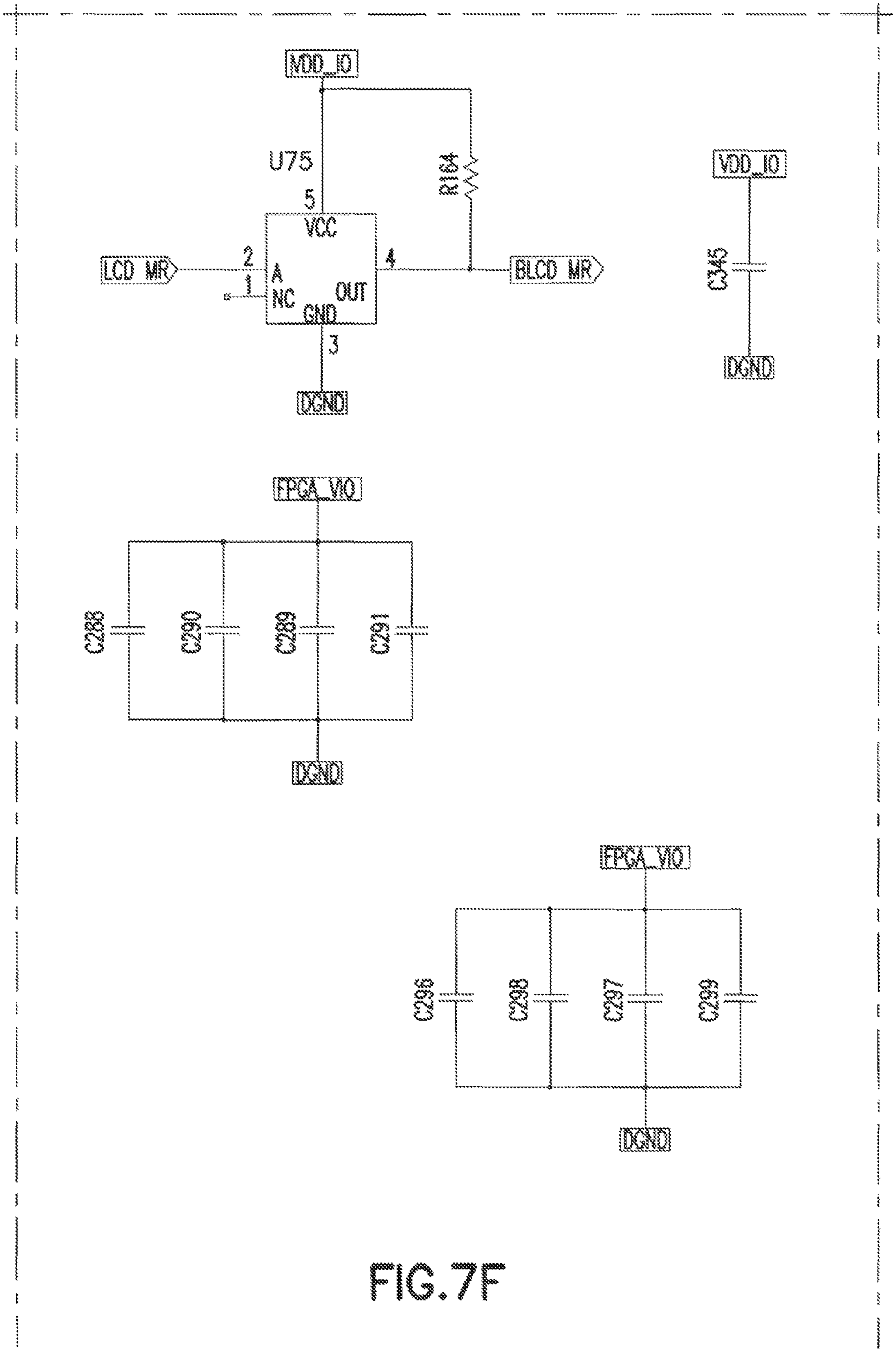
Figure 7G:
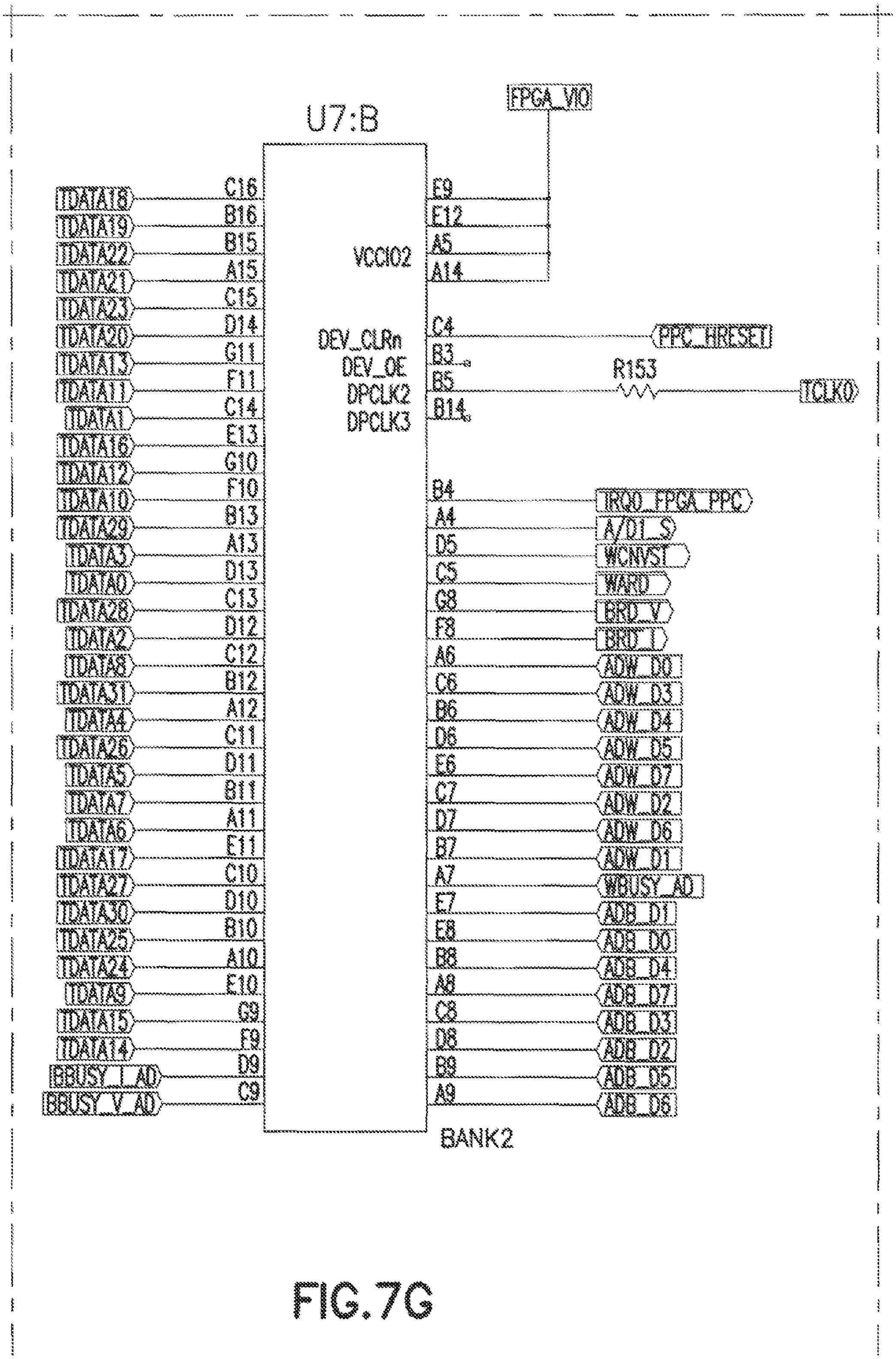
FIGS. 7G-7H is a schematic diagram showing the majority of the signals between the transient capture A/D converters and the FPGA and the waveform capture data and the FPGA and the revenue measurement data and the FPGA.
Figures 7, 7H:
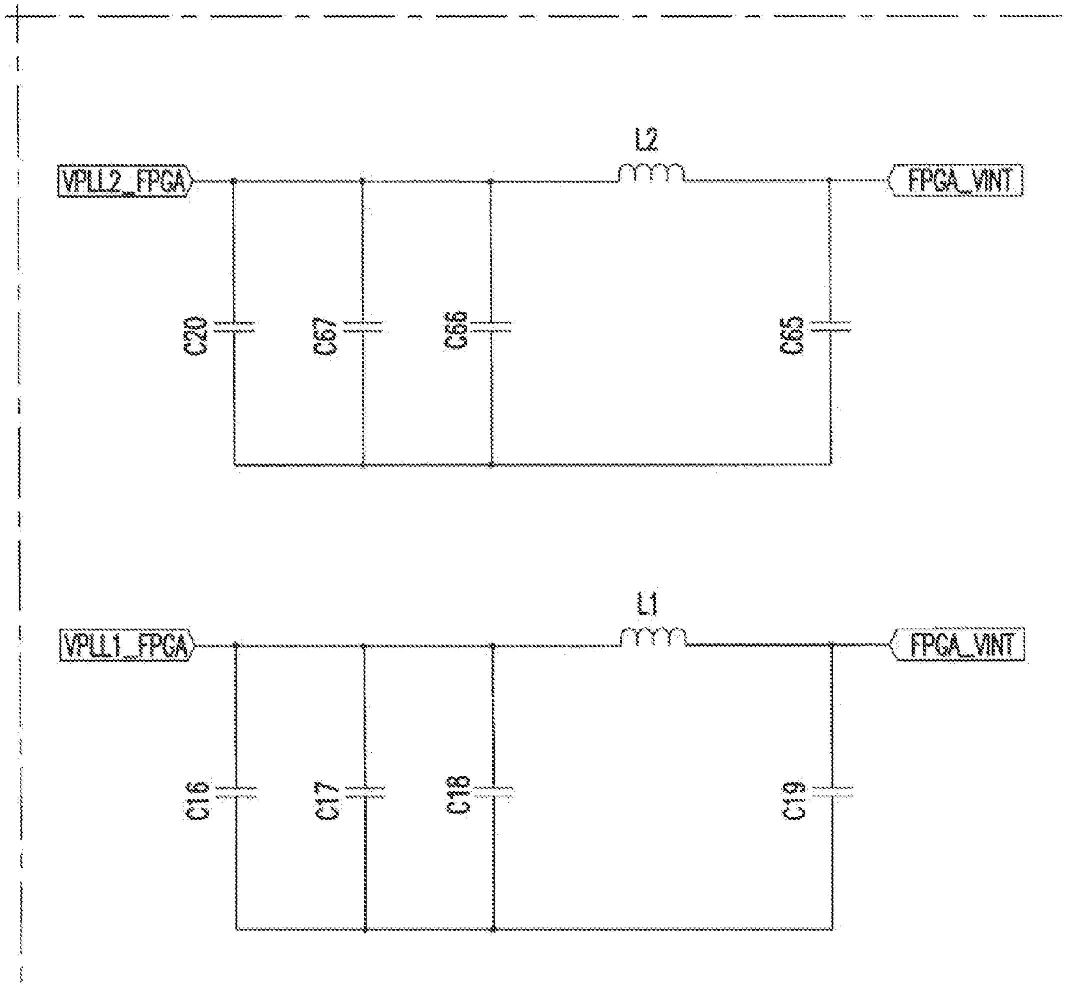

FIG. 7G-7H shows the signals between the transient capture A/D converters and FPGA 80, the waveform capture data and FPGA 80, and the revenue measurement data and FPGA 80, received from the AC voltage and current input channels. For each channel, FPGA 80 receives the transient samples and then performs algorithms to detect the largest transient value that occurred during each waveform sample interval. The identified largest transient value during each waveform sample interval, together with the waveform data, is passed to DSP 70. The voltage and current are converted under the control of FPGA 80, and then all the converted voltage and current inputs are received by FPGA 80, with the exception of the revenue A/D start conversion, which is controlled by DSP 60. FPGA 80 then routs the data to the appropriate processing element. In the case of the transients and the waveform data the data is transferred to DSP 70 via the high-speed serial channels; the revenue data is passed to DSP 60 via its host bus. Some of the additional status and control signals used to control A/D conversion are also shown, as well as the voltage decoupling capacitors used to reduce noise.

FIGS. 7E-7F shows the DSP 60 interface to FPGA 80, giving access to the dual port memory to facilitate communications between processing elements. Also shown are the control signals to the analog board and control lines for all I/O cards. The I/O control lines, along with a general-purpose I/O data and address bus, connect to internal expansion card slots. The general purpose I/O data and address bus is the buffered host bus from CPU 50. The general purpose I/O data and address bus supports the expansion of functionality inside the IED by allowing the insertion of additional hardware that can be controlled by CPU 50. In addition to the I/O bus, each card slot has dedicated I/O for specific functions, such as serial communication via Modbus RTU and network communication via Ethernet TCP/IP. The I/O bus allows redefinition of the functionality of each of the expansion card slots, by making a general-purpose bus interface available. For example, if additional A/D channels are required for an application, they can be easily implemented by conforming to the general-purpose bus' logic and timing. In addition, cards which conform to the general-purpose bus' logic and timing can be used in any slot, which provides the general-purpose bus interface. Such cards can be identified by use of the I2C bus provided for each of the I/O card slots for communications and identification of the card's functions and characteristics.

Figure 8A:
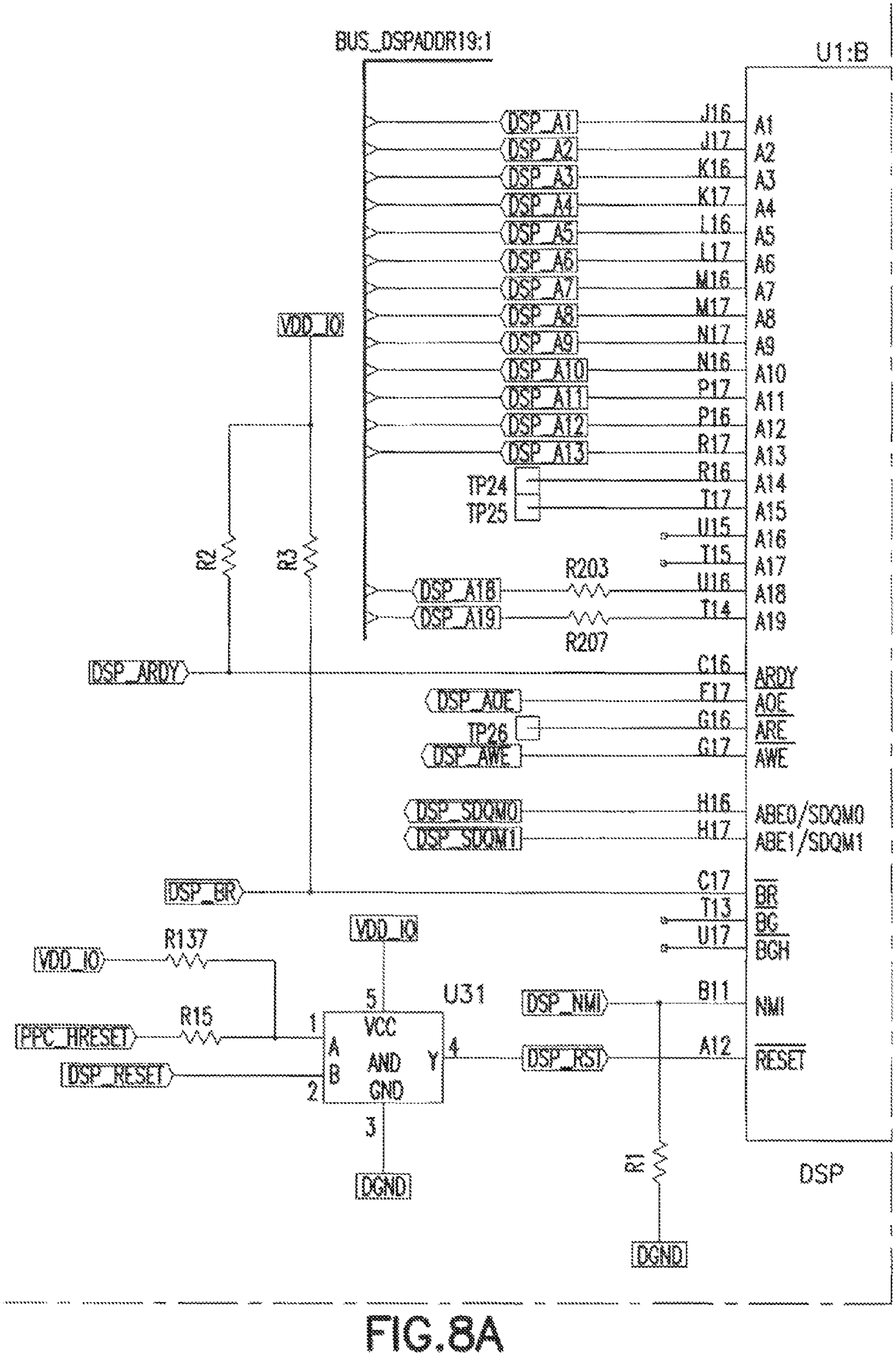
FIGS. 8A-8B is a schematic diagram showing a section of the DSP Processor 70.
Figure 8B:
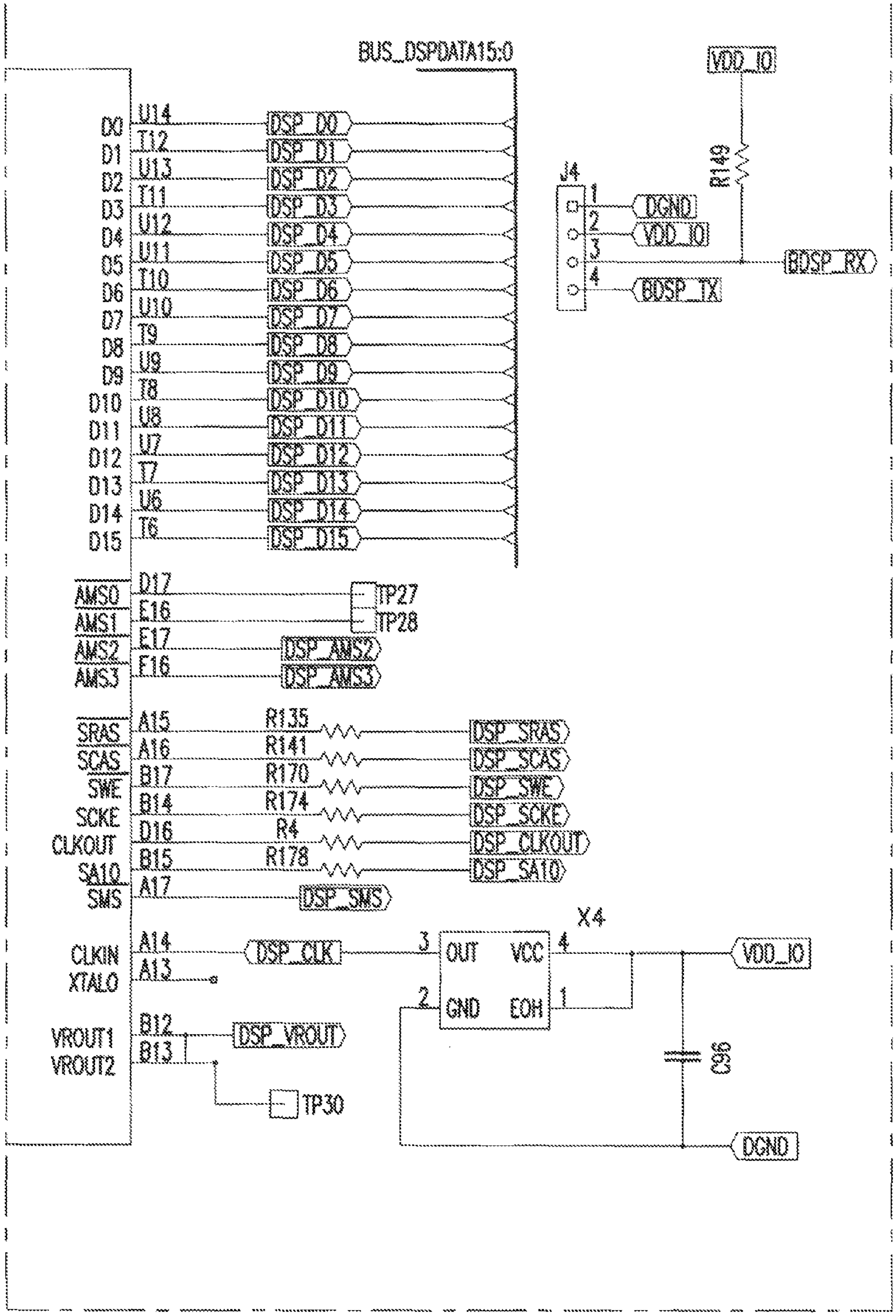

FIGS. 8A-8B shows a section of DSP 70, including the data bus and control signals, the DSP 70 crystal oscillator, and the DSP 70 Reset signal from CPU 50. DSP 70 replaces waveform sample data with transient peak data if there is a transient and transient capture is enabled in the IED. DSP 70 processing includes final processing of the transient data received from FPGA 80 (which finds the peak transient and its duration over a waveform sample interval): DSP 70 finds the peak and duration over a cycle. DSP 70 also determines overall power quality and measures the harmonic magnitude of the individual harmonics of the voltage and current input channels. DSP 70 also measures voltage fluctuations as well as voltage flicker.

Figure 8C:
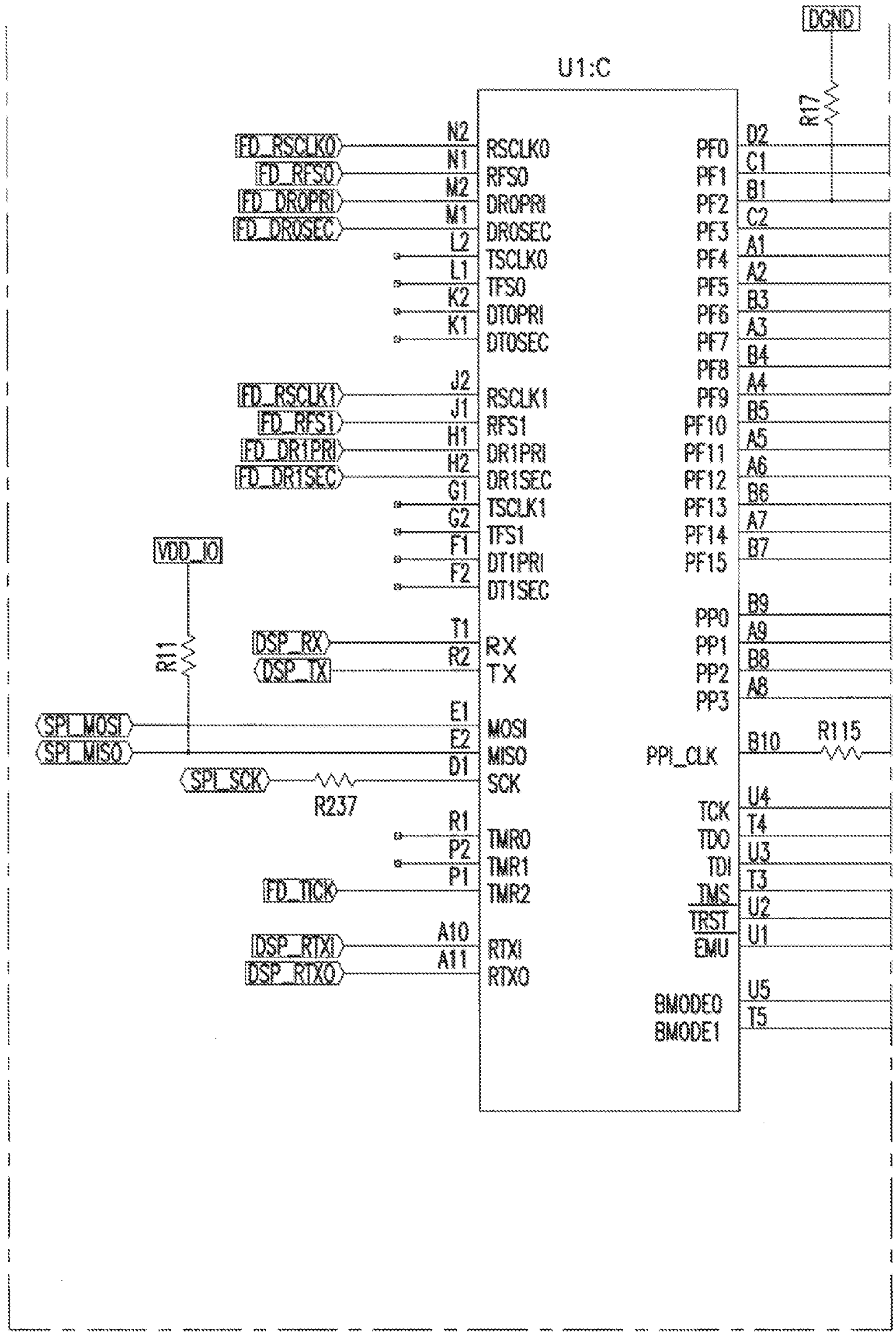
FIGS. 8C-8D is a schematic diagram showing another section of the DSP Processor 70.
Figure 8D:
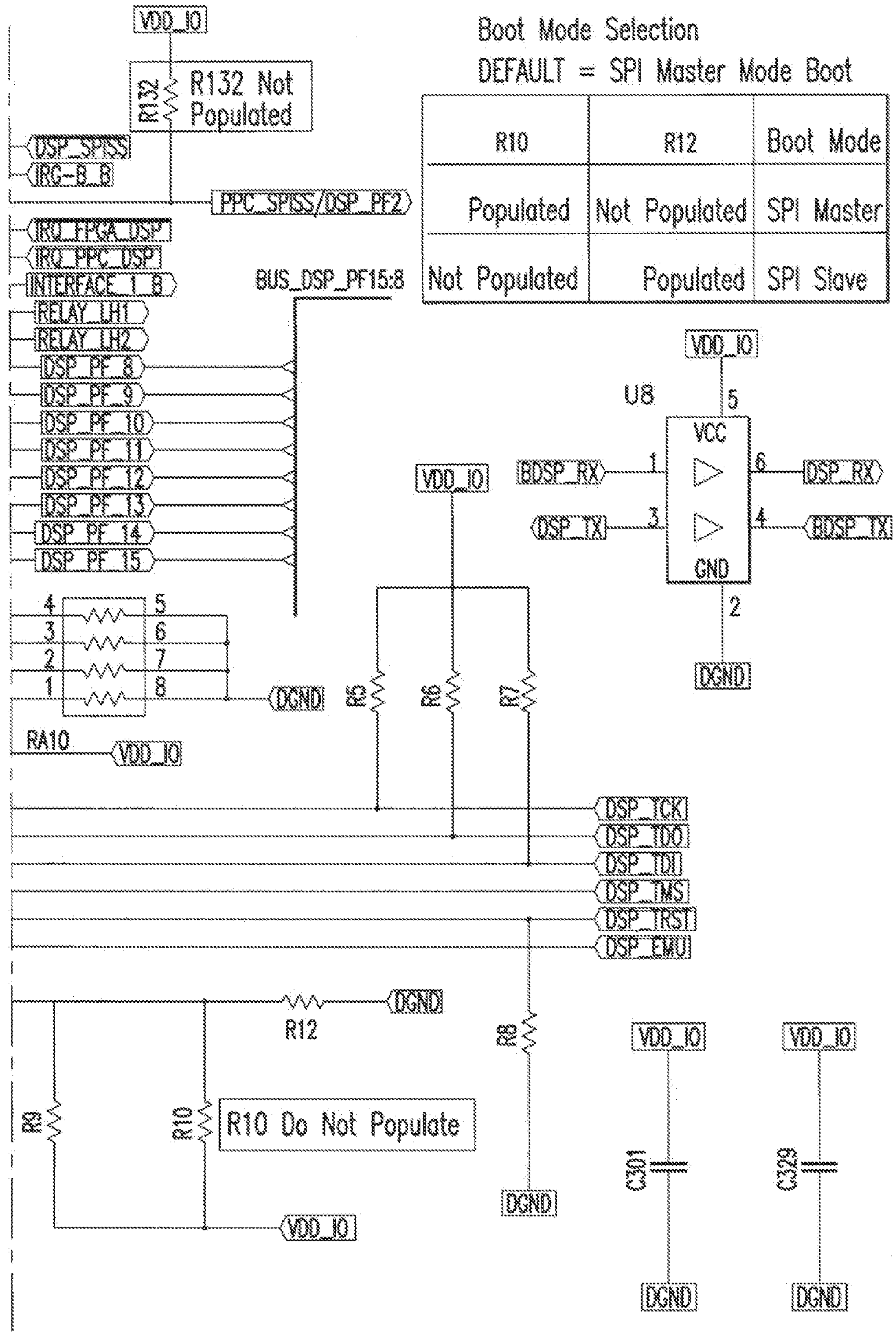

FIGS. 8C-8D shows another section of DSP 70, including DSP 70's 16-bit I/O bus, the high-speed serial channels which receive the waveform data and transient data, and the SPI bus input that is used by CPU 50 to program DSP 70. Also shown are interrupt request lines going to FPGA 80 and CPU 50, and a buffer for DSP 70's serial port.

Figure 8E:
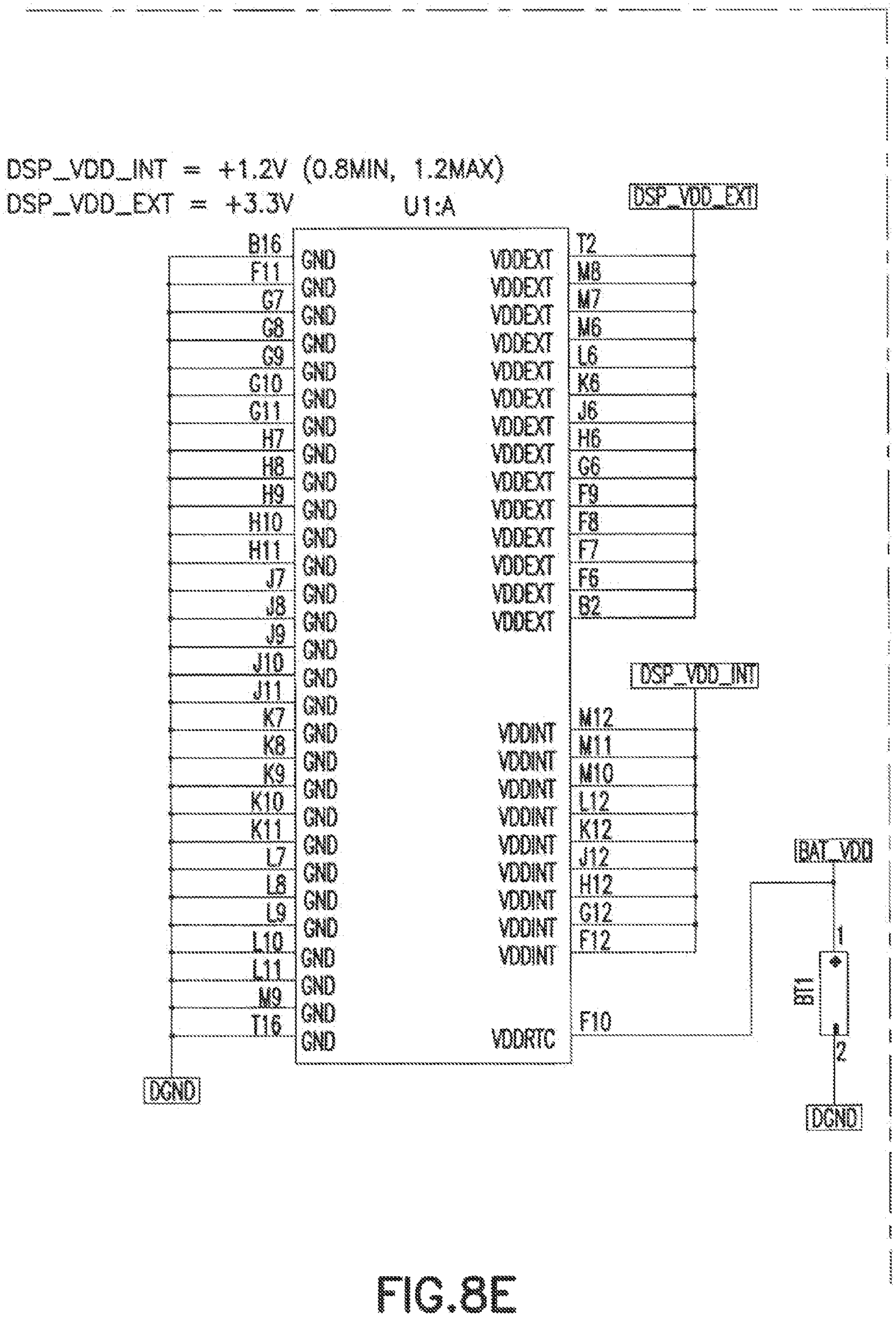
FIGS. 8E-8F is a schematic diagram showing voltage inputs for the DSP Processor and shows additional external memory for the DSP processor.
Figure 8F:
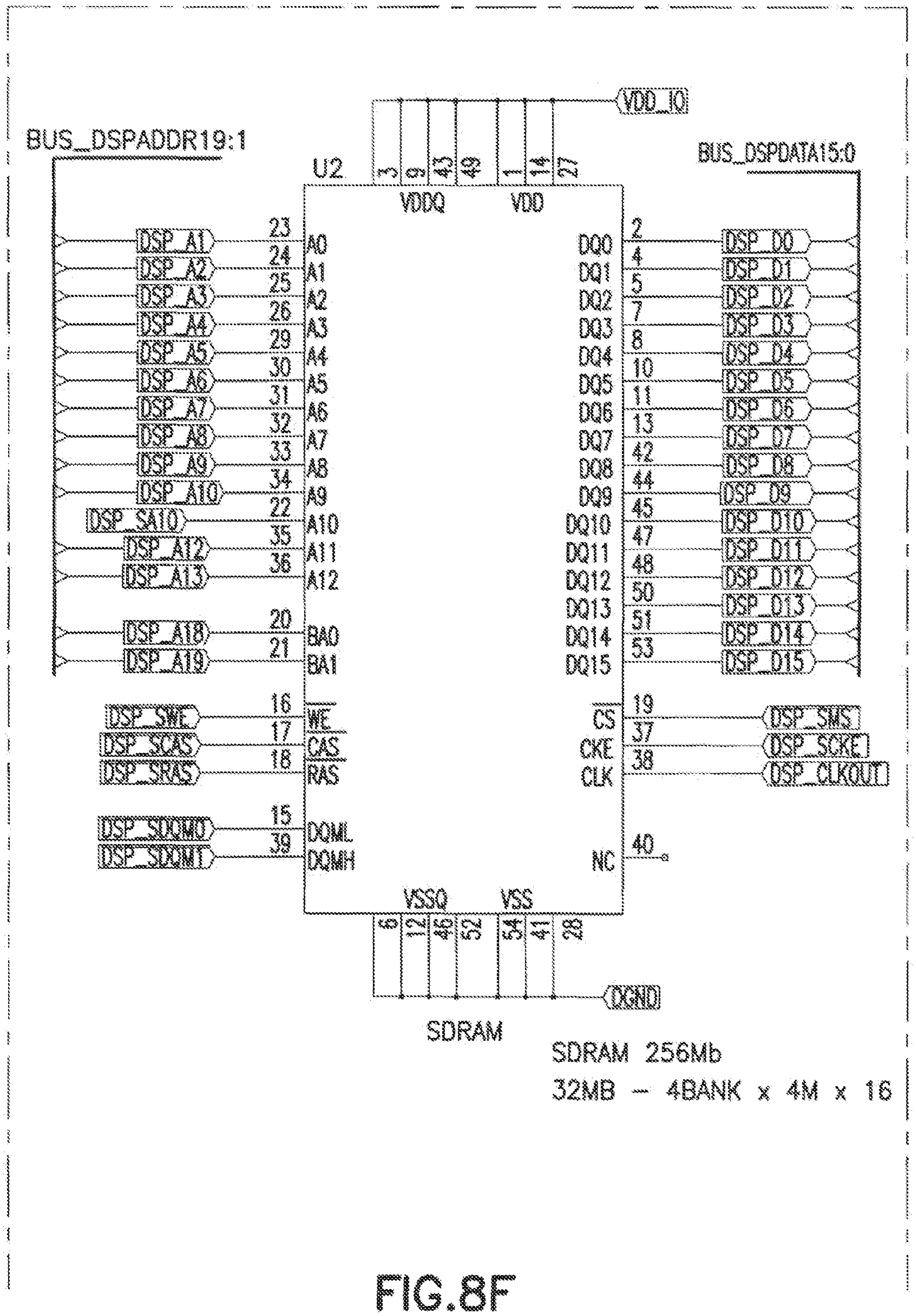
Figures 8, 8G:
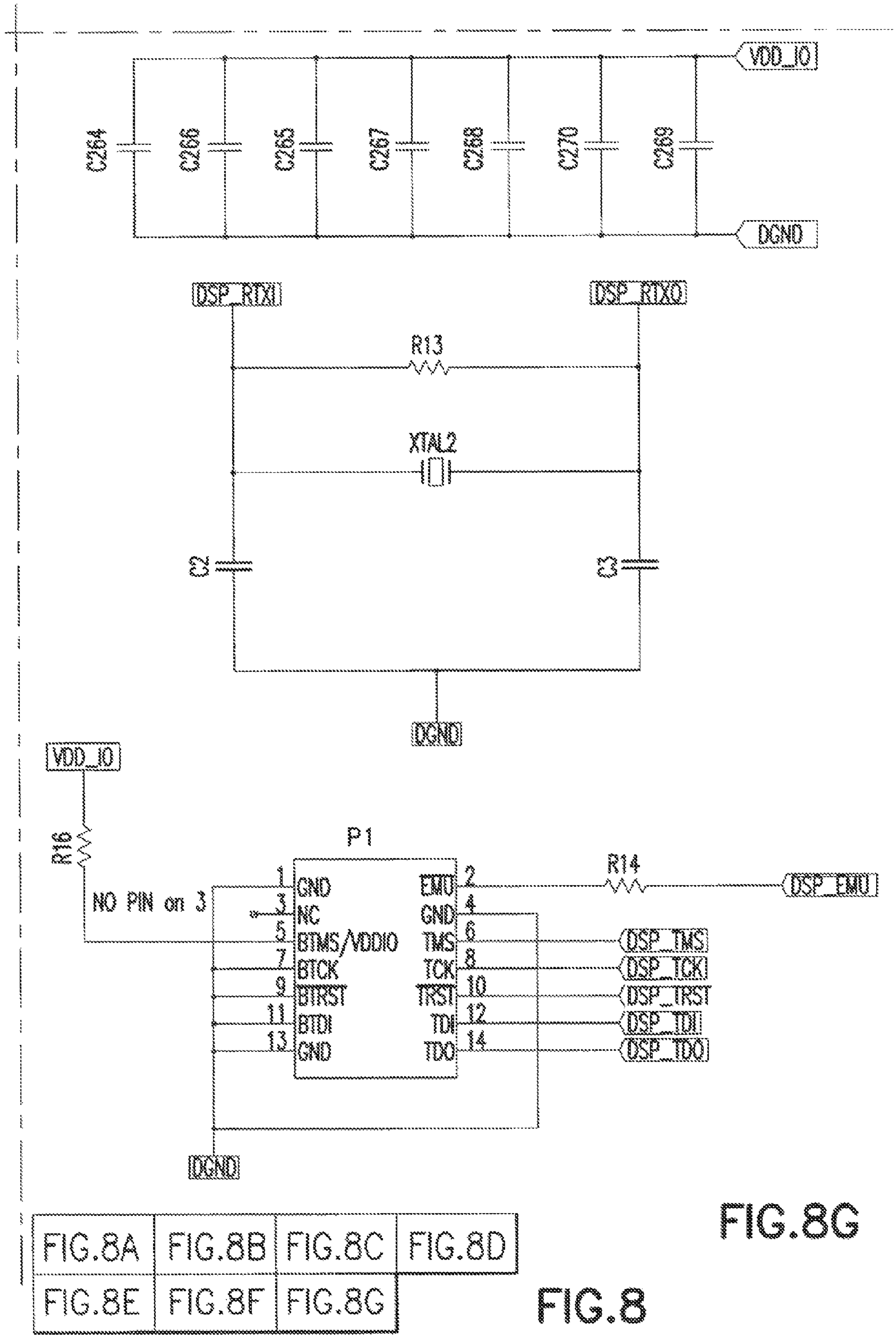
FIG. 8G is a schematic diagram showing the crystal circuit for the DSP Processor 70 and JTAG interface.

FIG. 8G shows the crystal circuit for DSP 70, which provides DSP 70 with a real-time clock, and the JTAG interface (JTAG stands for Joint Test Action Group and is an IEEE standard interface)—it is understood that the IED of the present disclosure is not limited to any particular interface and that the JTAG interface is an illustrative, non-limiting example. Also shown are the voltage decoupling capacitors used to reduce noise.

FIGS. 8E-8F shows voltage inputs for DSP 70 and shows additional external volatile memory for DSP 70, e.g., SDRAM, which is used for storing data, such as captured waveform samples, as part of its processing cycle. Also shown are a battery input and battery for battery backup of the internal real-time clock.

Figure 9A:
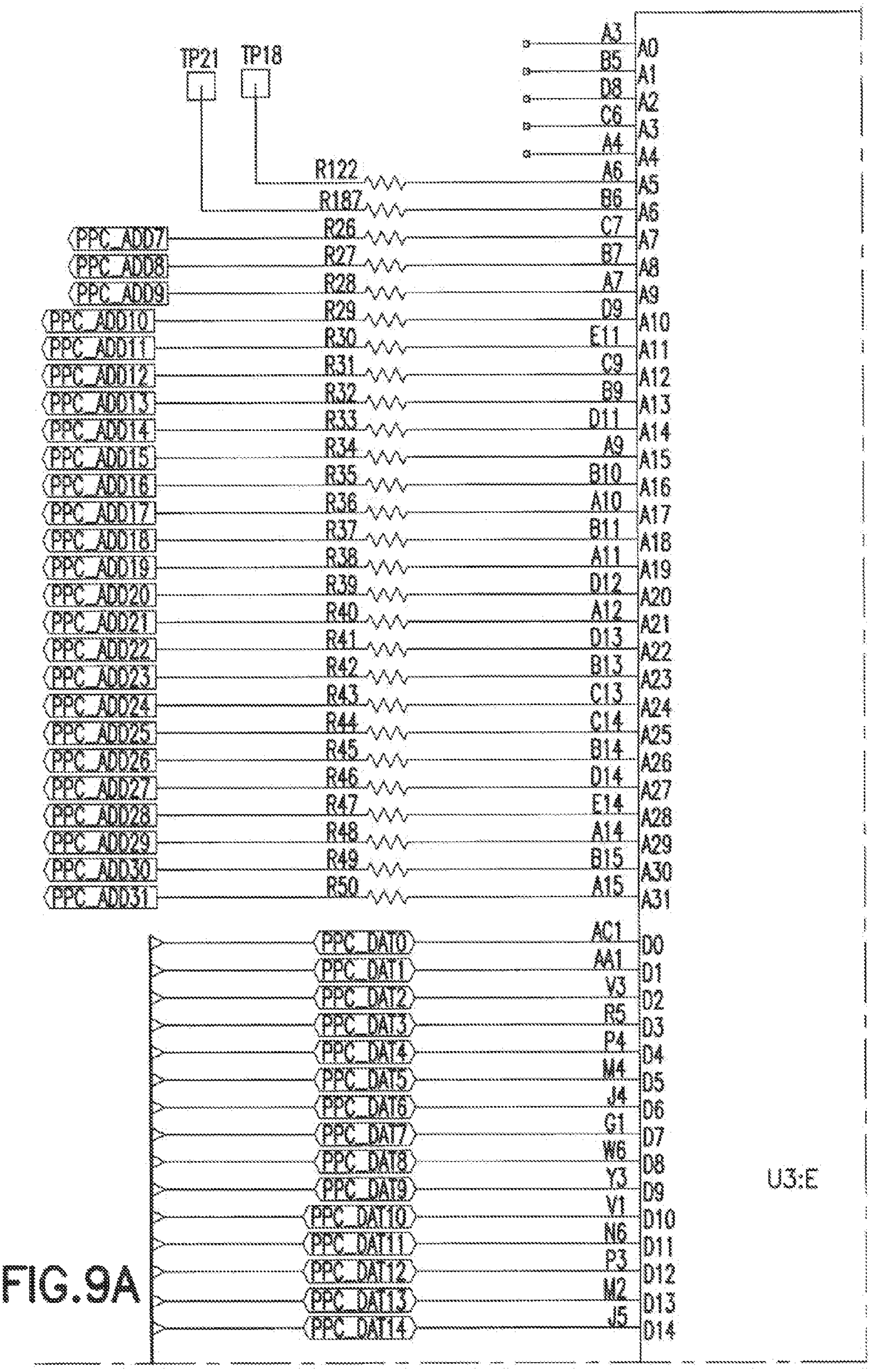
FIGS. 9A and 9C is a schematic diagram showing the address outputs of the CPU and the data bus outputs of the CPU.
Figure 9B:
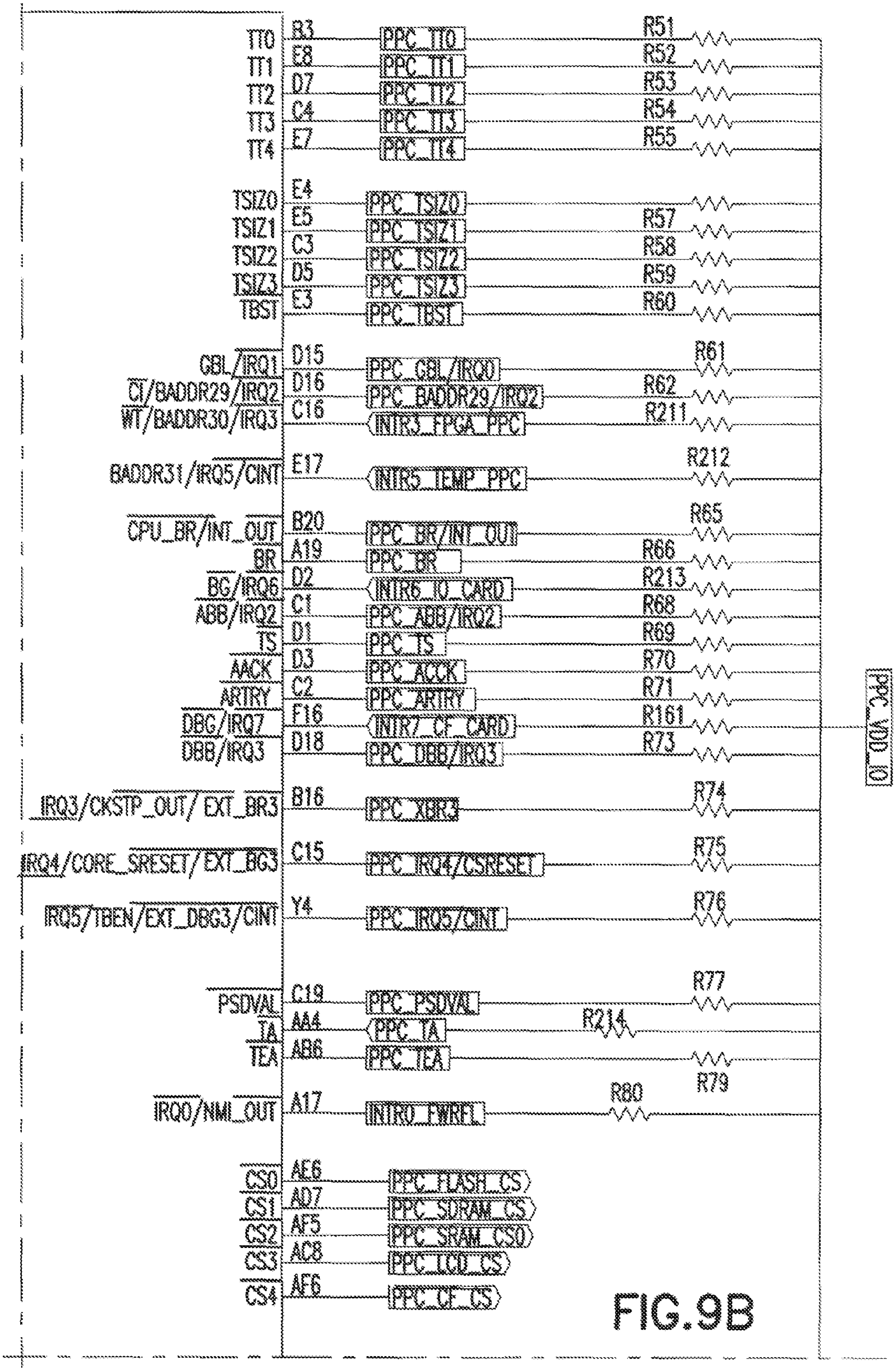
FIG. 9B is a schematic diagram showing a portion of the CPU and the bus control signal of the CPU.

FIG. 9B shows a portion of CPU 50, including the bus control signal of CPU 50. Also shown are the chip select outputs of CPU 50, which include those used to enable Flash memory, volatile SDRAM memory, non-volatile compact Flash memory (used for storing captured waveform samples from the ADC), and the graphical backlit display. The CPU 50 write signals are also shown.

Figure 9C:
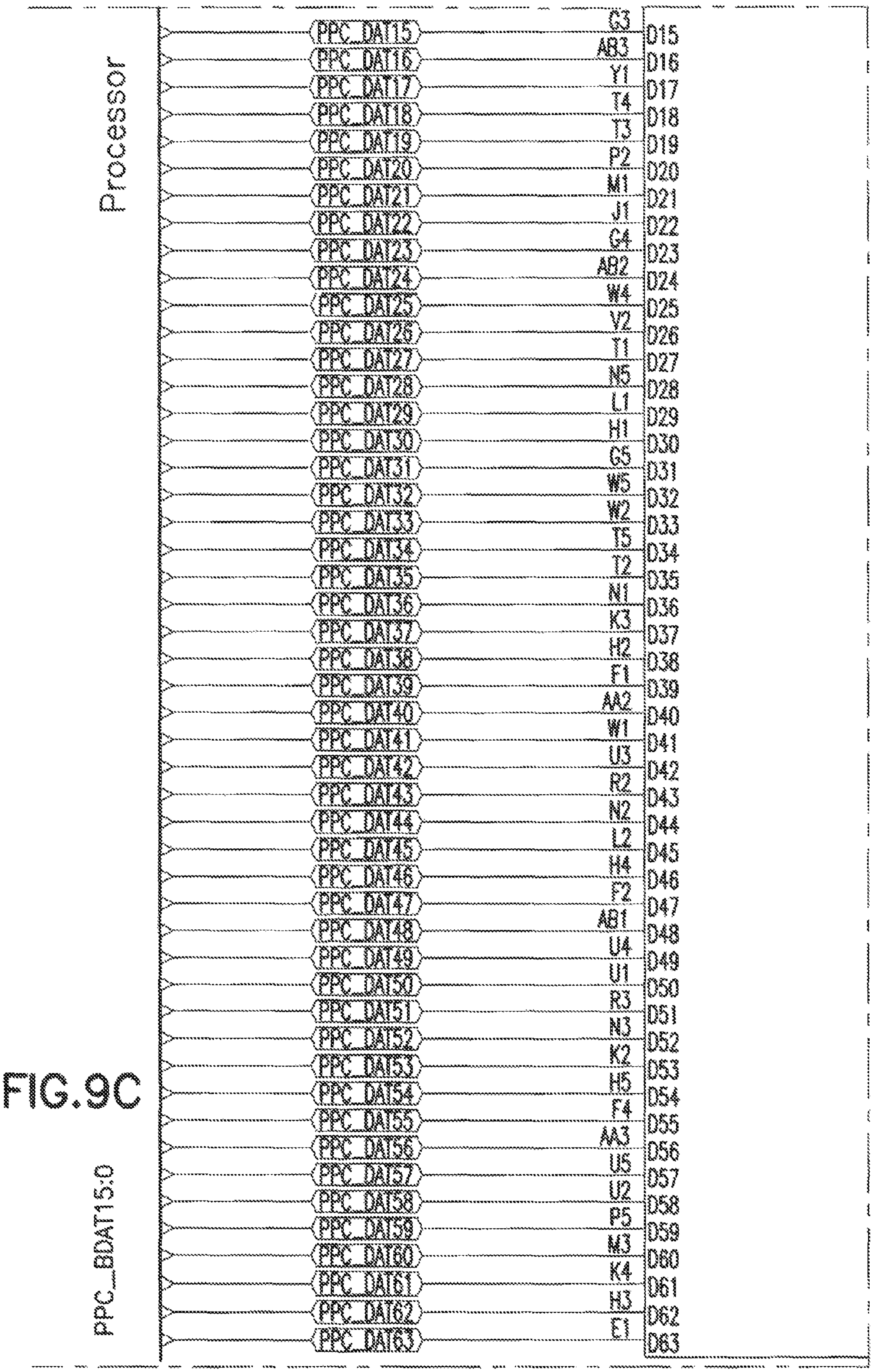
Figure 9D:
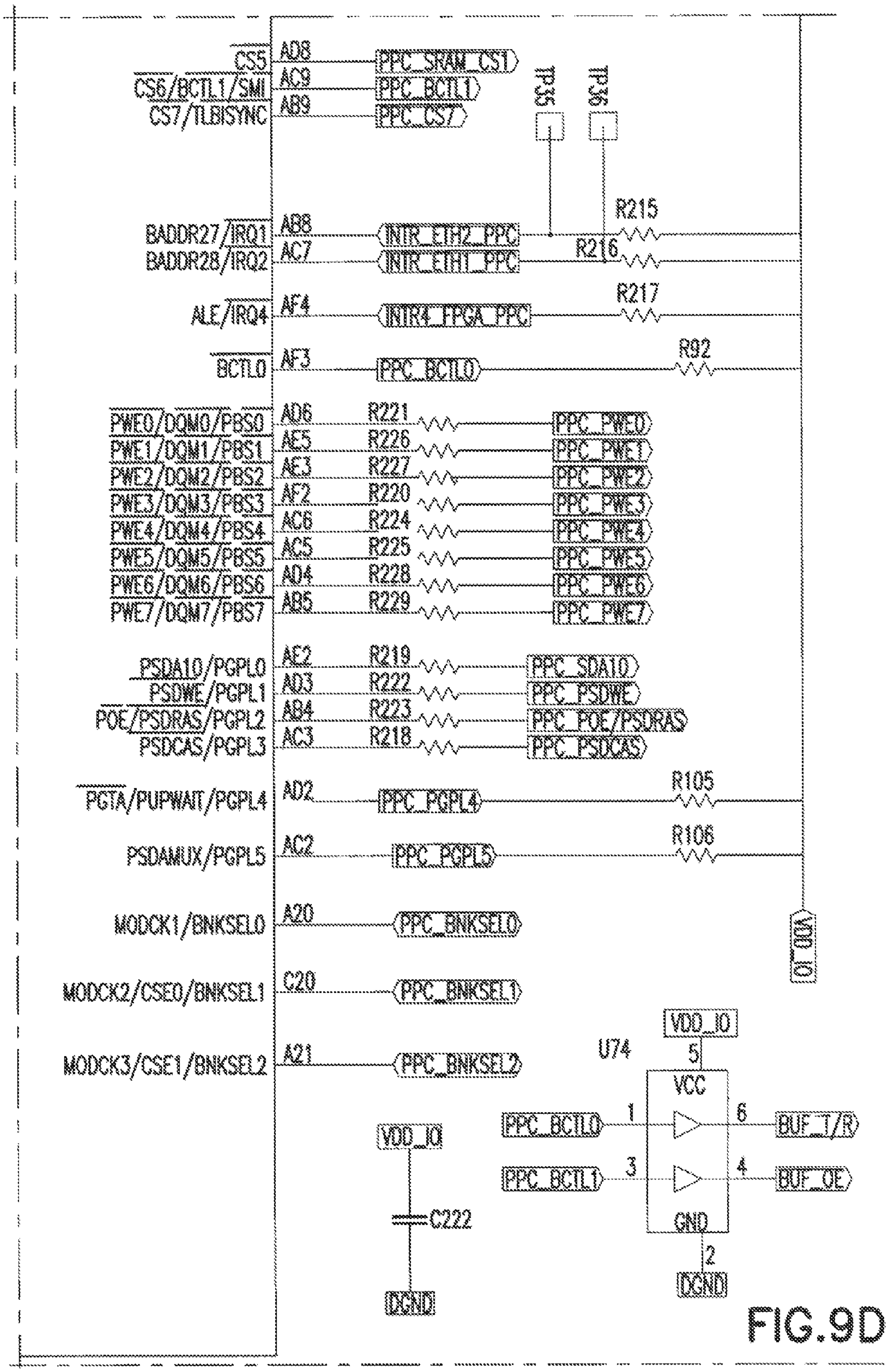
FIGS. 9D and 9F is a schematic diagram showing the data bus buffer for the CPU.
Figure 9E:
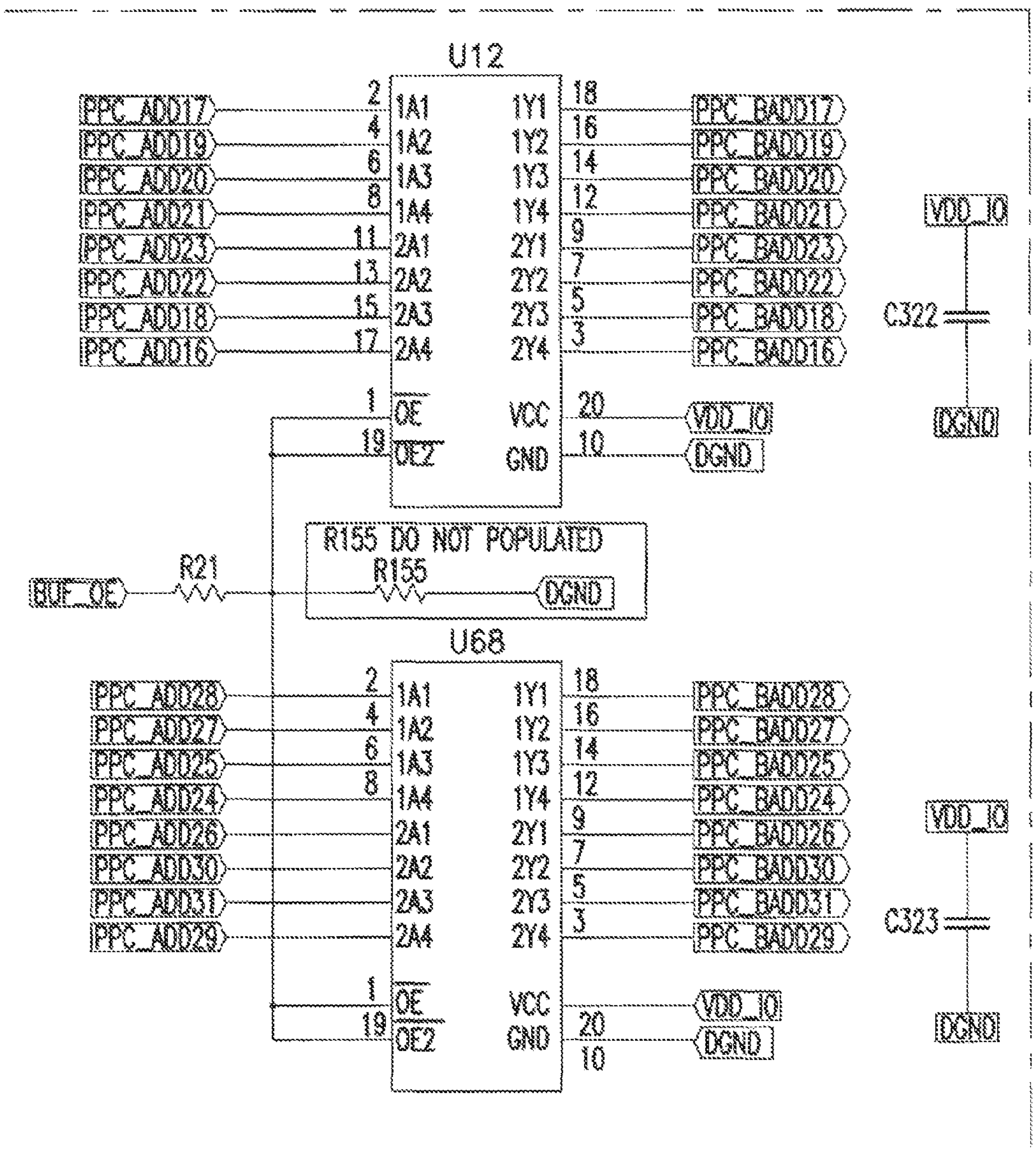
FIG. 9E is a schematic diagram showing address bus buffer for the CPU.
Figures 9, 9F:
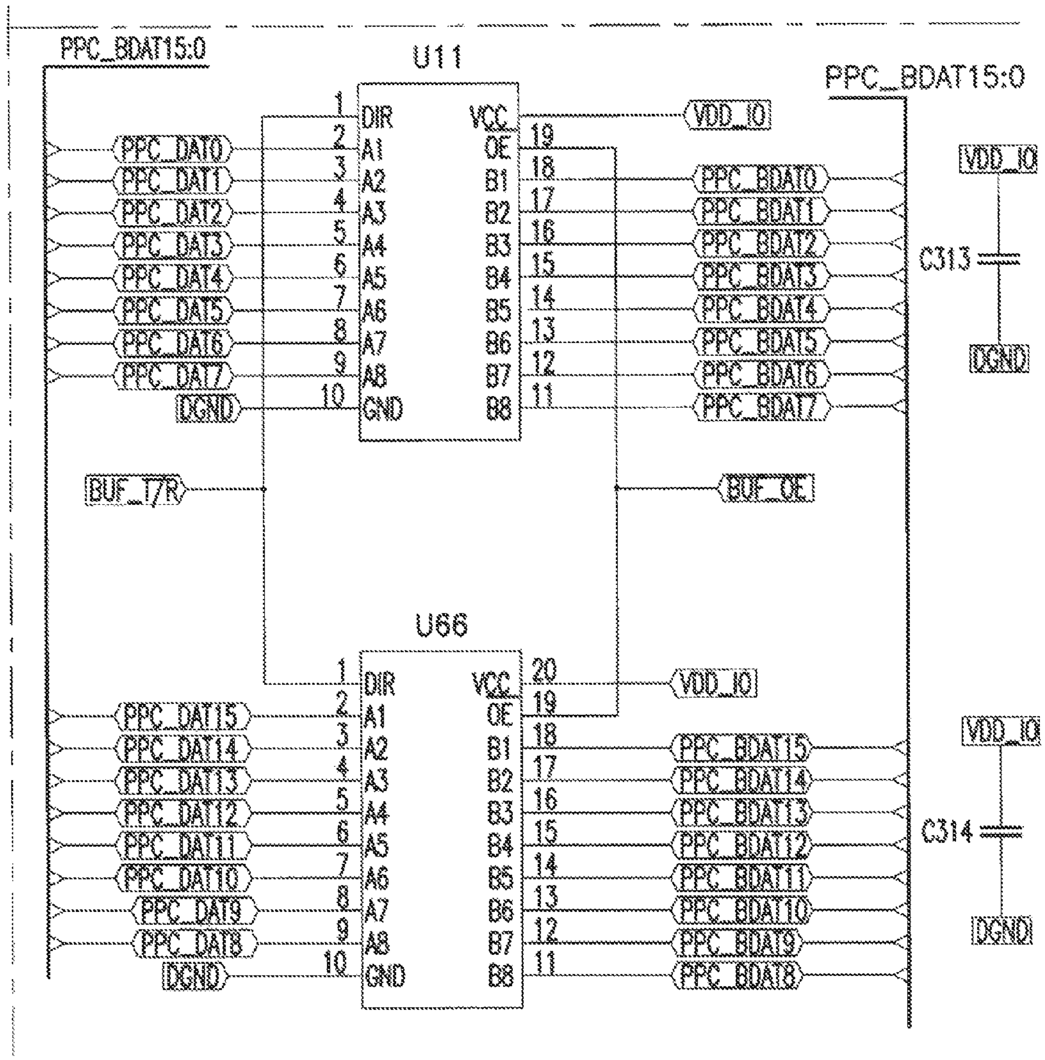

FIGS. 9D and 9F shows the primary data bus buffer for CPU 50, used to buffer the CPU 50 data bus to other components on the board. For example, CPU 50 interfaces to FPGA 80 via these data bus buffers to access the two FPGA 80 dual port memories. This allows CPU 50 to communicate with DSP 70 so that it can process transient and waveform data for presentation. The second dual port memory allows CPU 50 to communicate with DSP 60 so that it can process the revenue data for presentation. CPU 50 uses these interfaces to present power measurements, overall power quality, harmonic magnitudes, voltage fluctuations, and voltage flicker, via its communications outputs, such as Ethernet TCP/IP, or on the graphical backlit display, or both.

FIG. 9E shows the address bus buffer for CPU 50, used to buffer the CPU 50 address bus to other components on the board. Also shown is a portion of the CPU 50 data bus.

FIGS. 9A and 9C shows the address outputs of CPU 50 and the balance of the data bus outputs of CPU 50.

Figure 10A:
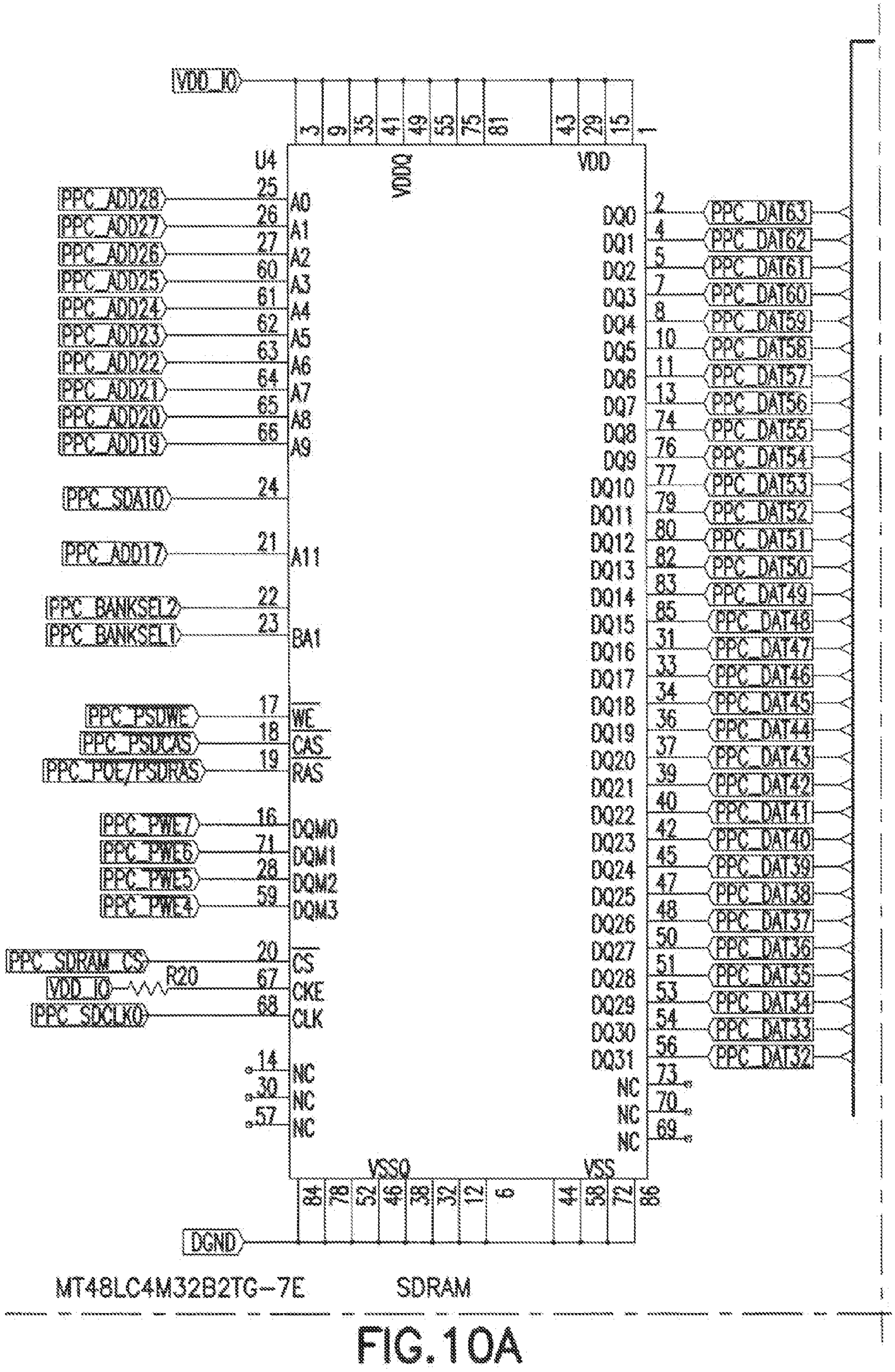
FIGS. 10A and 10B show the RAM memory of the CPU.
Figure 10B:
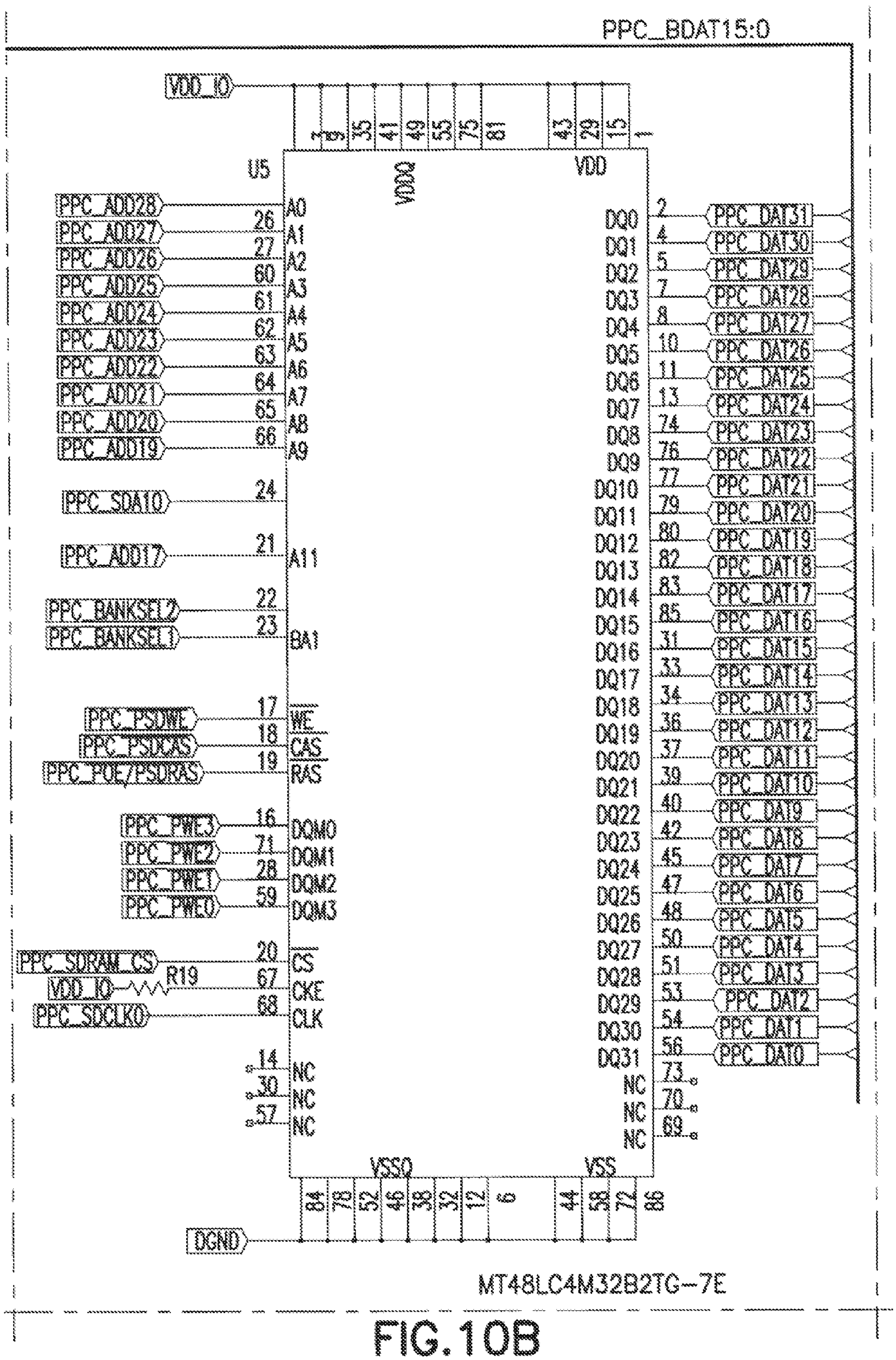

FIG. 10A-10B shows the volatile RAM memory of CPU 50, which is used by CPU 50 for all its processing for presentation of data, including power measurements, overall power quality, harmonic magnitudes, voltage fluctuations, and voltage flicker.

Figure 10C:
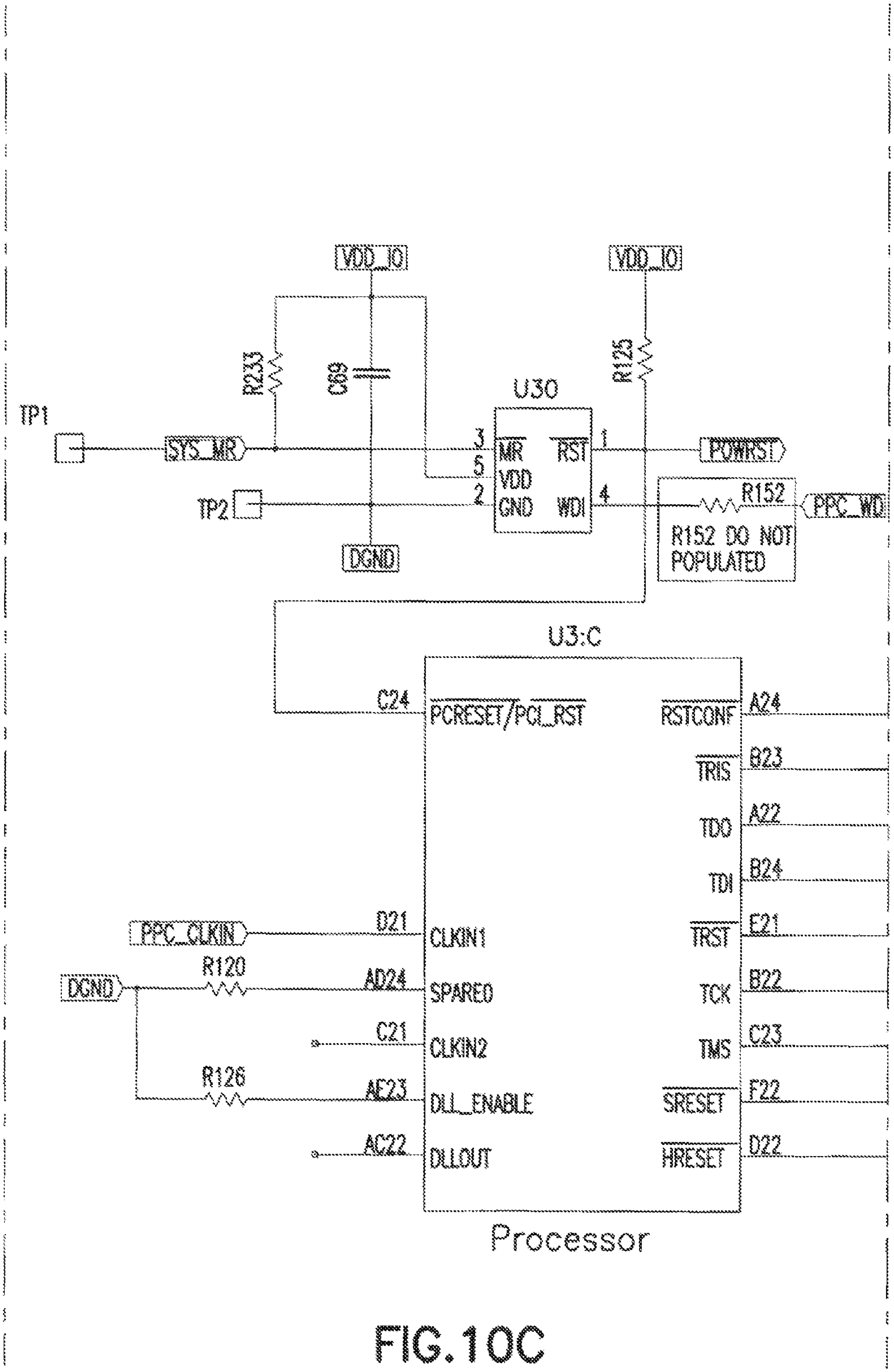
FIG. 10C is a schematic diagram showing the JTAG interface to the CPU and is a schematic diagram showing power on reset controller.
Figure 10D:
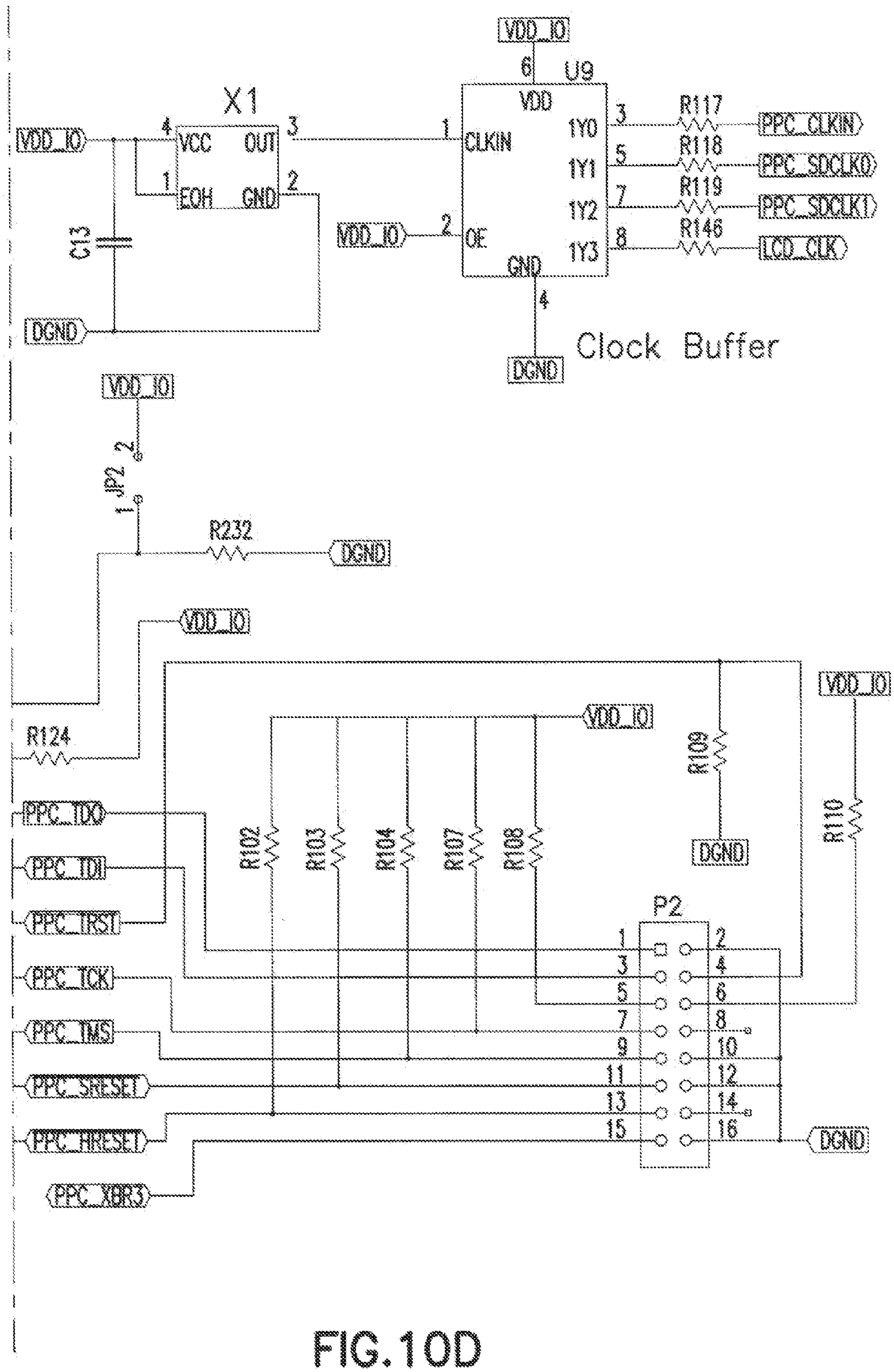
FIG. 10D is a schematic diagram showing the CPU clock buffers and mode select logic for the CPU.

FIGS. 10C-10D shows the JTAG interface to CPU 50 and shows the Power-on Reset controller.

Figure 10E:
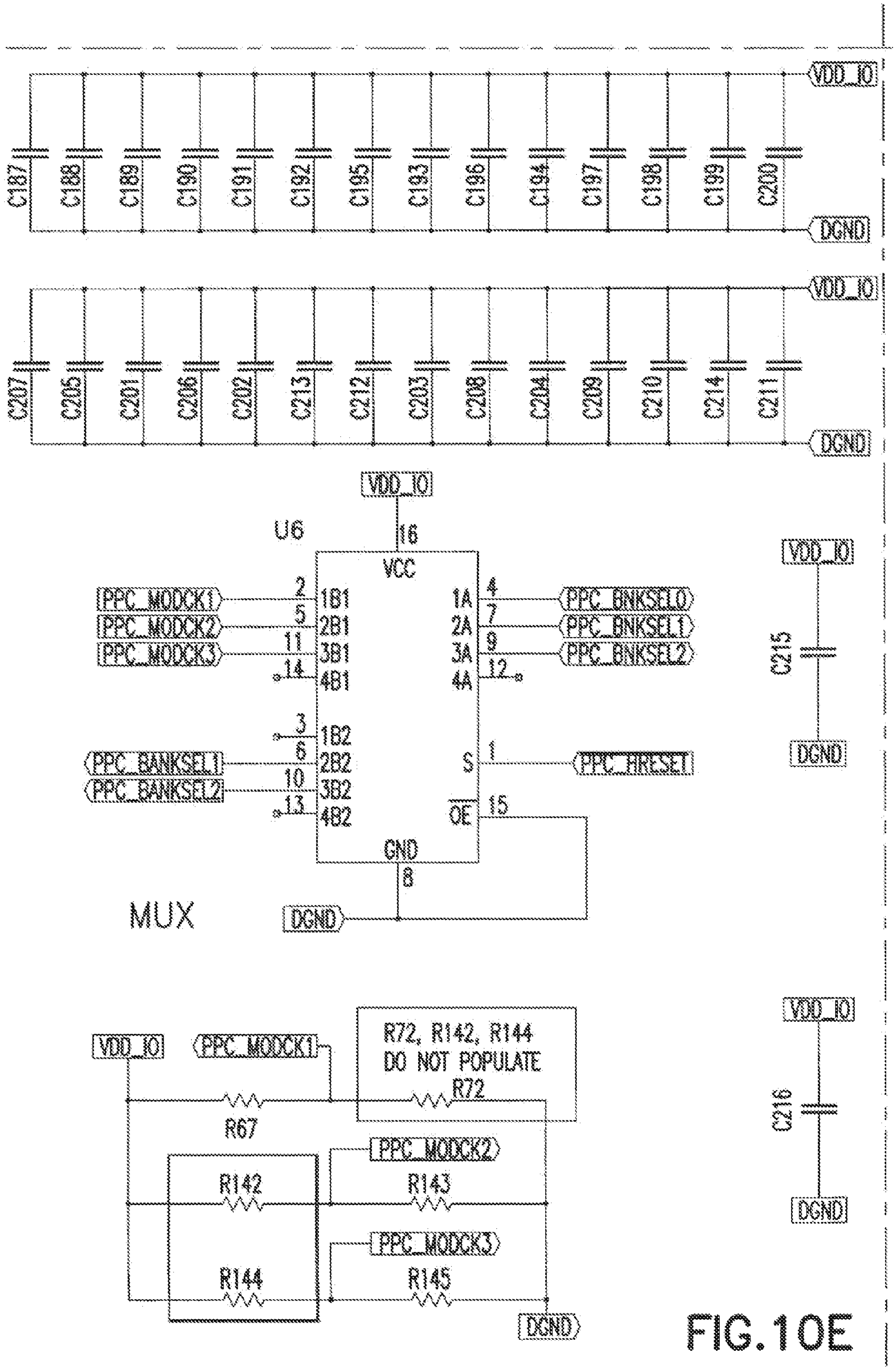
FIG. 10E is a schematic diagram showing the clock oscillator for the CPU.
Figures 10, 10F:
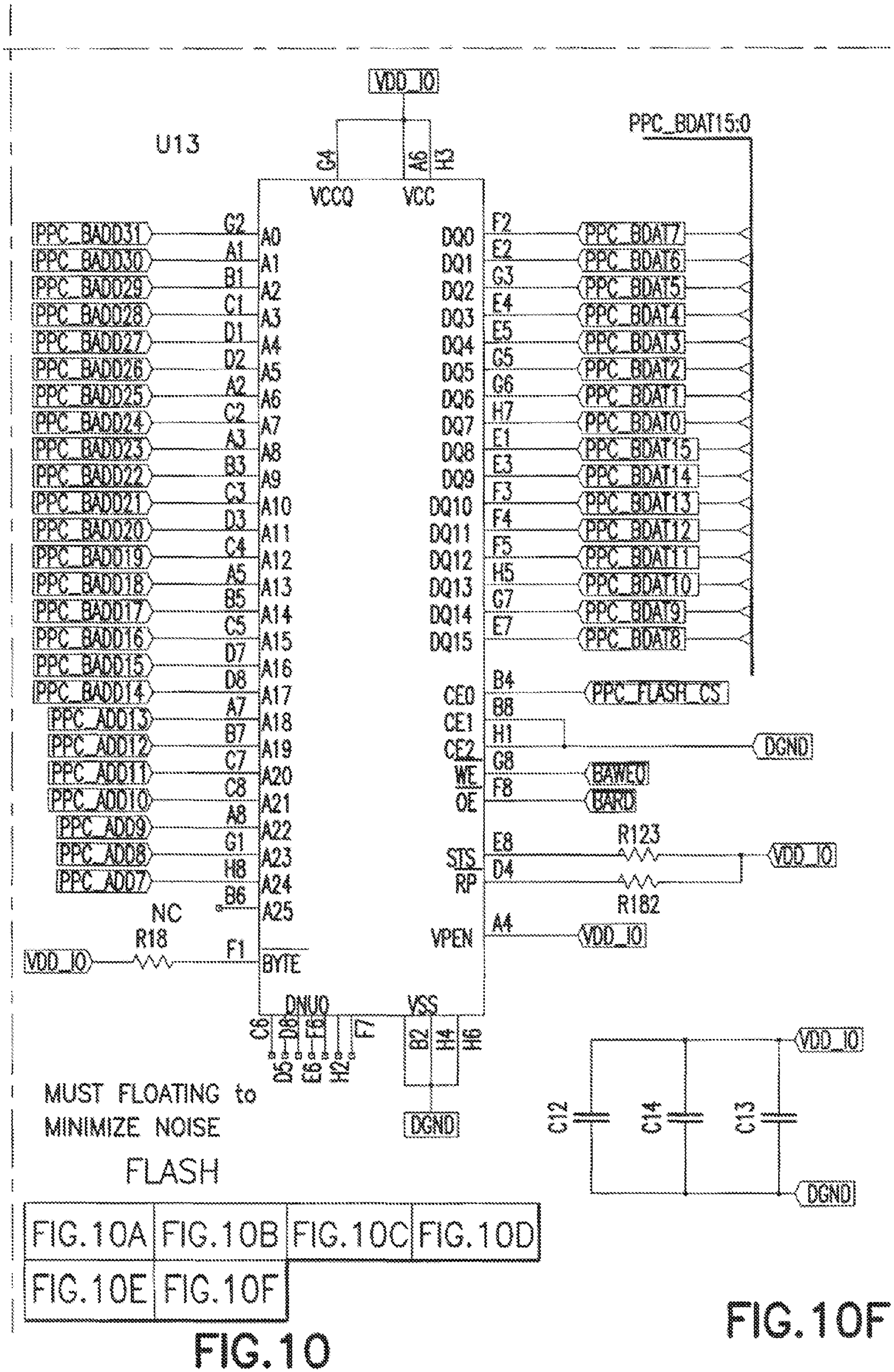
FIG. 10F show the programmable flash memory for the CPU.

FIG. 10F together show the programmable non-volatile Flash memory for CPU 50, which is used to load the CPU 50 runtime firmware from non-volatile compact Flash memory to volatile SDRAM memory. Once the runtime firmware has loaded, all execution of CPU 50 code is from the SDRAM memory.

FIG. 10D-10E shows the CPU 50 clock buffers, and mode select logic for CPU 50.

FIG. 10D shows the clock oscillator for CPU 50, the voltage decoupling capacitors used to reduce noise, and a portion of the volatile SDRAM memory.

Figure 11A:
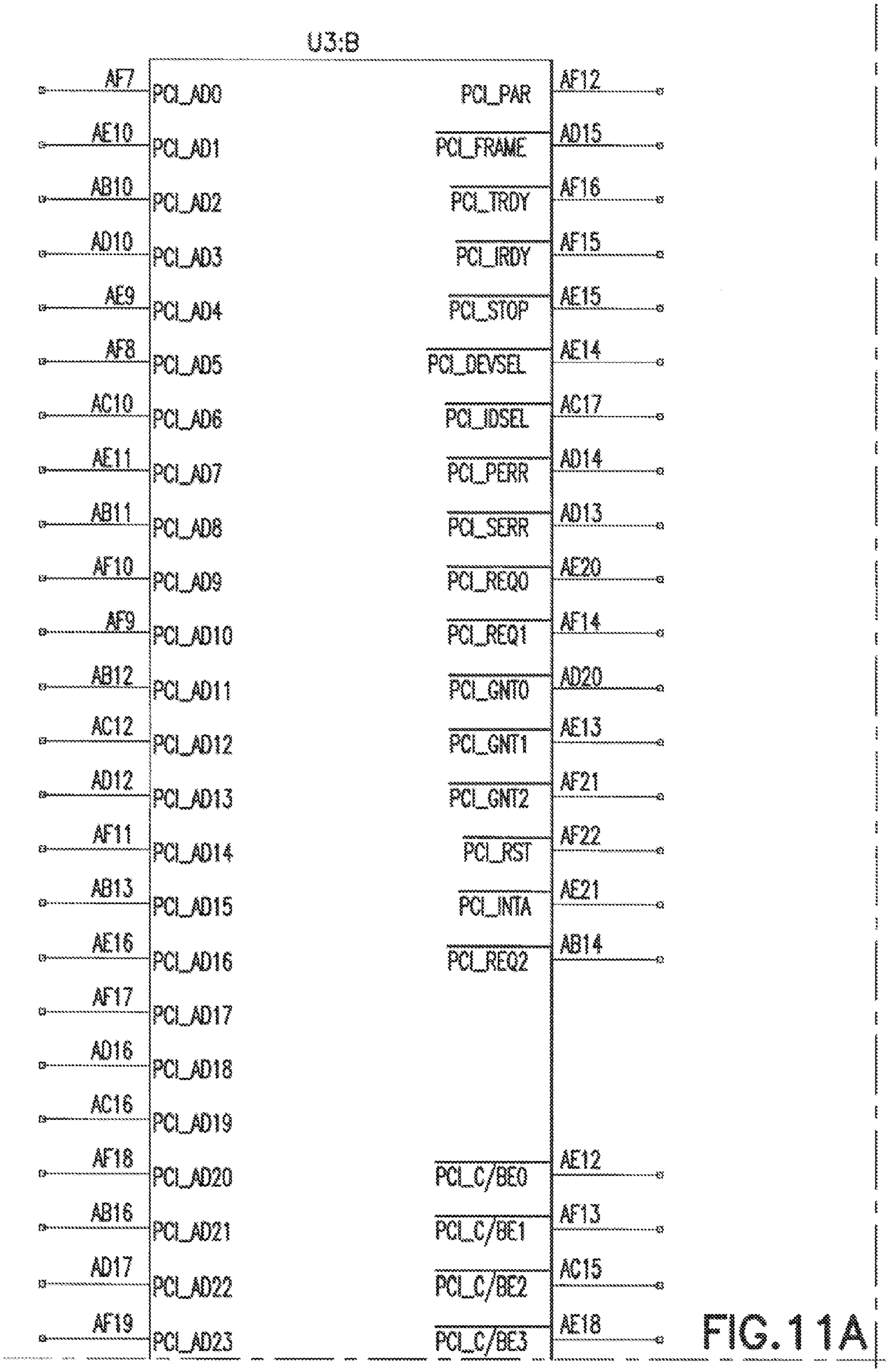
FIGS. 11A-11B is a schematic diagram showing the CPU Bus control logic and CPU I/O ports.
Figure 11B:
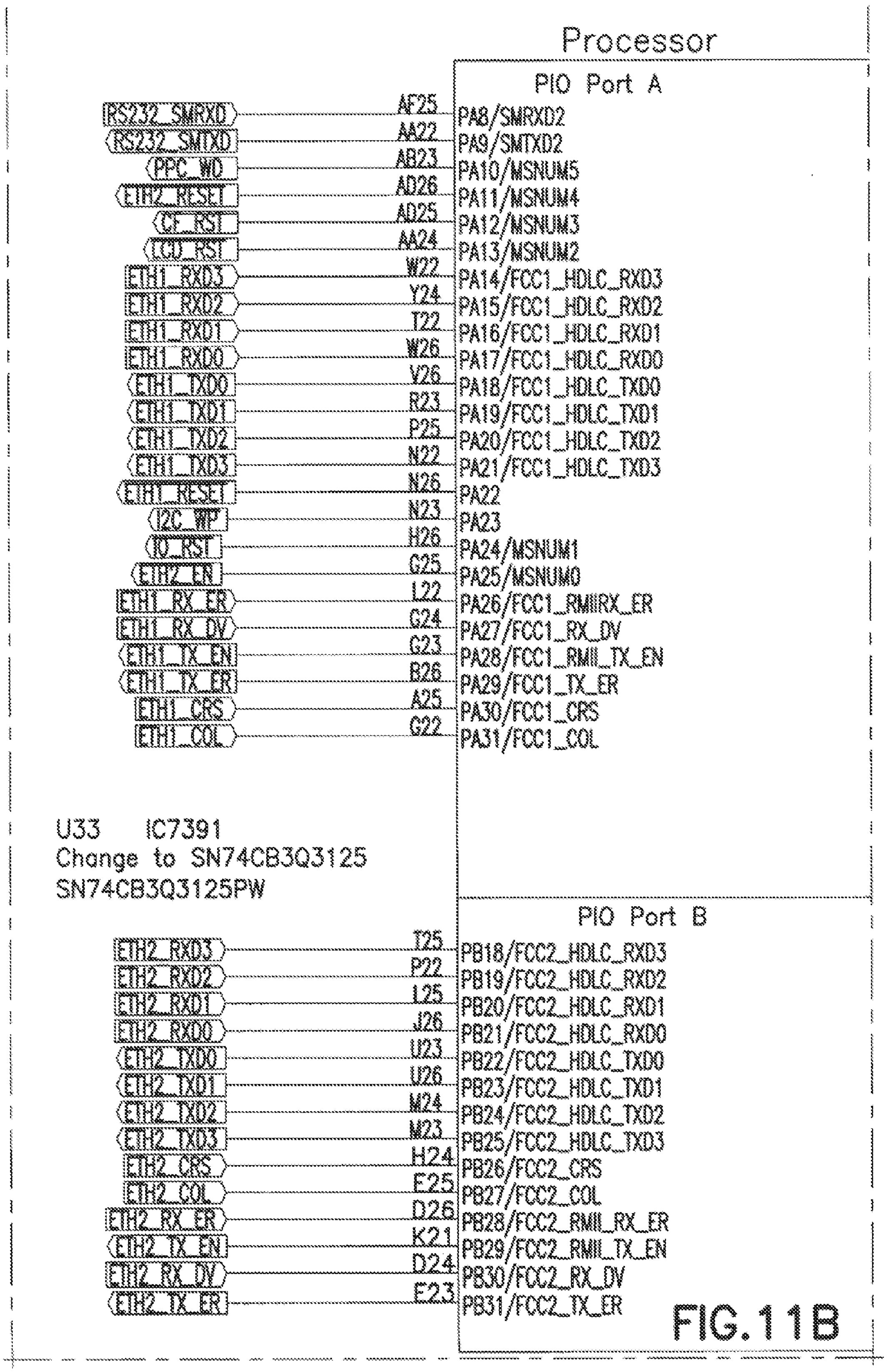

FIGS. 11A-11B shows a portion of the CPU 50 bus control logic and the CPU 50 I/O ports. Also shown are the Ethernet bus signals, which are generated by CPU 50 for Ethernet TCP/IP communication.

Figure 11C:
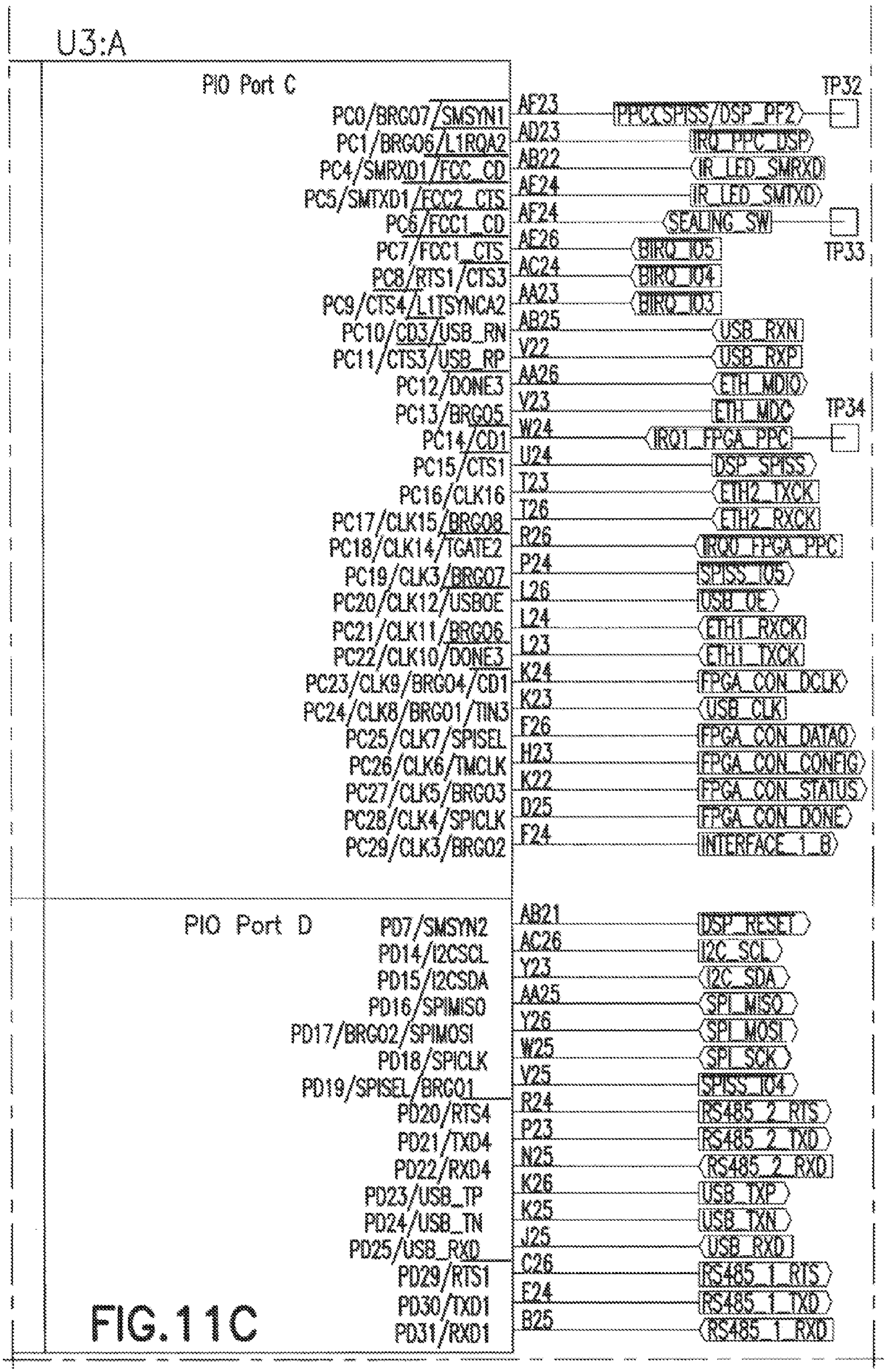
FIGS. 11C-11D is a schematic diagram showing additional CPU I/O ports and is a schematic diagram showing interface logic between the CPU and the DSP Processor 60.
Figure 11D:
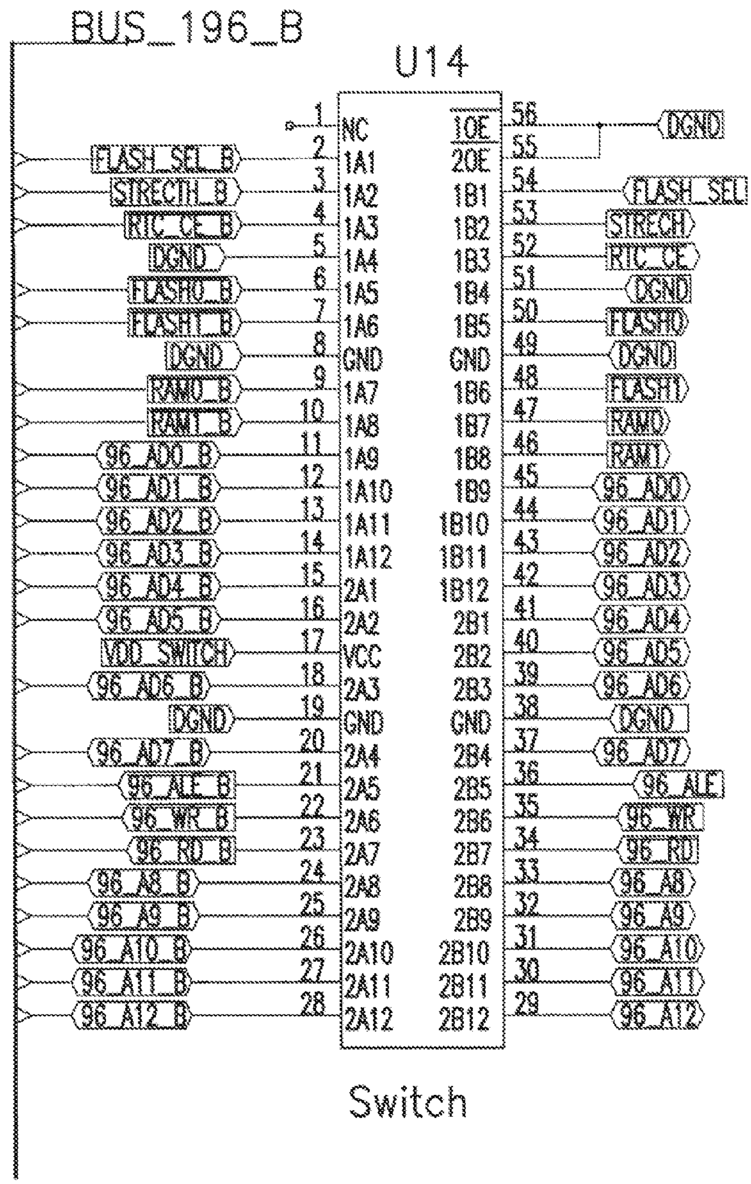

FIGS. 11C-11D shows additional CPU 50 I/O ports and also shows a voltage translator that allows DSP 60 to interface to FPGA 80 by translating 5 Volt logic signals to 3.3 Volt logic signals.

Figure 11E:
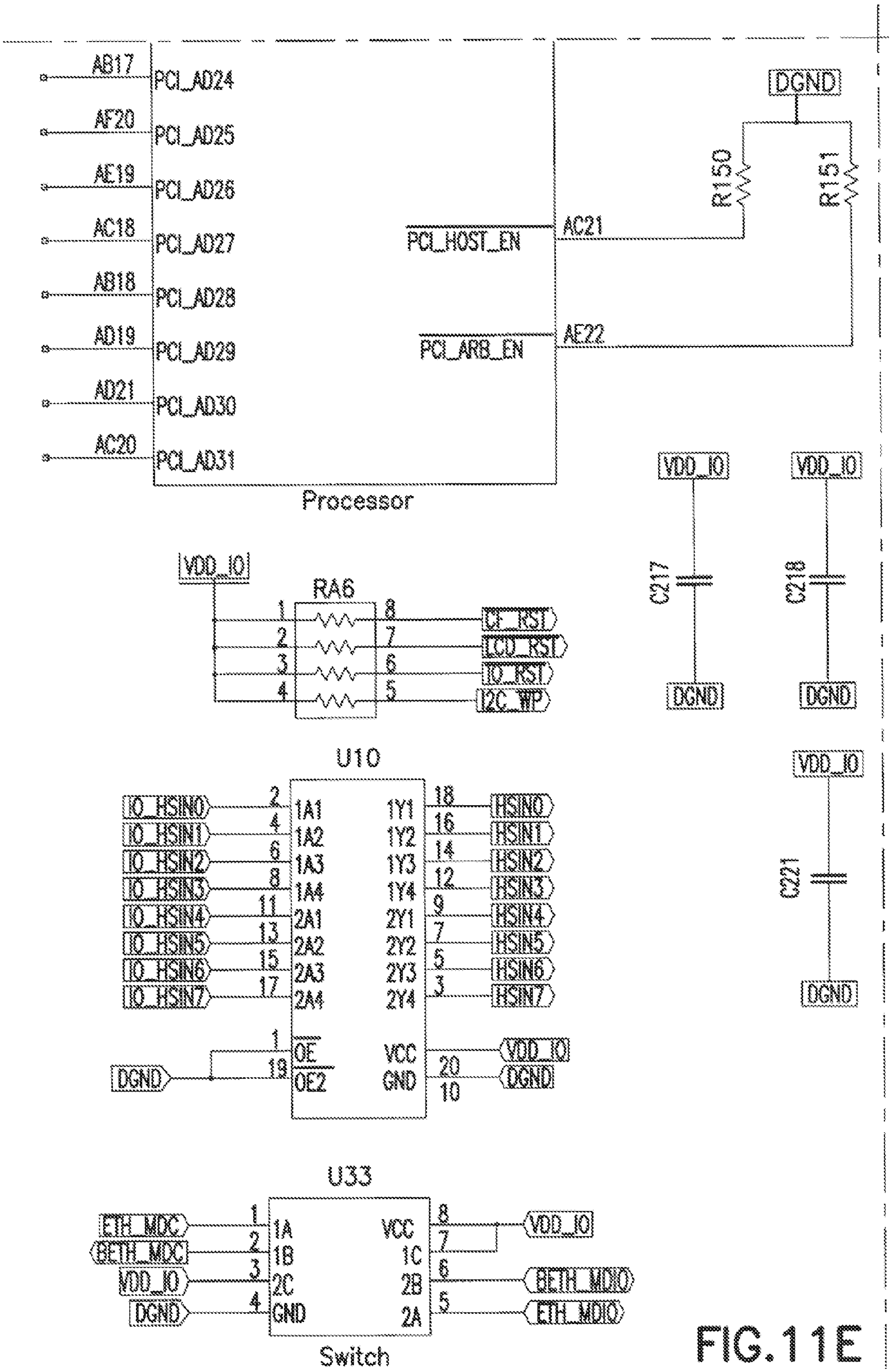
FIGS. 11E-11F is a schematic diagram showing additional CPU Bus control logic signals and CPU Ethernet control signals and Ethernet buffers between the CPU and the I/O Board and the Digital input signals to the CPU.
Figure 11F:
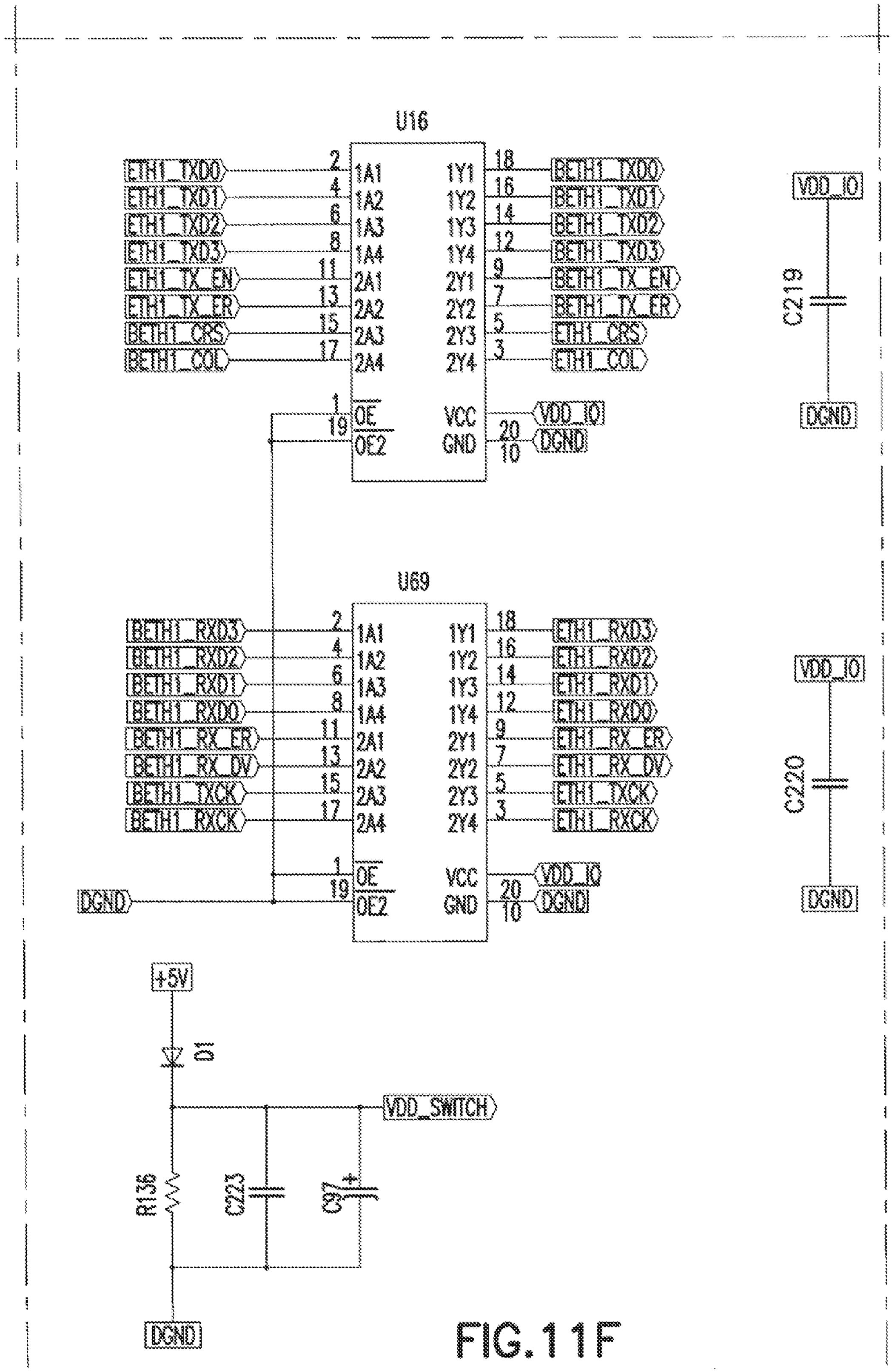
Figures 11, 11G:
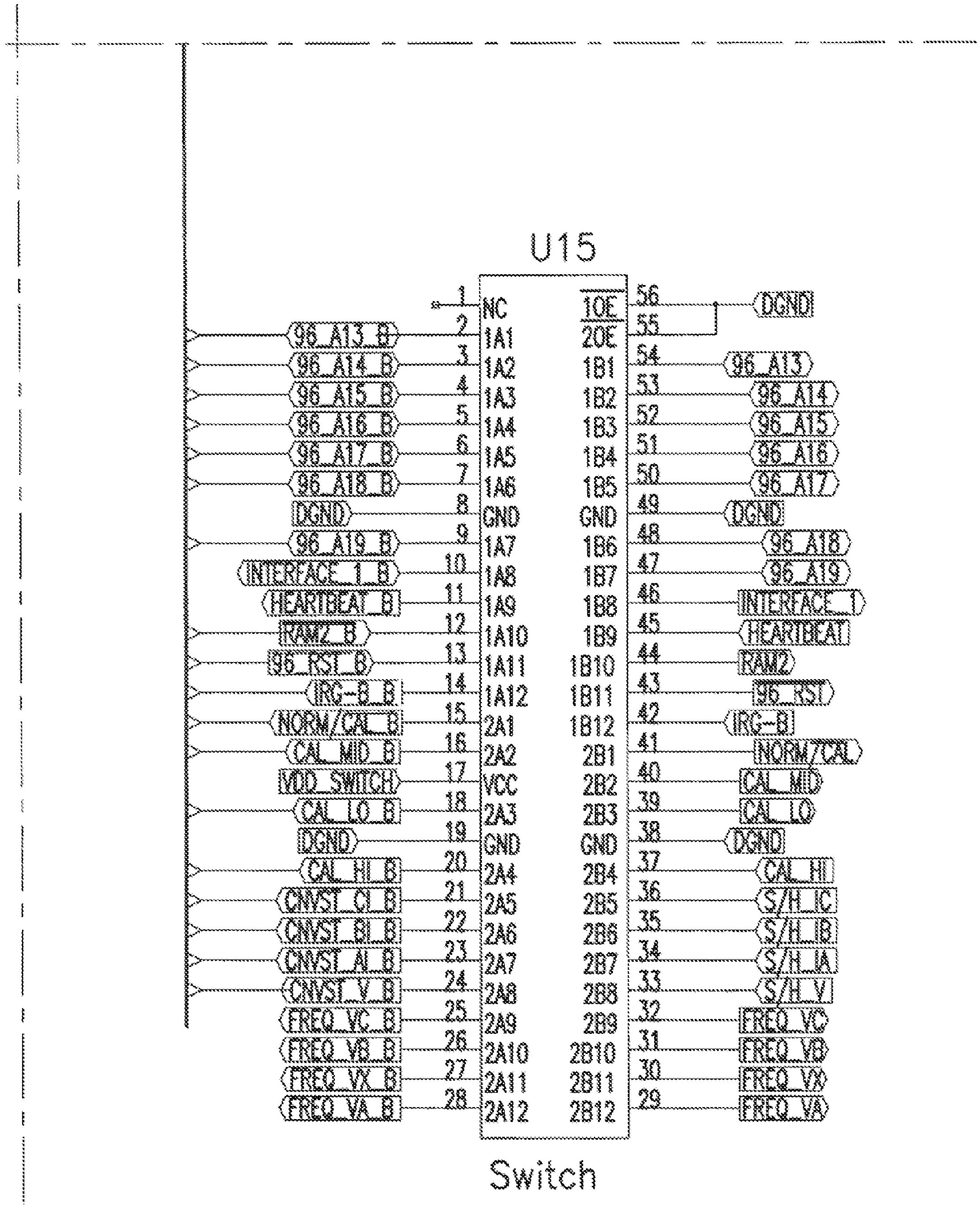
FIG. 11G is a schematic diagram showing the Ethernet buffer between the CPU and the I/O cards and additional logic interface signal between the CPU and the DSP Processor 60.

FIG. 11G shows the Ethernet buffer between CPU 50 and the Ethernet I/O card, which provides Ethernet TCP/IP communication for the IED. Also shown is a voltage translator that allows DSP 60 to interface to FPGA 80 by translating 5 Volt logic signals to 3.3 Volt logic signals.

FIGS. 11E-11F shows additional CPU 50 bus control logic signals, and CPU 50 Ethernet control signals and Ethernet buffers between the CPU 50 and the Ethernet I/O card. It also shows the buffer for the High Speed Digital Inputs that go to FPGA 80.

Figure 12A:
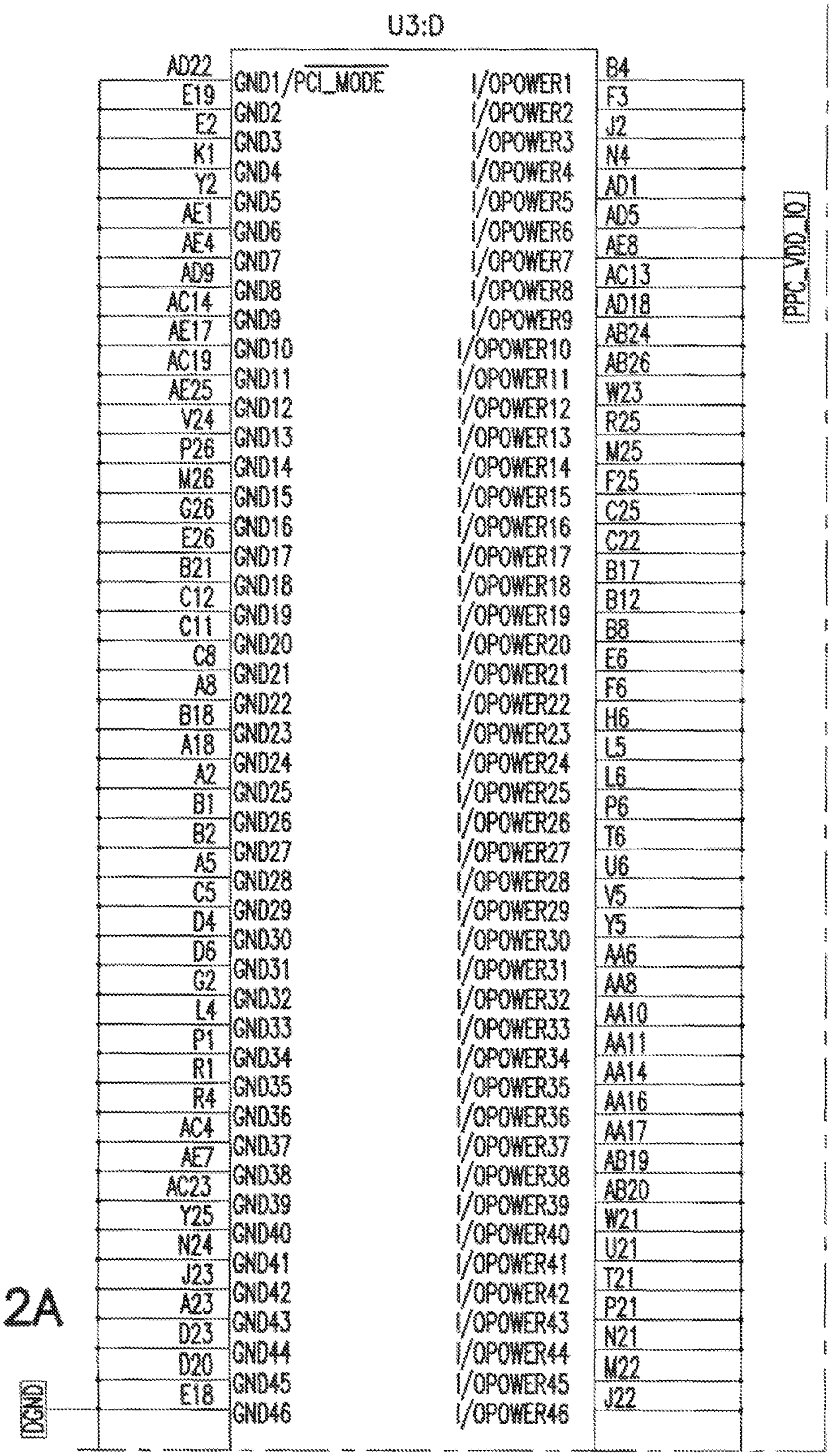
FIG. 12A is a schematic diagram showing power and ground to the CPU.

FIG. 12A shows power and ground to CPU 50.

Figure 12B:
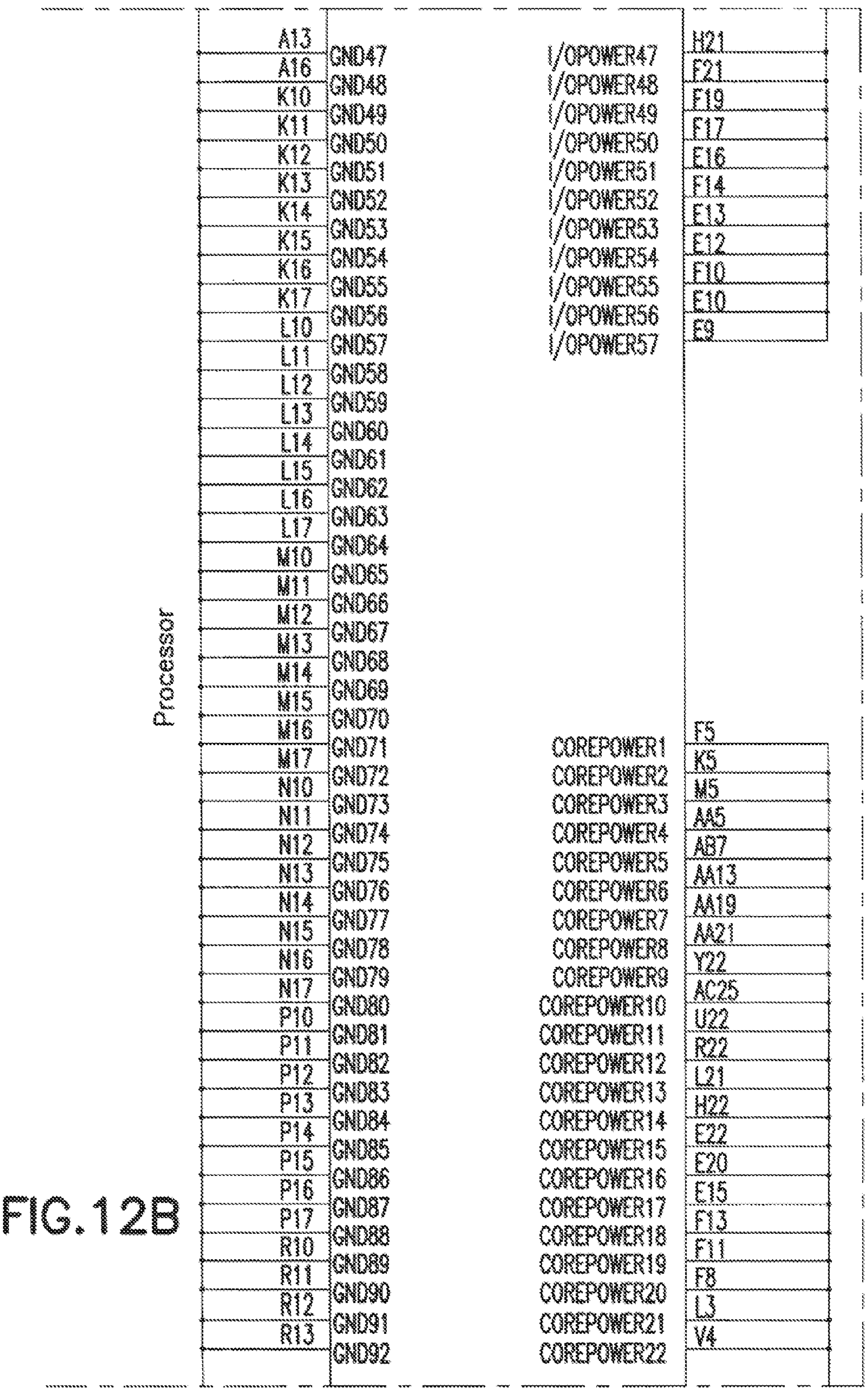
FIGS. 12B-12C is a schematic diagram showing power and ground to the CPU.
Figure 12C:
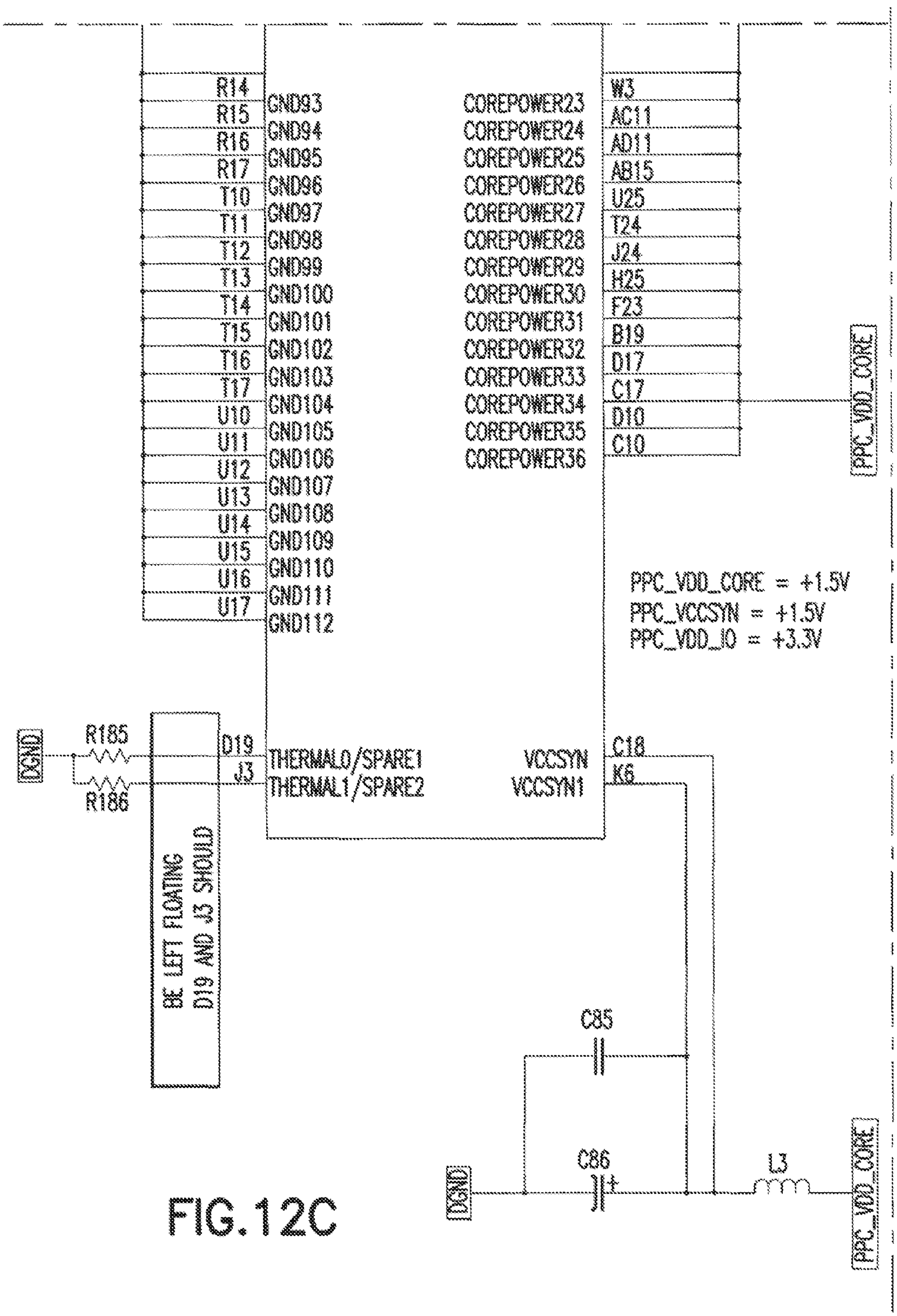

FIGS. 12B-12C shows power and ground to CPU 50 and a voltage decoupling circuit for CPU 50 and DSP 70.

Figure 12D:
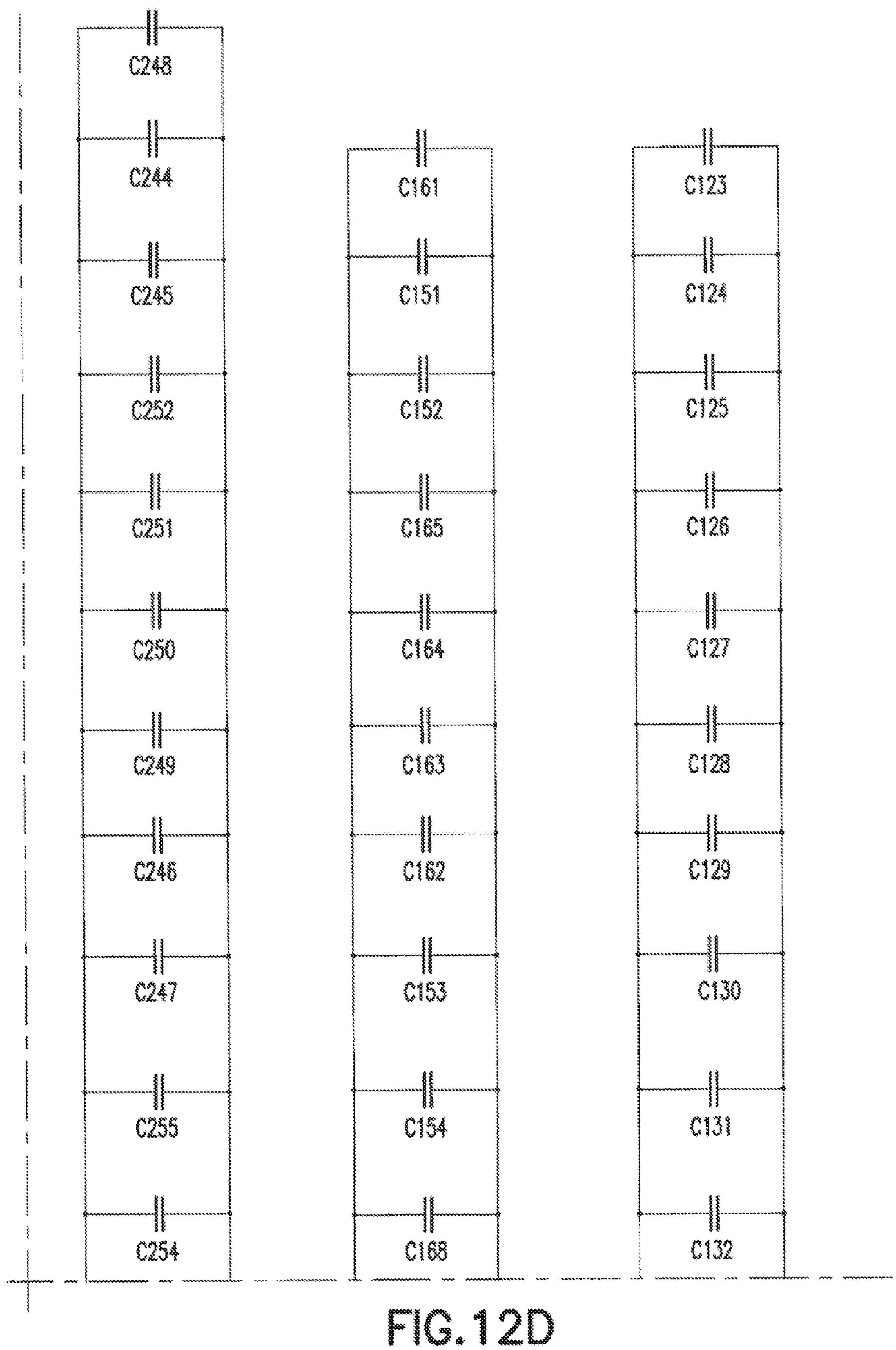
FIG. 12D is a schematic diagram showing more voltage decoupling circuitry for CPU and the DSP Processor 70.
Figure 12E:
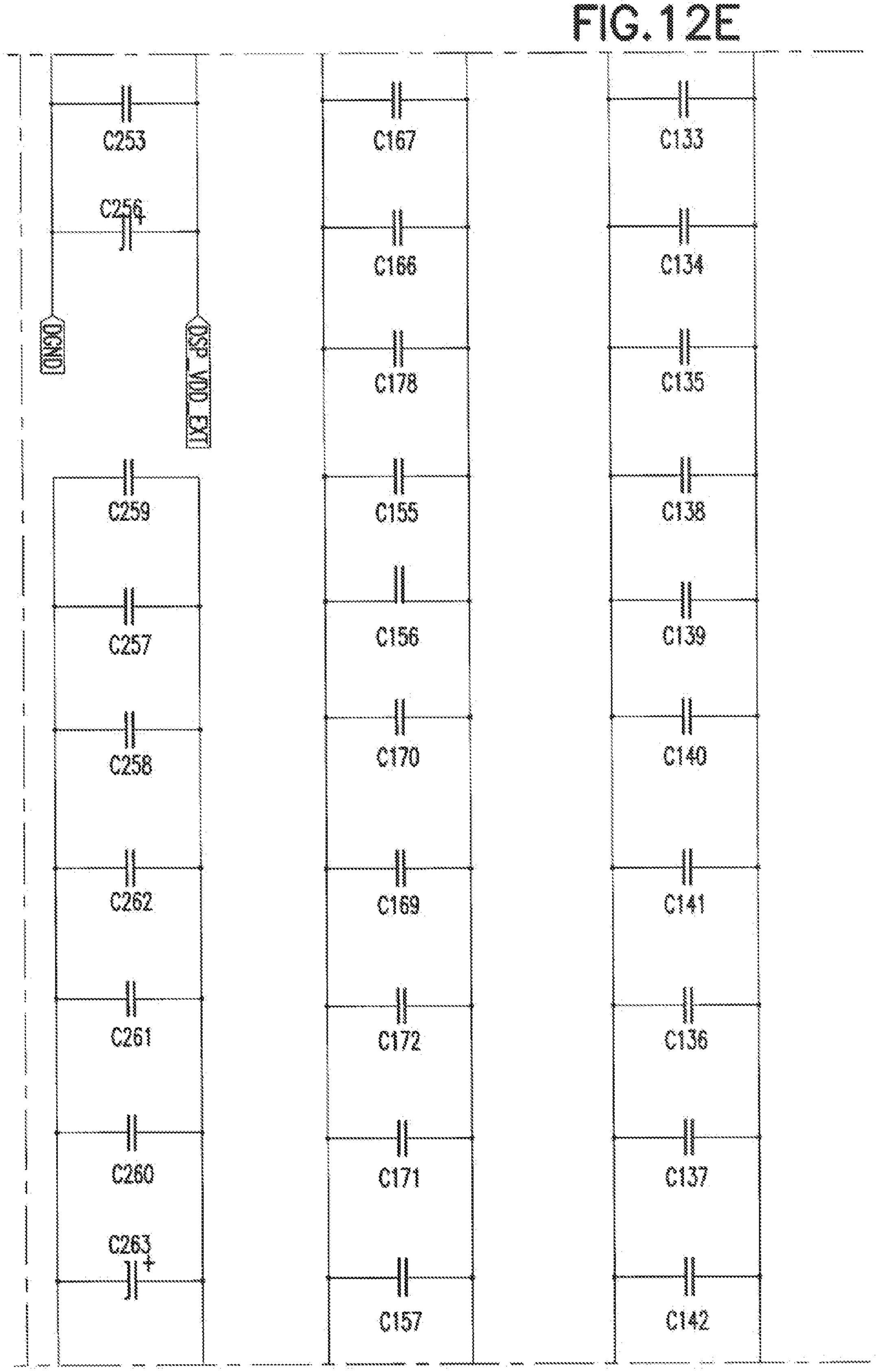
FIGS. 12E-12F is a schematic diagram showing voltage-decoupling circuit for CPU and for the DSP Processor 70.
Figures 12, 12F:
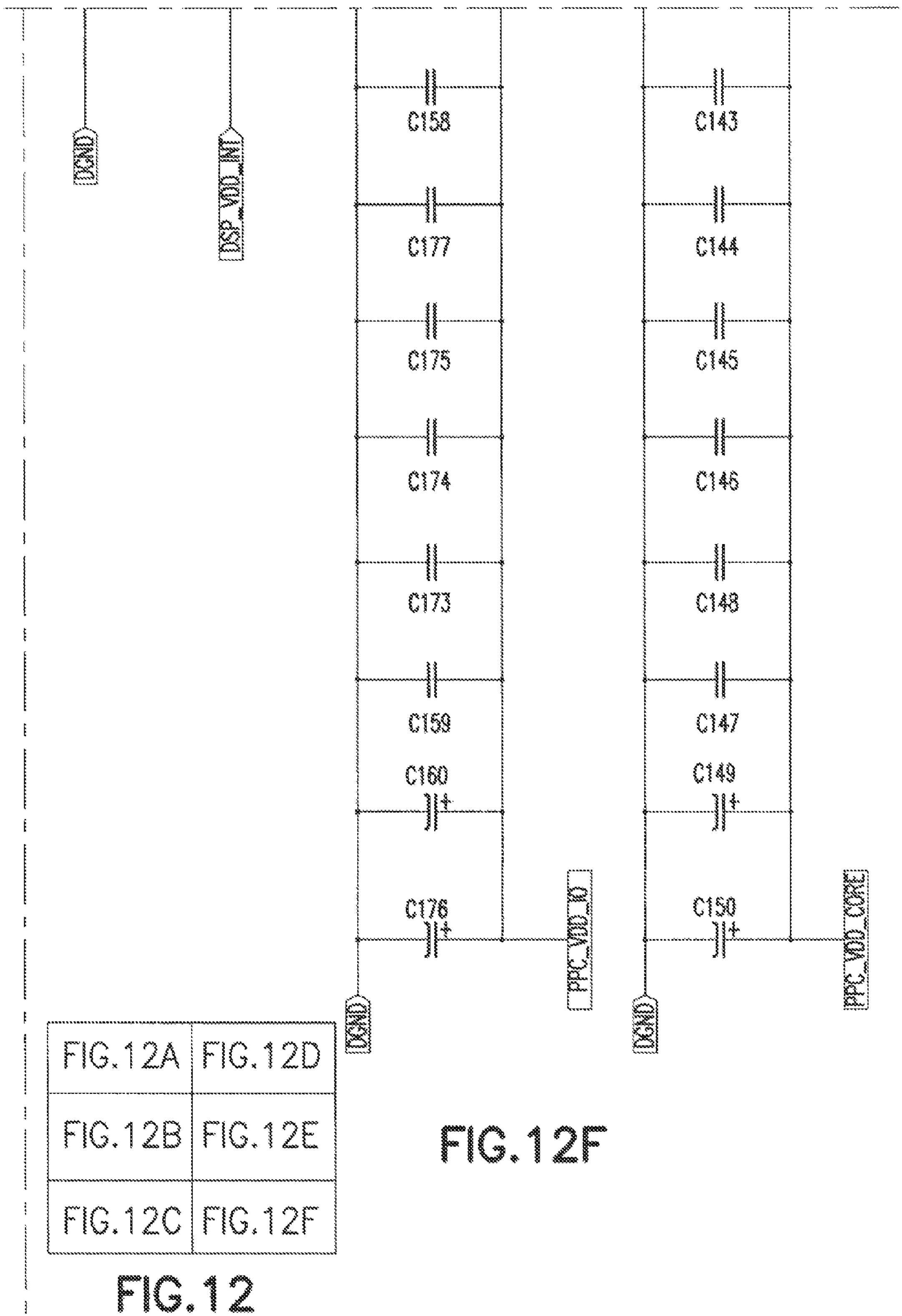

FIGS. 12E-12F shows a voltage decoupling circuit for CPU 50 and DSP 70.

FIG. 12D shows more voltage decoupling circuitry for CPU 50 and DSP 70.

Figure 13A:
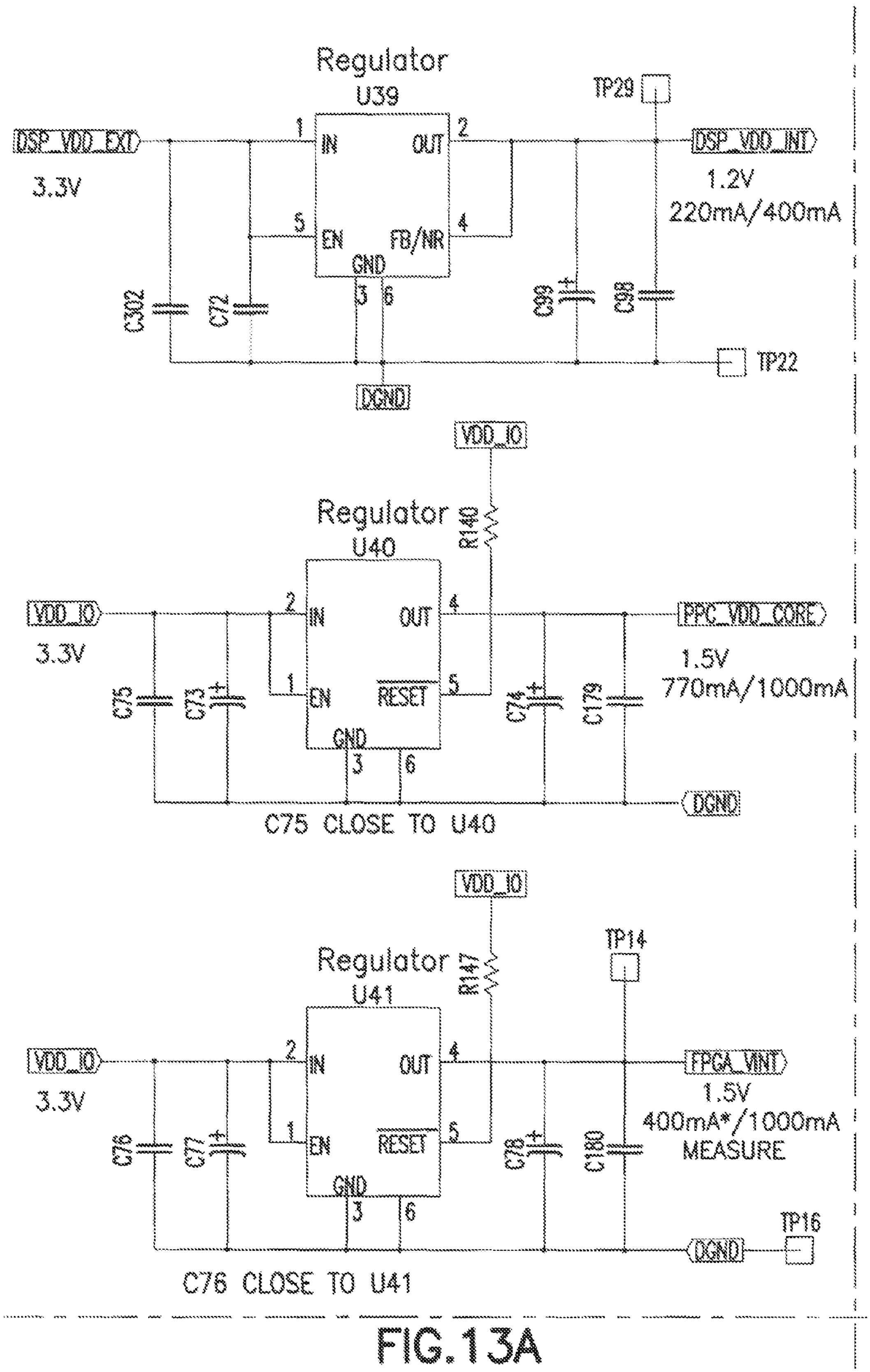
FIGS. 13A-13B is a schematic diagram showing voltage regulator for DSP Processor 70, CPU, FPGA and voltage regulator for transient capture A/D converters.
Figure 13B:
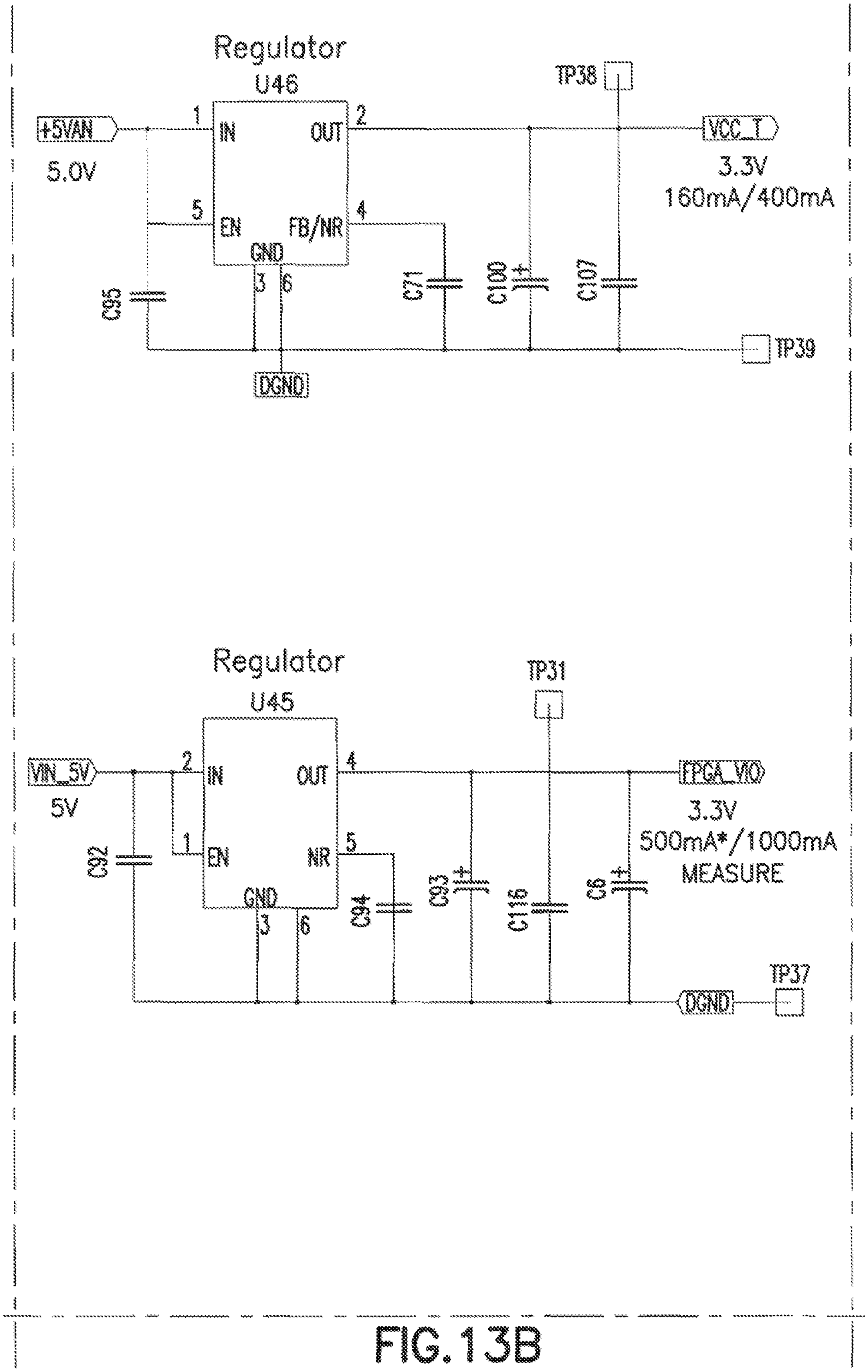

FIGS. 13A-13B shows a voltage regulator for DSP 70, CPU 50, and FPGA 80; and a voltage regulator for transient capture A/D converters.

Figure 13C:
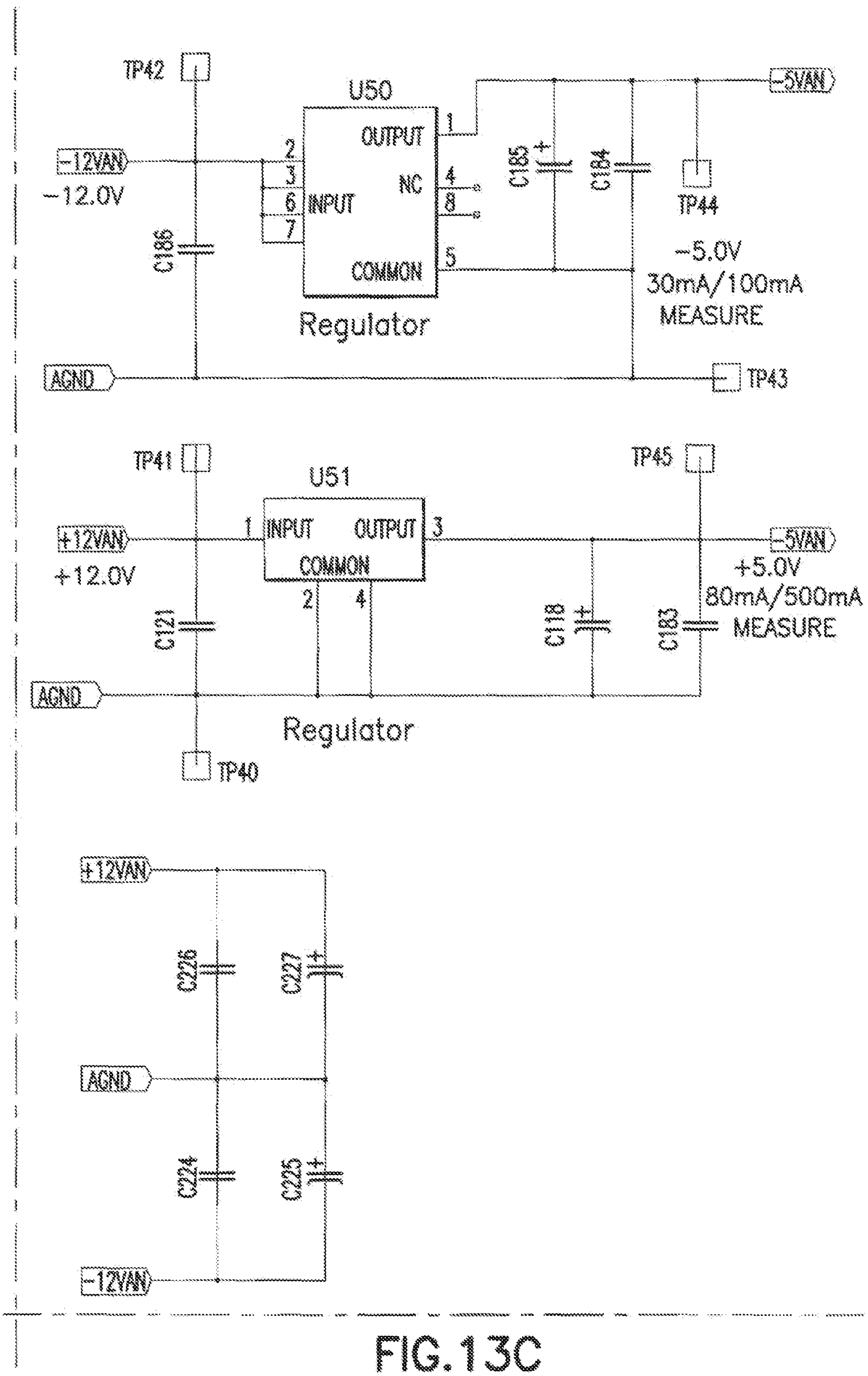
FIG. 13C Voltage regulator for transient detection circuitry and voltage decoupling capacitors and also is a schematic diagram showing DSP Processor 60 voltage decoupling circuits.

FIG. 13C shows a voltage regulator for transient detection circuitry and voltage decoupling capacitors used for reducing noise. It also shows DSP 60 decoupling circuits.

Figure 13D:
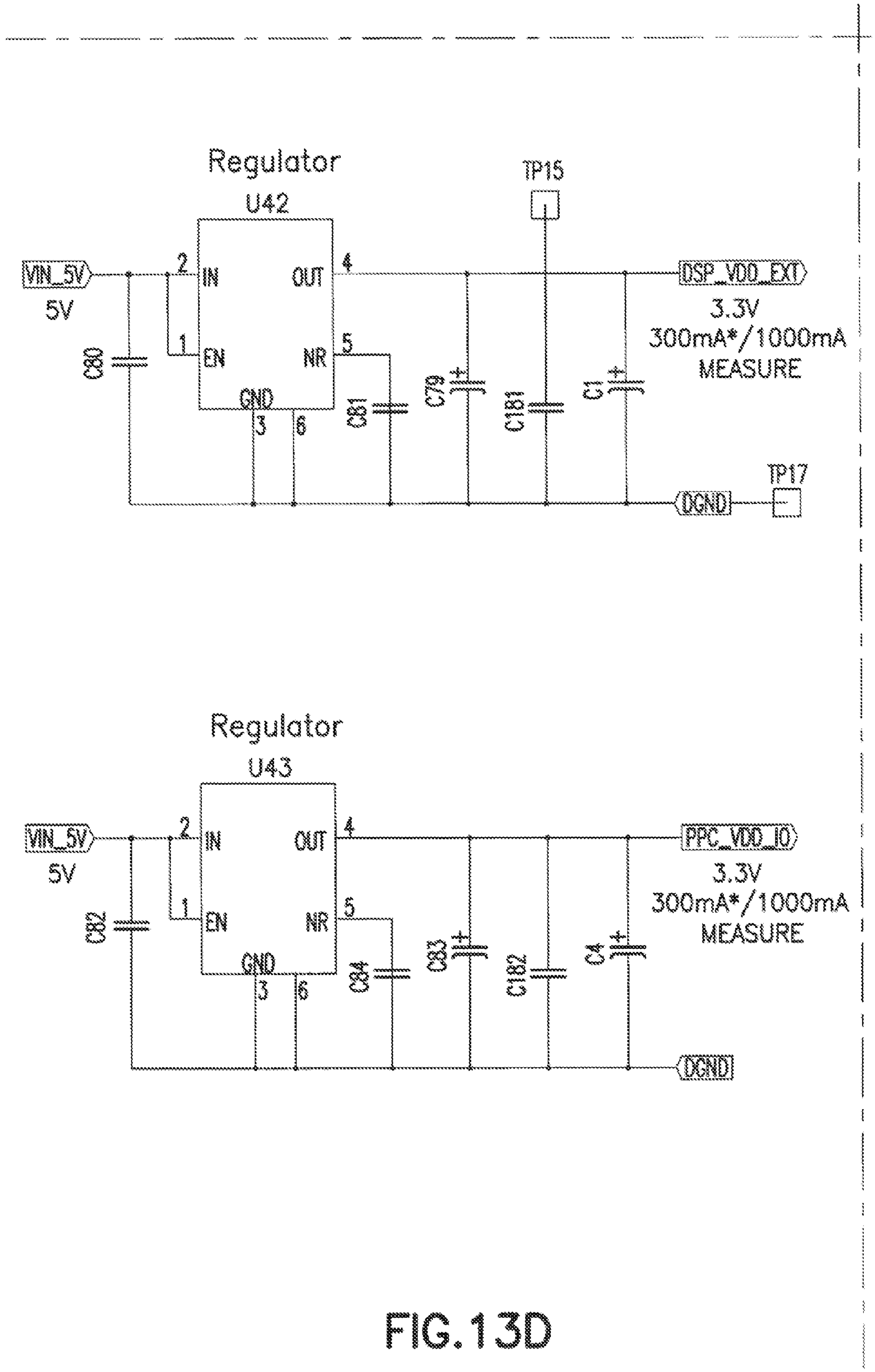
FIG. 13D is a schematic diagram showing voltage regulator for CPU and a voltage regulator for the DSP Processor.
Figure 13E:
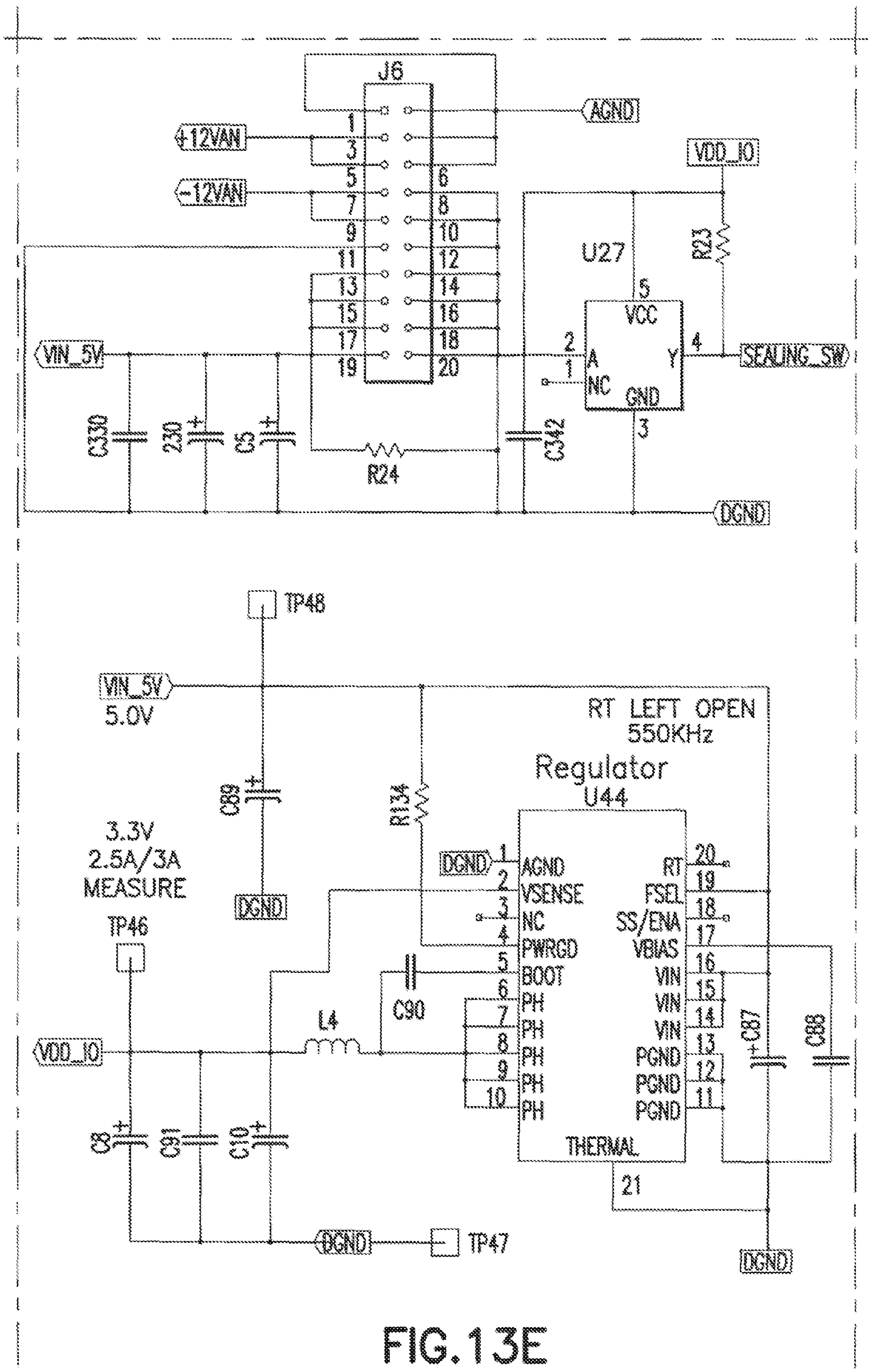
FIGS. 13E-13F shows a voltage regulator for miscellaneous digital logic and shows voltage-decoupling capacitors.
Figures 13, 13F:
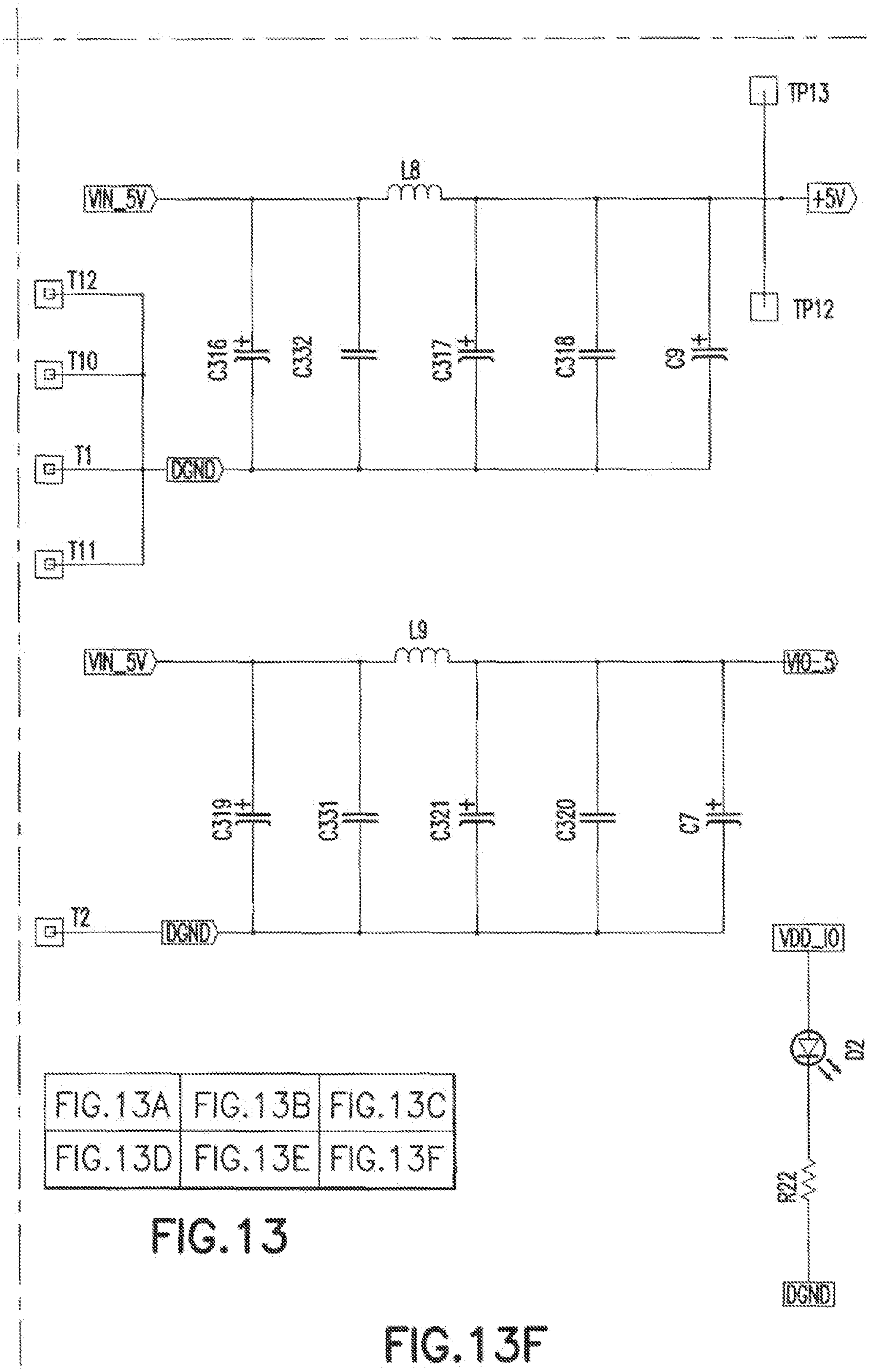

FIGS. 13E-13F shows a voltage regulator for miscellaneous digital logic and shows voltage-decoupling capacitors used for reducing noise. Also shown is a sealing switch buffer for security support.

FIG. 13D shows a voltage regulator for CPU 50 and a voltage regulator for DSP 70.

Figures 14, 14A:
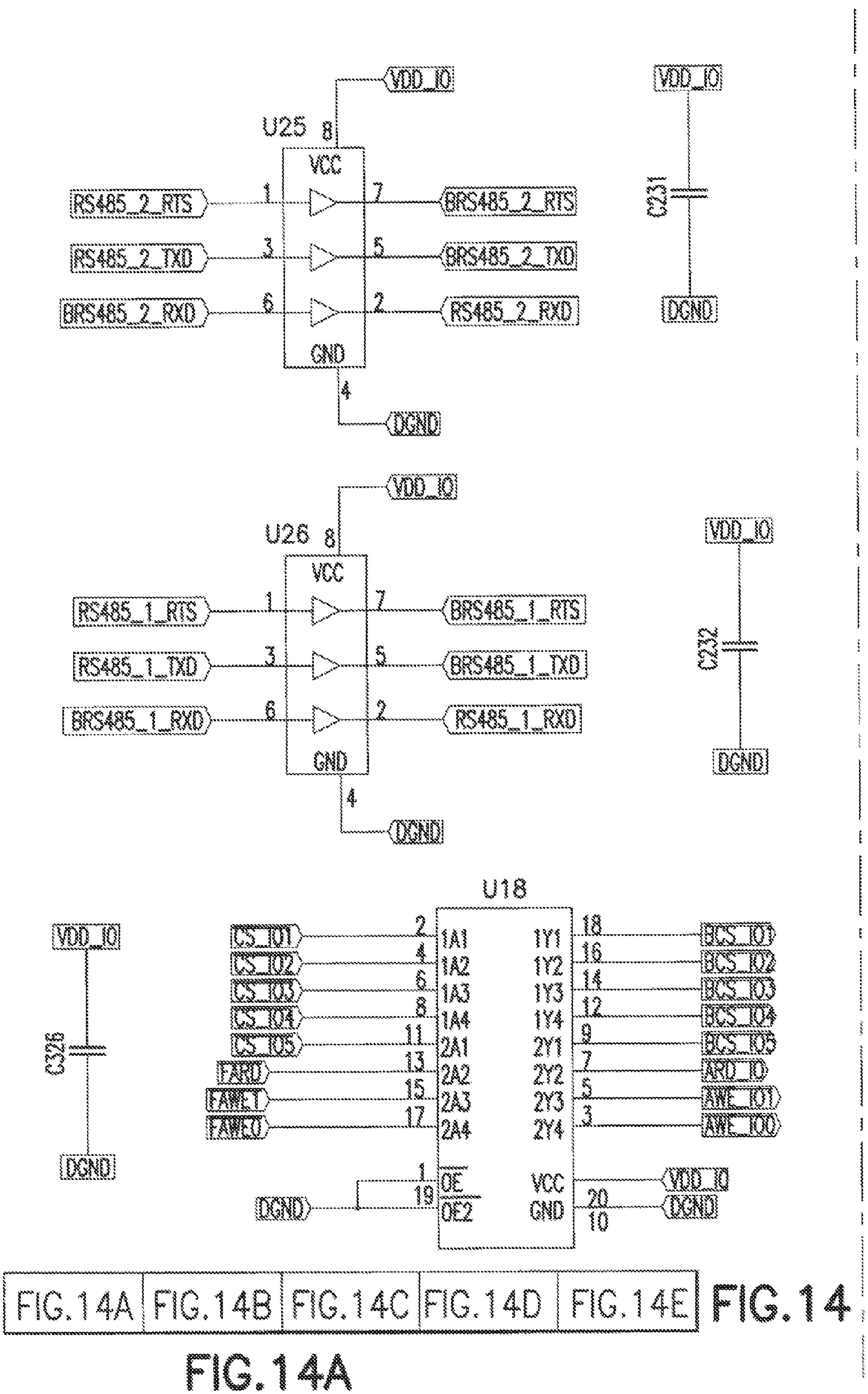
FIGS. 14A-14B is a schematic diagram showing buffers for I/O cards and I/O card 1 connector and signals.
Figure 14B:
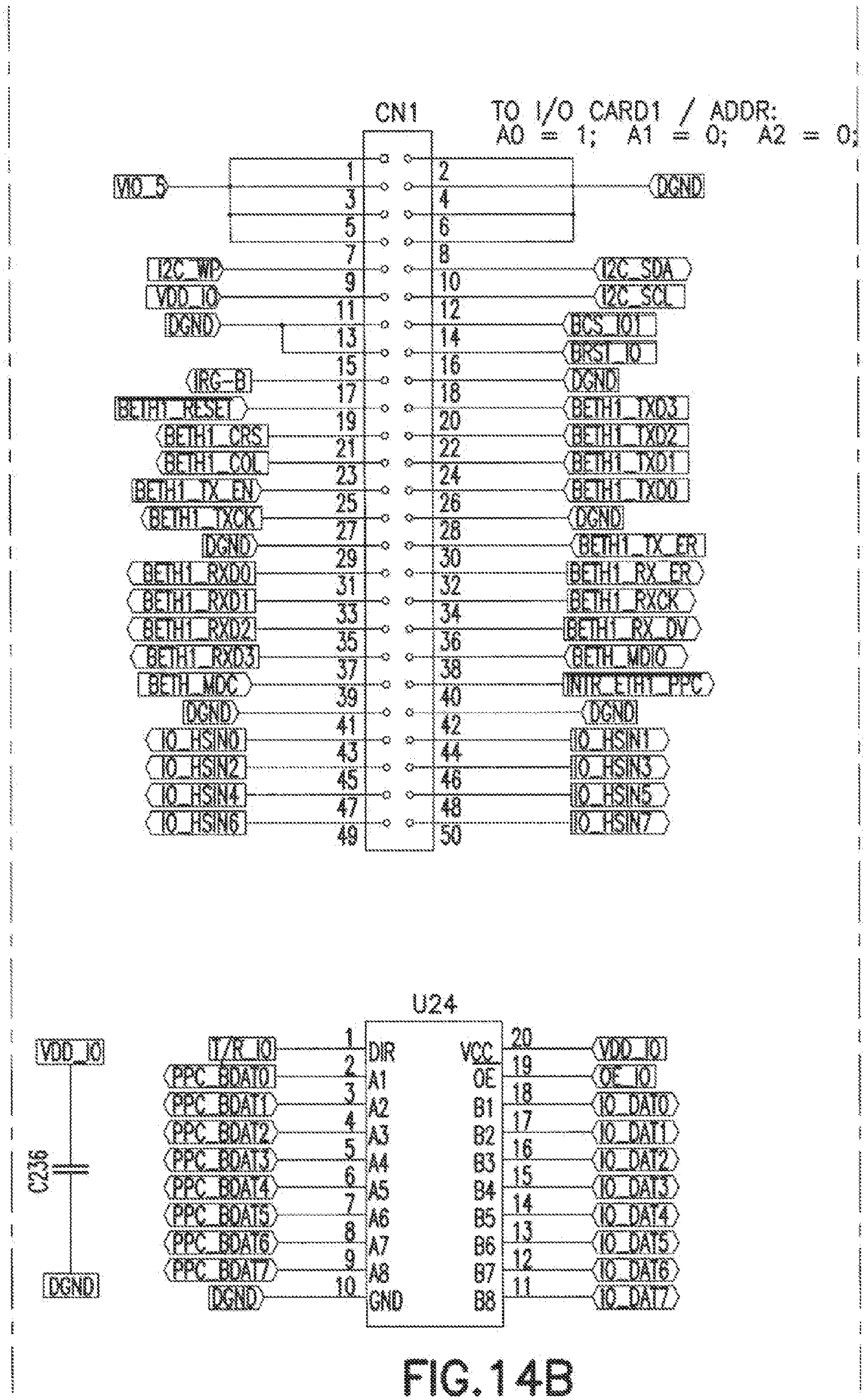

FIGS. 14A-14B shows buffers to support serial communications via I/O card 2; and I/O card 1's connector and signals. I/O card 1's connector and signals are used for Ethernet TCP/IP communication, IRIG-B, and the High Speed Digital Inputs. Also shown are the I2C bus signals used to communicate with and identify I/O card 1's characteristics.

Figure 14C:
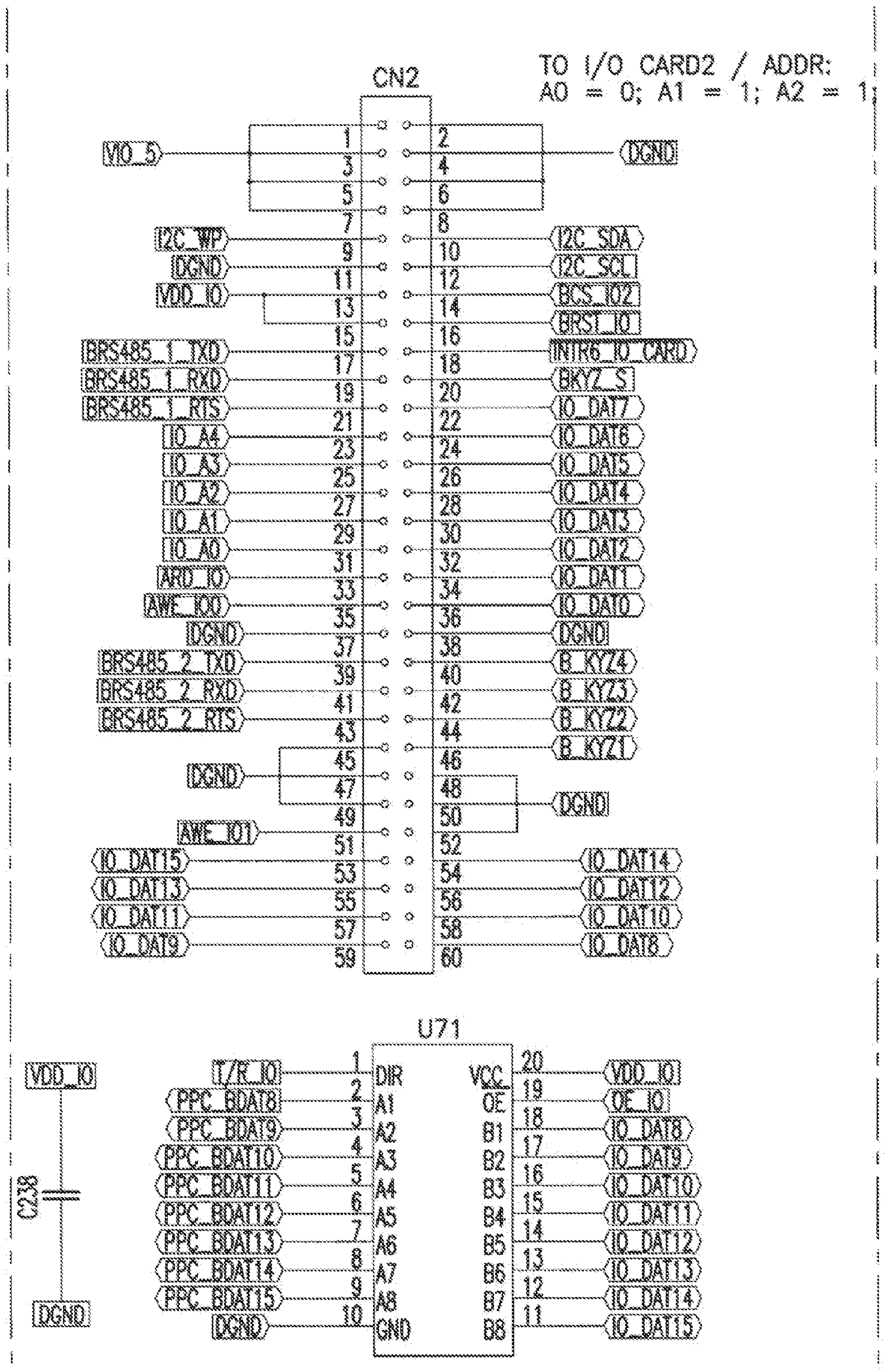
FIGS. 14C-14D is a schematic diagram showing I/O card 2 and I/O card 3 connectors and I/O signals.
Figure 14D:
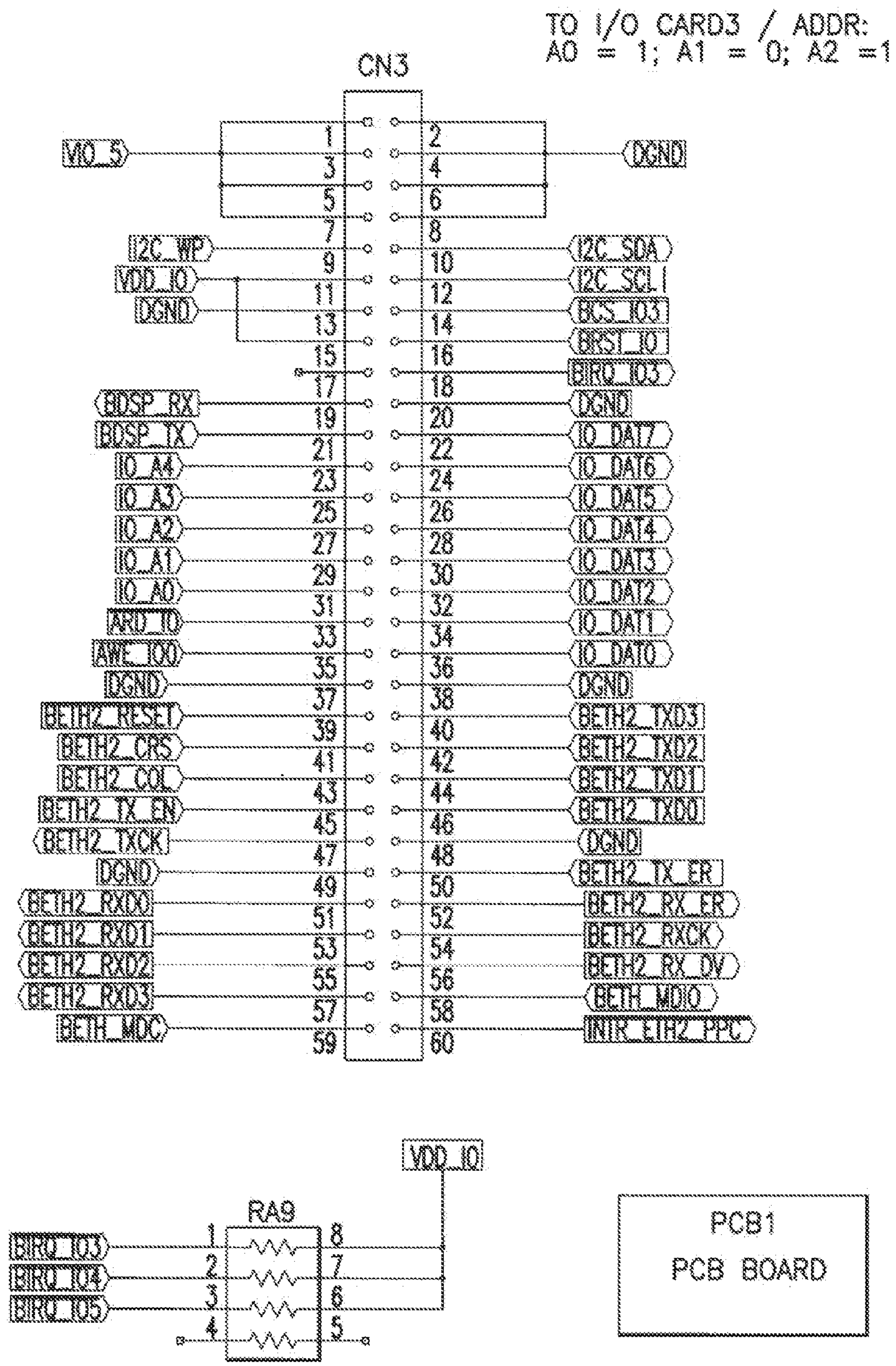

FIGS. 14C-14D shows I/O card 2 and I/O card 3 connectors and I/O signals. I/O Card 2's connector and signals are used for RS485 serial communication and to provide KYZ pulse outputs. I/O card 3's connector and signals are used for Ethernet TCP/IP communication. Also shown is the general-purpose data and address bus for use in I/O card slots 2 and 3; and also the I2C bus signals used to communicate with and identify I/O card characteristics.

Figure 14E:
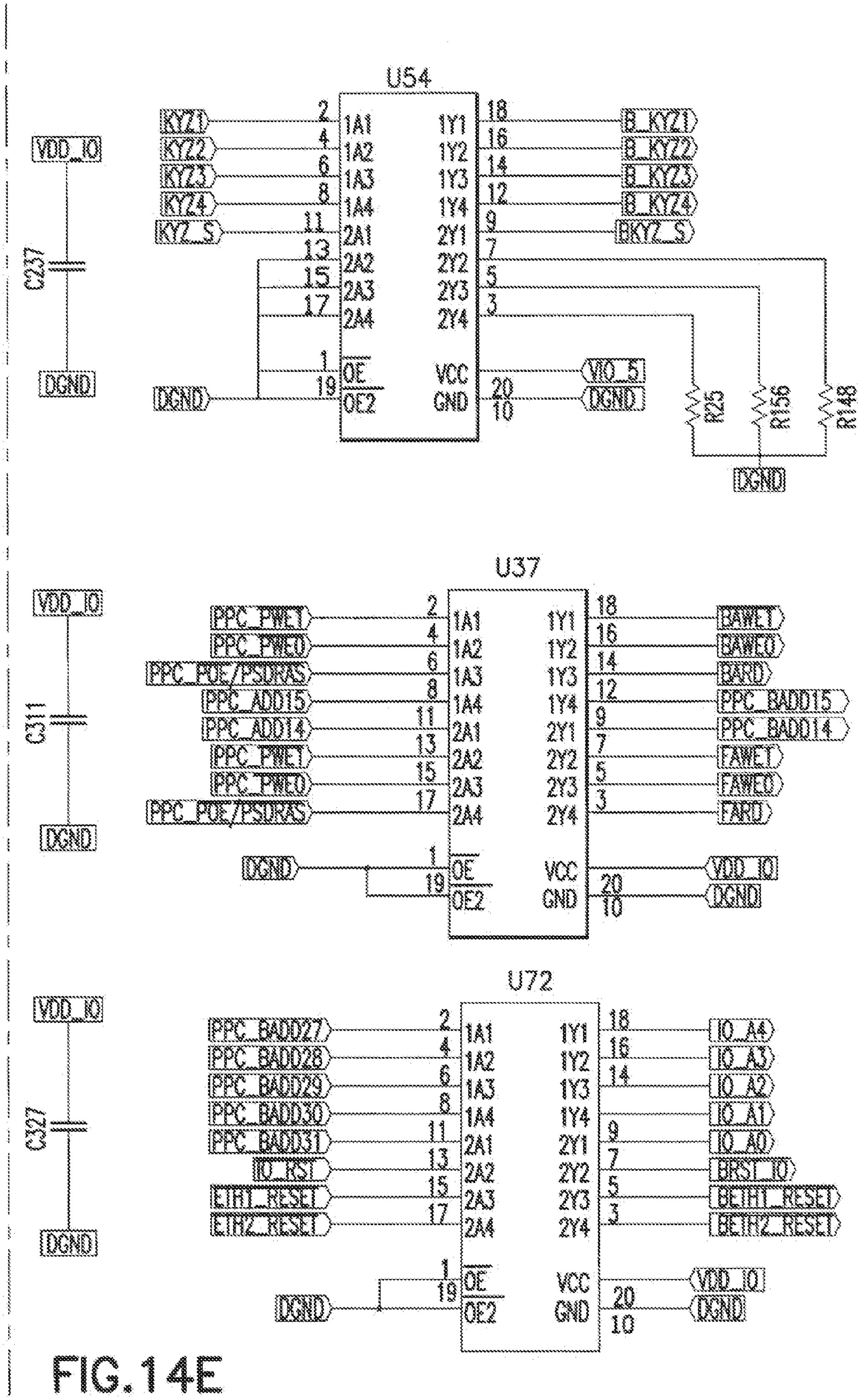
FIG. 14E is a schematic diagram showing I/O card buffers.

FIG. 14E shows I/O card buffers, used to buffer the signals going to the I/O cards.

Figures 15, 15A:
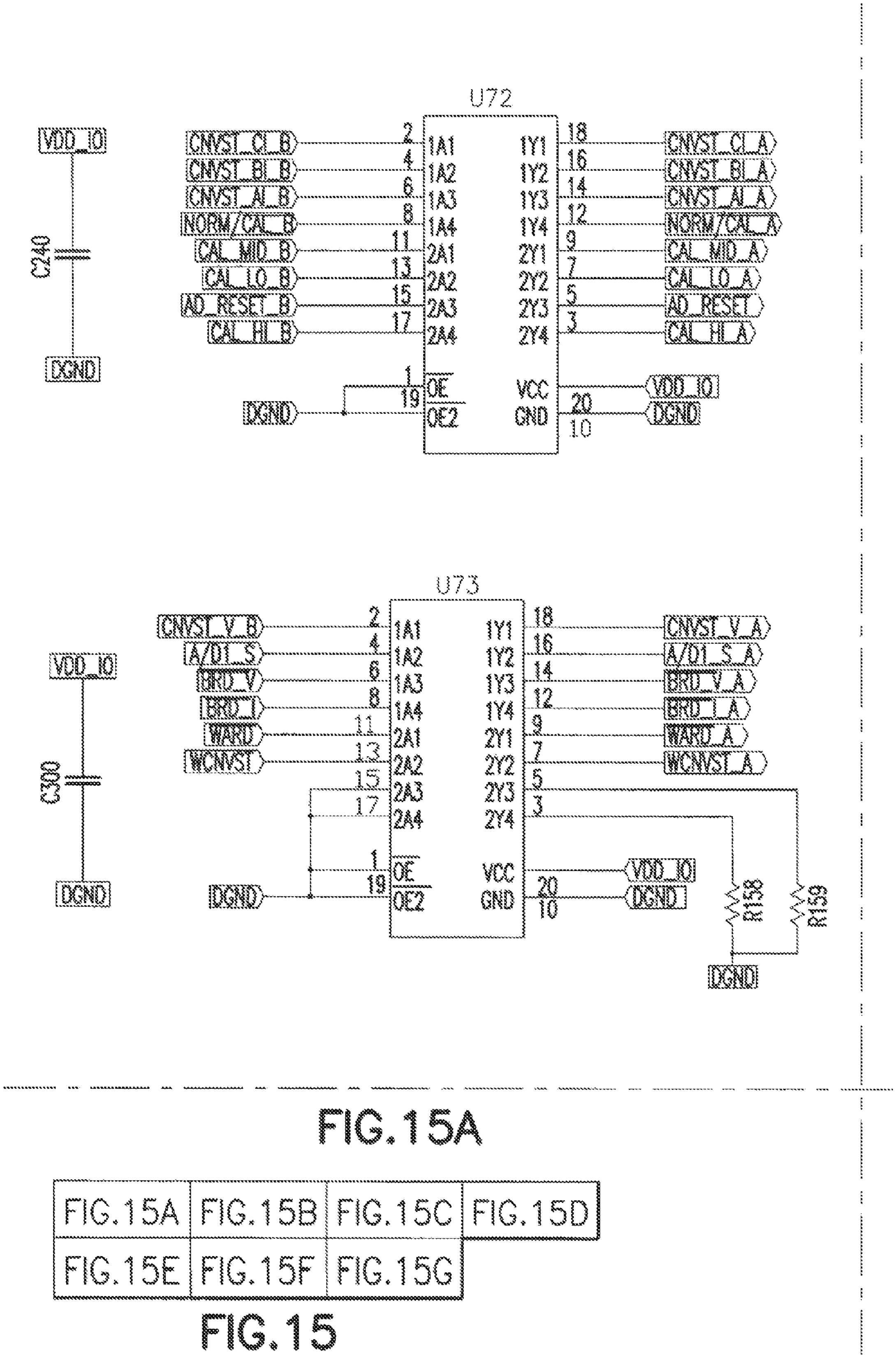
FIGS. 15A-15B is a schematic diagram showing I/O card buffers and analog input card connector and signals.
Figure 15B:
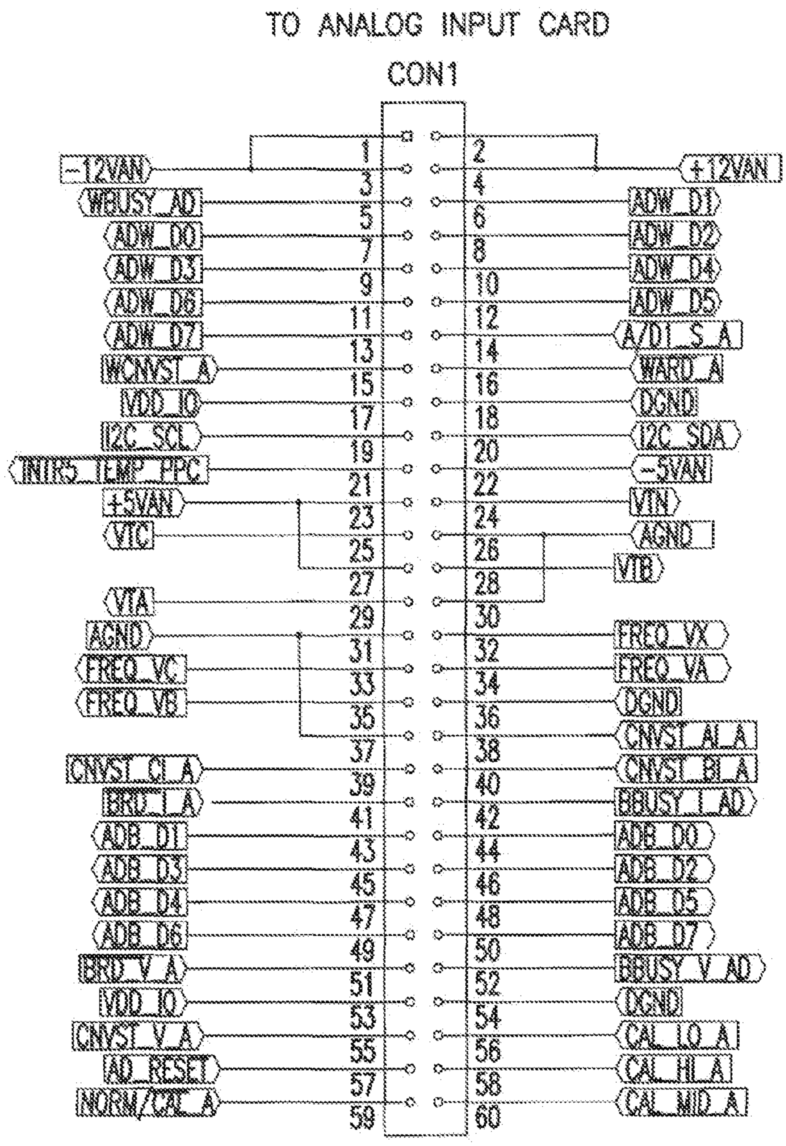

FIGS. 15A-15B shows logic buffers for interfacing to the analog board; and the Analog Input card connector and signals.

Figure 15C:
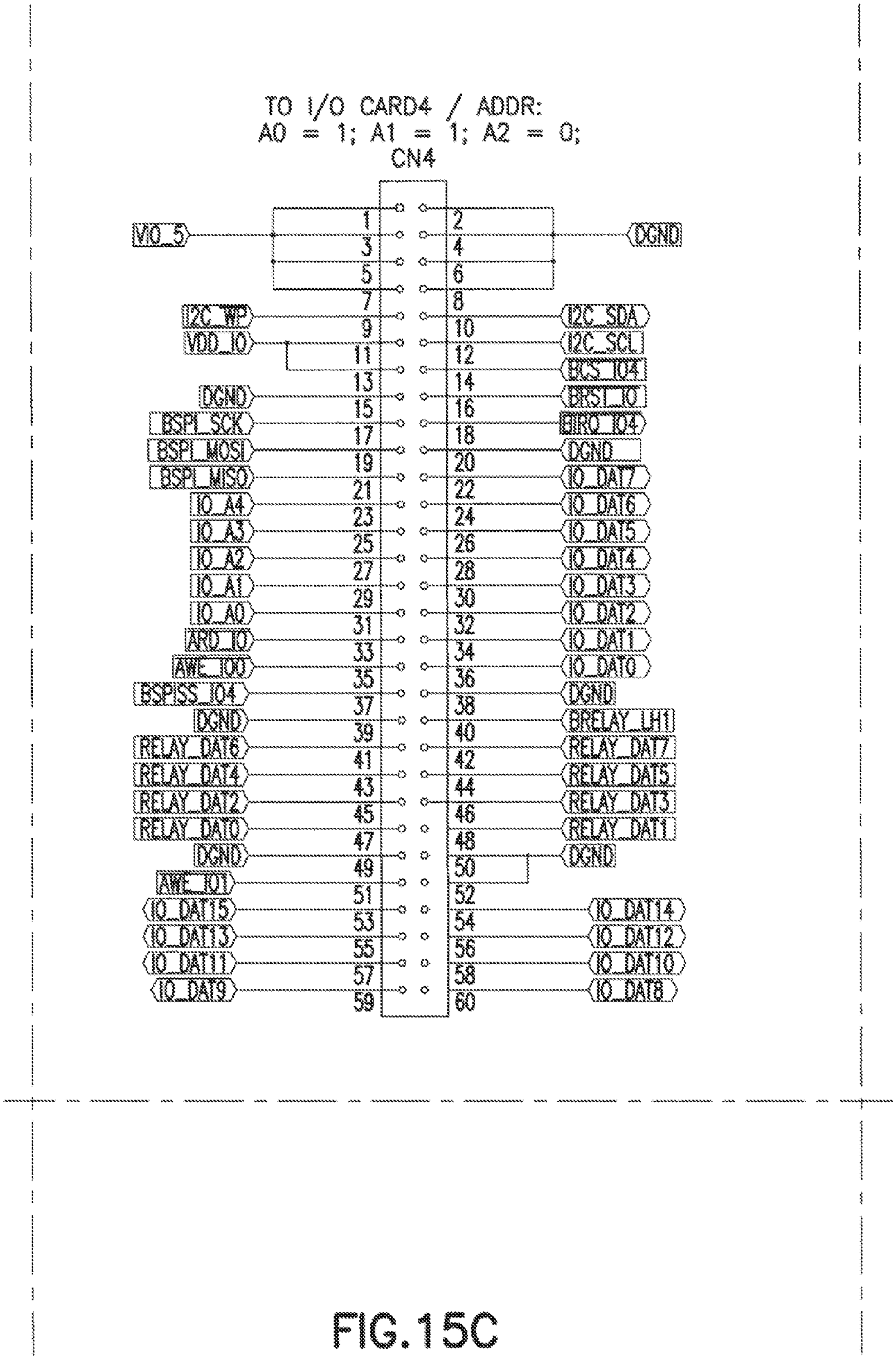
FIGS. 15C-15D is a schematic diagram showing I/O card 4 and I/O card 5 connectors and I/O signals.
Figure 15D:
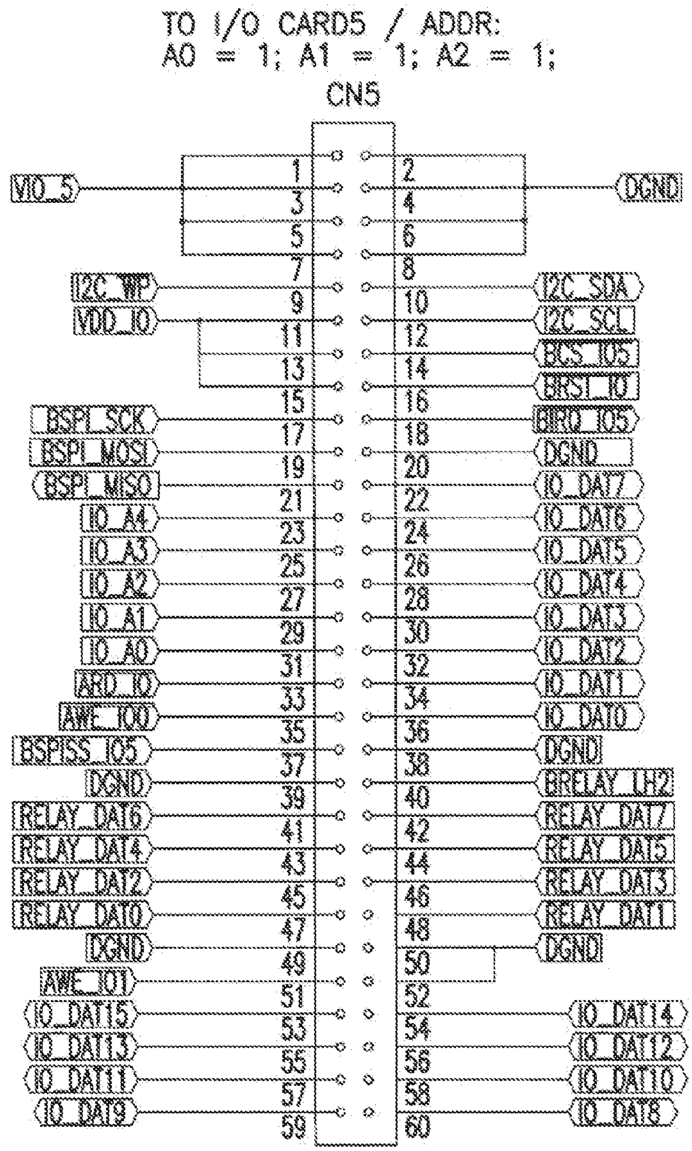

FIGS. 15C-15D shows I/O card 4 and I/O card 5 connectors and I/O signals. Also shown is the general-purpose data and address bus for use in I/O card slots 4 and 5; and the I2C bus signals used to communicate with and identify I/O card characteristics.

Figure 15E:
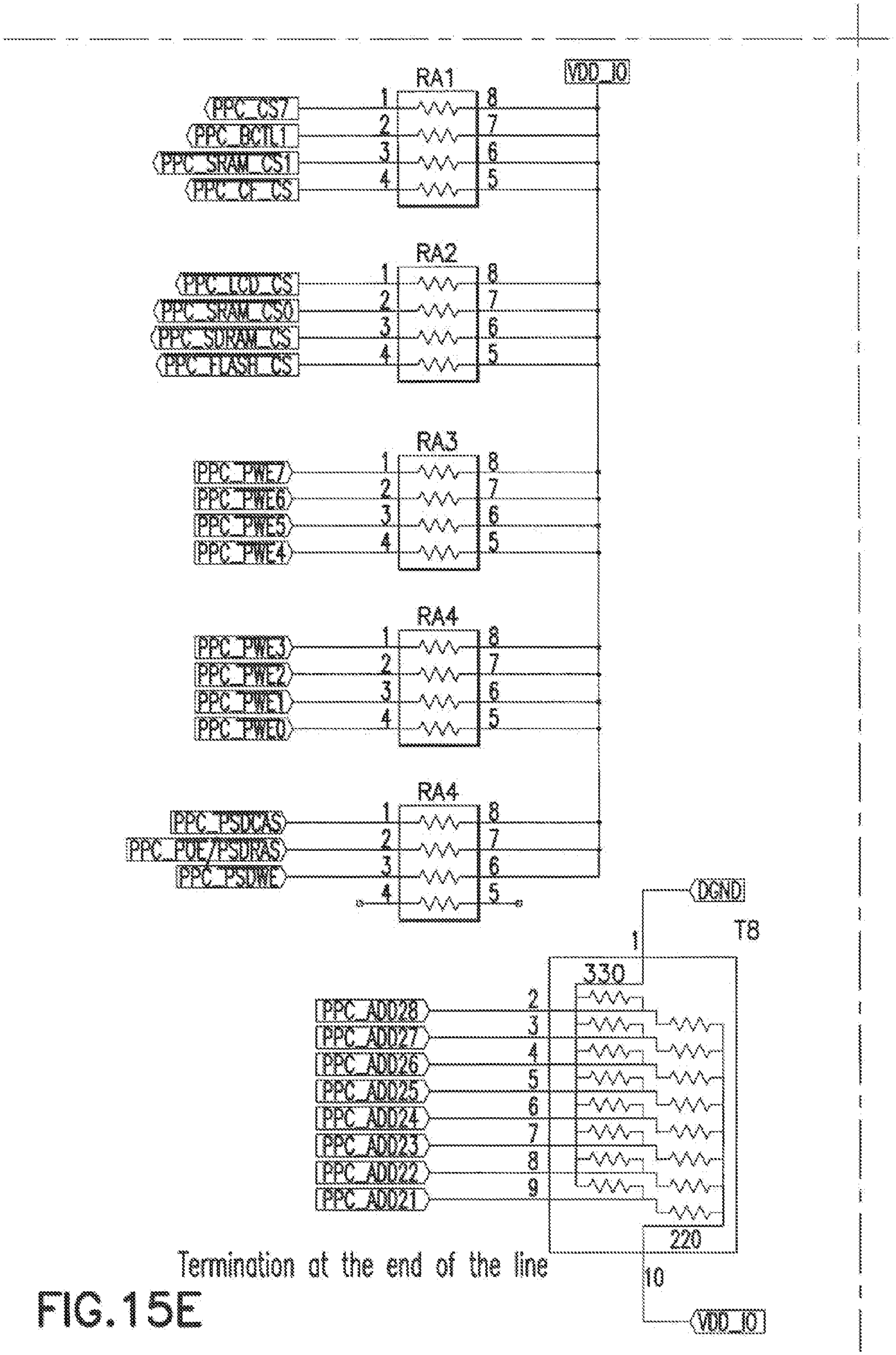
FIGS. 15E-15F is a schematic diagram showing I/O card termination resistors and CPU termination resistors.
Figure 15F:
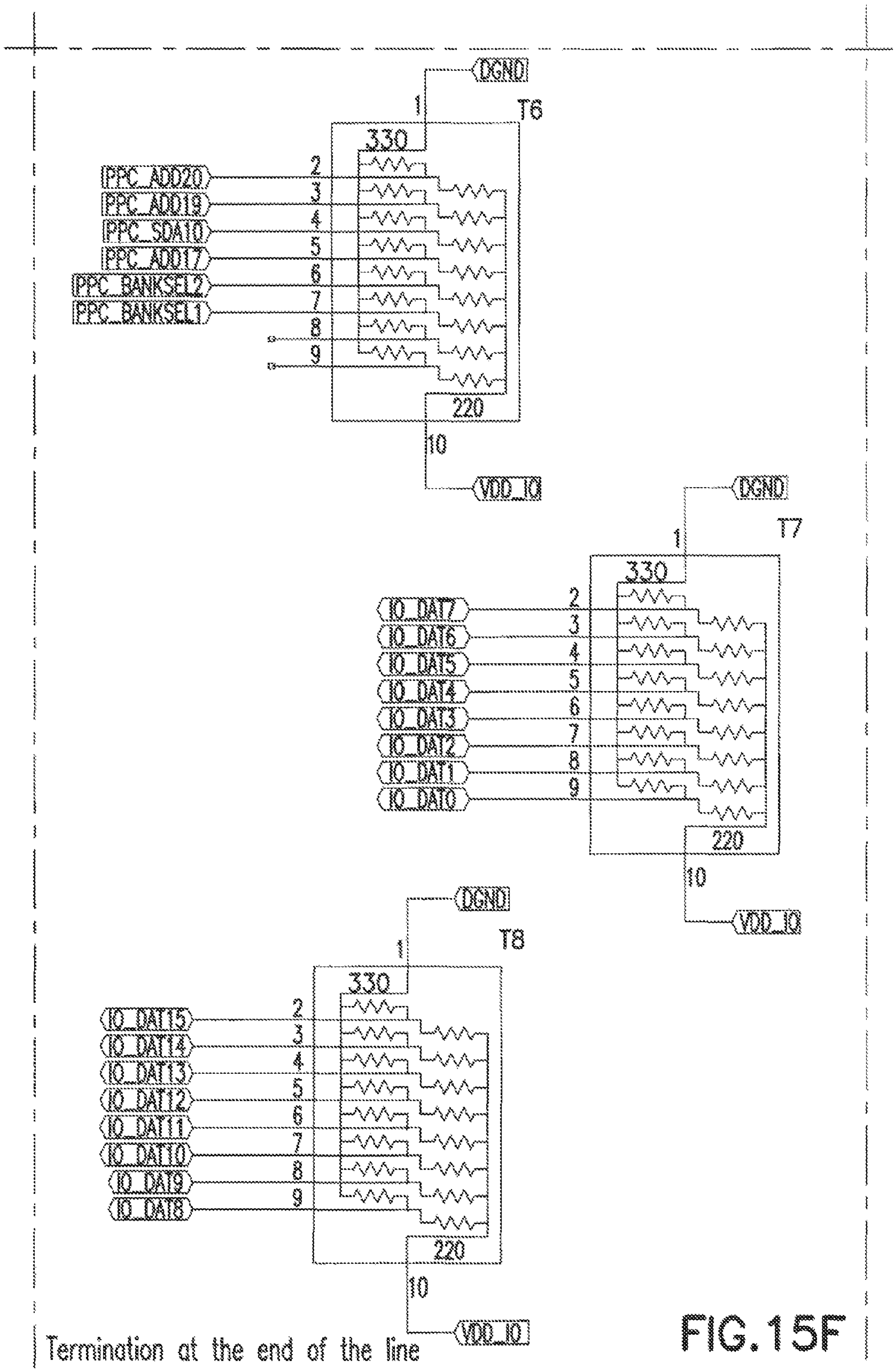
Figure 15G:
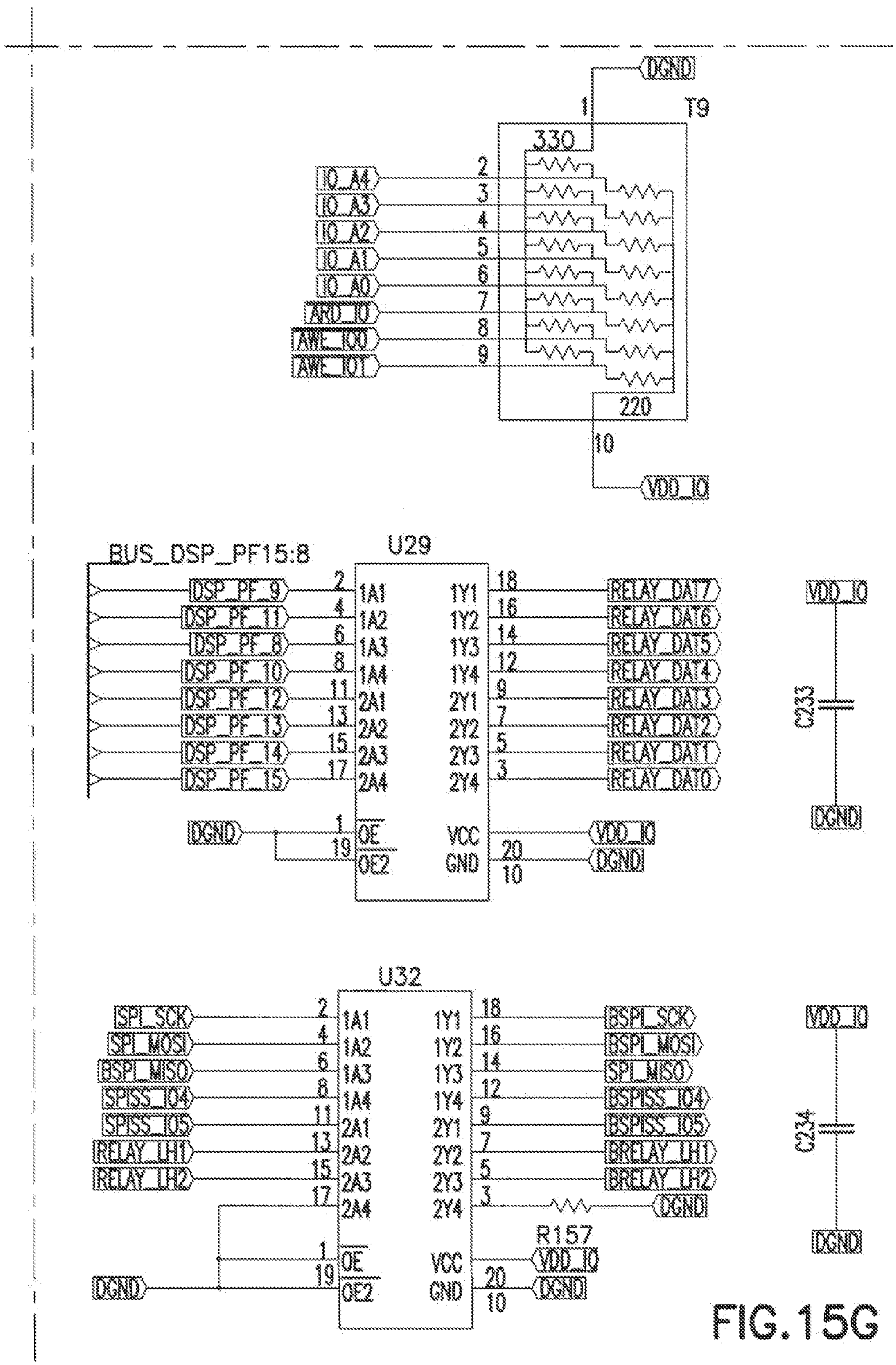
FIG. 15G is a schematic diagram showing I/O card buffers and termination resistors.

FIG. 15G shows I/O card buffers and termination resistors.

FIGS. 15E-15F shows I/O card termination resistors and CPU 50 termination resistors.

Figure 16A:
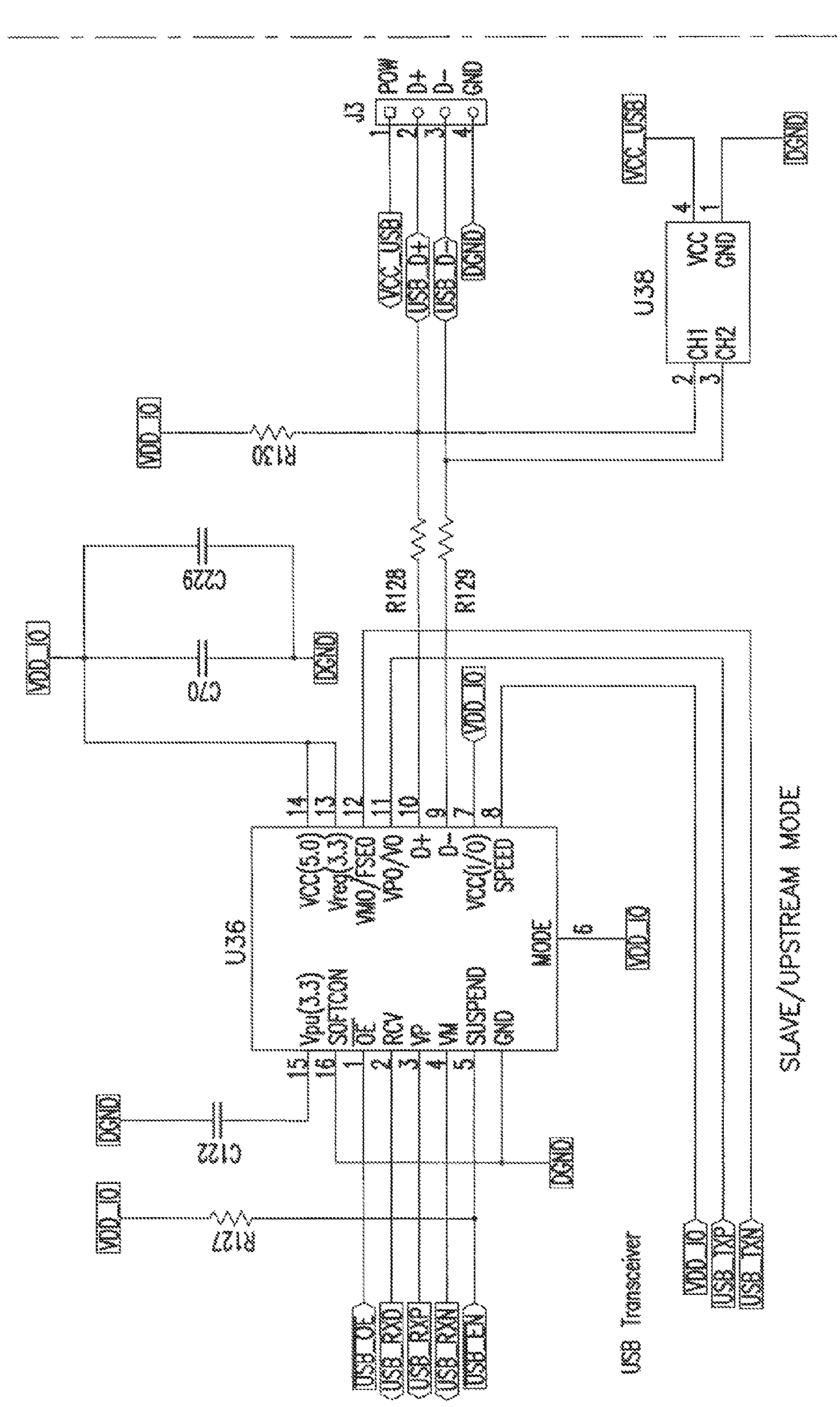
FIG. 16A is a schematic diagram showing USB transceiver and same miscellaneous signal buffers and USB clock oscillator.
Figure 16B:
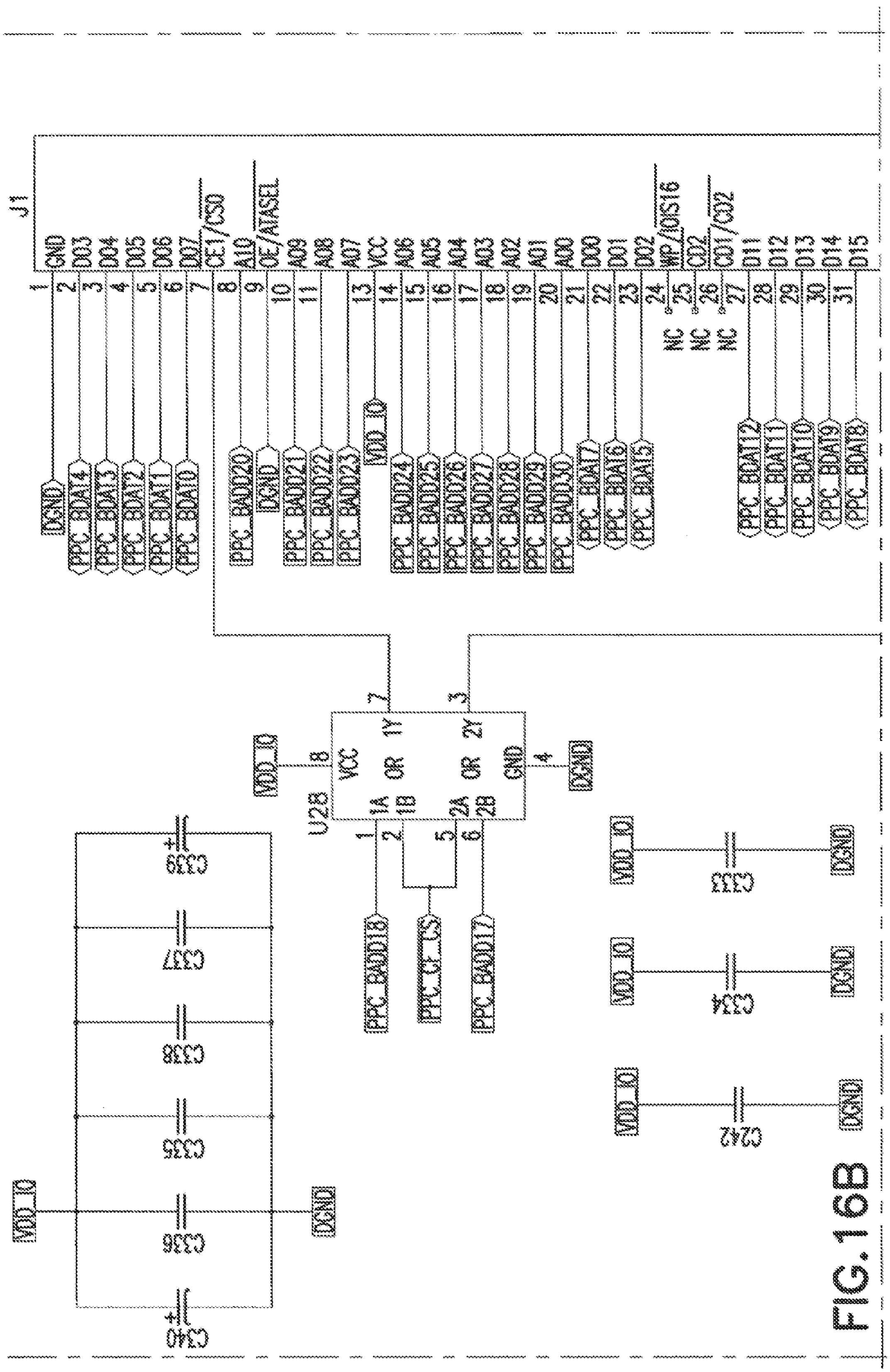
FIGS. 16-B-16C AND 16E-16F show compact flash connector interface and LCD controller and LCD buffers.
FIGS. 16D and 16G is a schematic diagram showing LCD I/O connector, Audio DAC (Digital to Analog Converter) and front panel connectors and I/O Board buffers.
Figure 16C:
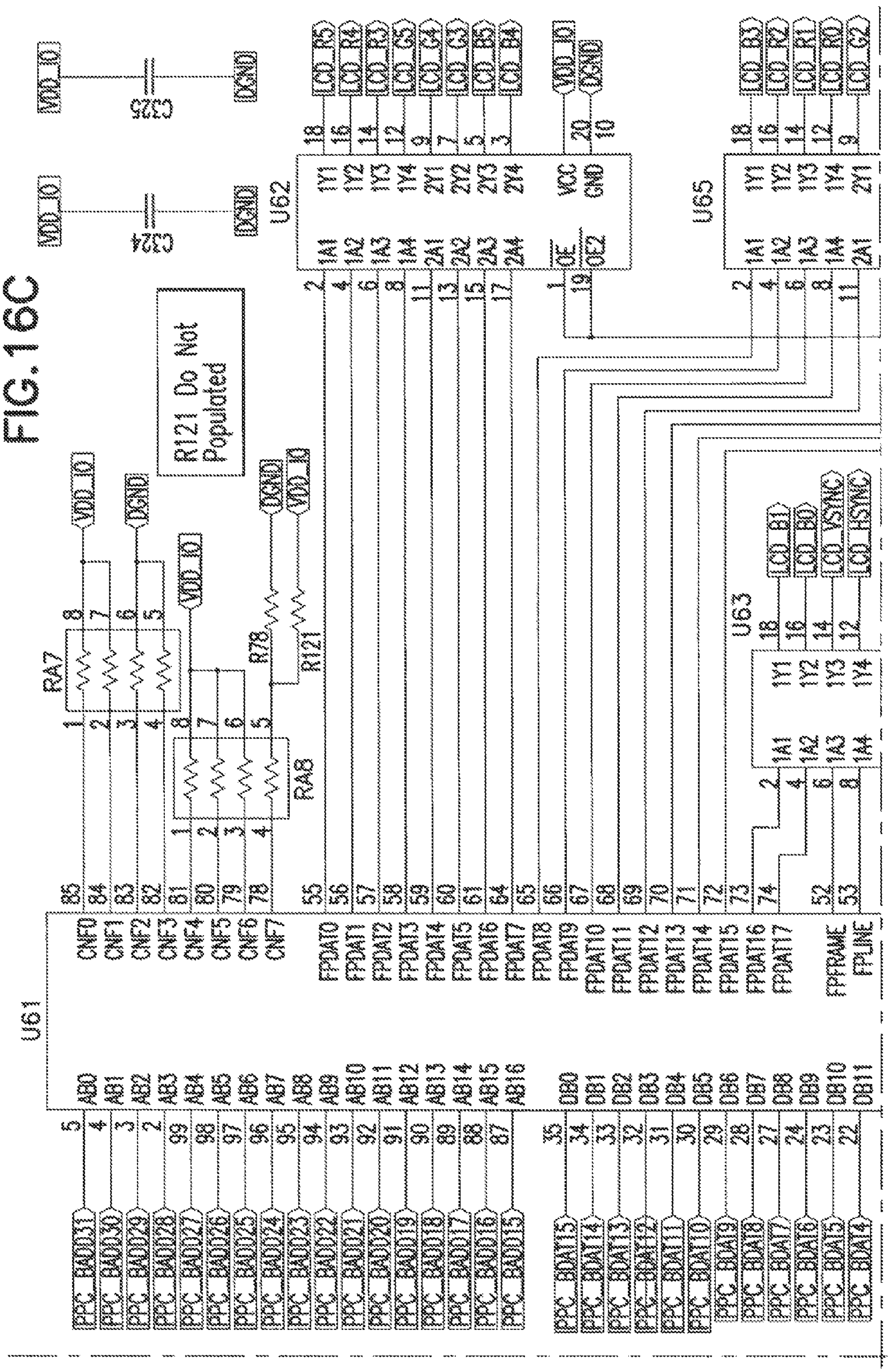

FIG. 16A shows a USB transceiver and connector, a USB clock oscillator, miscellaneous signal buffers, and decoupling capacitors.

FIGS. 16B-16C and 16E-16F show a compact Flash connector interface for non-volatile memory storage, used for storing captured waveform samples from the ADC. Also shown is an LCD controller and LCD buffers for the graphical backlit display.

Figure 16D:
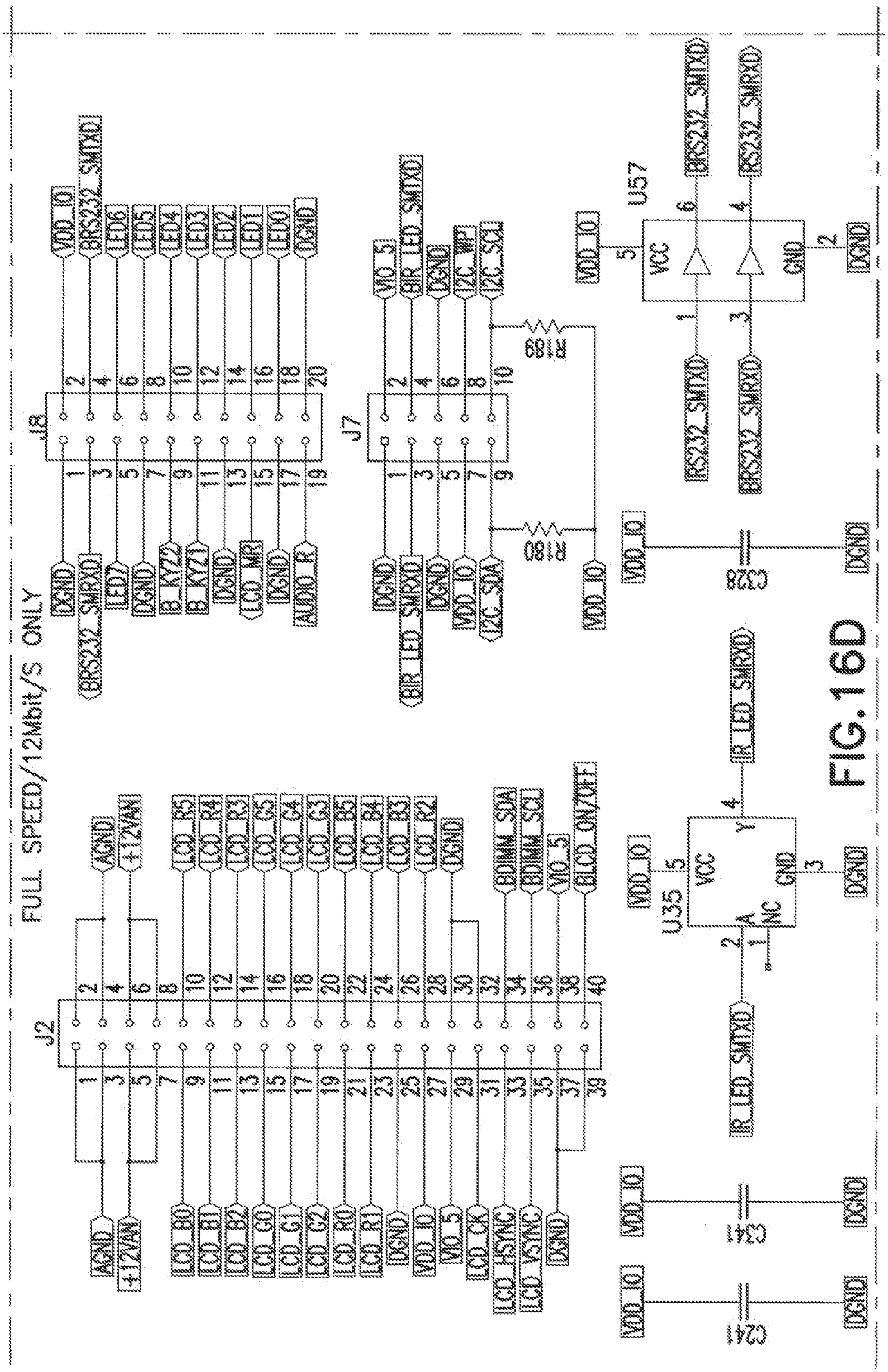
Figure 16E:
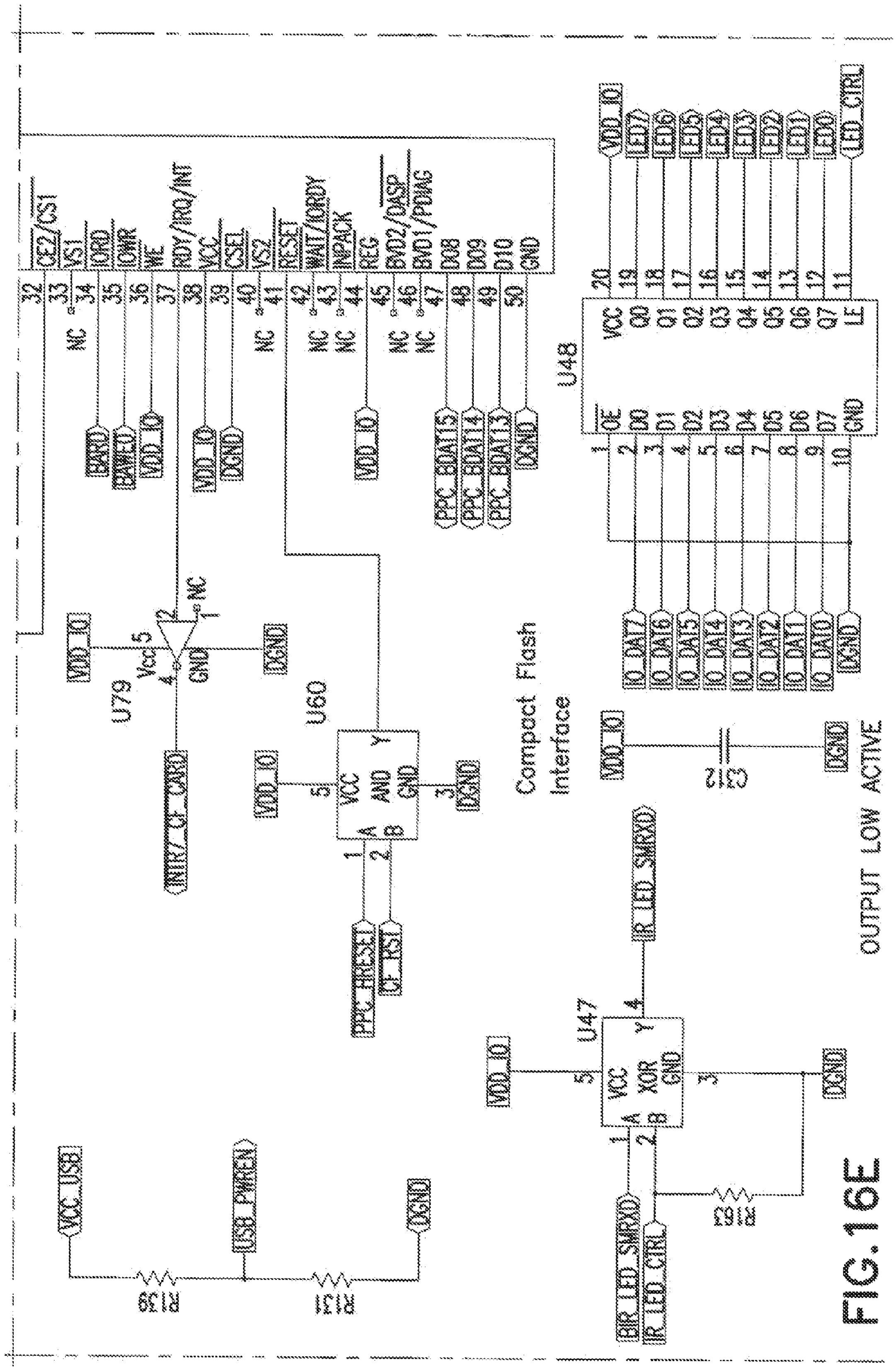
Figure 16F:
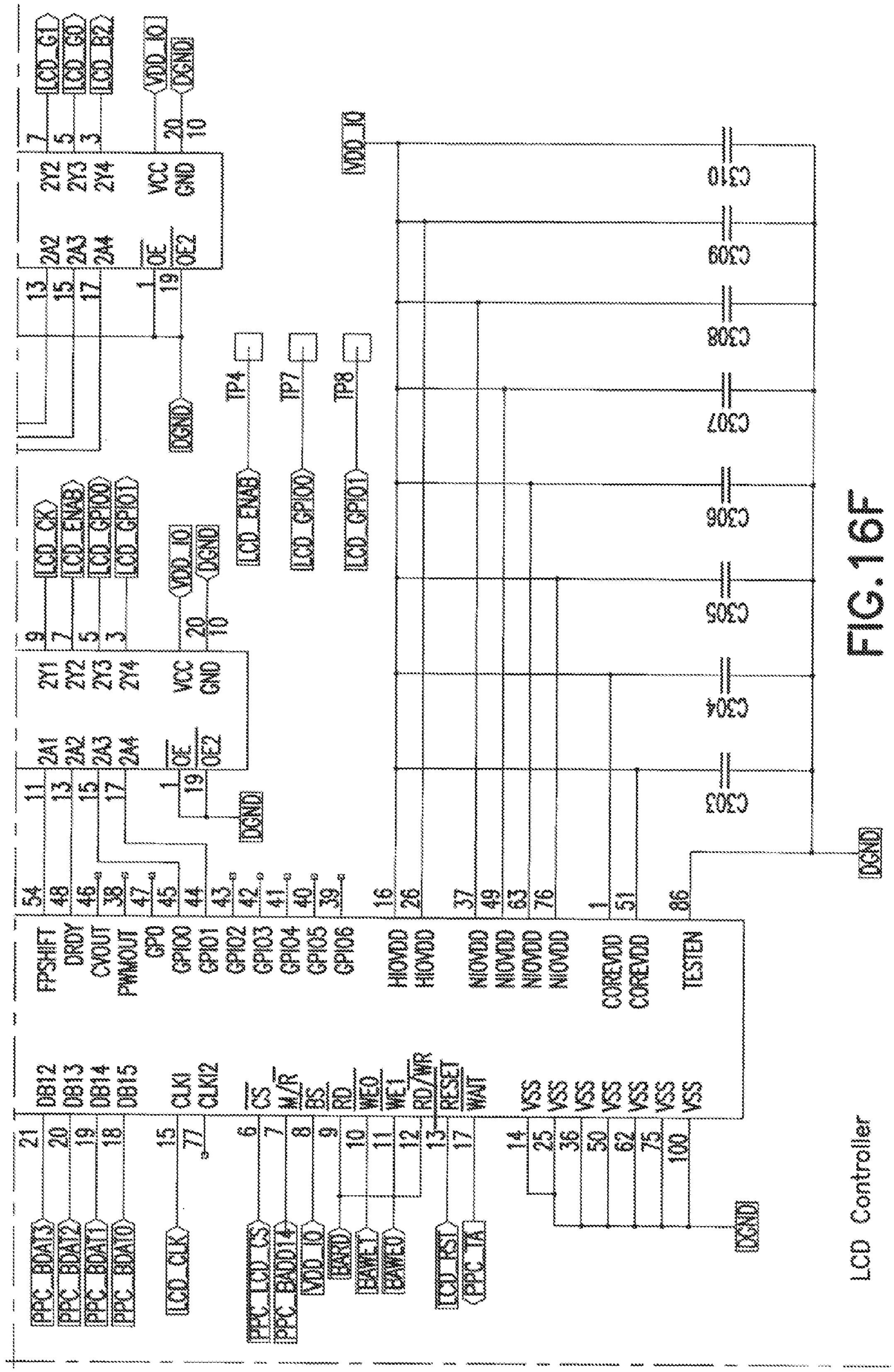
Figures 16, 16G:
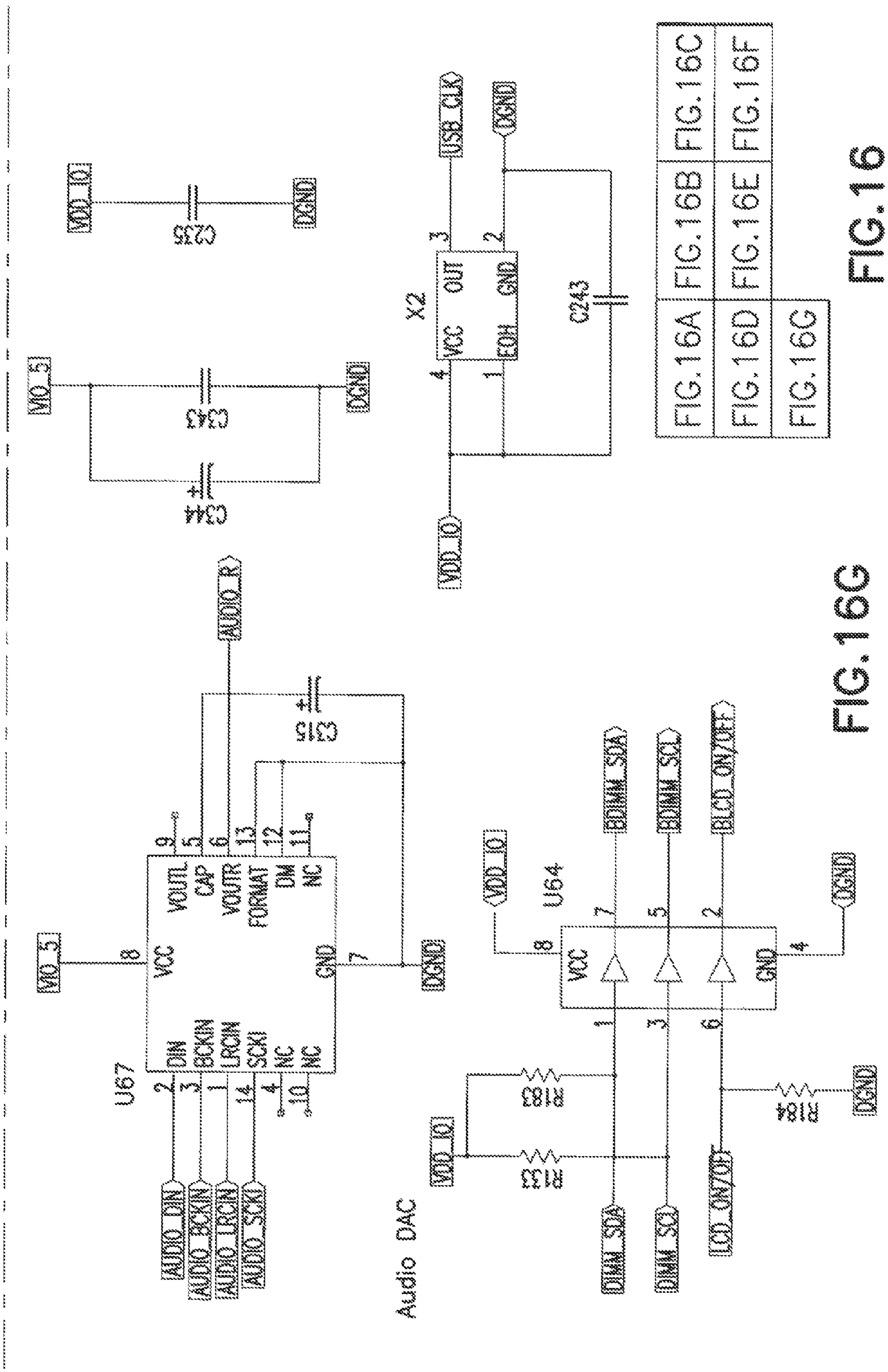

FIGS. 16D and 16G shows a LCD I/O connector for the graphical backlit display; Audio DAC (Digital to Analog Converter) for sound generation; front panel connectors and signals for interfacing to the front panel LEDs and Infrared LED; Infrared LED polarity control circuit; and I/O Board buffers.

FIGS. 17A-17B and 17D-17E together show real-time clock; Power-on Reset controller; DSP 60; voltage decoupling capacitors to reduce noise; and a crystal oscillator. Also shown are the DSP 60 data, address, and control busses that communicate with FPGA 80's dual port memory via voltage level translators that allow communication between CPU 50, DSP 60, and DSP 70.

Figure 17A:
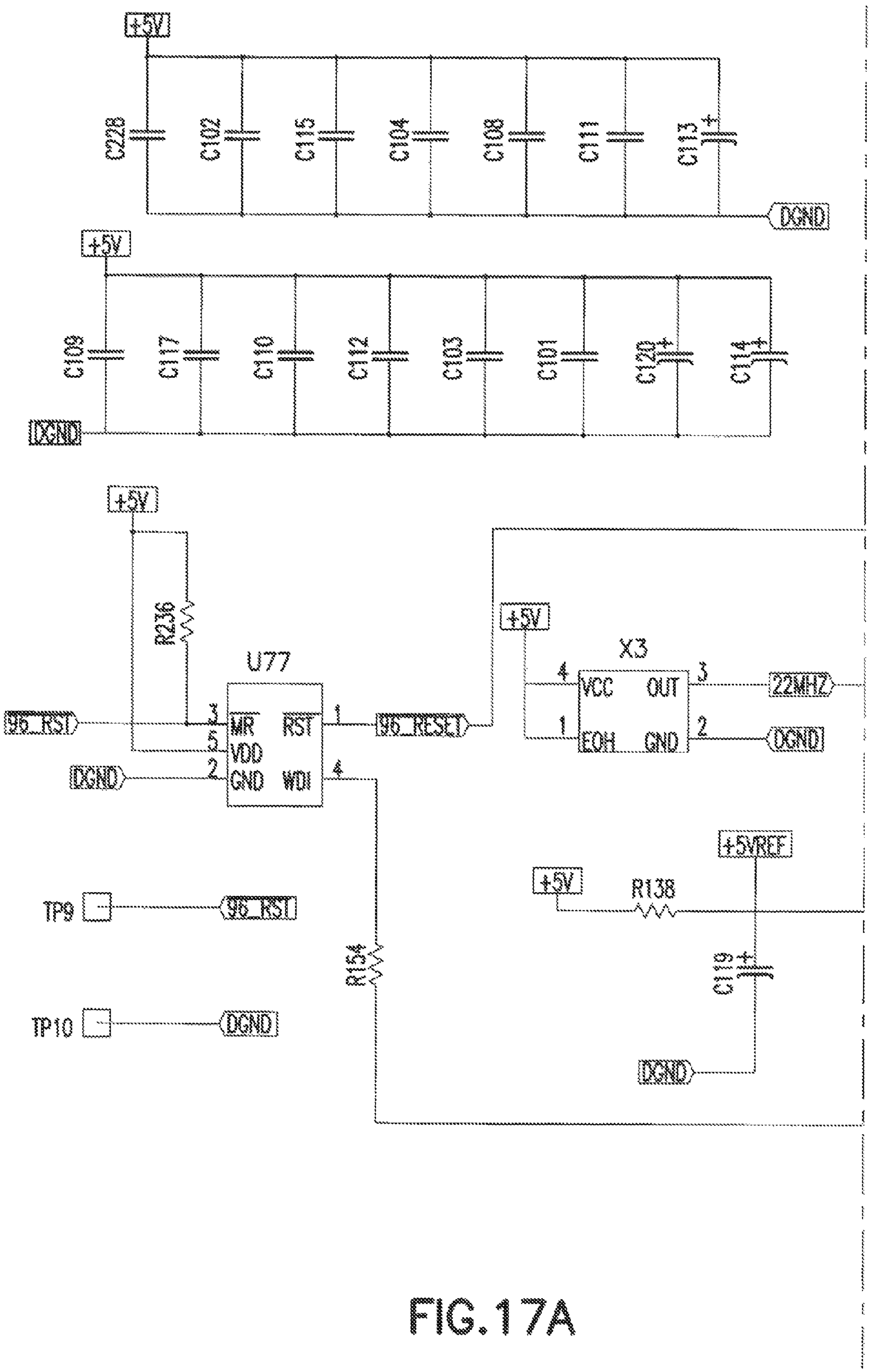
FIGS. 17A-17B AND 17E show real time clock, power reset controller, and a DSP Processor.
Figure 17B:
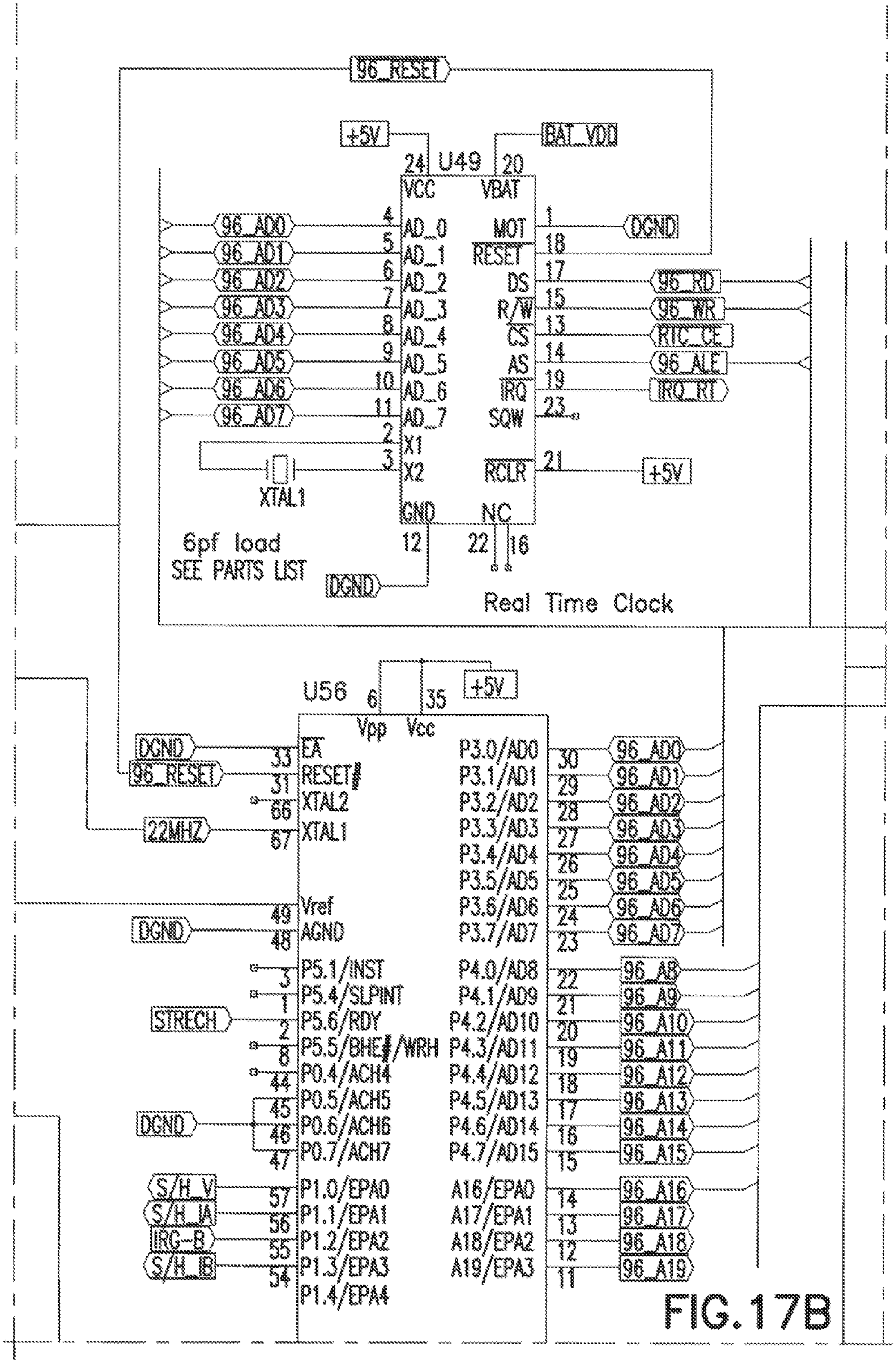
Figure 17C:
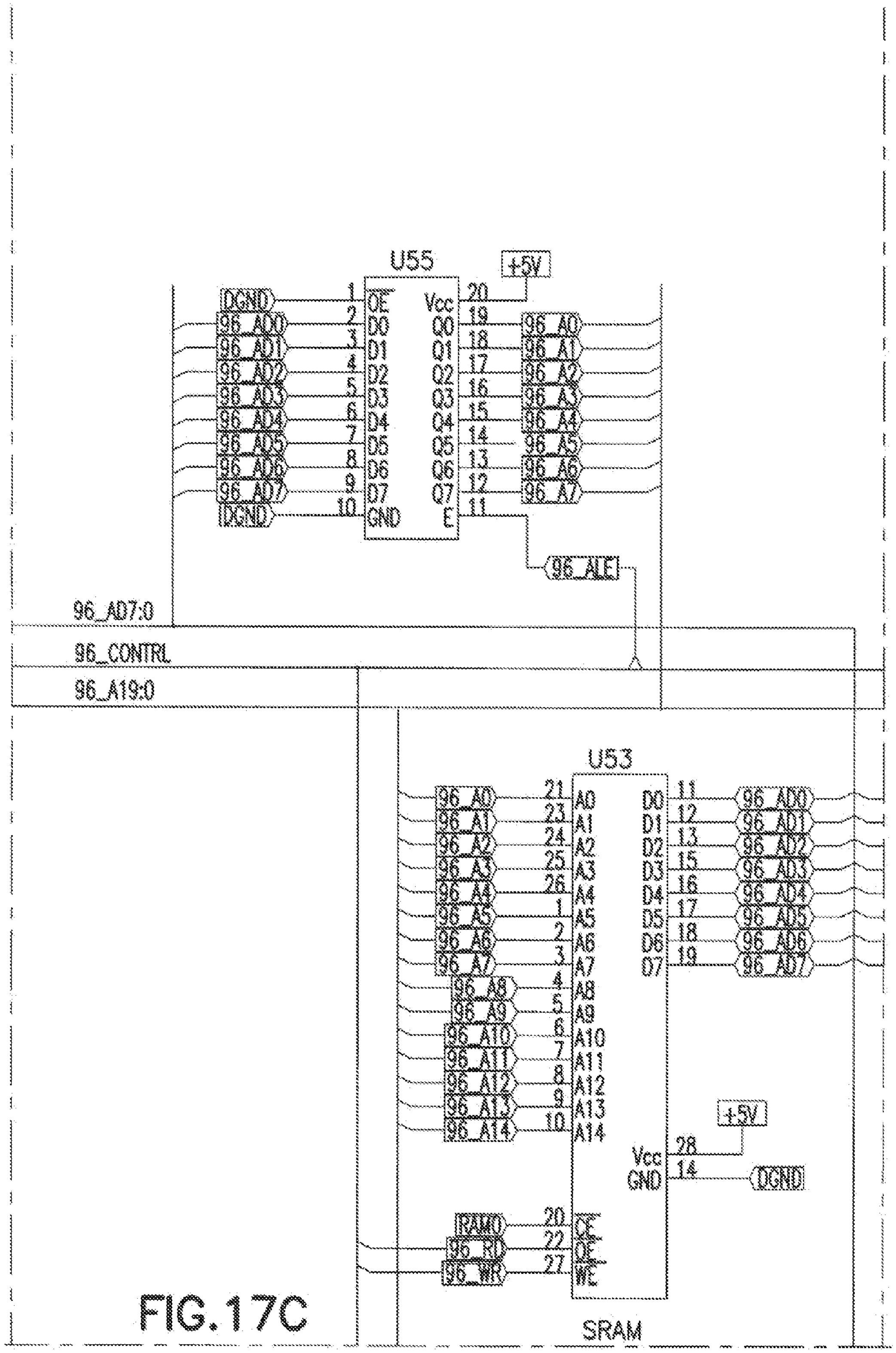
FIGS. 17C-17D is a schematic diagram showing RAM and FLASH Memory and address buffers of the DSP Processor.
Figure 17D:
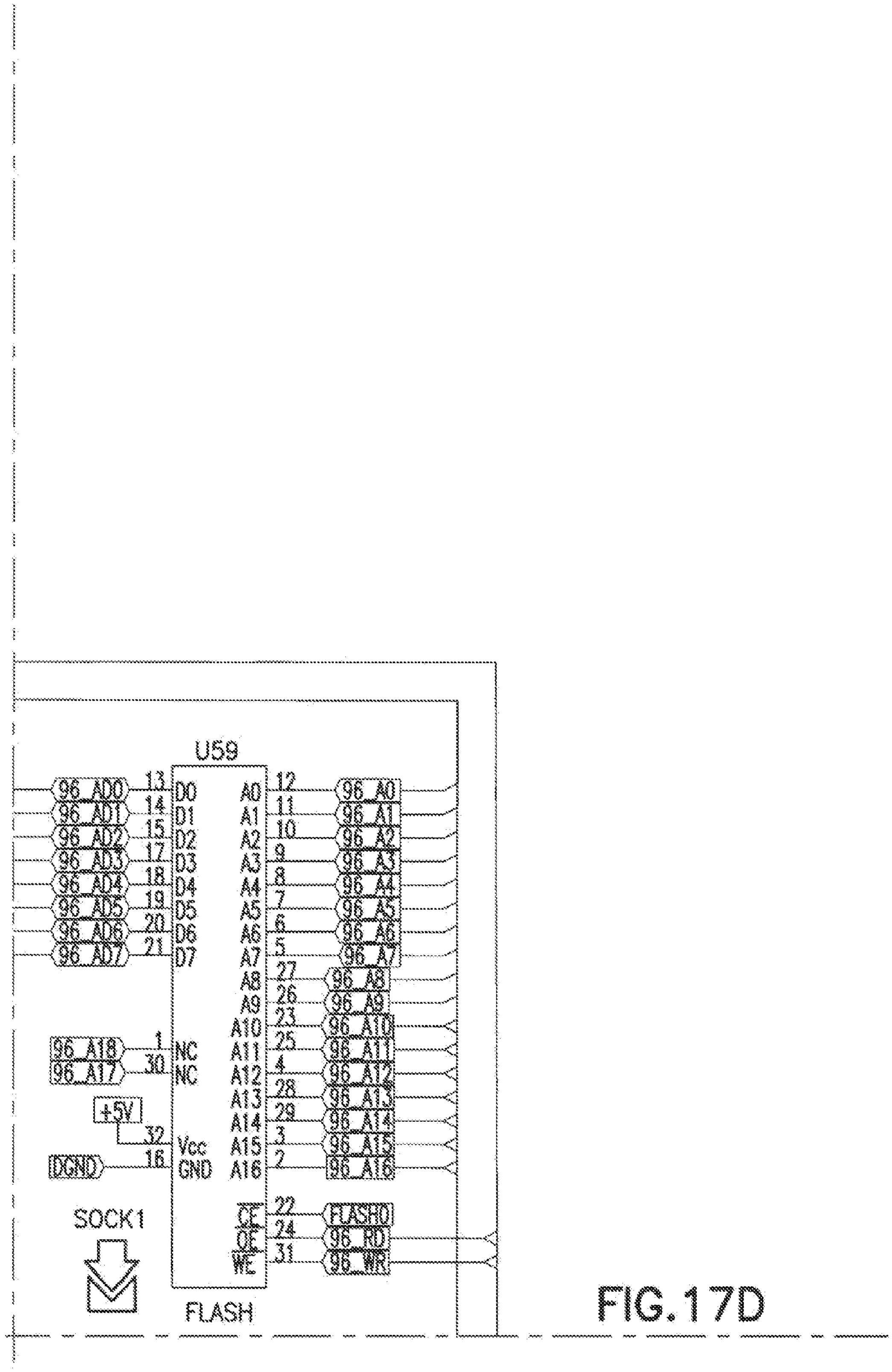
Figure 17E:
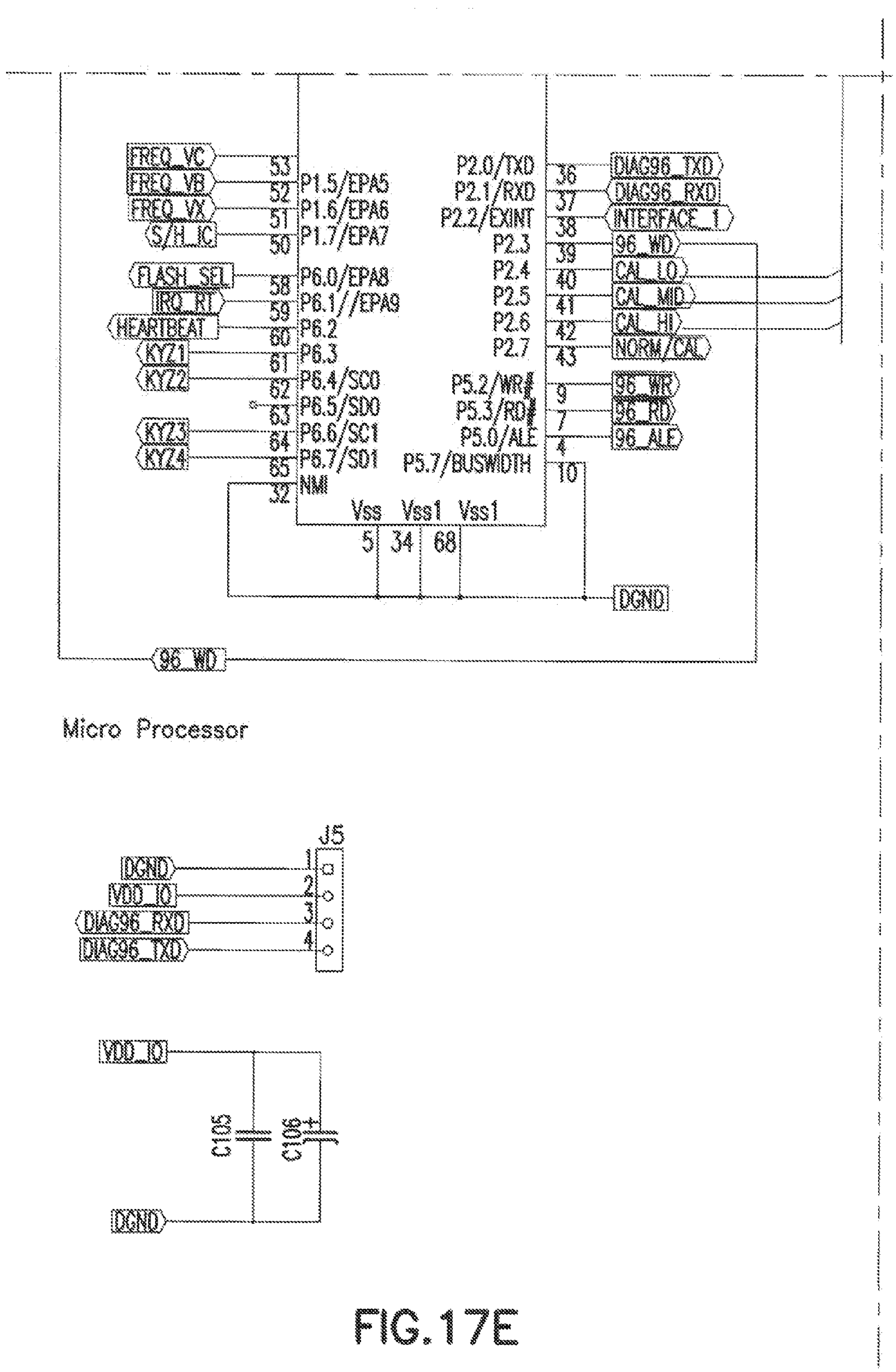

FIGS. 17C-17D shows volatile RAM and non-volatile Flash memory, and DSP 60 address buffers. DSP 60 memory decoding is performed by FPGA 80 via the voltage level translators.

Figure 17F:
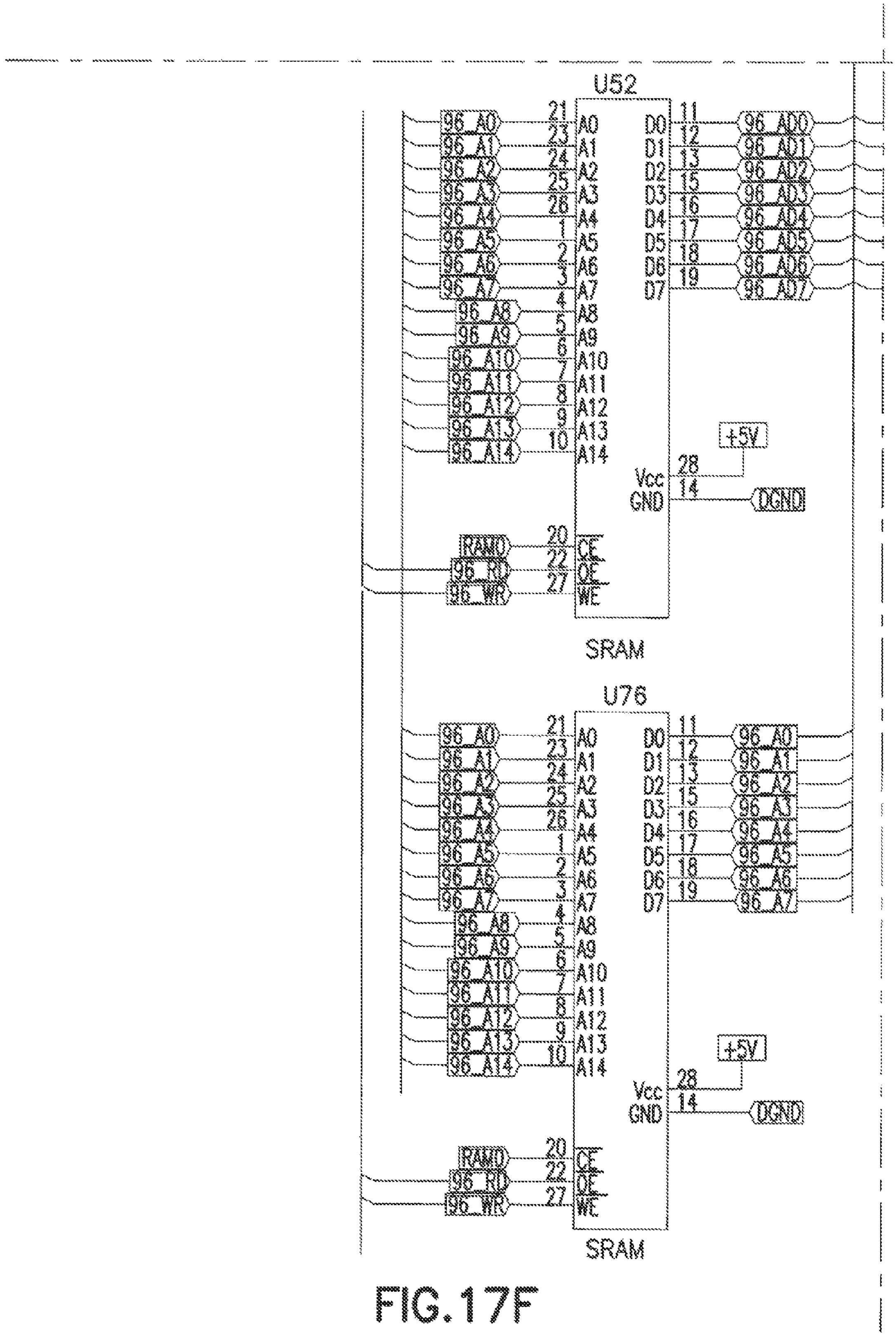
FIGS. 17F-17G is a schematic diagram showing additional RAM and FLASH Memory.
Figures 17, 17G:
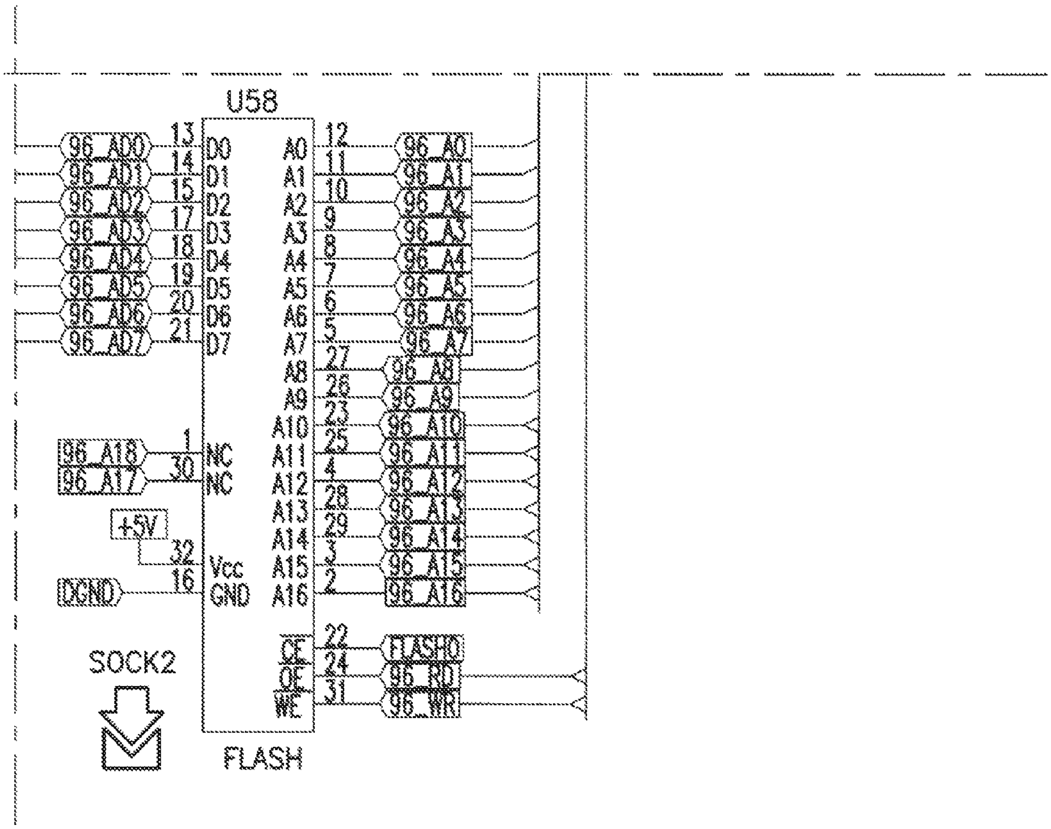
Figures 18, 18A:
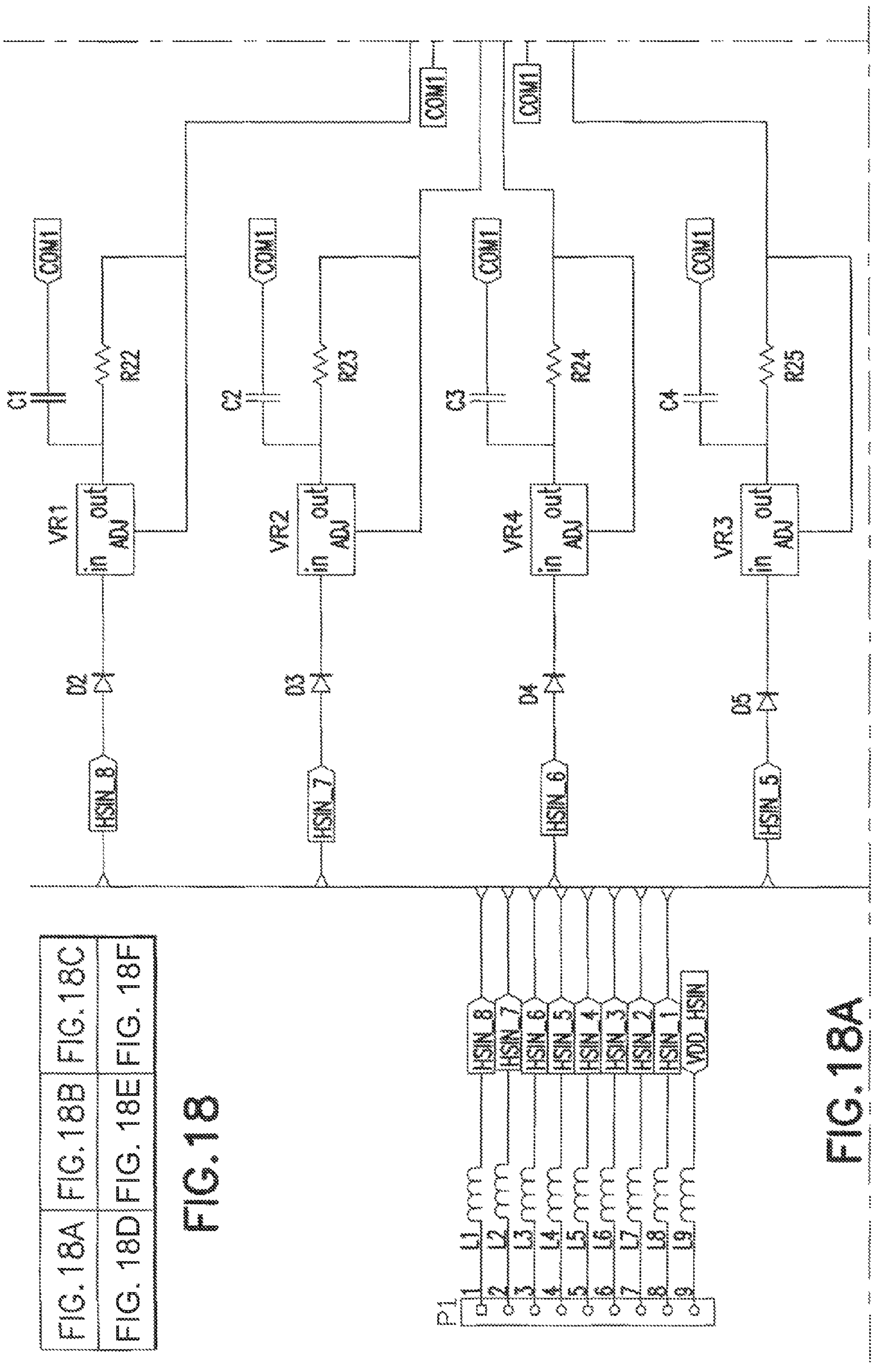
FIGS. 18A-18F illustrates the High Speed Digital Input circuitry, an Ethernet connector, I2C serial EEPROM, voltage regulators and an IRIG-B interface.
Figure 18B:
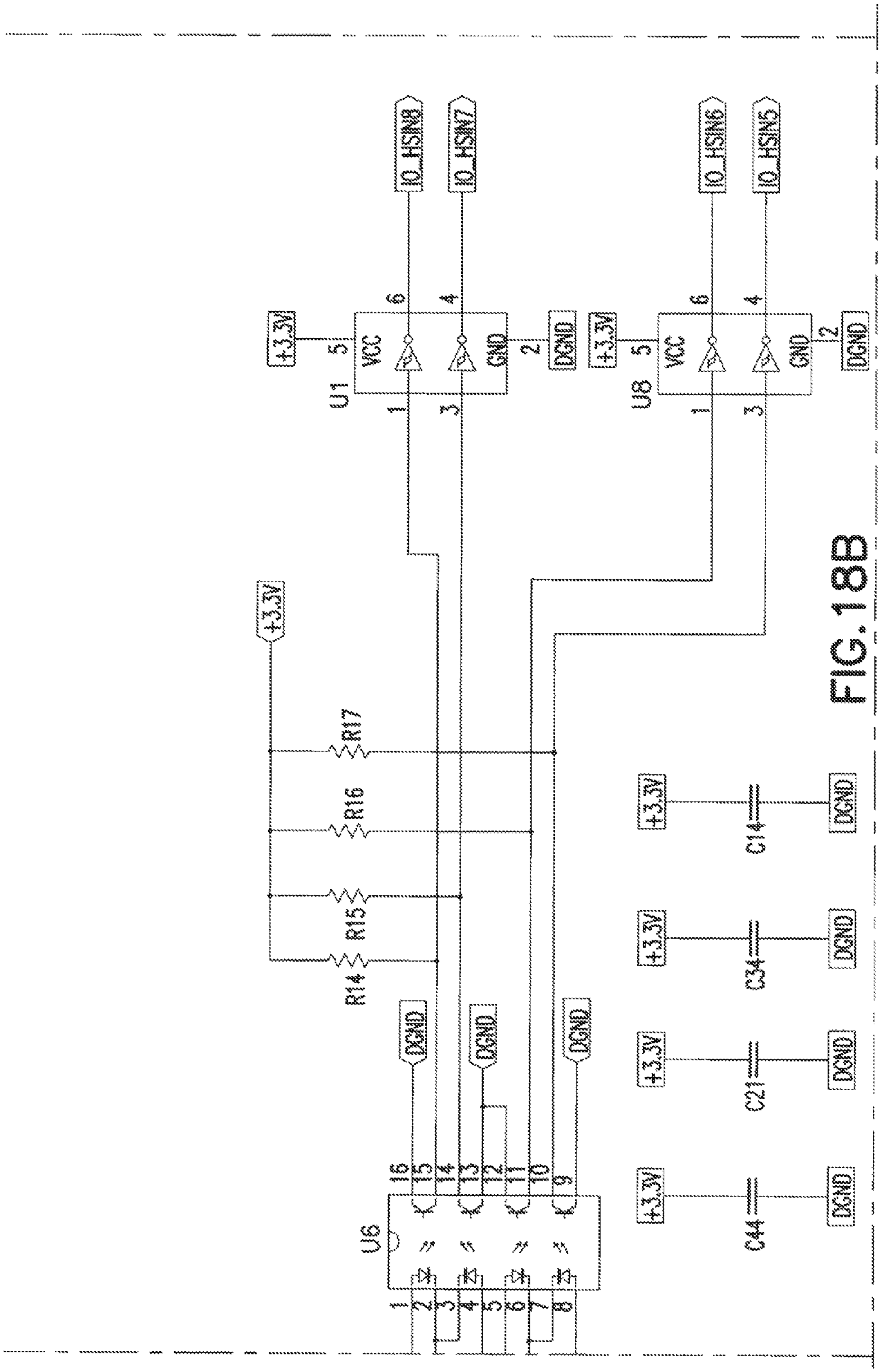
Figure 18C:
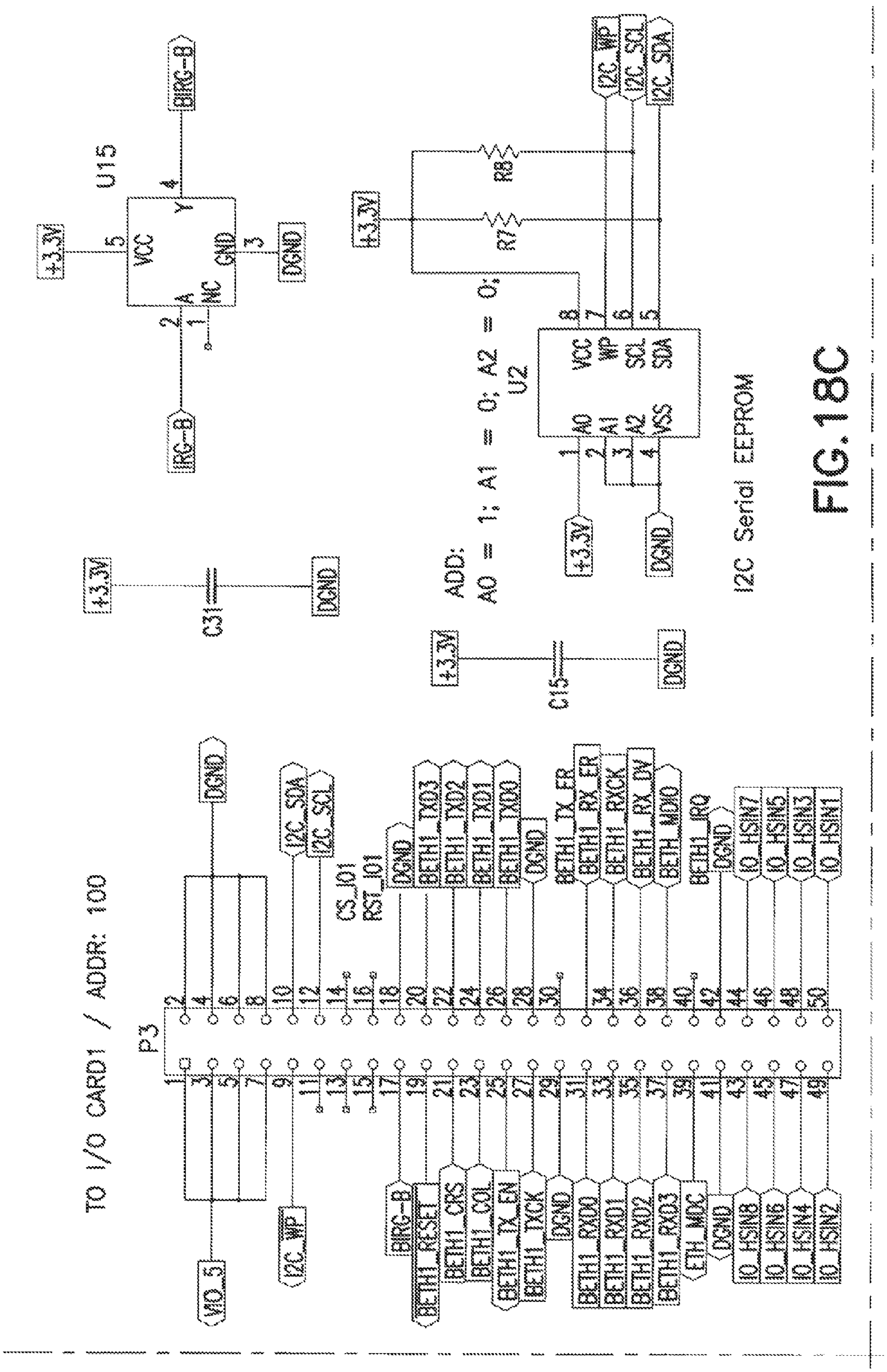
Figure 18D:
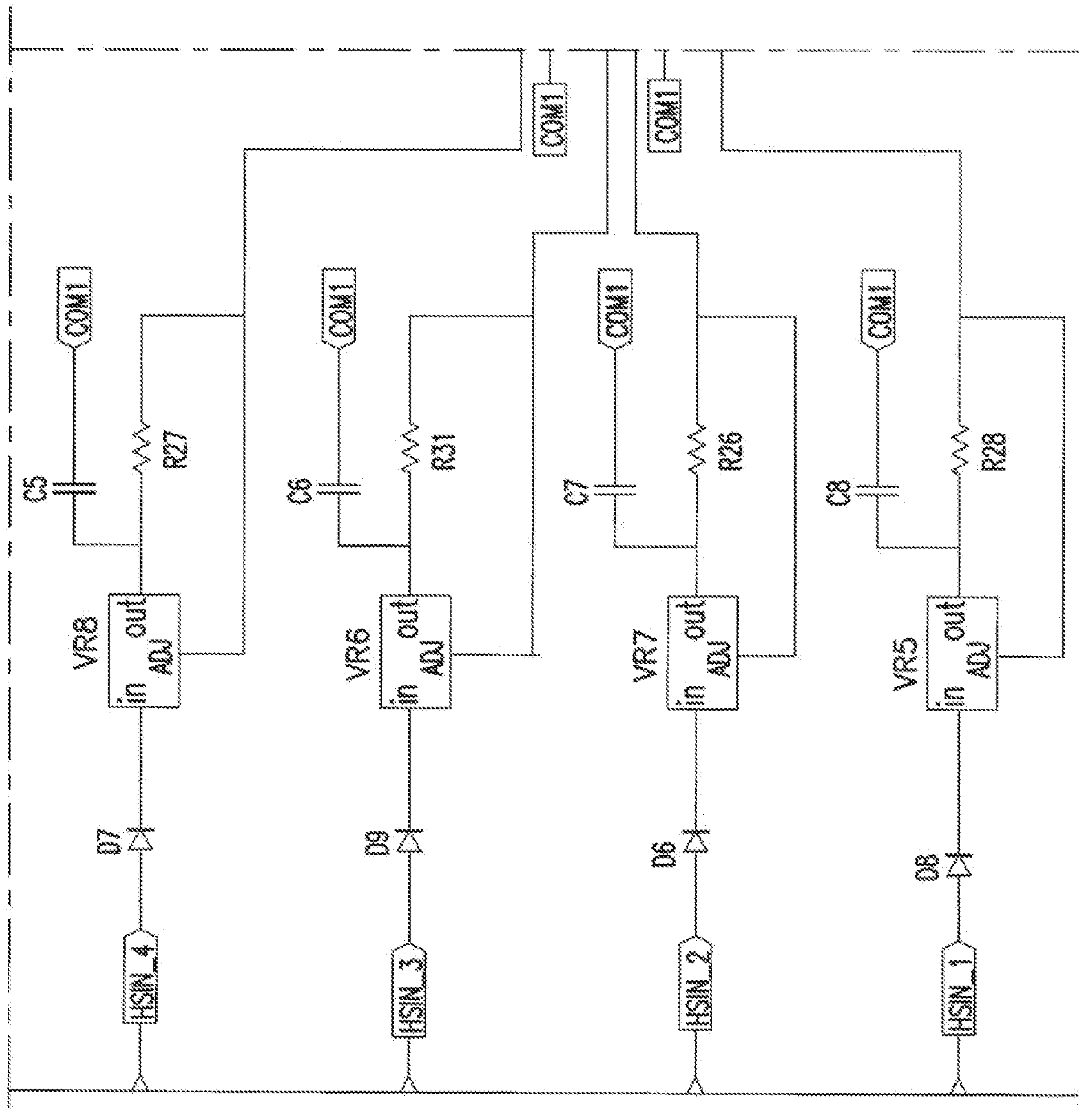
Figure 18E:
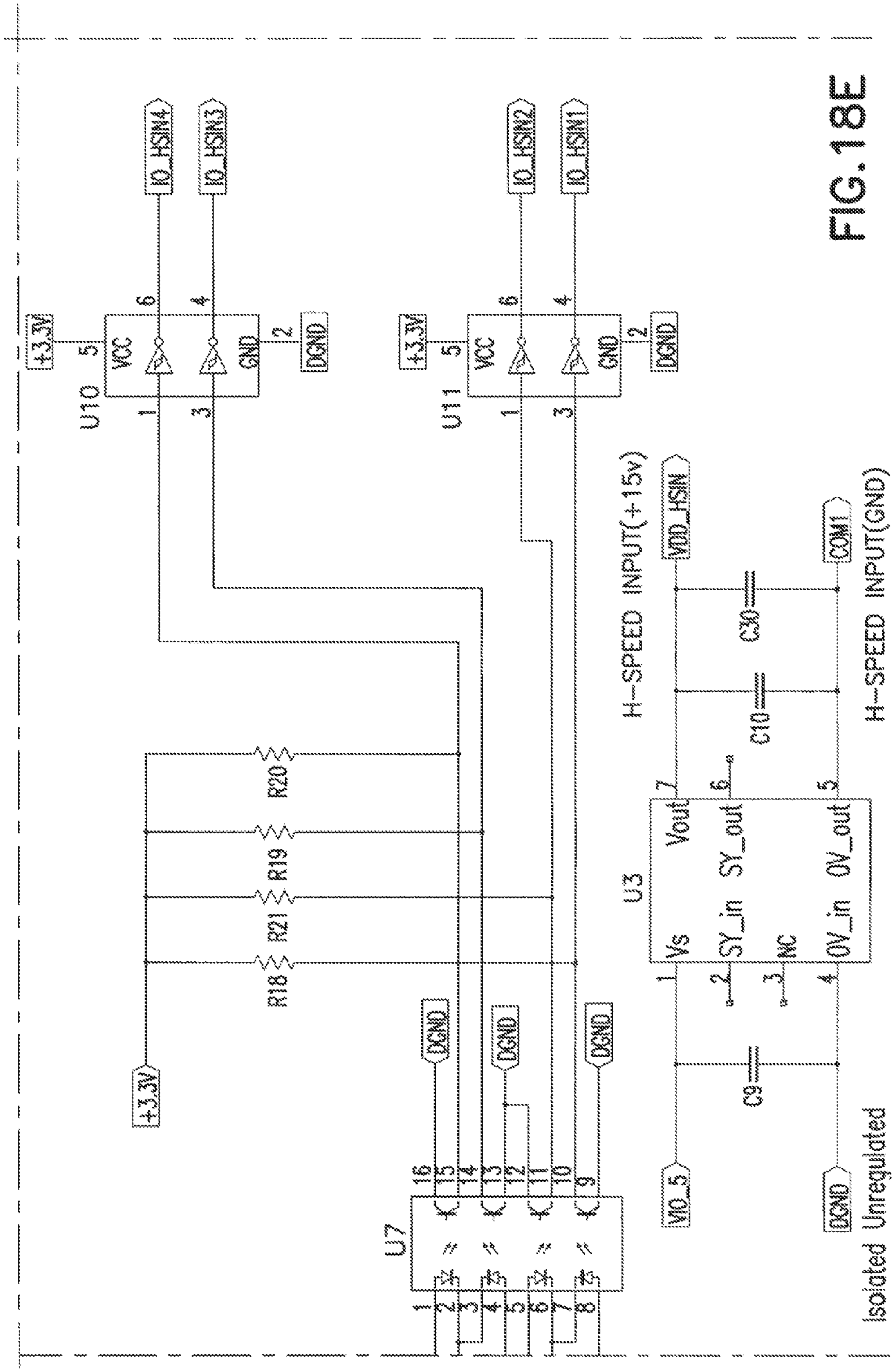
Figure 18F:
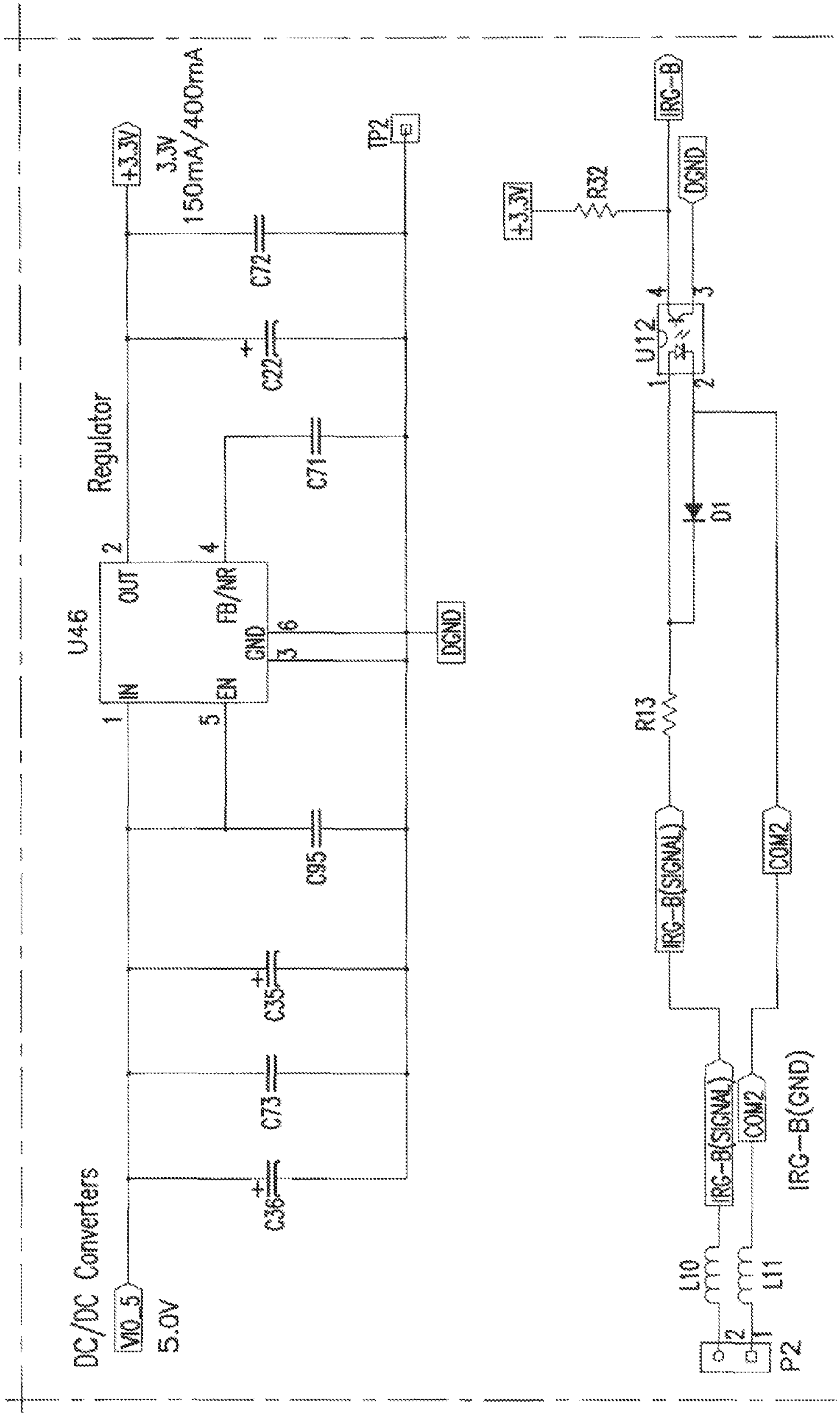
Figure 19A:
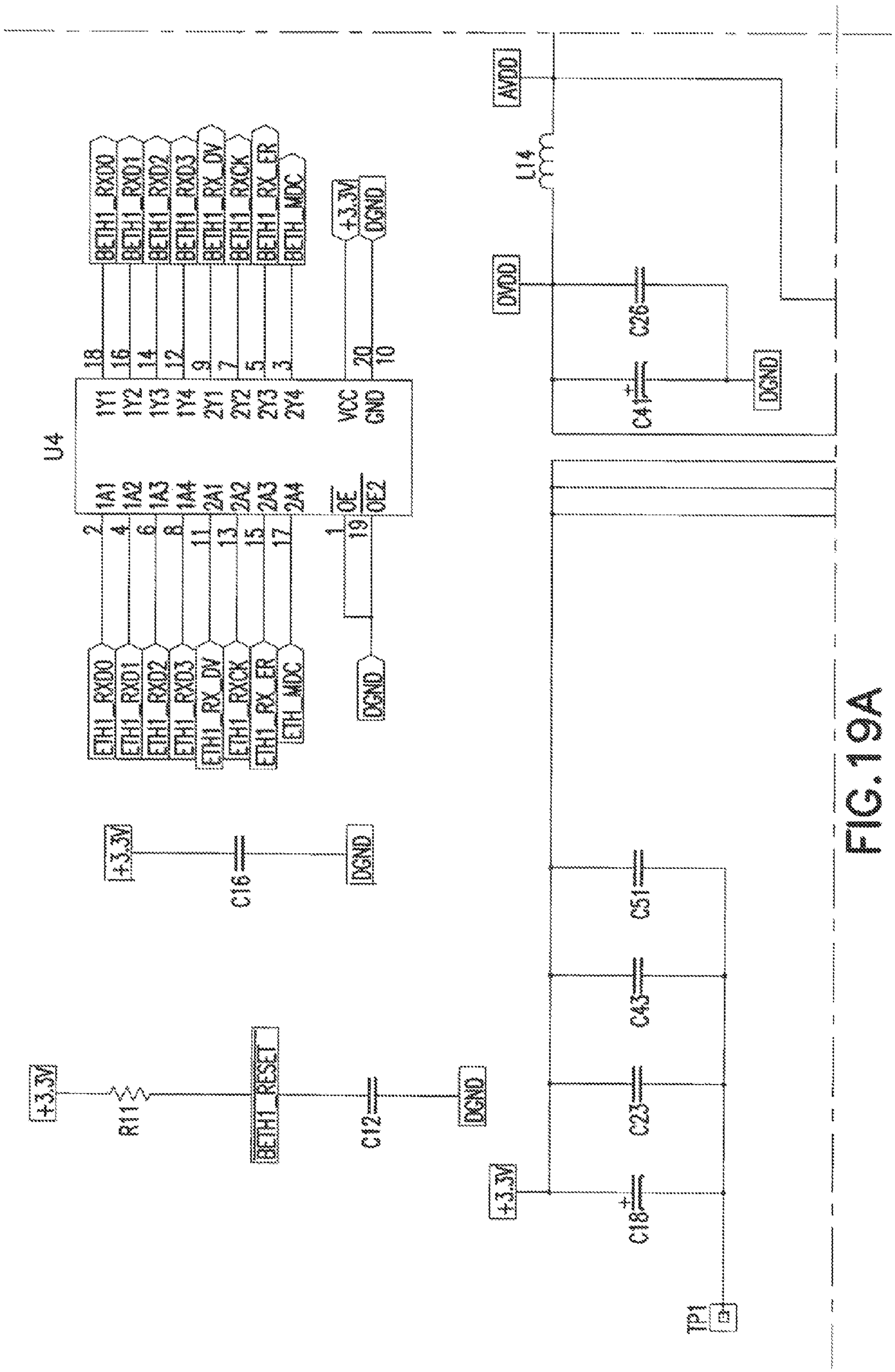
FIGS. 19A-19E illustrate Ethernet circuitry and buffers and a first 10/100 Base-TX/FX transceiver.
Figure 19B:
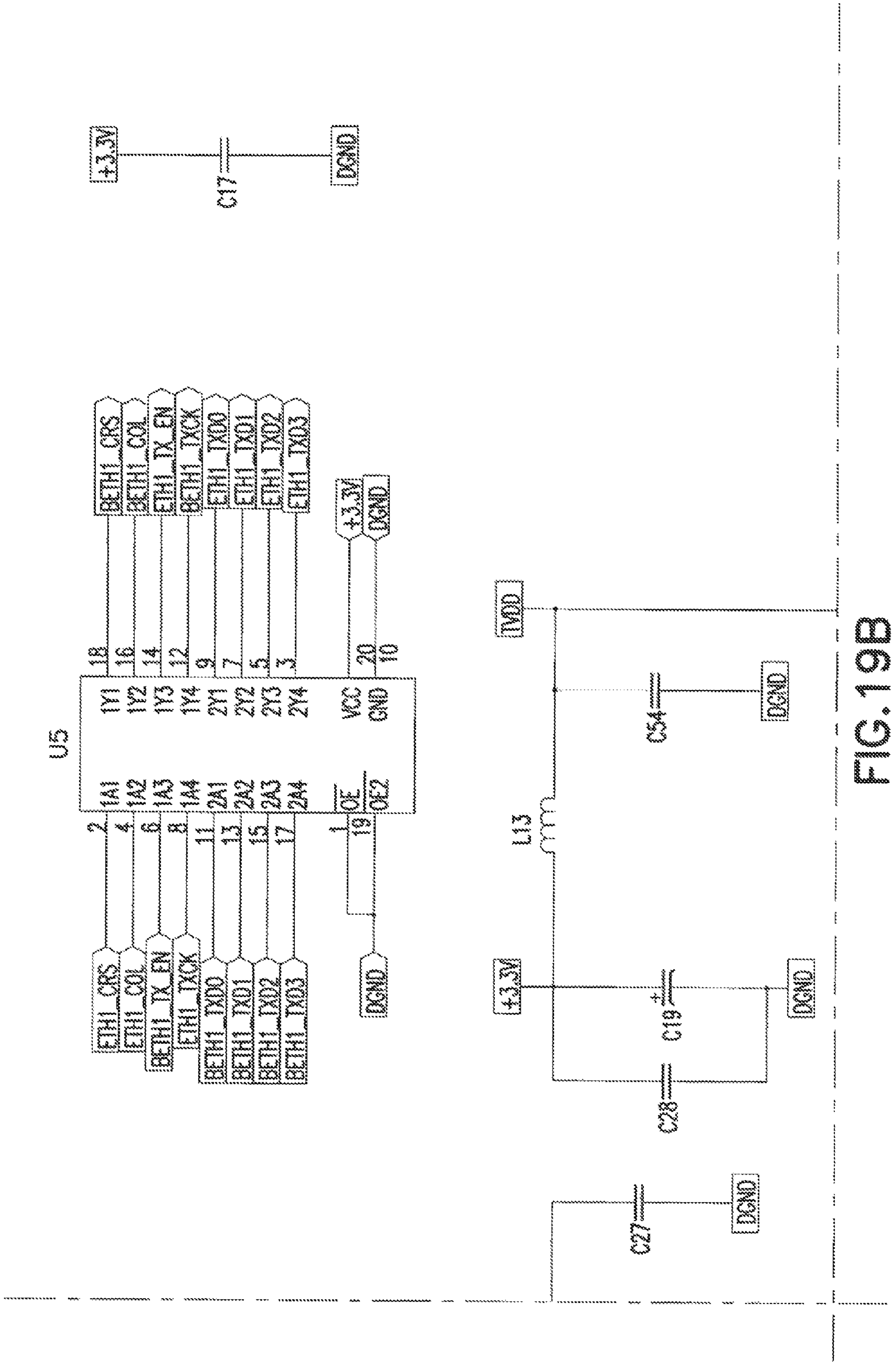
Figure 19C:
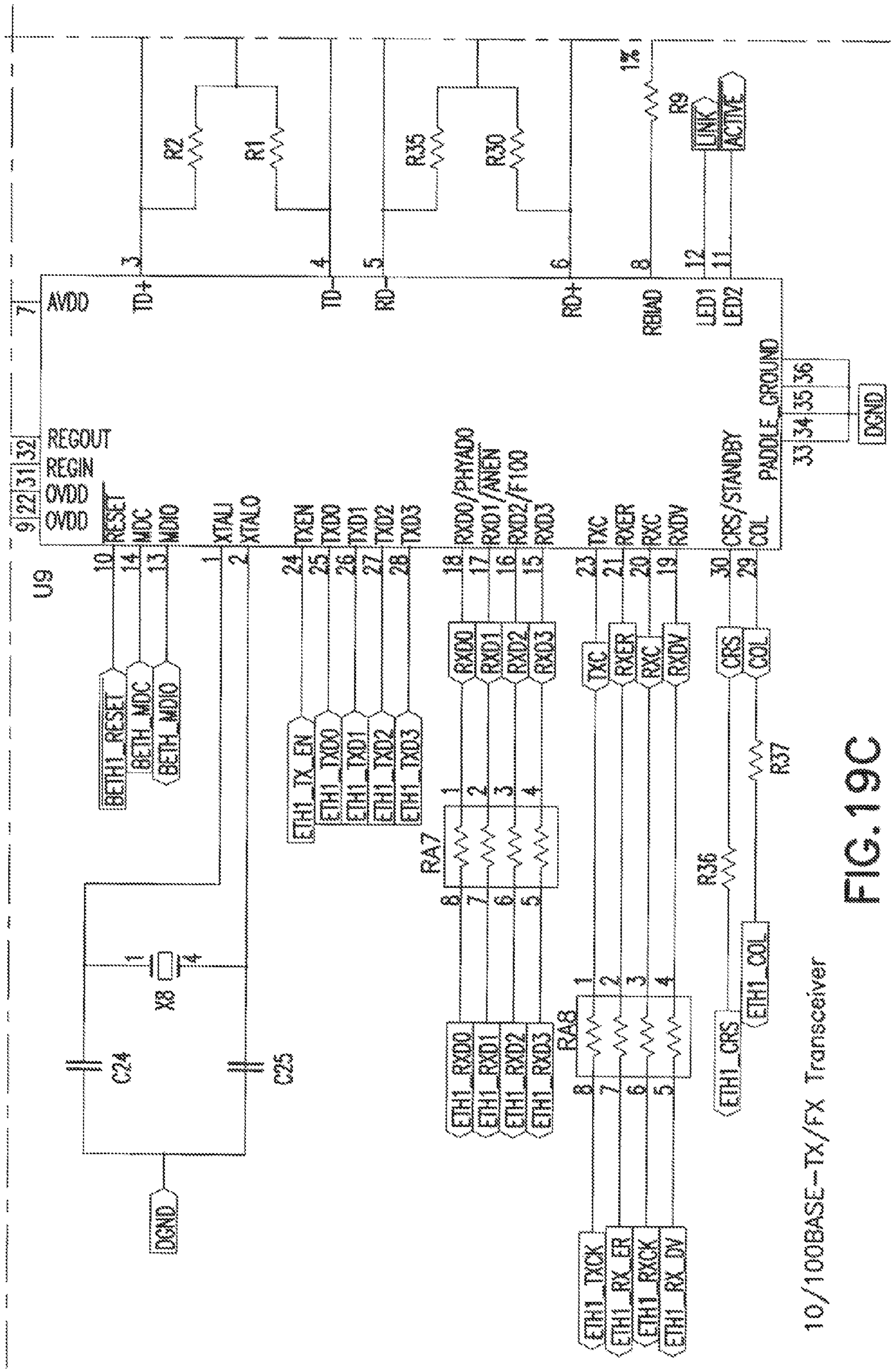
Figure 19D:
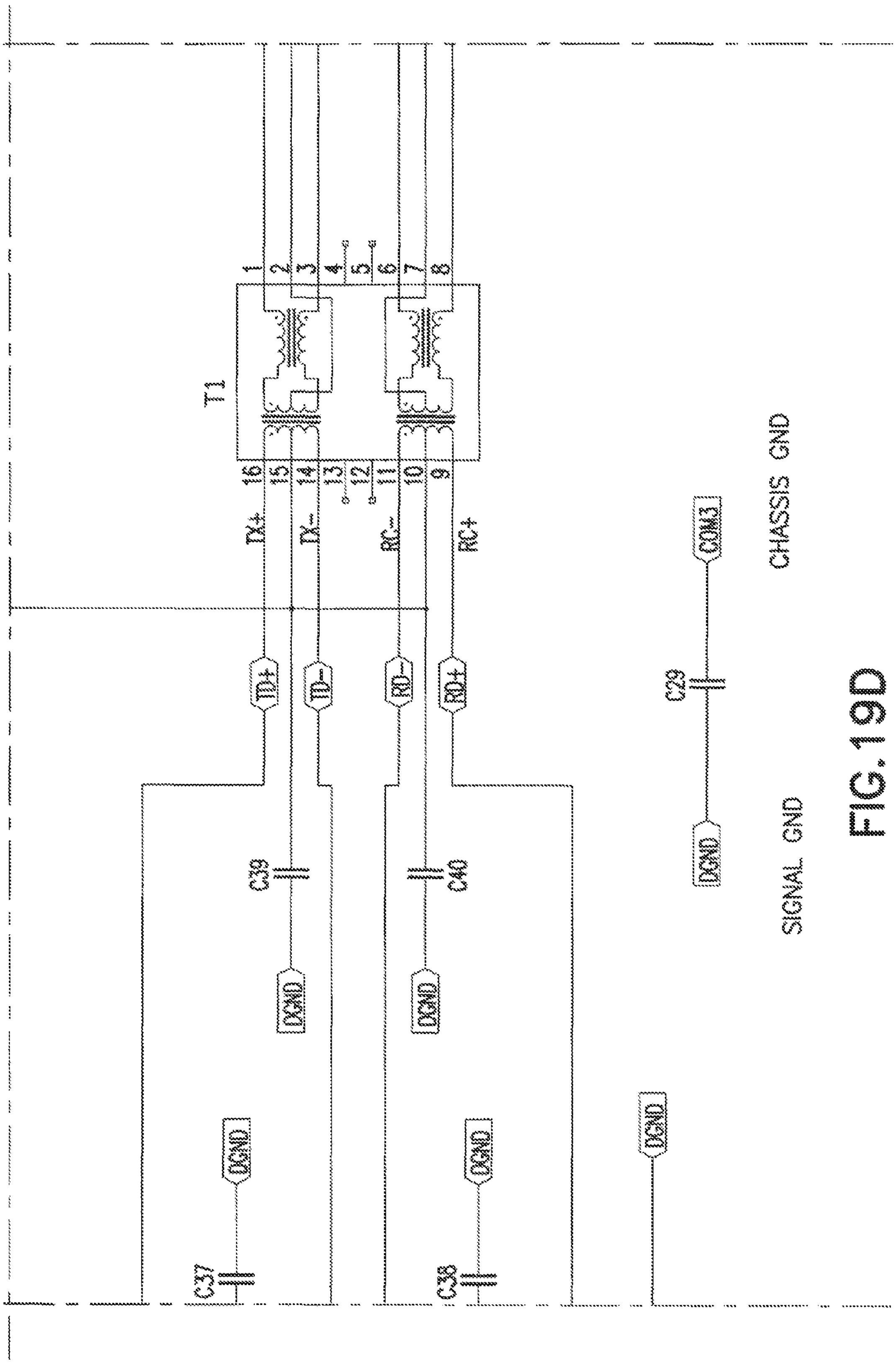
Figures 19, 19E:
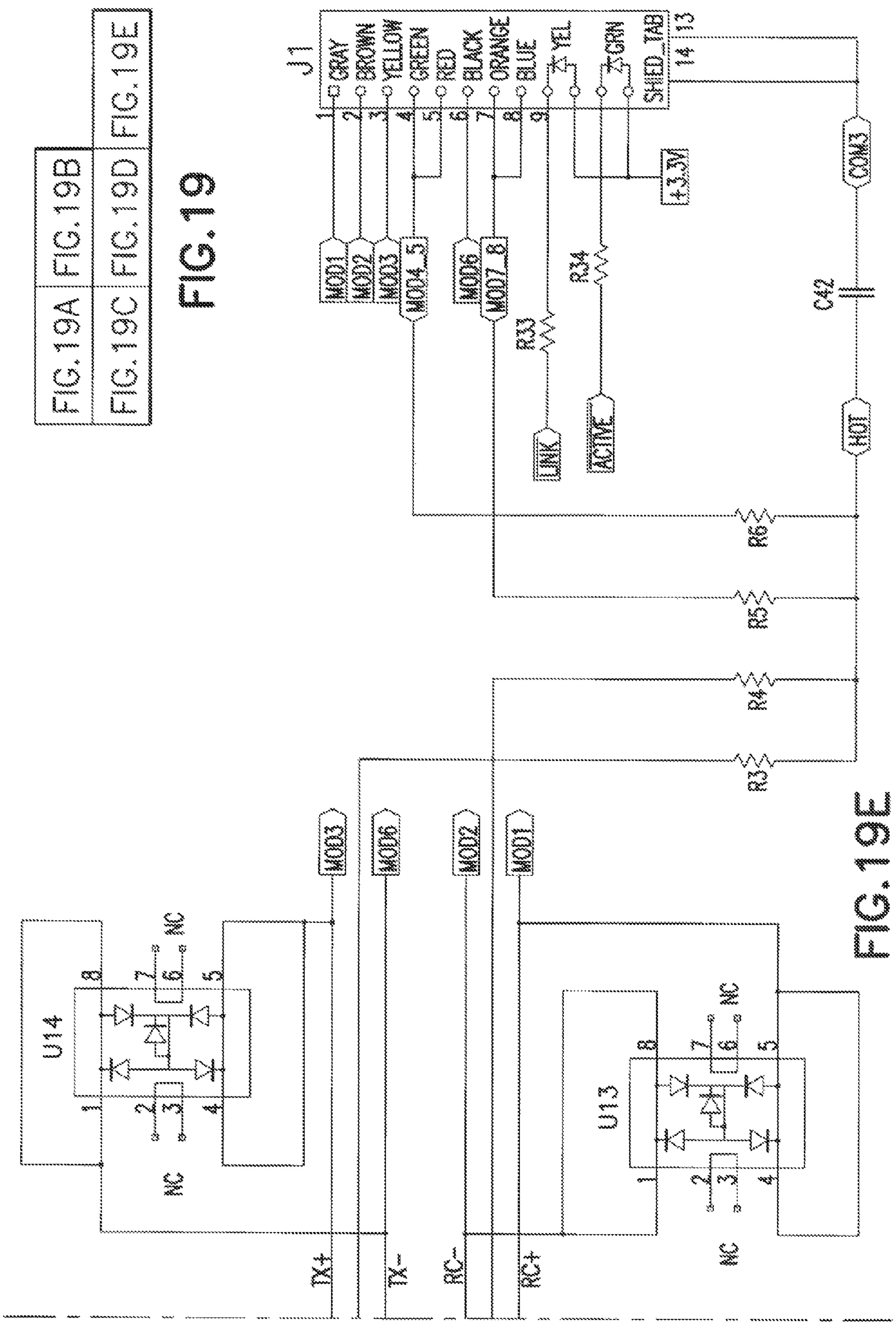

FIGS. 17F-17G shows additional volatile RAM and non-volatile Flash memory. DSP 60 memory decoding is performed by FPGA 80 via the voltage level translators.

FIGS. 18A-18F show the High Speed Digital Input circuitry; an Ethernet connector to support Ethernet TCP/IP communication; I2C serial EEPROM; voltage regulators; and an IRIG-B interface. I2C serial EEPROM is used to communicate with and identify I/O card characteristics to CPU 50. Also shown are voltage-decoupling capacitors used to reduce noise.

FIGS. 19A-19E illustrate Ethernet circuitry to support Ethernet TCP/IP communication, Ethernet buffers to buffer the Ethernet signals coming from CPU 50, and a 10/100 Base-TX/FX transceiver. Also shown are the RJ-45 connector and Ethernet transformer used to support Ethernet TCP/IP communication, and the voltage decoupling capacitors used to reduce noise.

Figure 20:
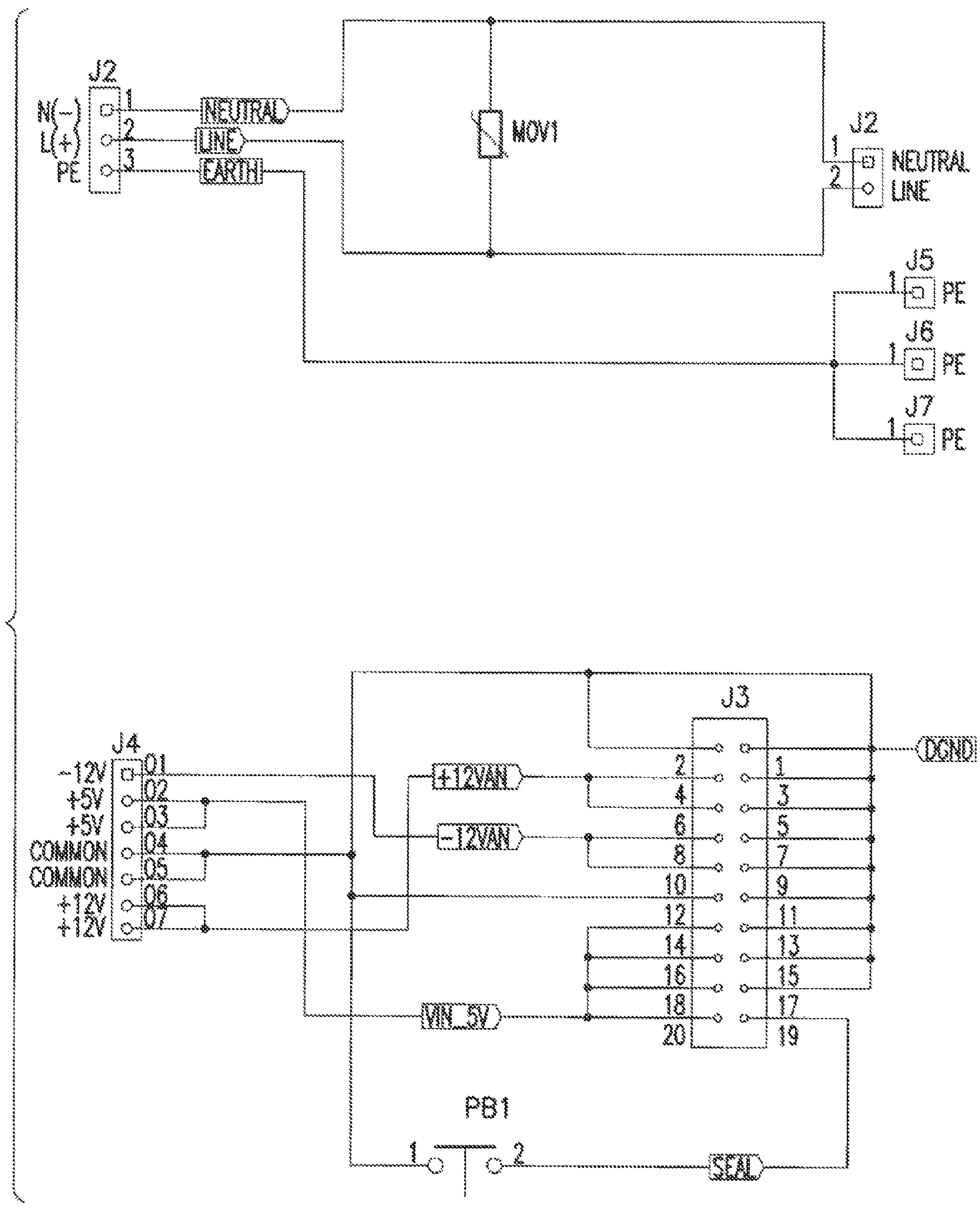
FIG. 20 illustrates a main power supply interface board.

FIG. 20 illustrates a main power supply interface board, which is used for mechanically interfacing the power supply assembly to the IED.

Figures 21, 21A:
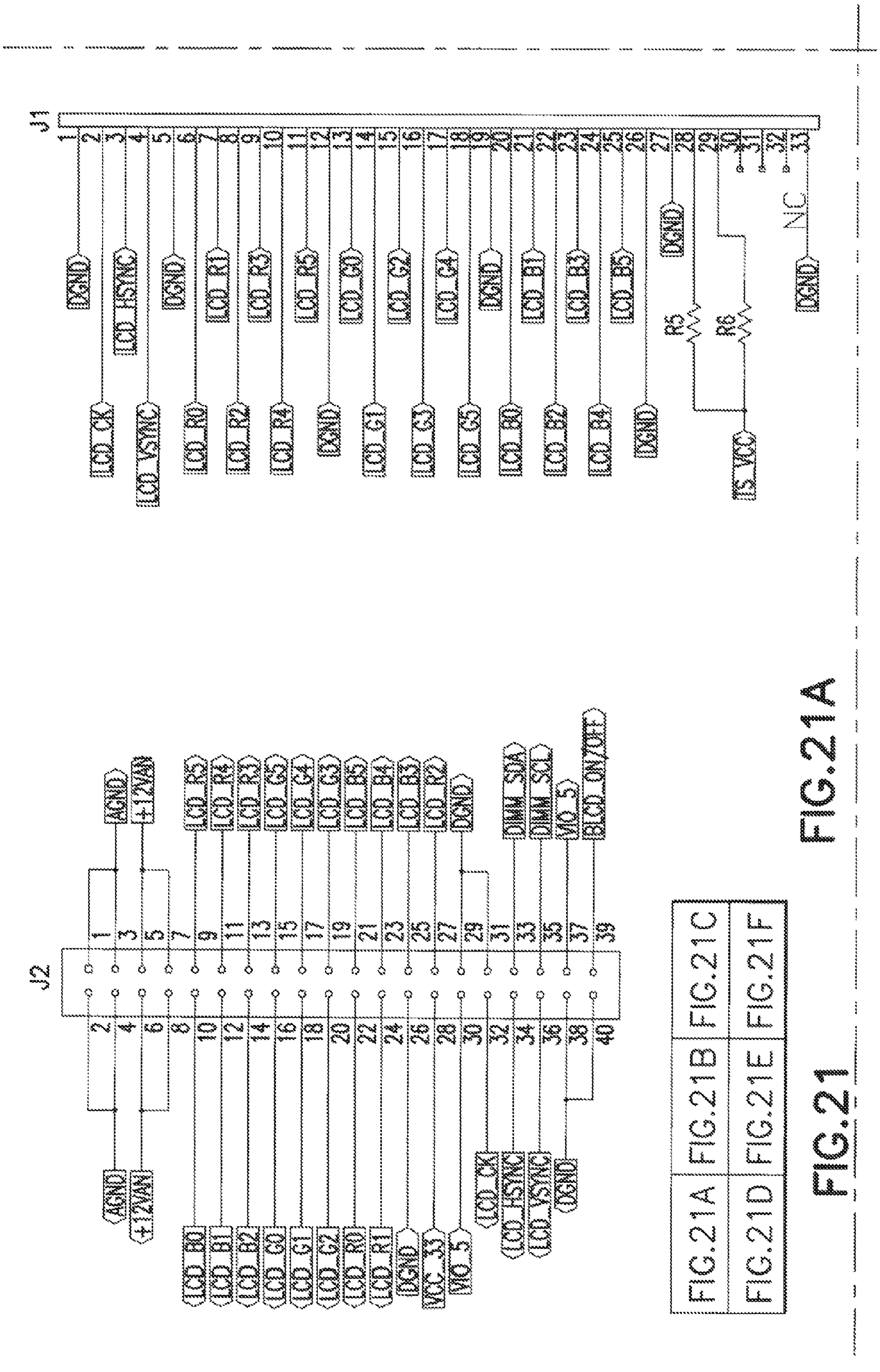
FIGS. 21A-21F illustrates a front panel interface board.
Figure 21B:
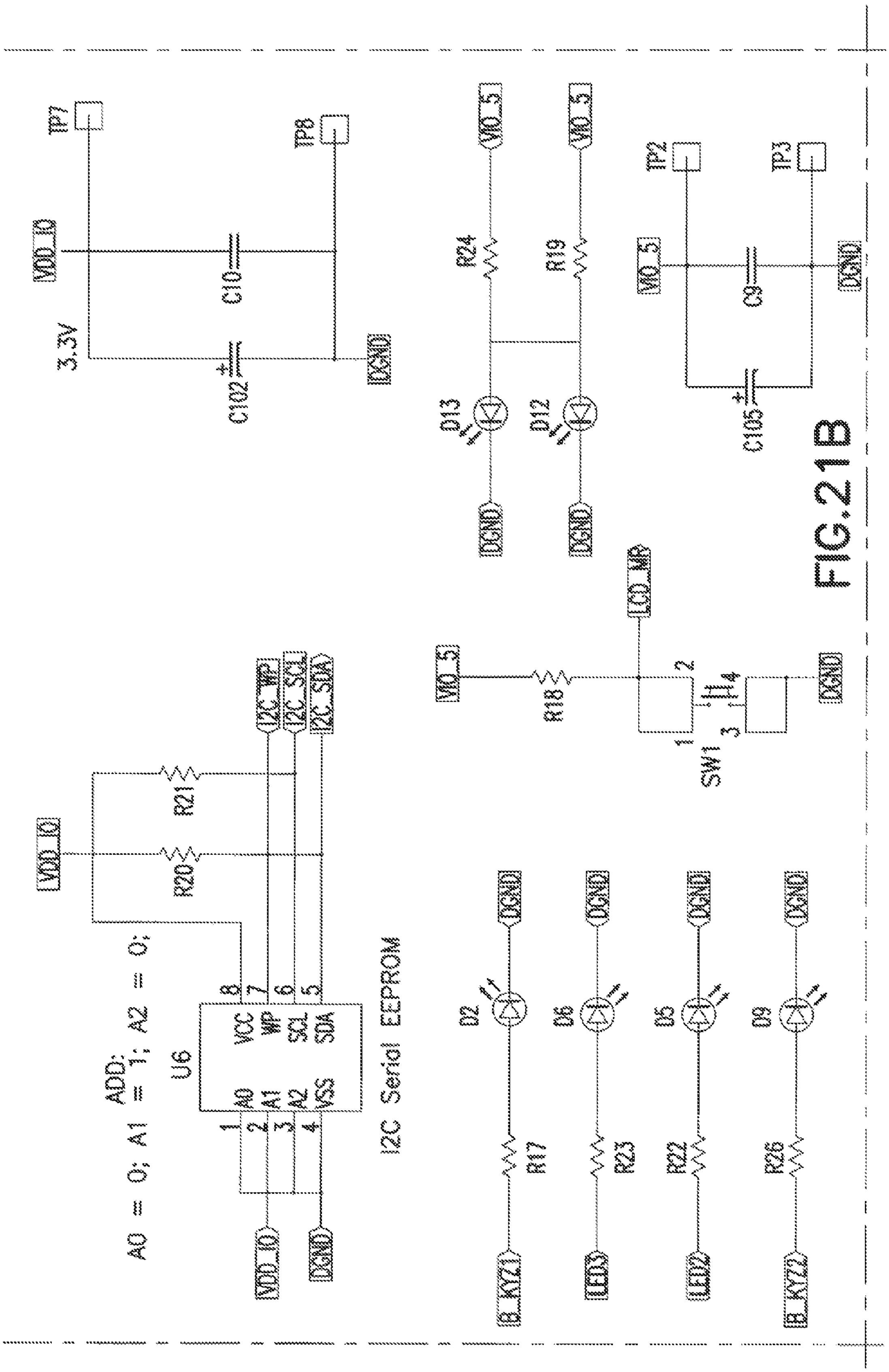
Figure 21C:
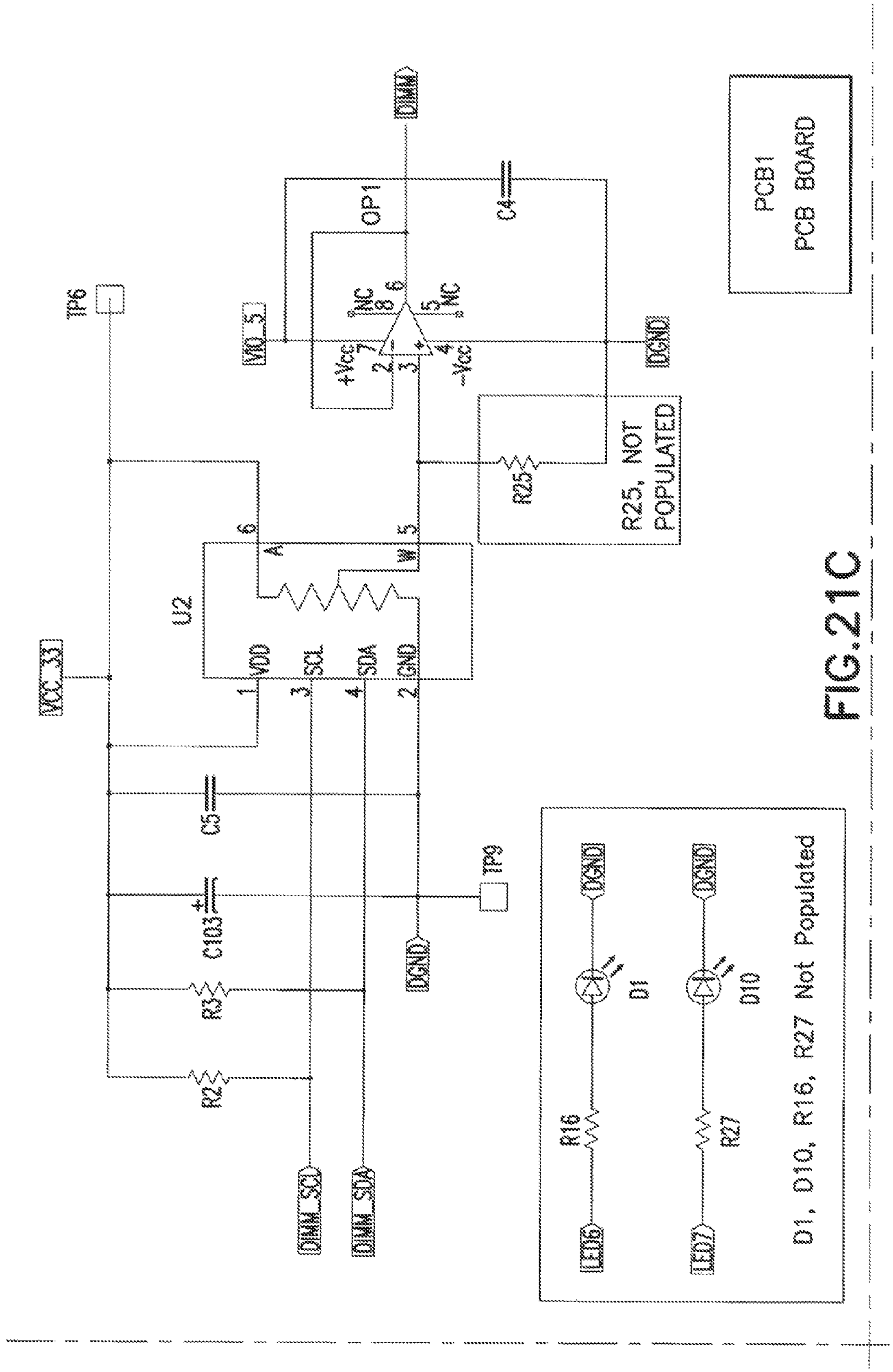
Figure 21D:
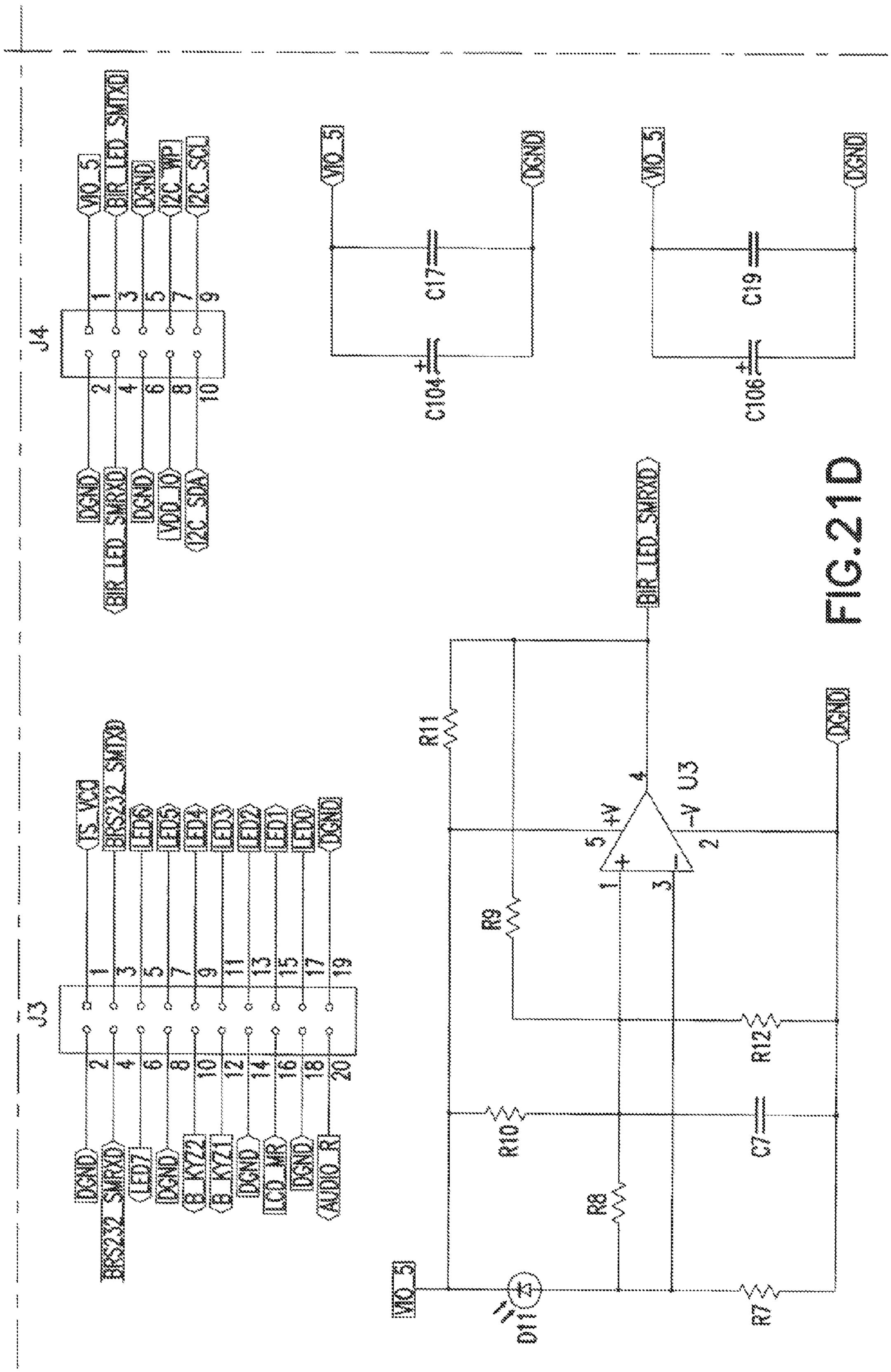
Figure 21E:
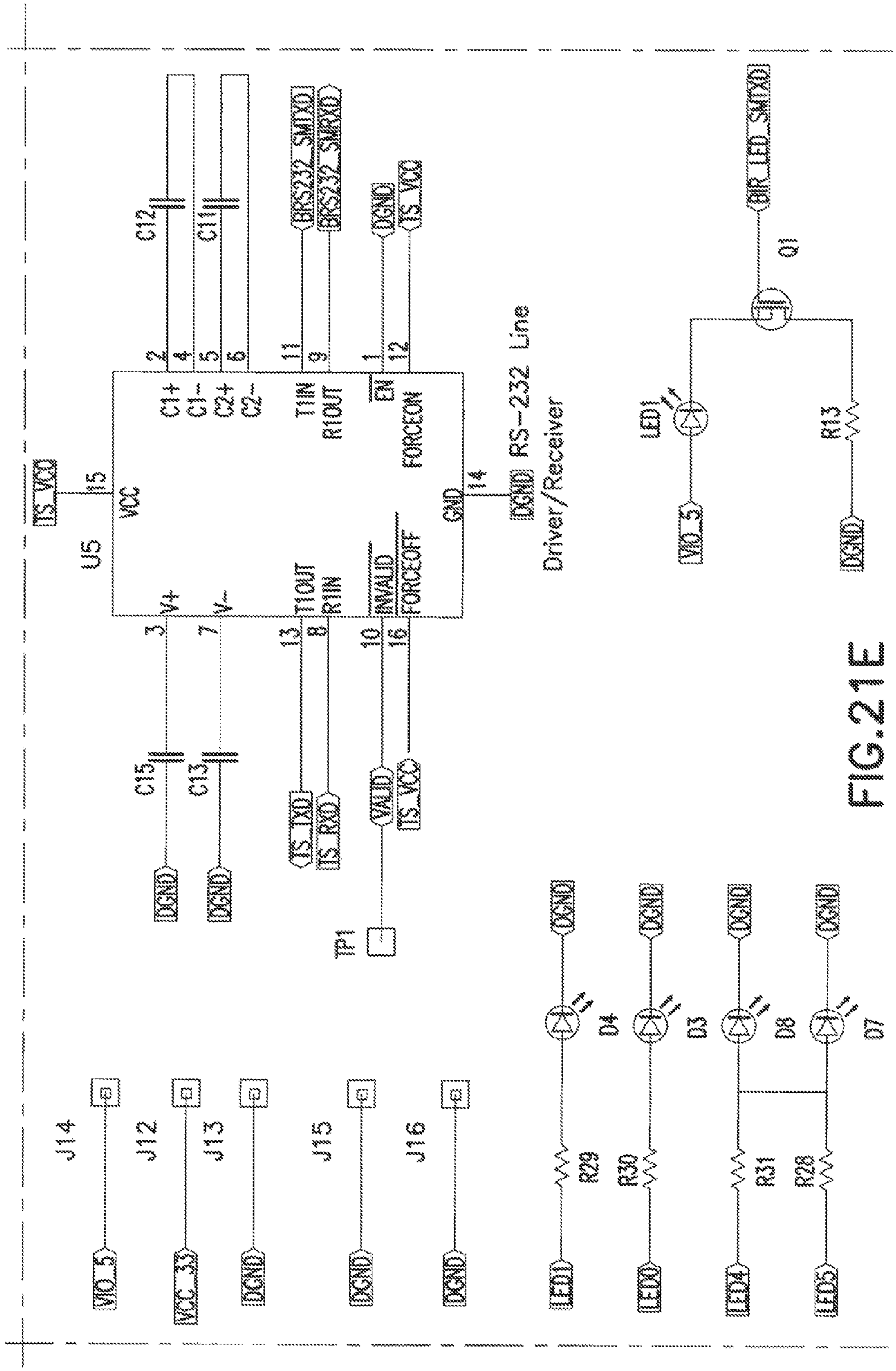
Figure 21F:
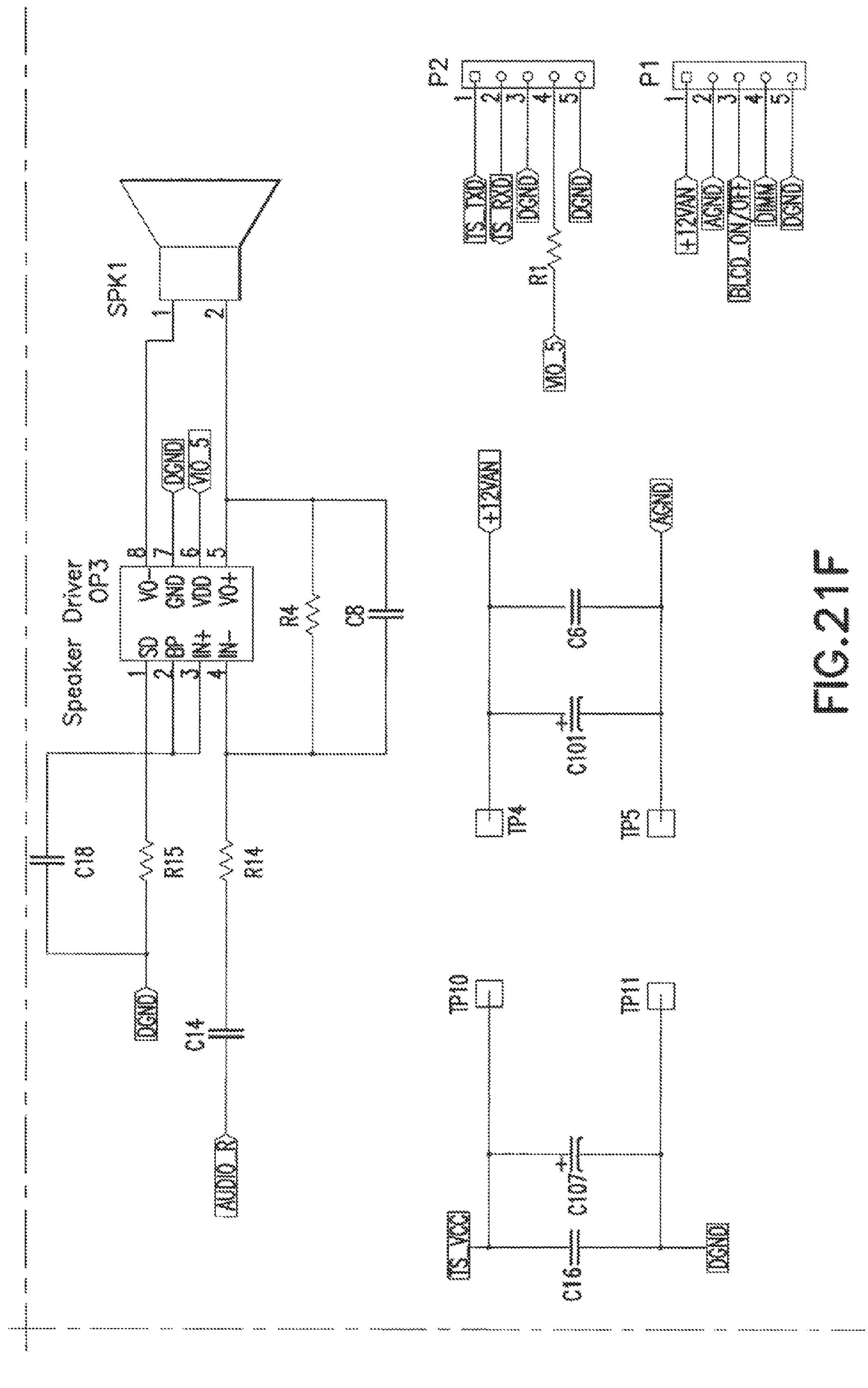

FIGS. 21A-21F illustrate a front panel interface board. Shown are the LCD connectors and signals for the graphical backlit display, connector and signals to drive the front panel LEDS and KYZ LED outputs, the audio signals to drive the front panel speaker, and the touch screen serial interface signals. I2C serial EEPROM is used to communicate with and identify I/O card characteristics to CPU 50. (FIG. 21A) Also shown are the intensity control circuitry used to control intensity for the graphical backlit display, a speaker audio driver, and front panel switch circuitry (FIG. 21B), RS232 interface chip for the touch screen control (FIG. 21C), and voltage decoupling capacitors to reduce noise. Also shown is the Infrared driver receiver circuitry (FIG. 21D).

Figure 22A:
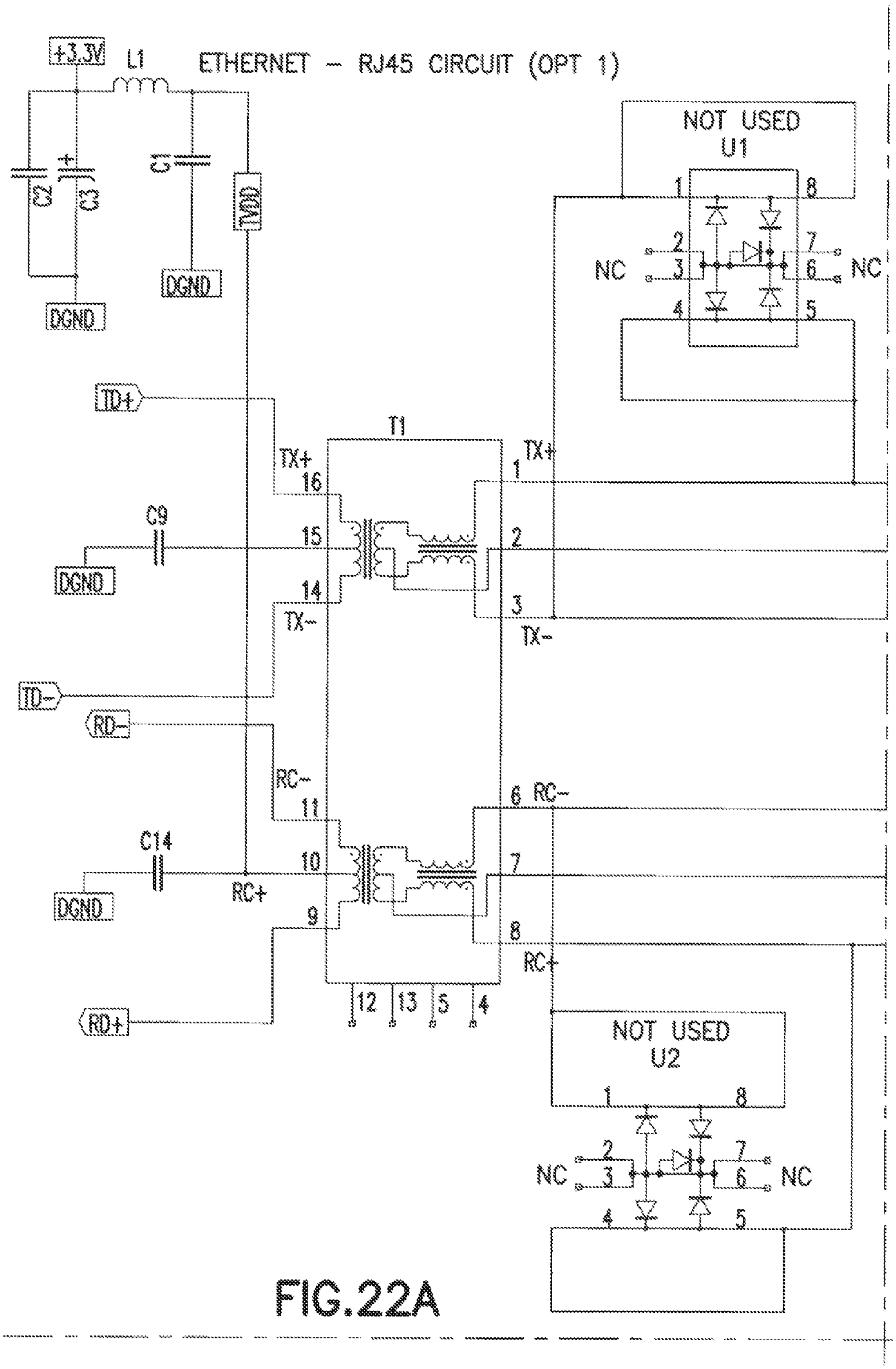
FIGS. 22A-22E illustrate various outputs of the network board including a RJ46 option (FIG. 22A); fiber optic options (FIGS. 22D-22E); and a wireless option, e.g. 802.11 (FIG. 22B-22C).
Figure 22B:
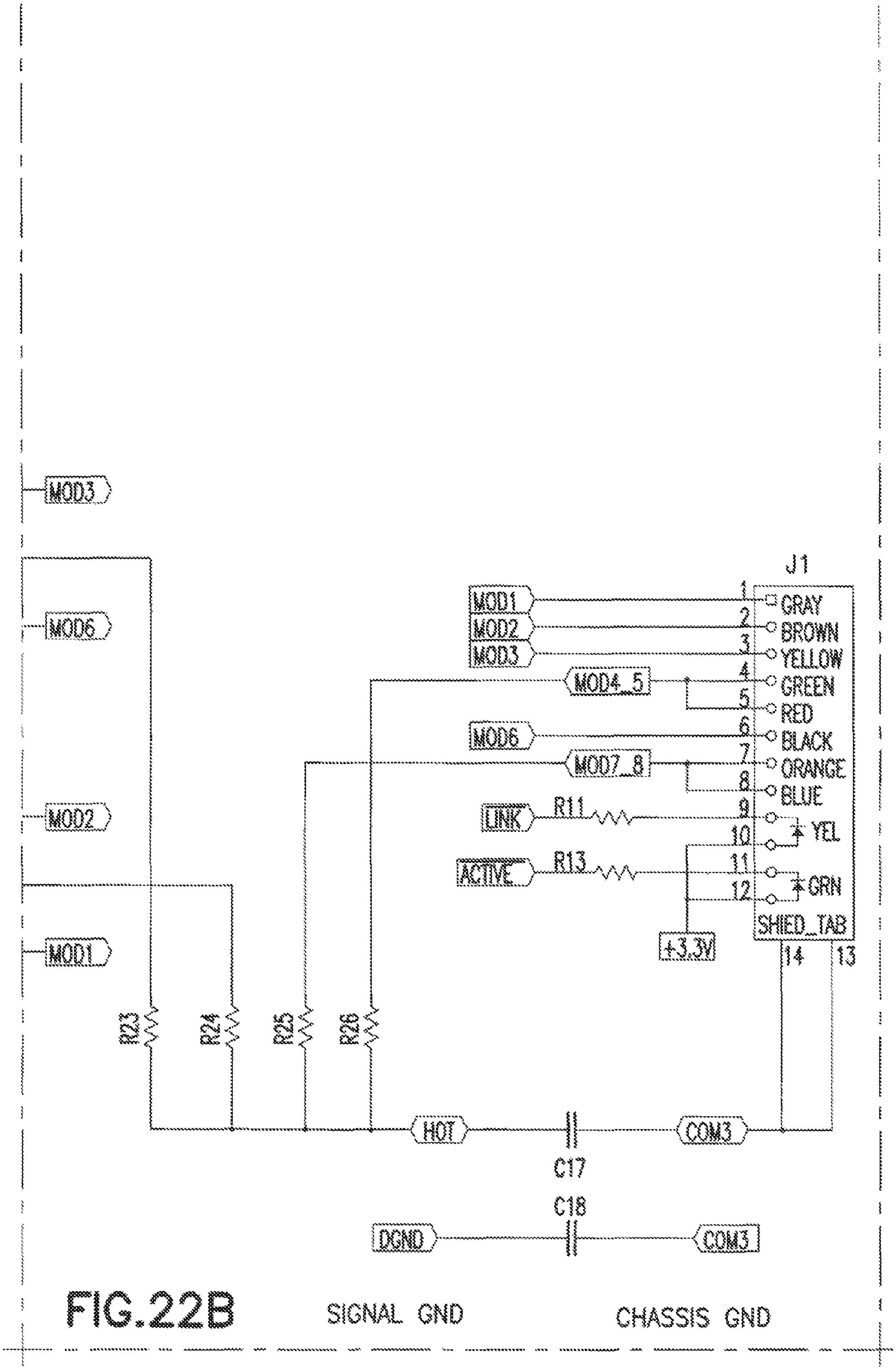
Figure 22C:
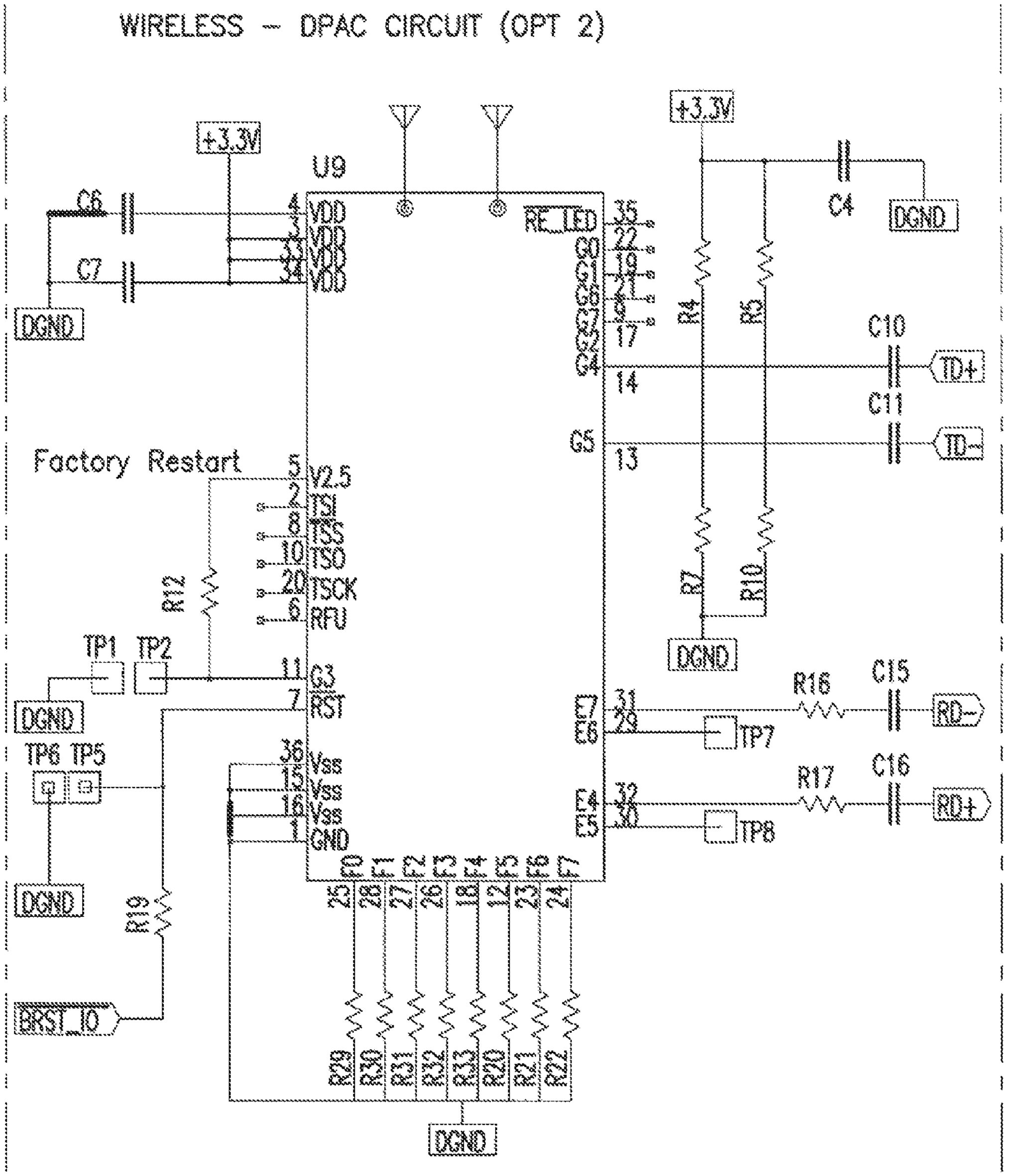
Figure 22D:
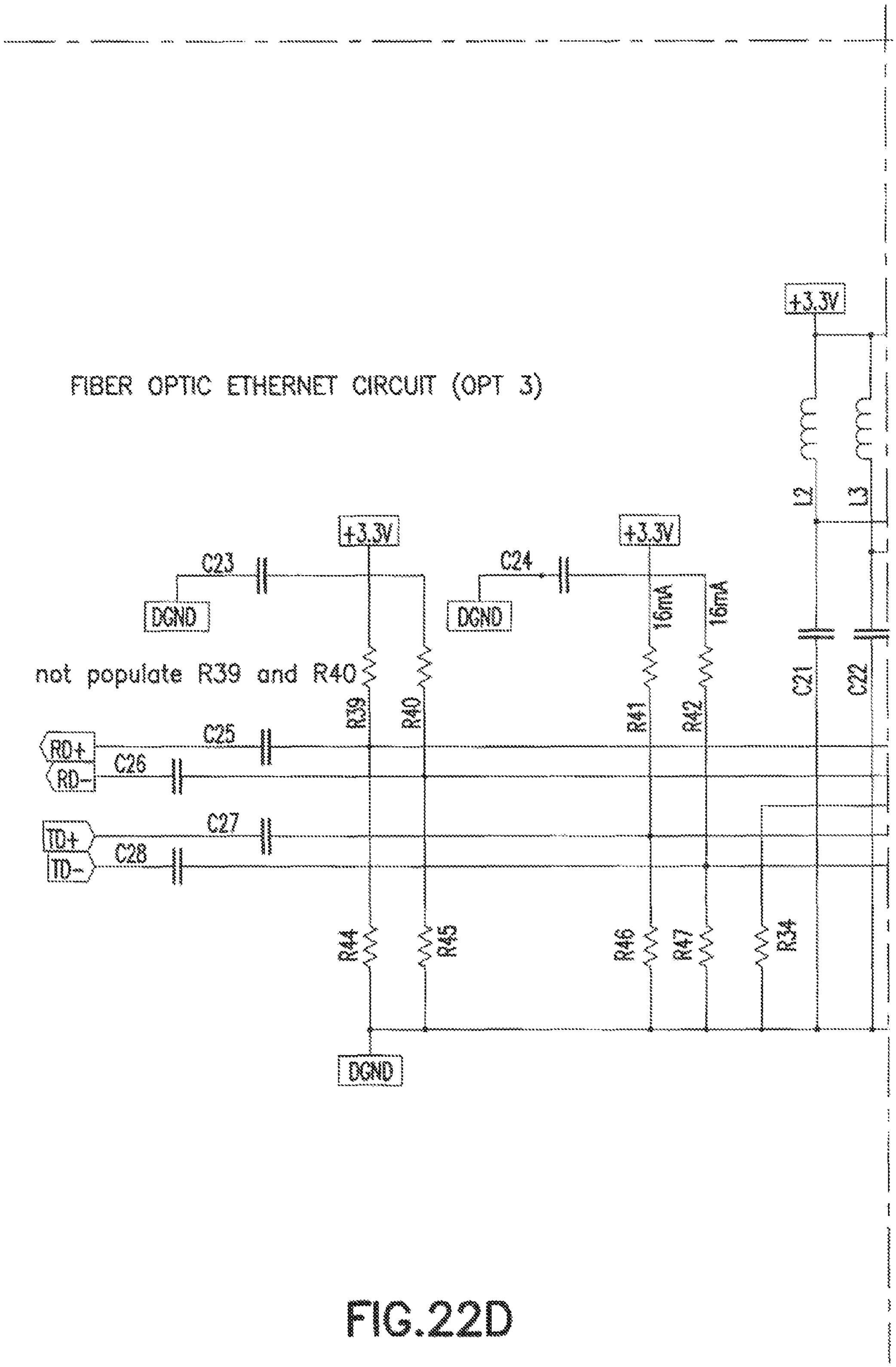
Figures 22, 22E:
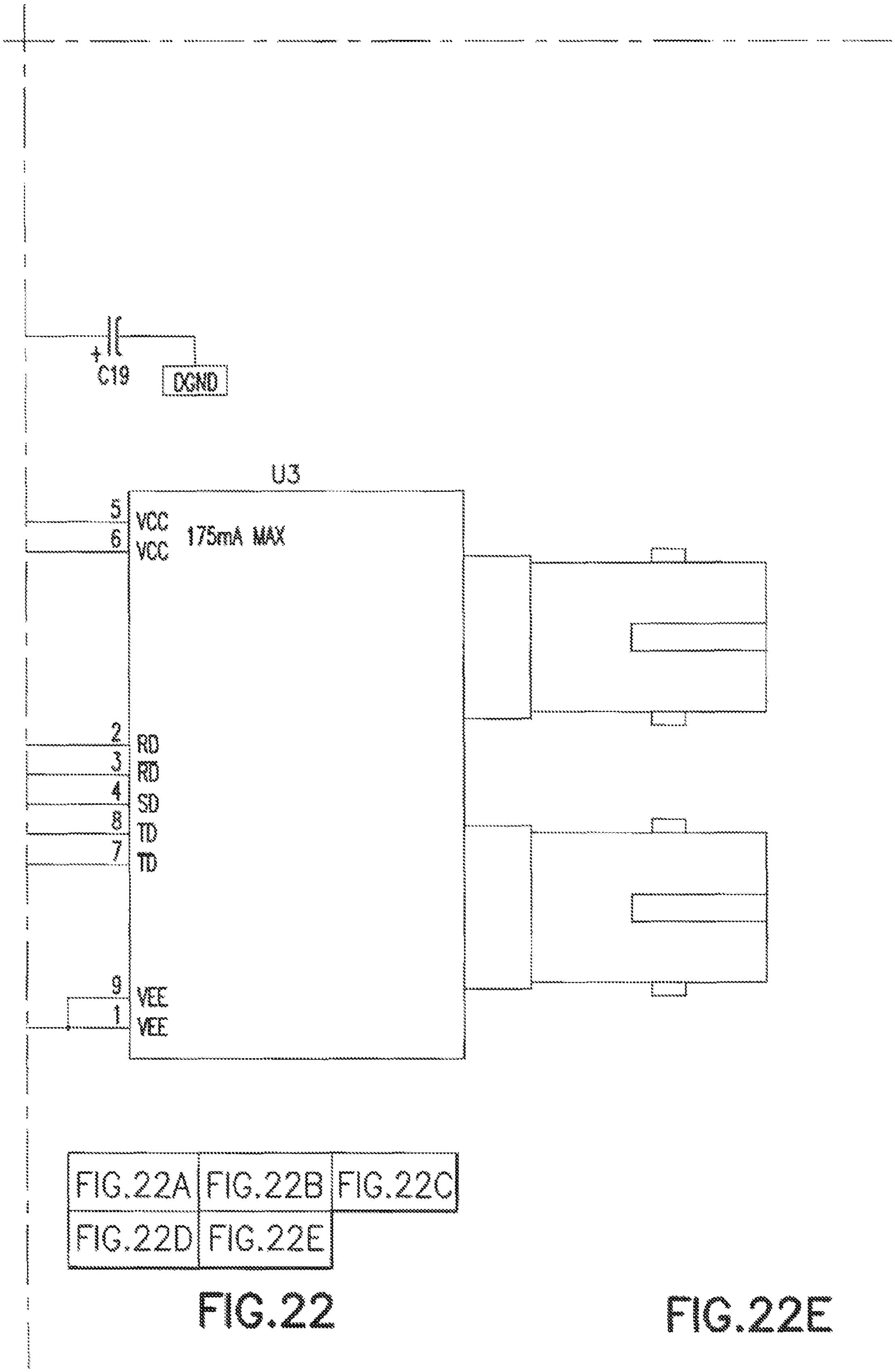

FIGS. 22A-22E illustrate various outputs of a second network board used to support Ethernet TCP/IP communication, including an RJ45 option (FIGS. 22A and 22D); fiber optic options (FIGS. 22B-C); and a wireless option, 802.11 (FIG. 22D).

Figures 23, 23A:
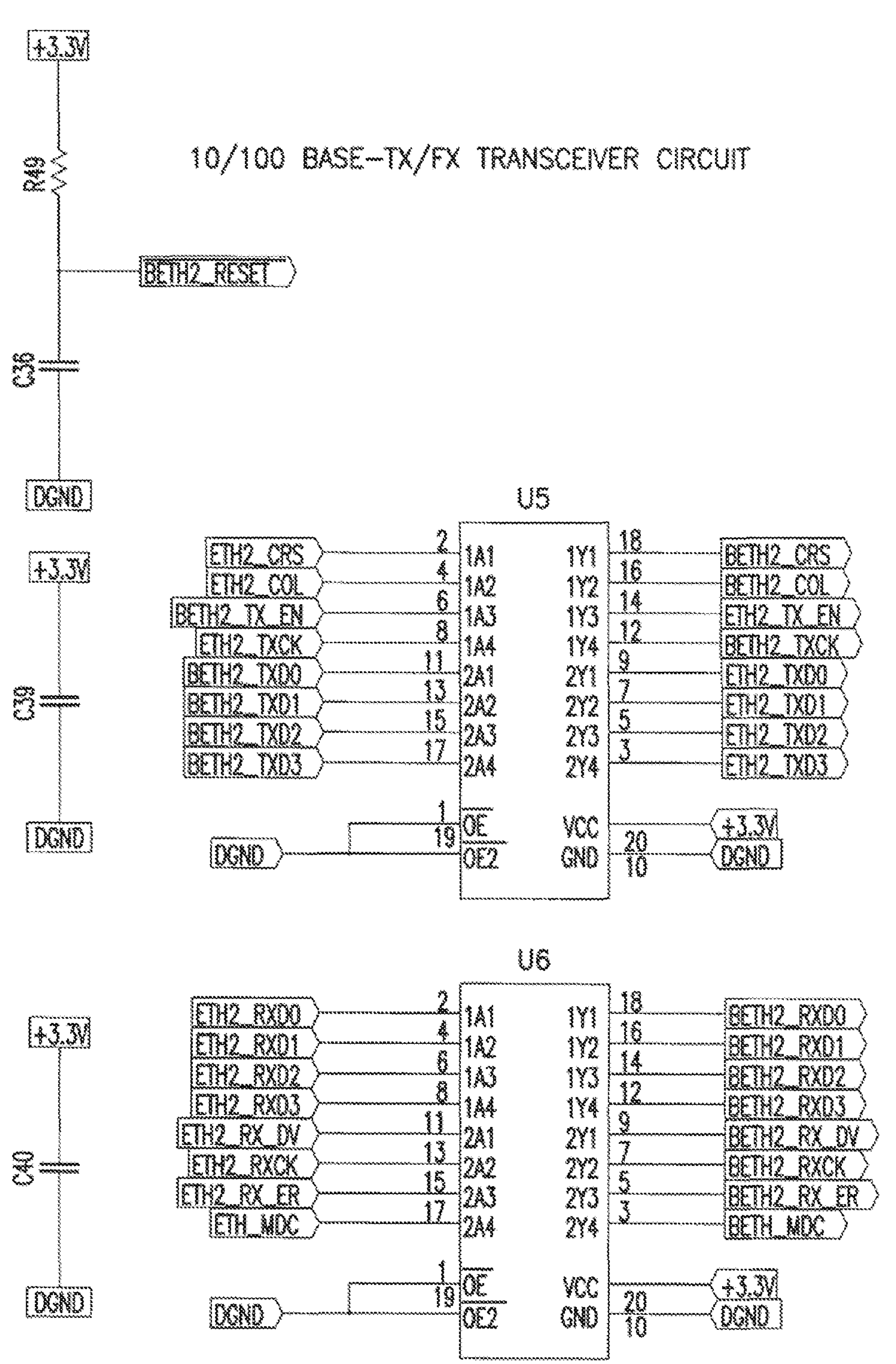
FIGS. 23A-23D illustrate Ethernet circuitry and buffers and a second 10/100 Base-TX/FX transceiver.
Figure 23B:
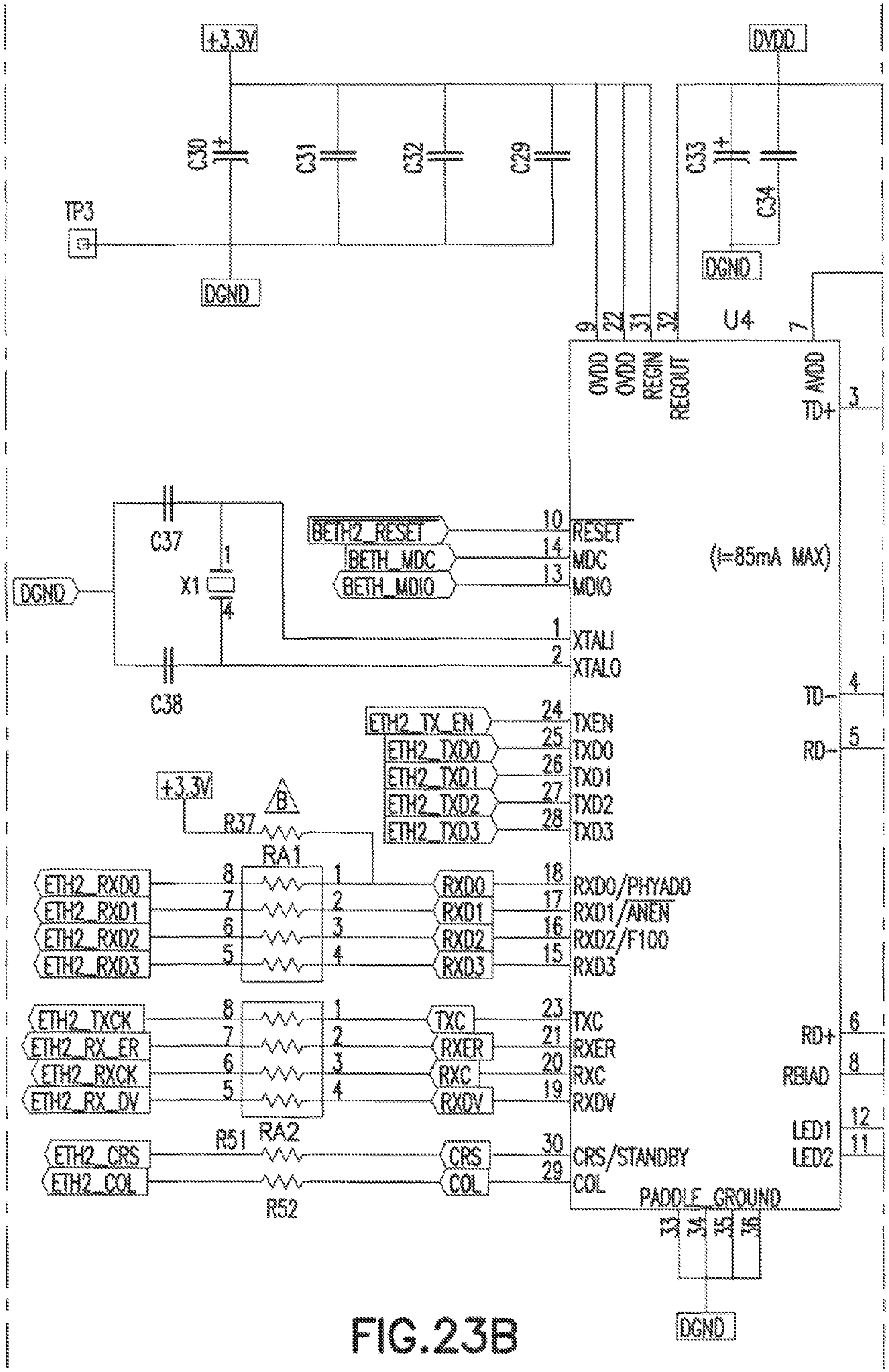
Figure 23C:
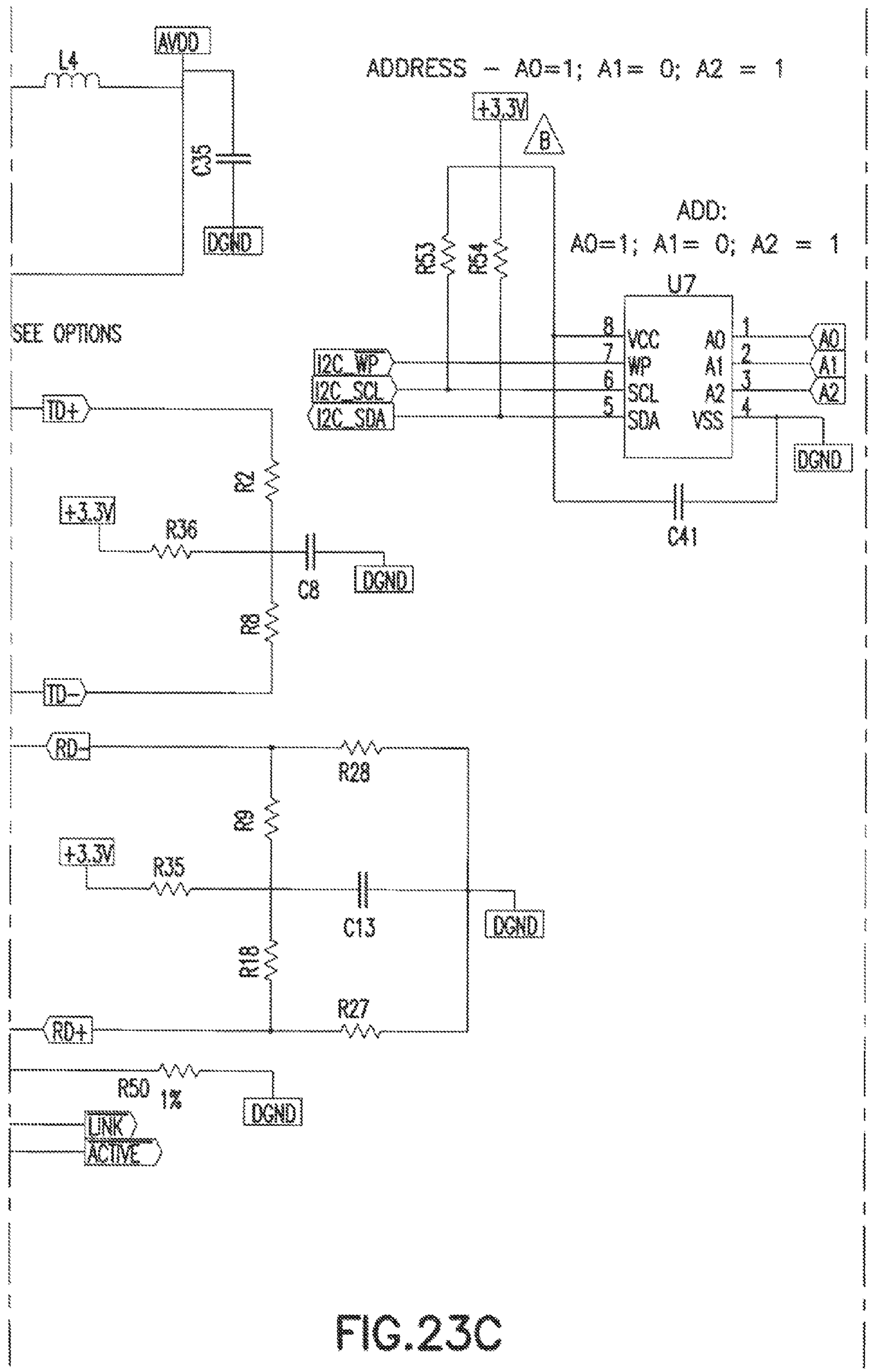
Figure 23D:
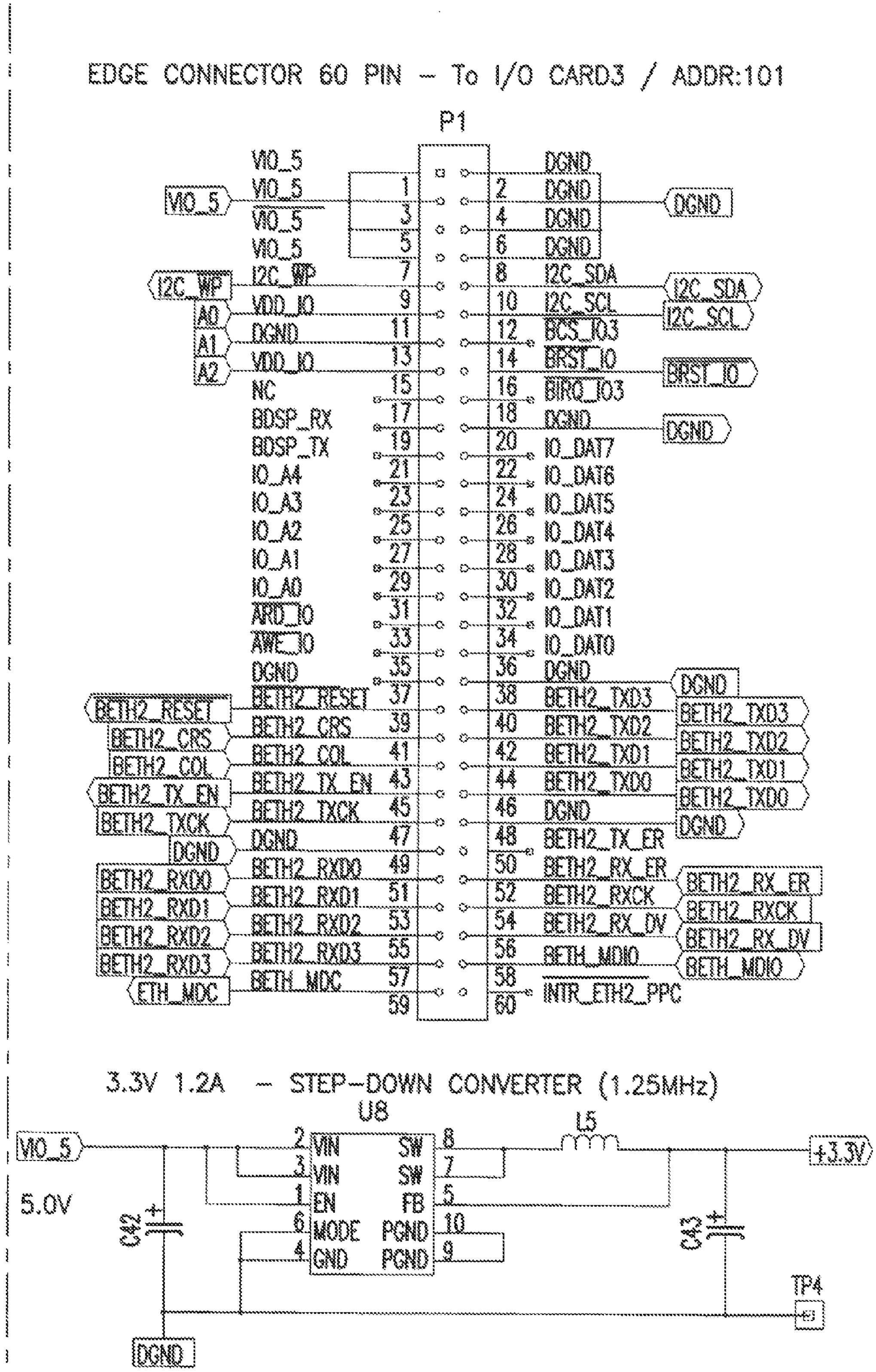

FIGS. 23A-22D illustrate another portion of the second network board, including Ethernet circuitry to support Ethernet TCP/IP communication, Ethernet buffers to buffer the Ethernet signals coming from CPU 50, and a 10/100 Base-TX/FX transceiver. Also shown are a DC-to-DC voltage regulator and I2C serial EEPROM used to communicate with and identify I/O card characteristics to CPU 50. Also shown is the I/O connector and signals for the Ethernet, I2C EEPROM, and the general-purpose data and address bus coming from CPU 50.

Figures 24, 24A, 24B, 24C, 24D:
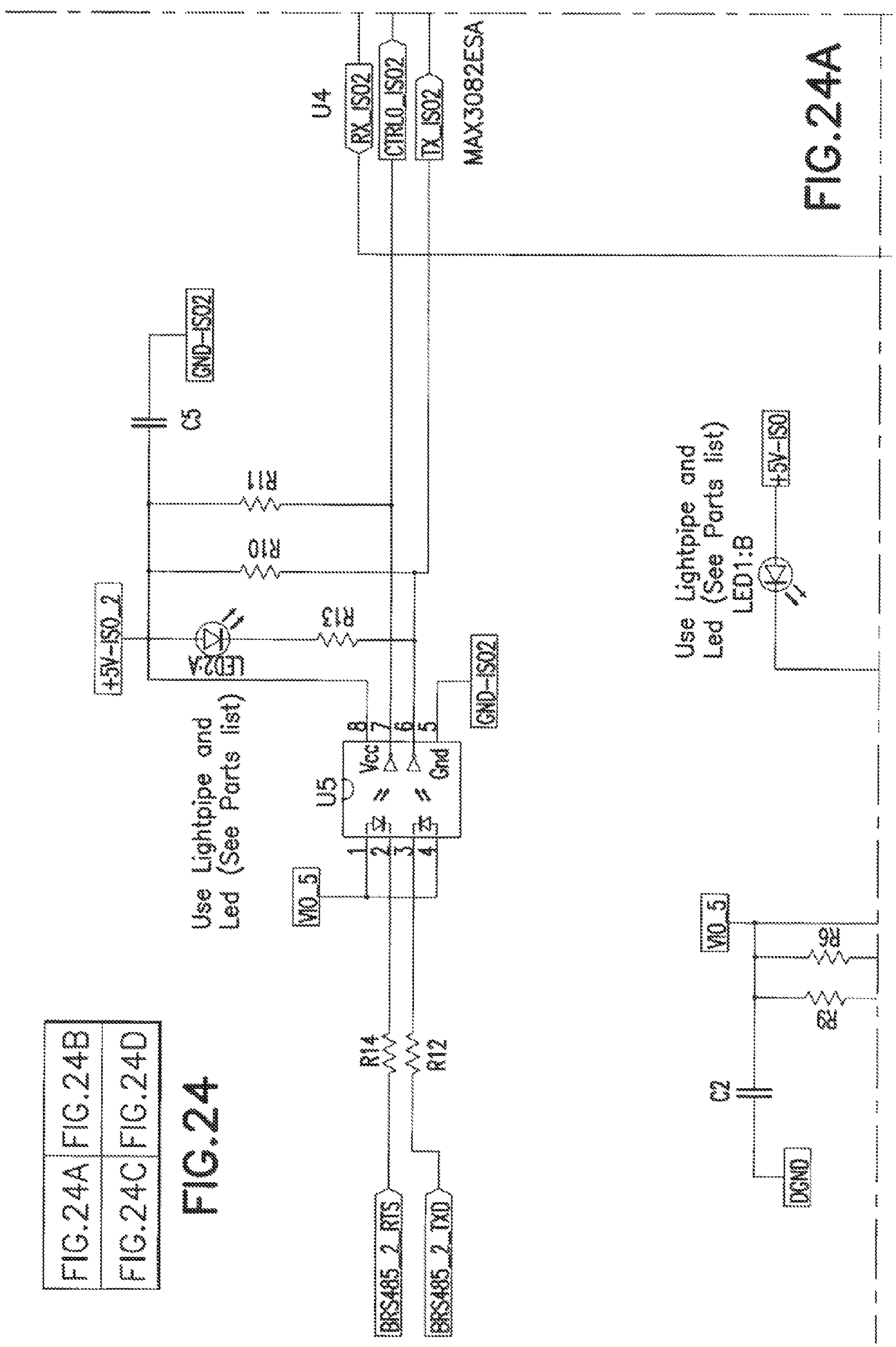
FIGS. 24A-24D illustrates 2 channels of RS-485 communication circuitry.
Figure 24B:
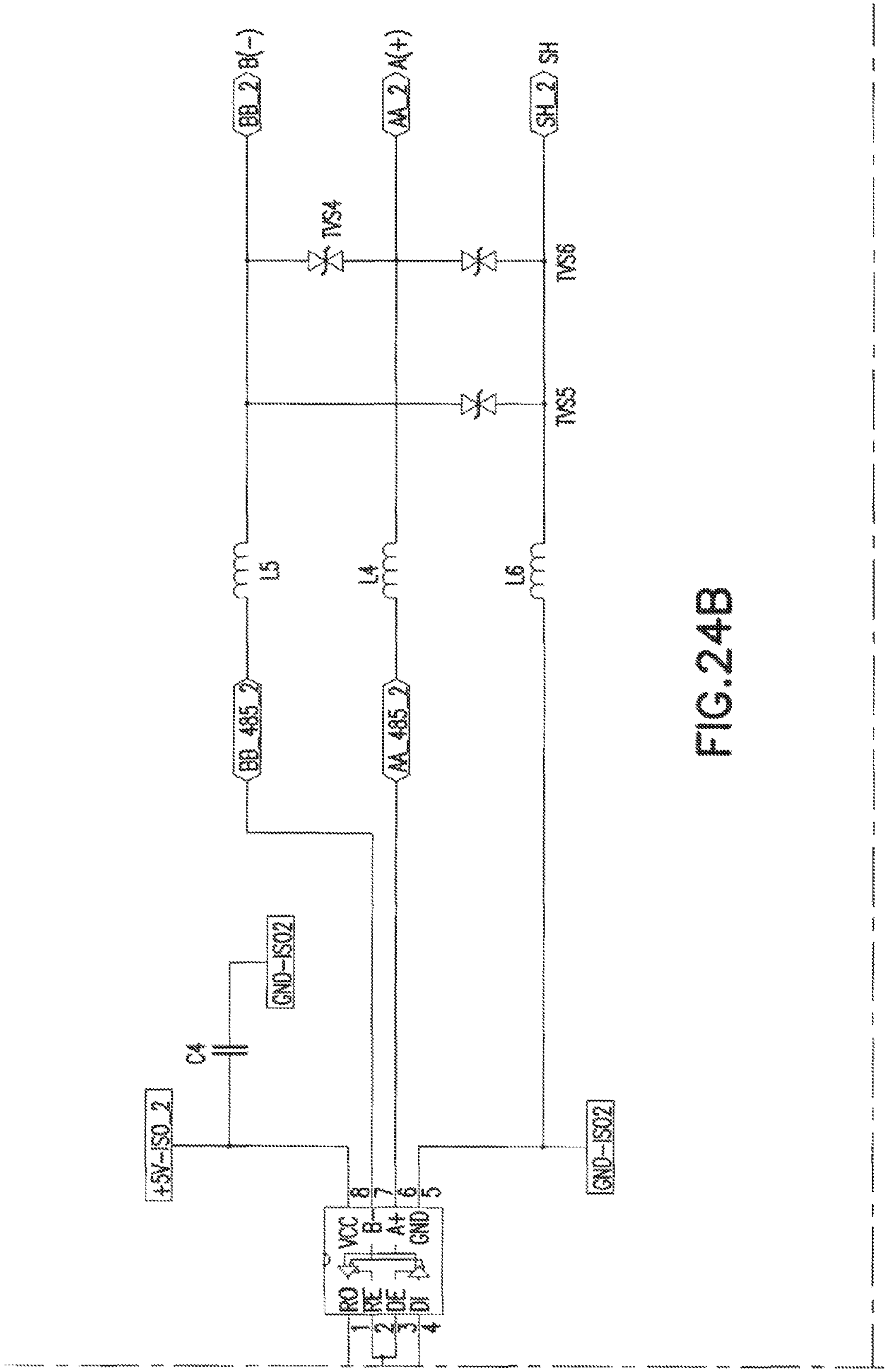
Figure 24C:
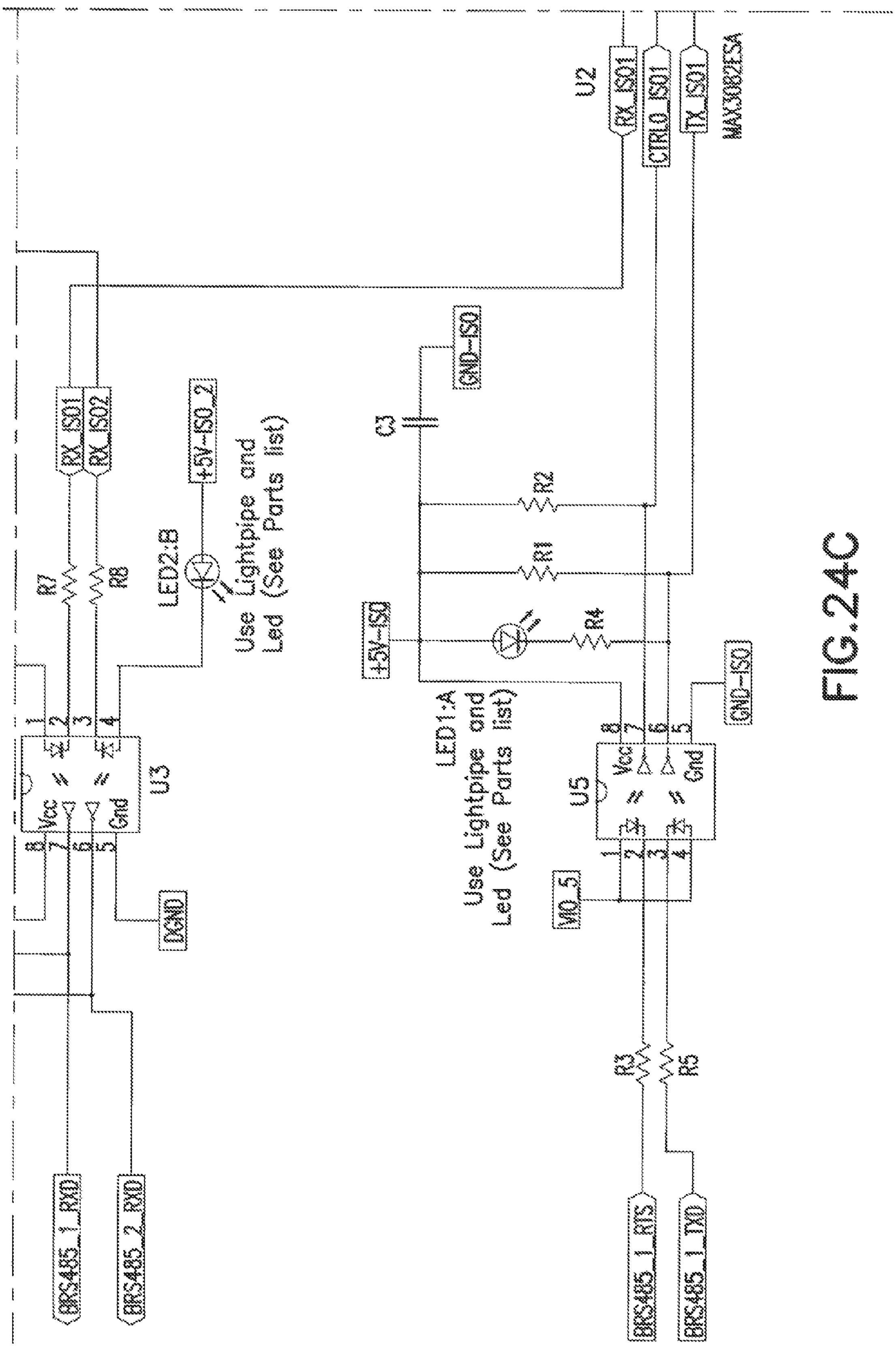
Figure 24D:
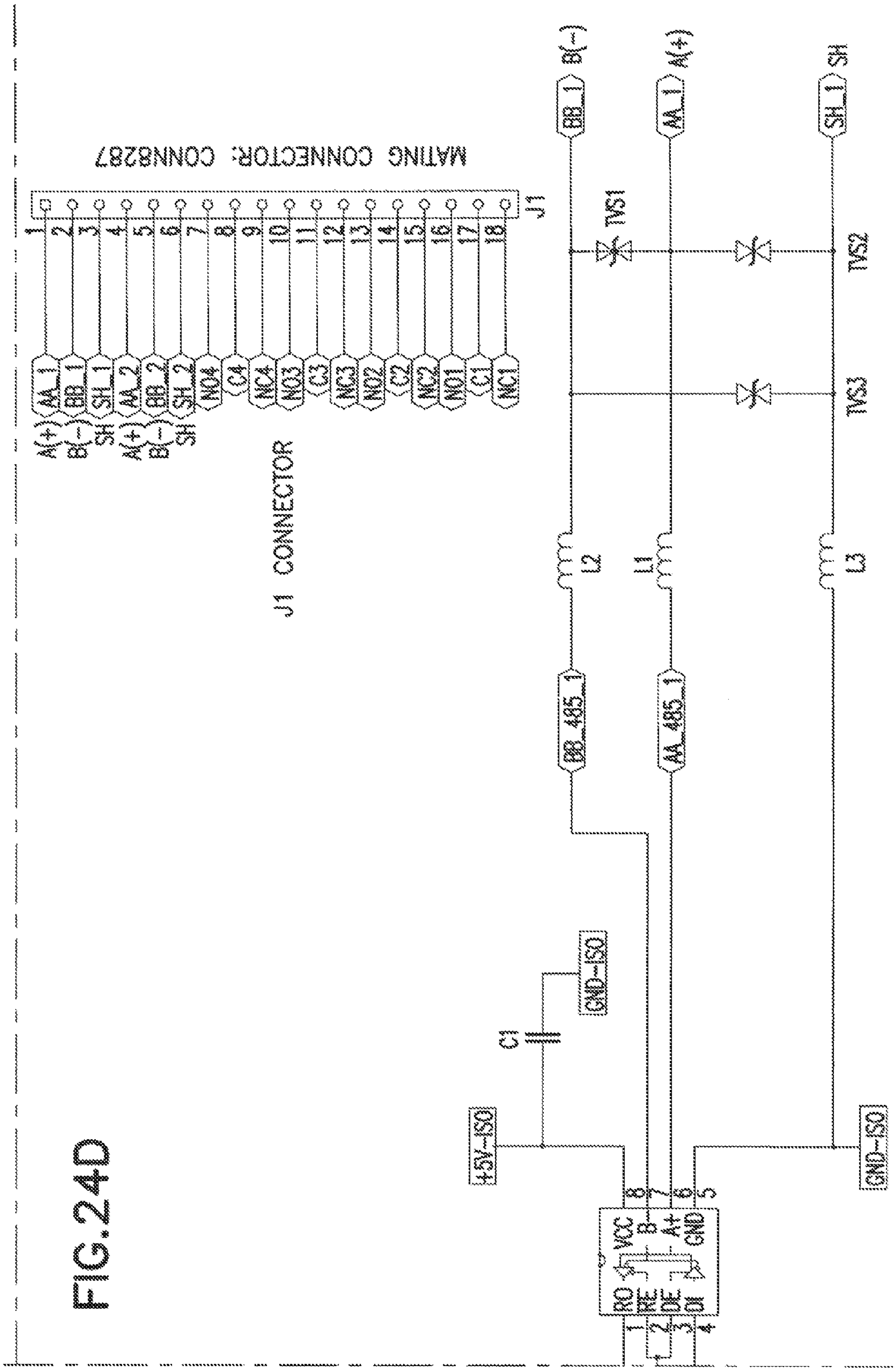

FIGS. 24A-22D illustrate 2 channels of RS485 communication circuitry, showing LED indicators and protection circuitry and optical isolation for the RS485. Also shown is a connector and signals for RS485 serial communication and KYZ pulse output signals.

Figure 25A:
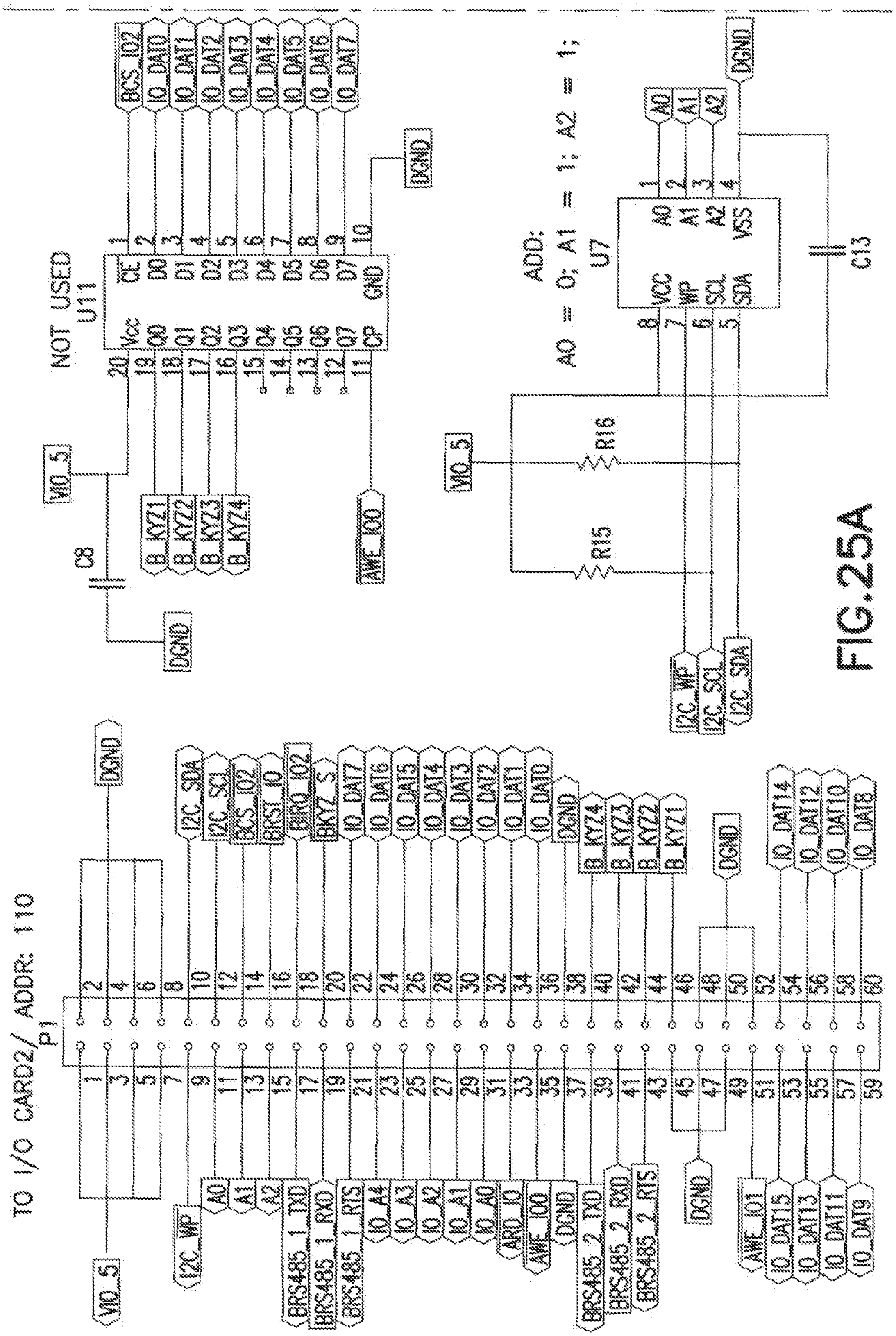
FIGS. 25A-25C illustrates circuitry for pulsed outputs (also known as KYZ outputs).
Figure 25B:
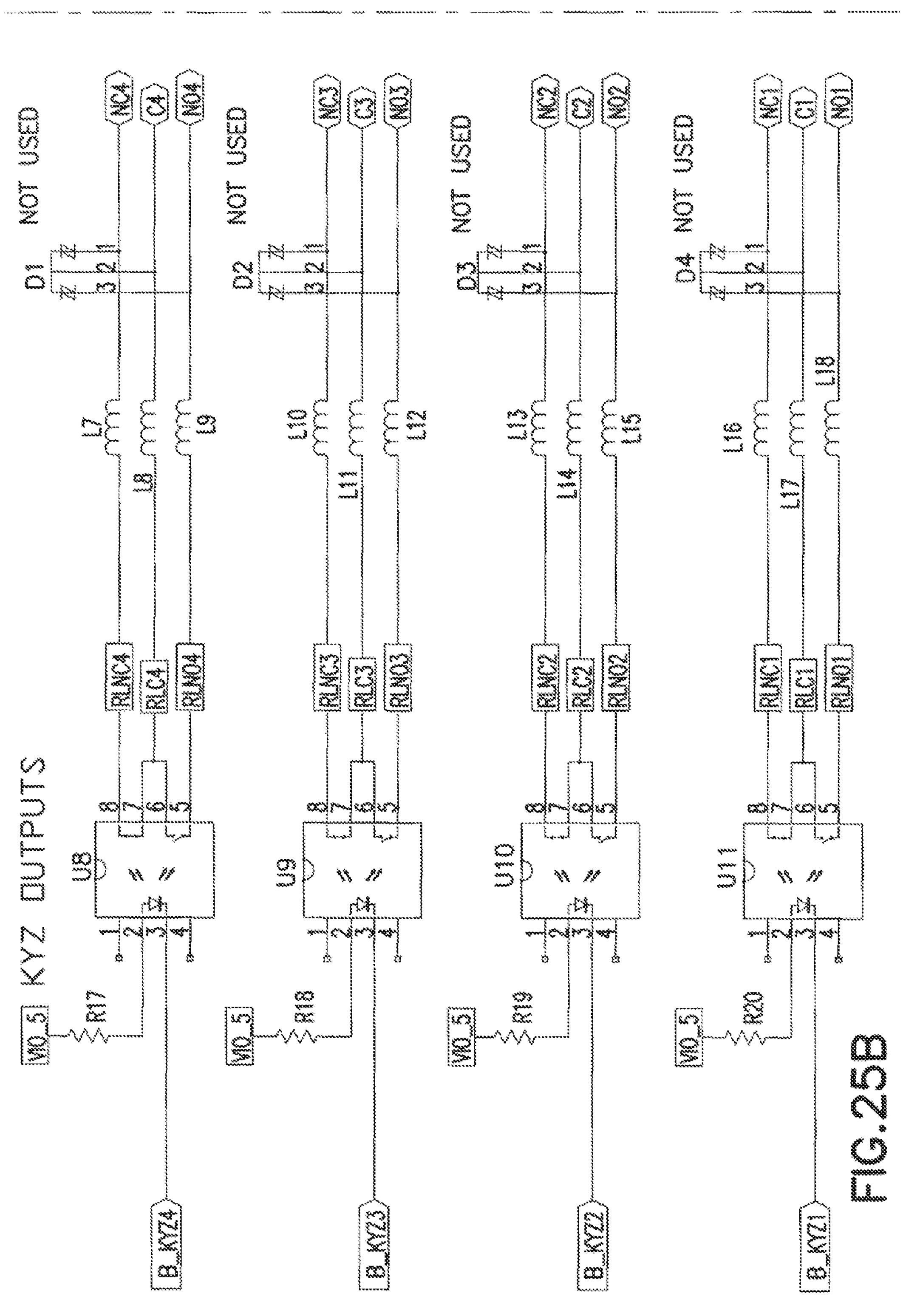
Figures 25, 25C:
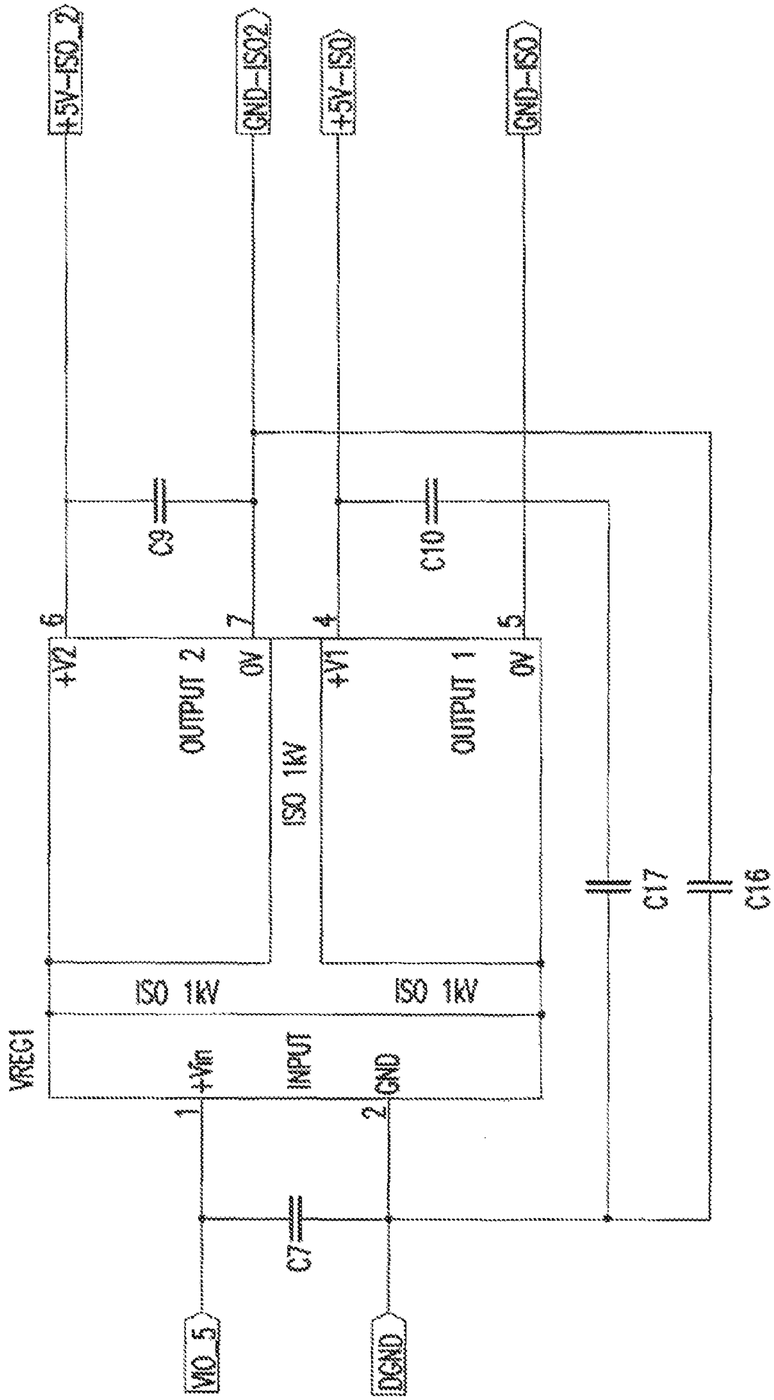

FIGS. 25A-25C illustrate circuitry for pulsed outputs (also known as KYZ outputs). Also shown is a connector and signals, which come from CPU 50, for RS485 serial communications, KYZ pulse outputs, the I2C EEPROM, and the general-purpose data and address bus. Also shown are a DC-to-DC voltage regulator and I2C serial EEPROM used to communicate with and identify I/O card characteristics to CPU 50.

Figures 26, 26A:
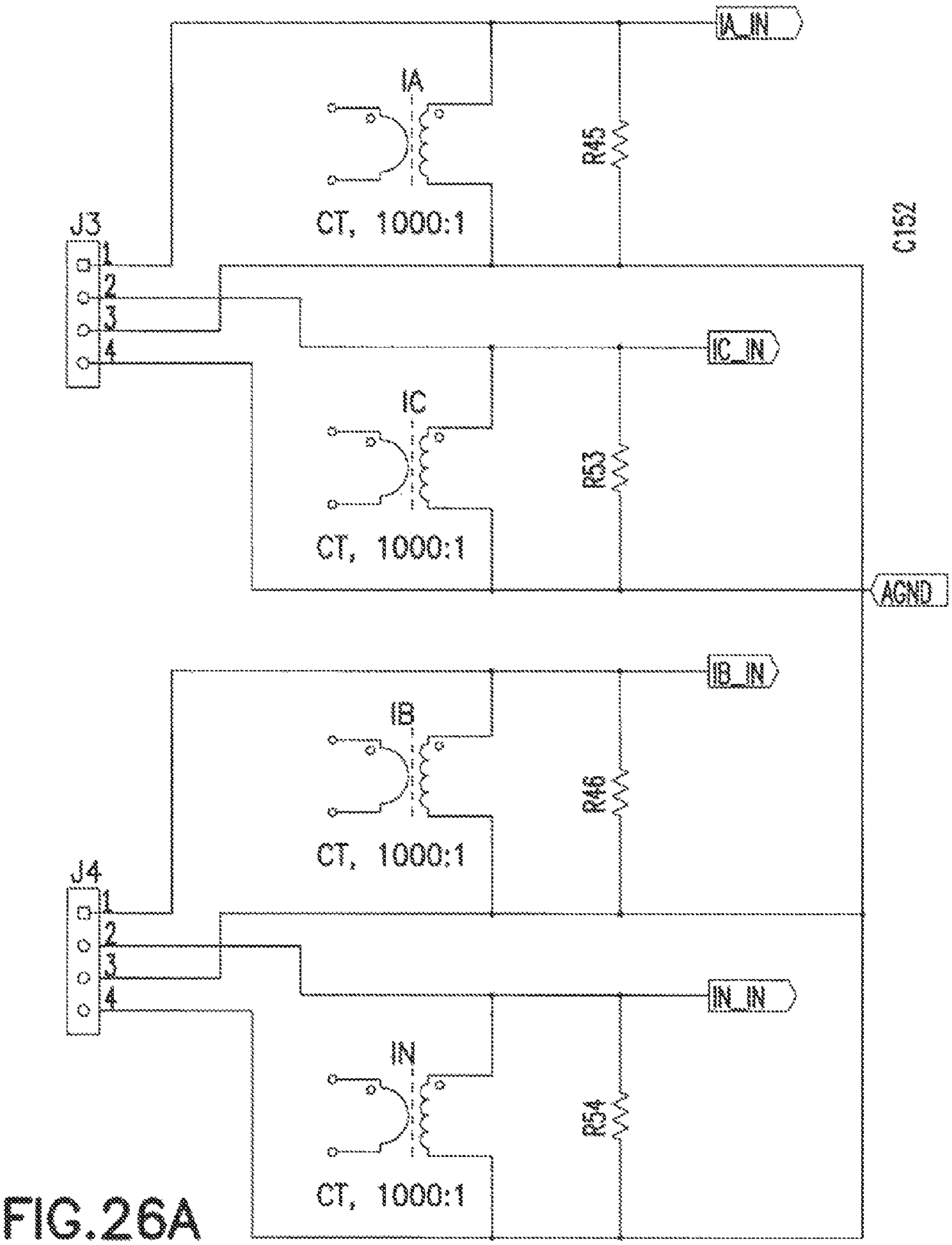
FIGS. 26A-26B illustrate the current input channels and voltage transient buffers.
Figure 26B:
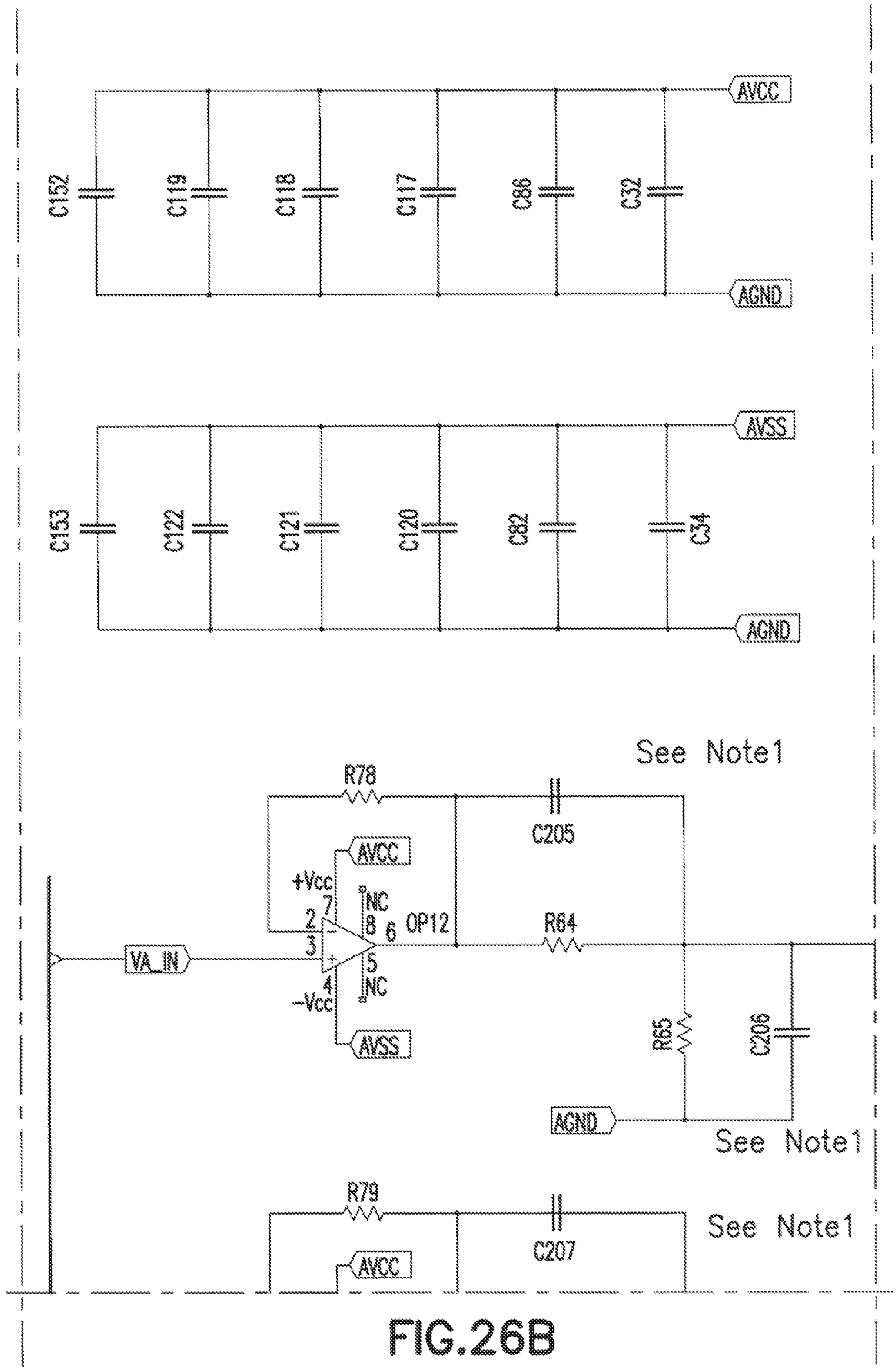

FIG. 26A illustrates the current input channels and voltage transient buffers. Also shown are the voltage decoupling capacitors used to reduce noise. The current inputs and the transient signals are routed in such a way to prevent crosstalk between waveform capture and revenue measurement circuits. This is done by assuring that a circuit does not overlap or lie in close approximation with part of another circuit, and each trace is properly separated from each other.

Figure 26C:
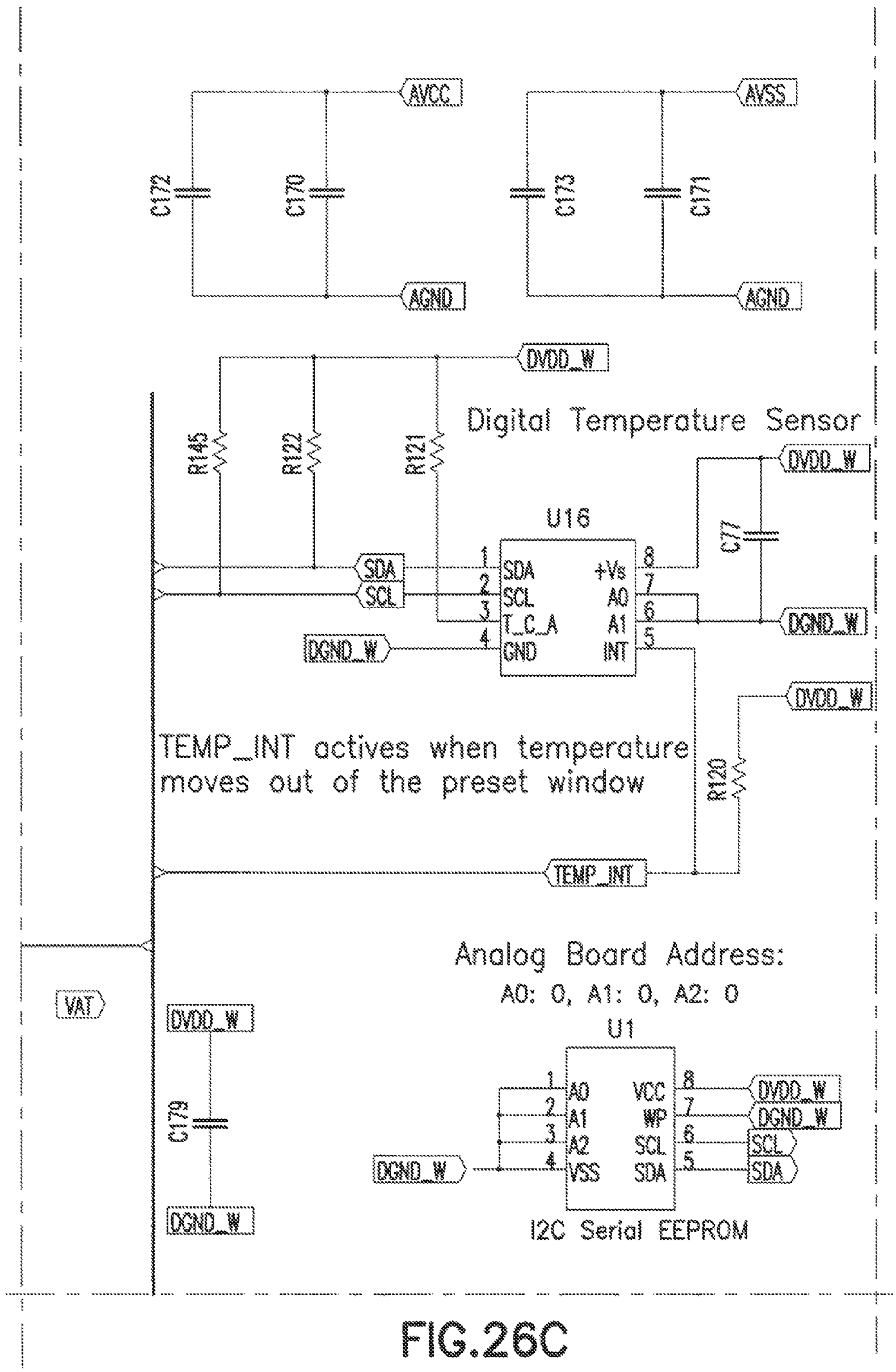
FIG. 26C illustrates an I2C serial EEPROM and a temperature sensing circuit employed for calibration.
Figure 26D:
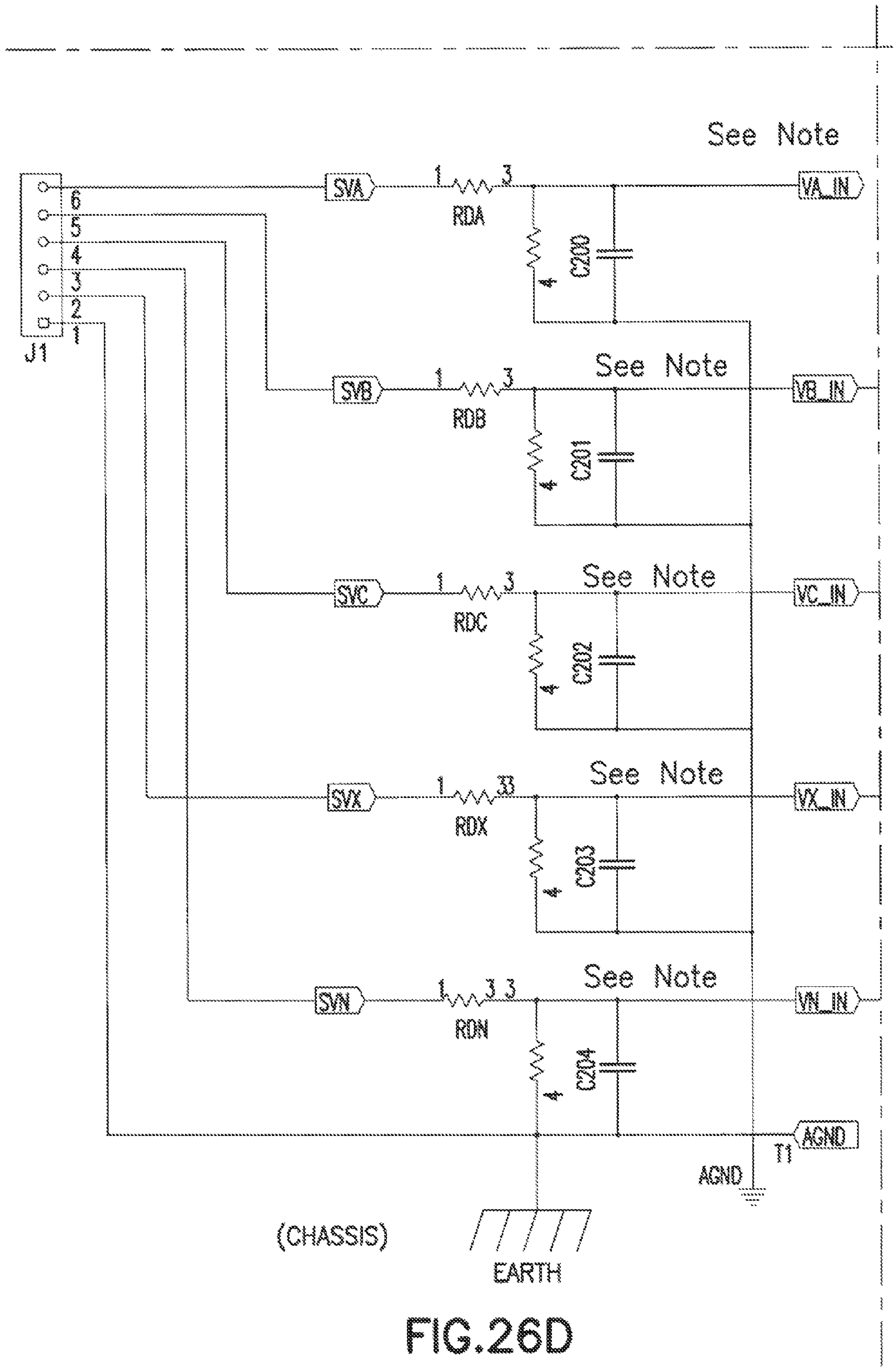
FIG. 26D-26E illustrates the voltage input channels and voltage transient buffers.
Figure 26E:
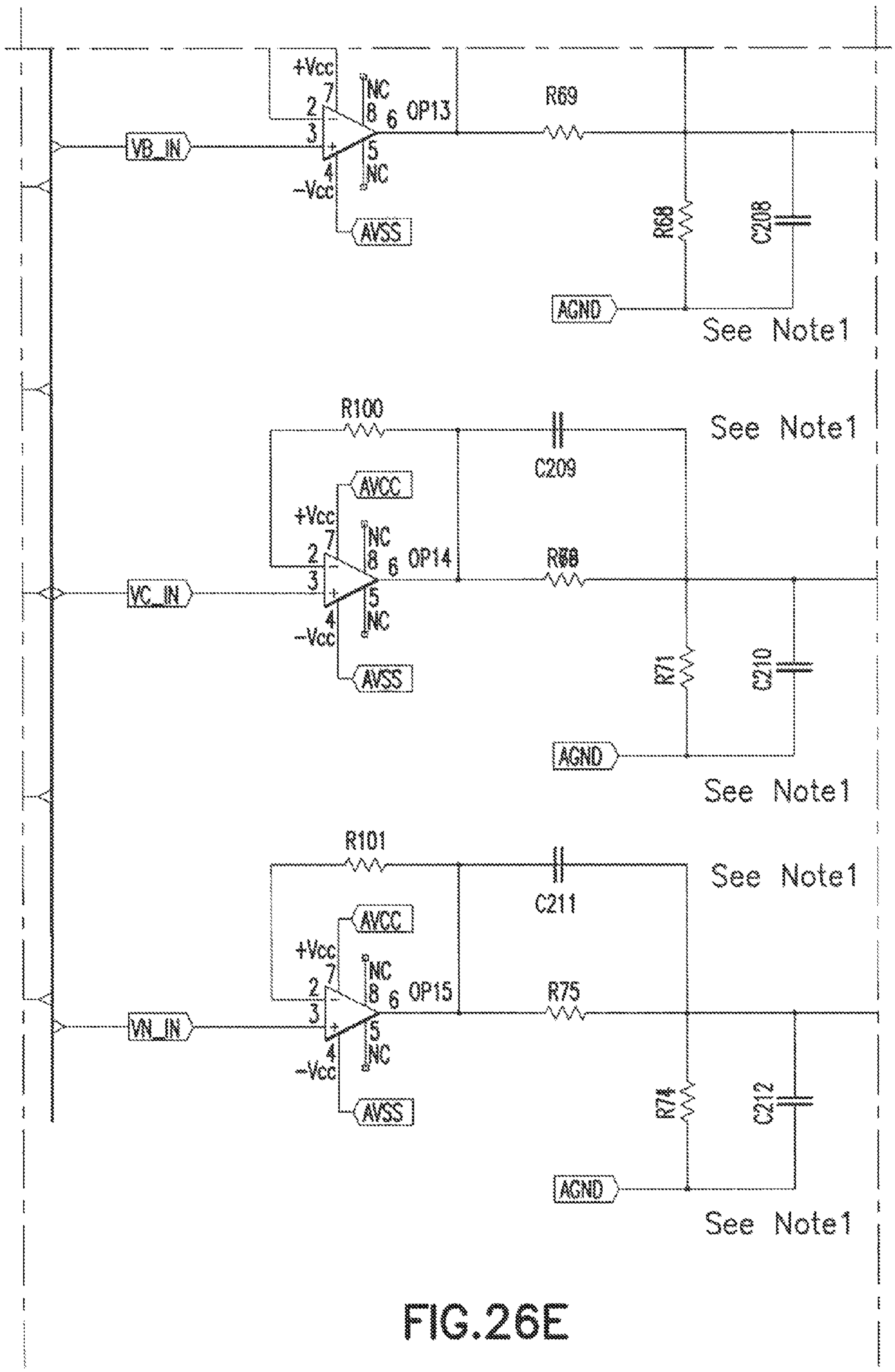

FIG. 26D-26E illustrates the voltage input channels and voltage transient buffers. The voltage inputs and the transient signals are routed in such a way to prevent crosstalk between waveform capture and revenue measurement circuits. This is done by assuring that a circuit does not overlap or lie in close approximation with part of another circuit, and each trace is properly separated from each other.

Figure 26F:
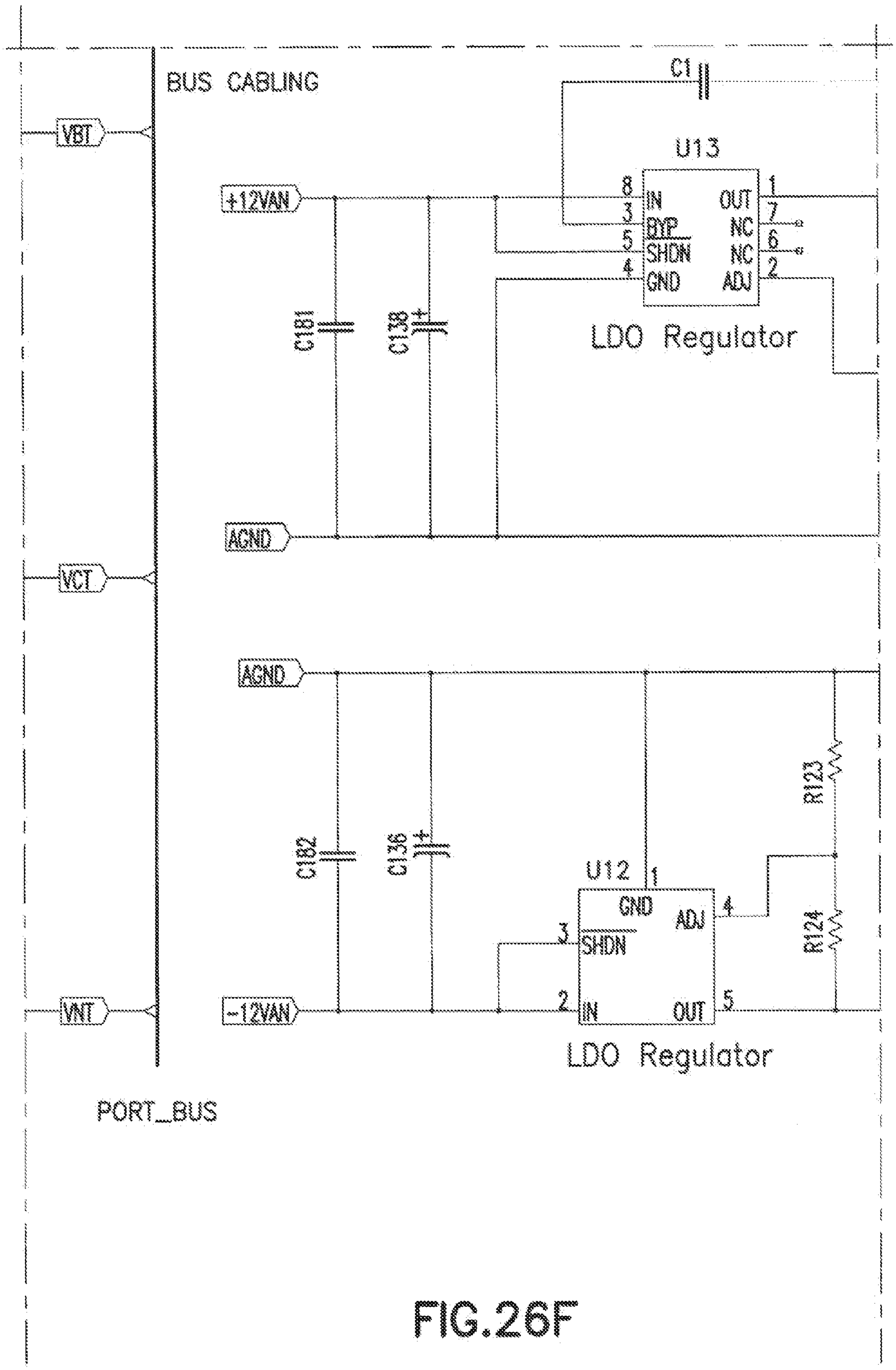
FIGS. 26F-26G illustrates a high voltage regulator.
Figure 26G:
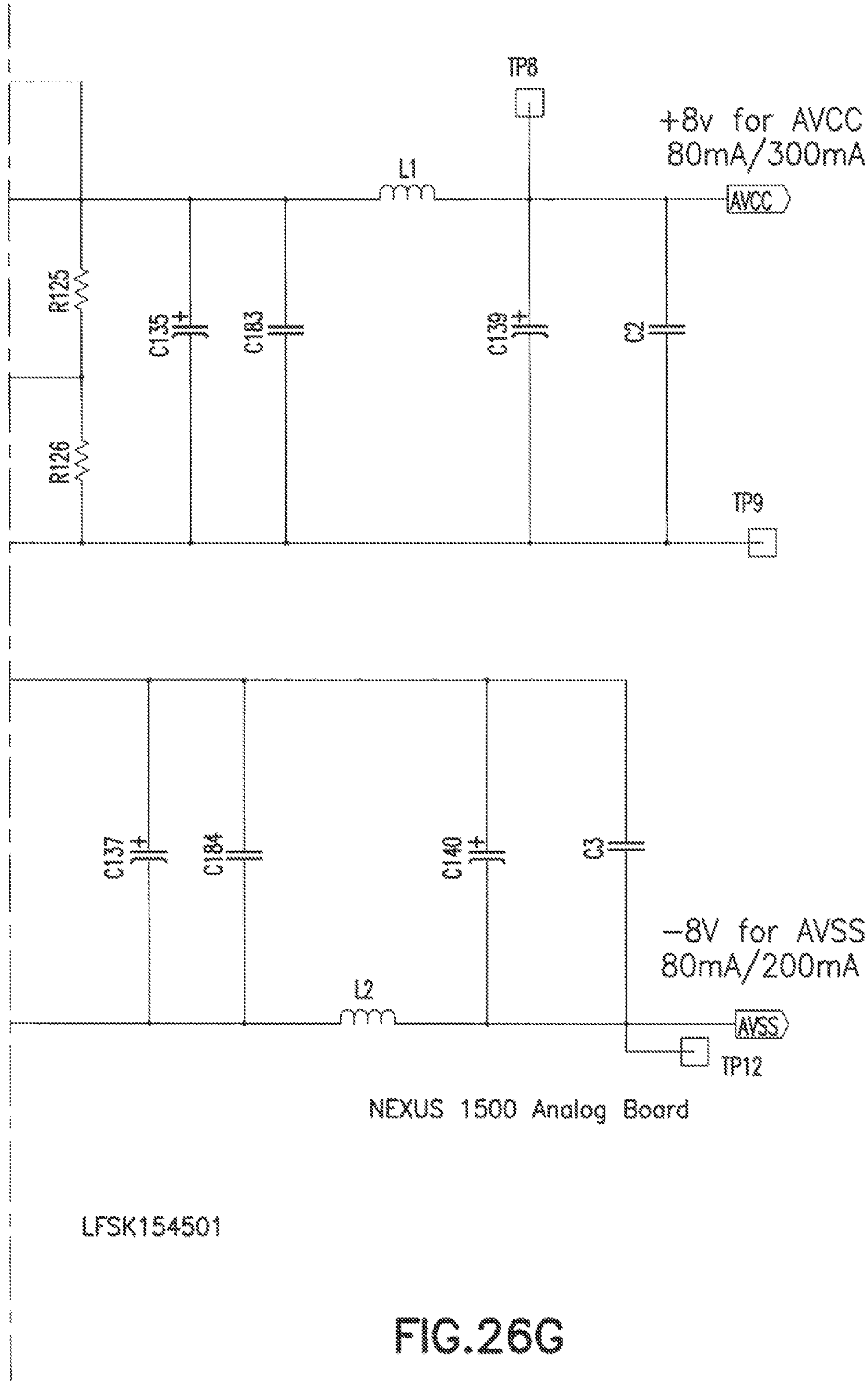

FIGS. 26E-26G illustrates +/−12 Volt regulators to produce +/−8 Volts for the analog circuitry.

FIG. 26C illustrates an I2C serial EEPROM and an I2C temperature sensing circuit employed for calibration. The I2C serial EEPROM is used to communicate with and identify I/O card characteristics to CPU 50. Also shown are the voltage decoupling capacitors used to reduce noise.

Figure 27A:
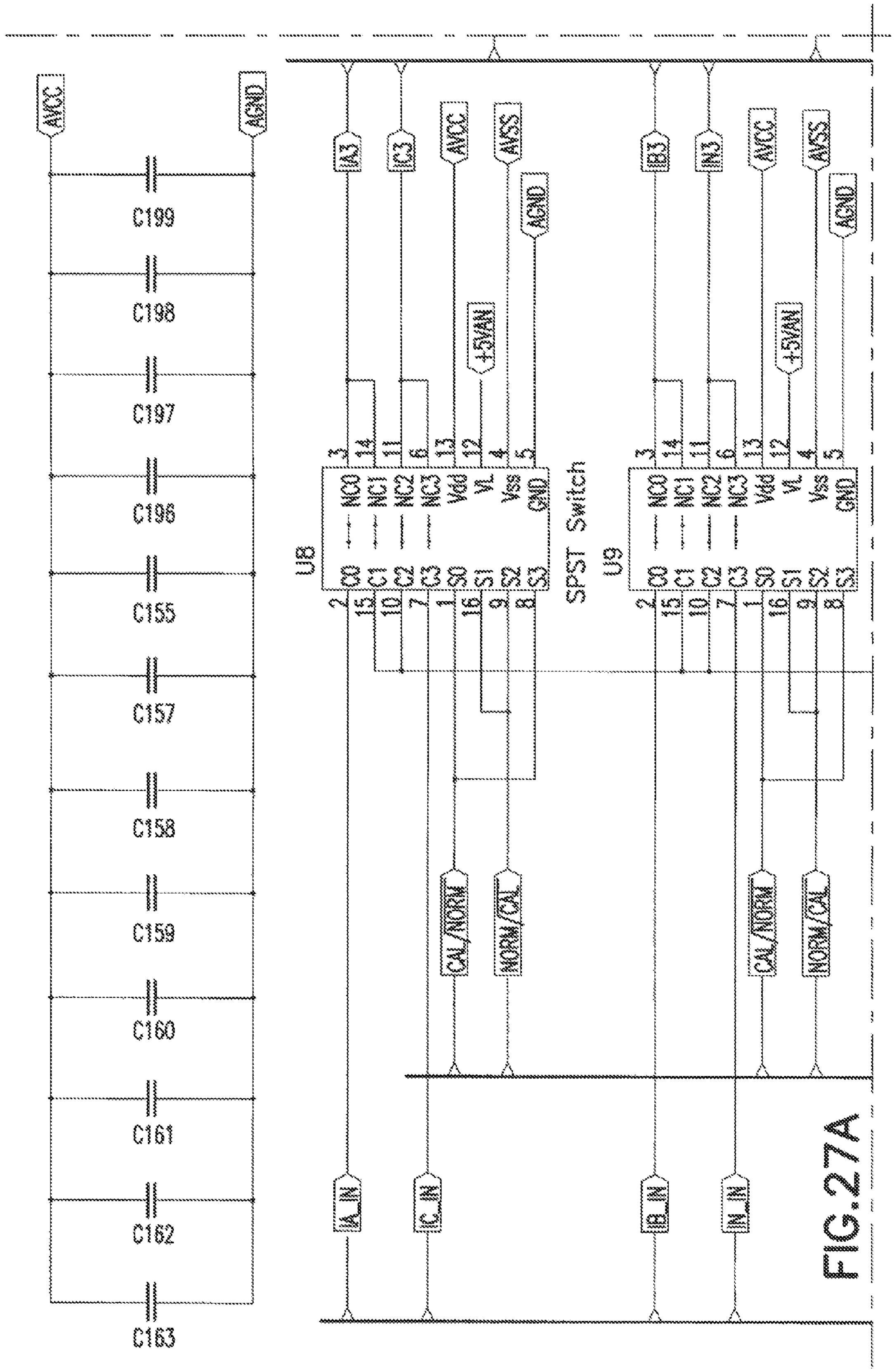
FIGS. 27A-27D and 27G illustrate calibration circuitry.
Figure 27B:
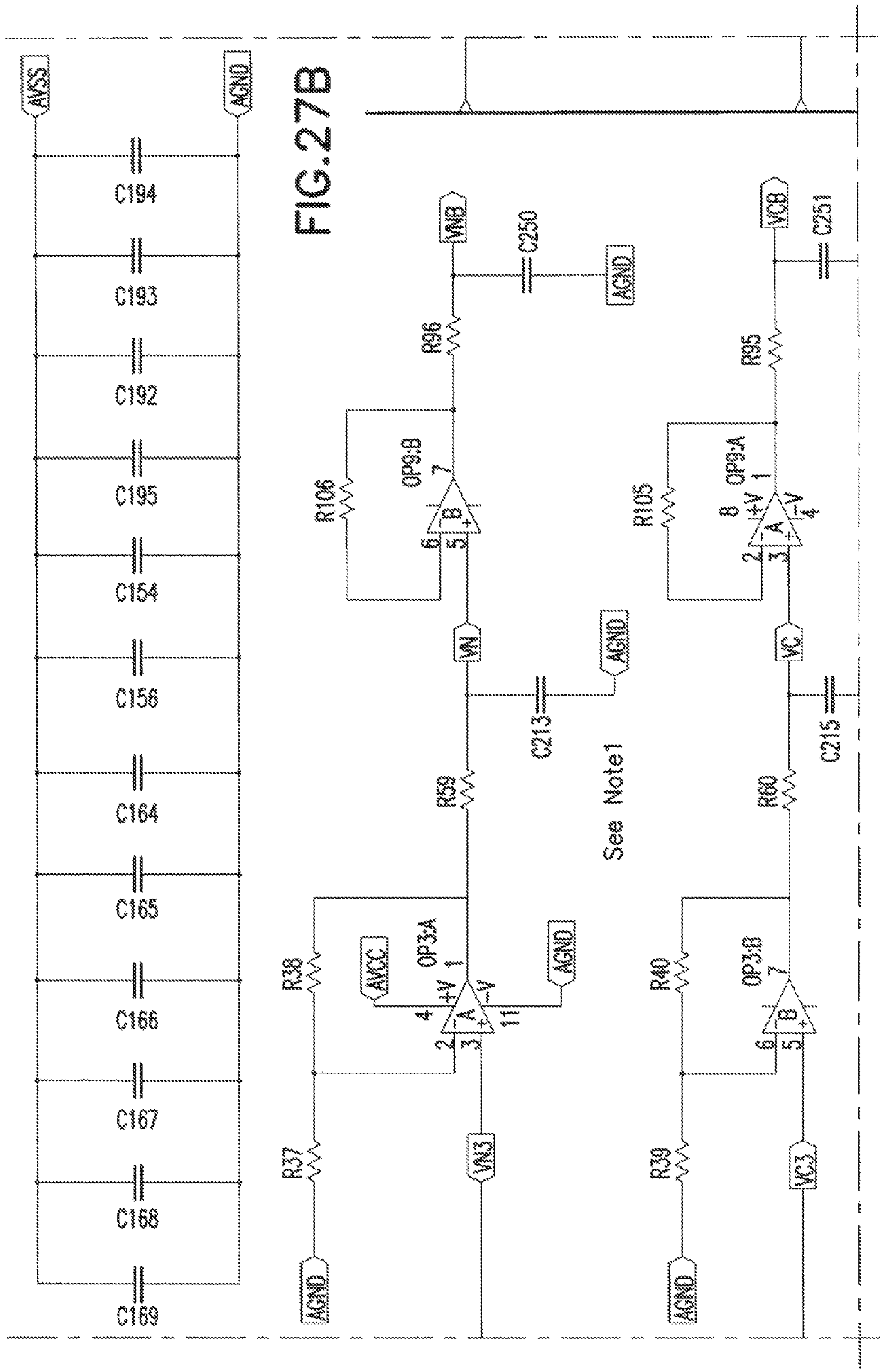
Figure 27C:
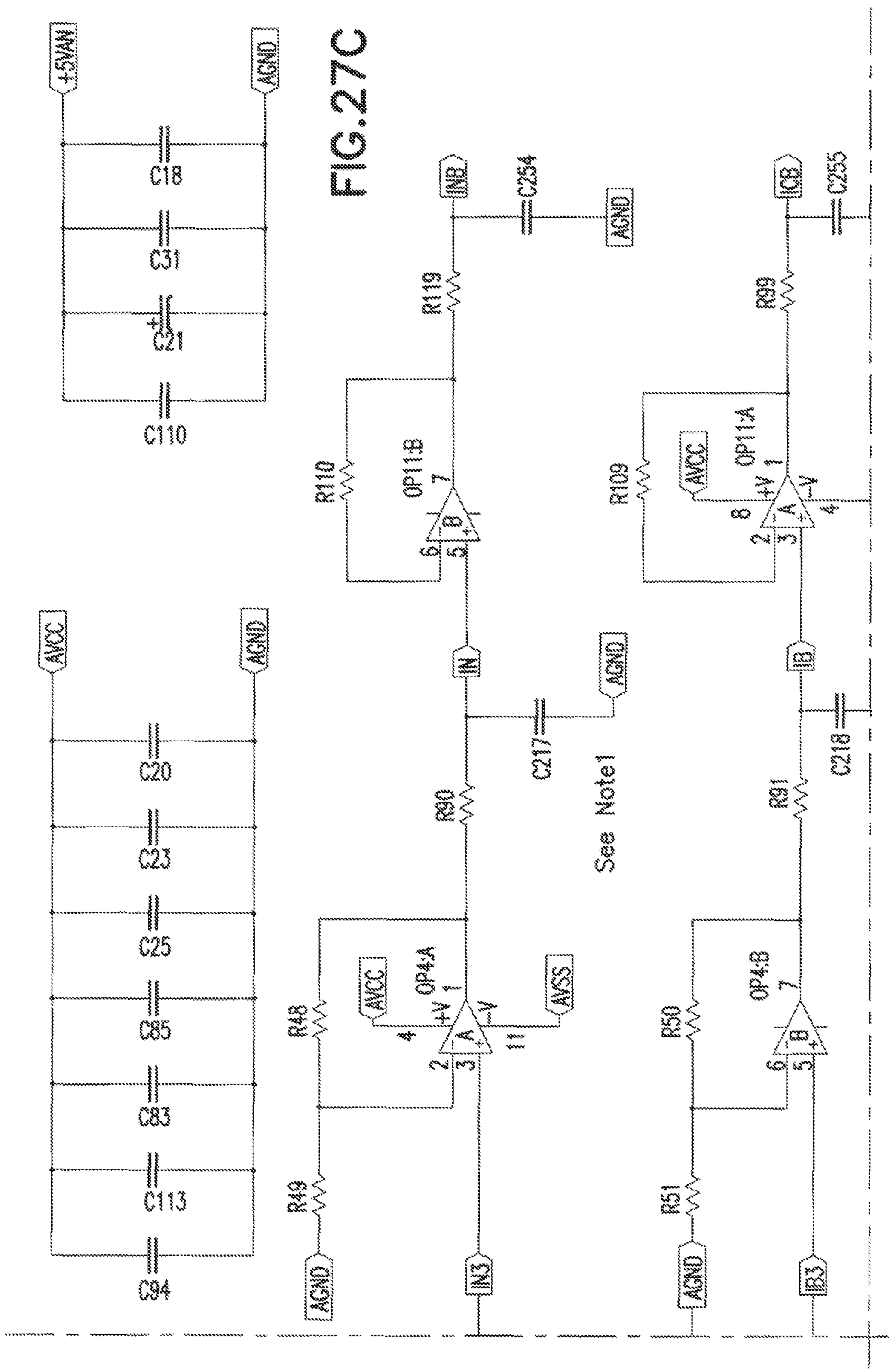
Figure 27D:
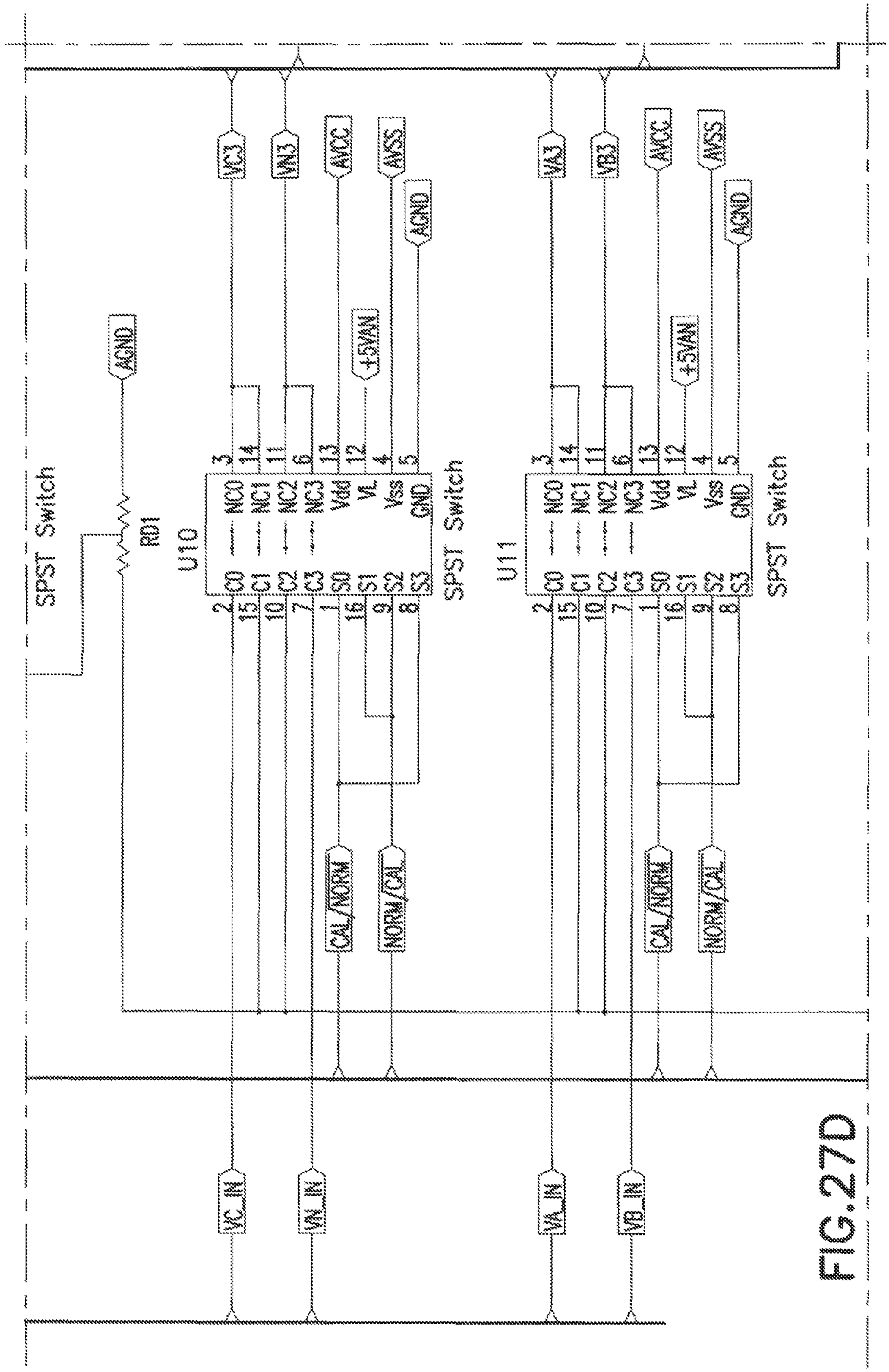
Figure 27E:
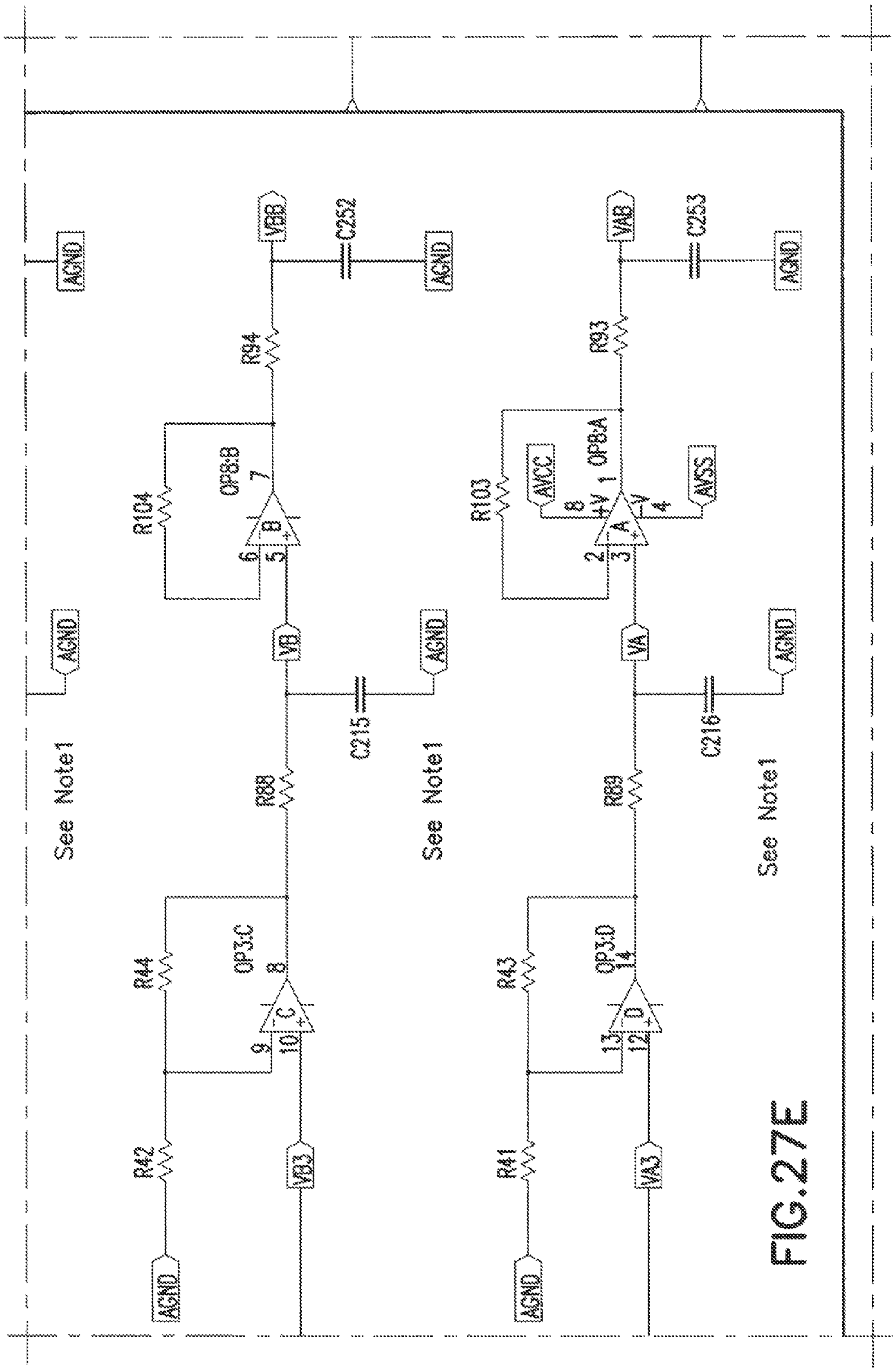
FIGS. 27E-27F and 27H illustrate voltage and current buffers (also known as conditioning circuitry) for the revenue-measuring path described above.
Figure 27F:
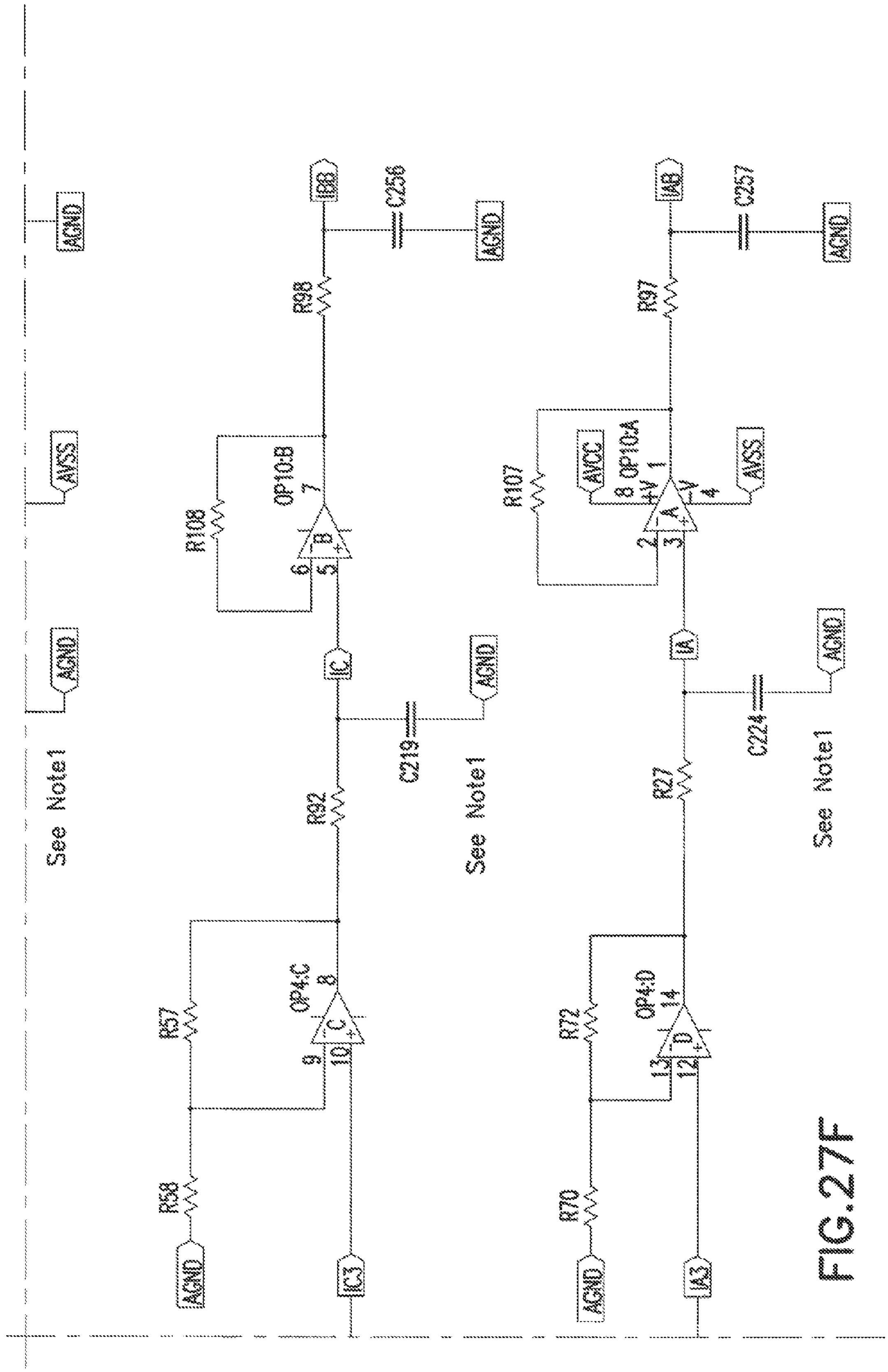
Figure 27G:
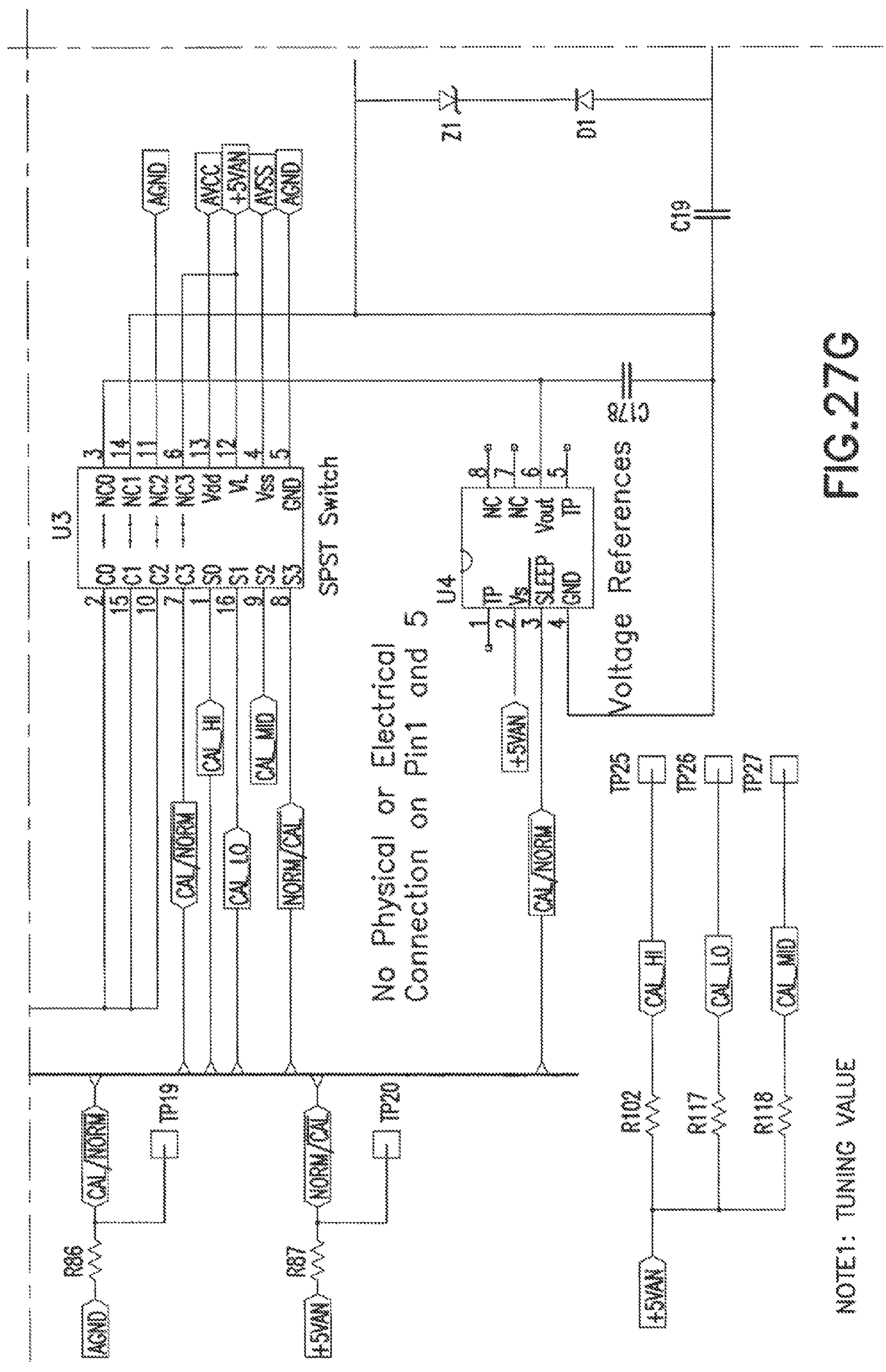
Figure 27H:
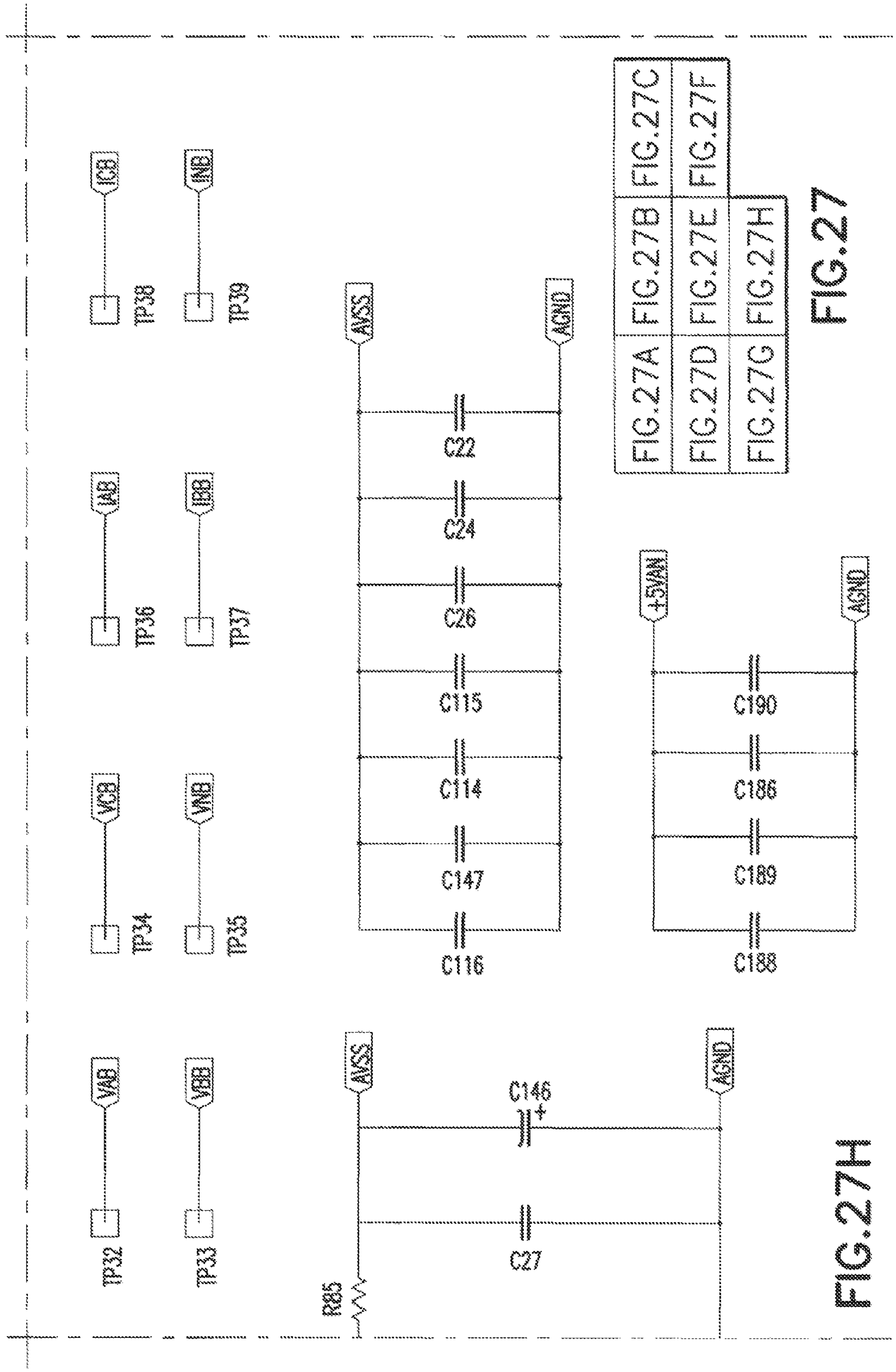

FIGS. 27A, 27D and 27G illustrate the auto-calibration circuitry. Also shown is a portion of the voltage buffers for the voltage inputs and the voltage decoupling capacitors used to reduce noise.

FIGS. 27B-27C, 27E-27F and 27H illustrate voltage and current buffers used in the revenue measurement circuits. The voltage and current revenue circuits are routed in such a way to prevent crosstalk between waveform capture and revenue measurement circuits. This is done by assuring that a circuit does not overlap or lie in close approximation with part of another circuit, and each trace is properly separated from each other. Also shown are the voltage decoupling capacitors used to reduce noise.

Figure 28A:
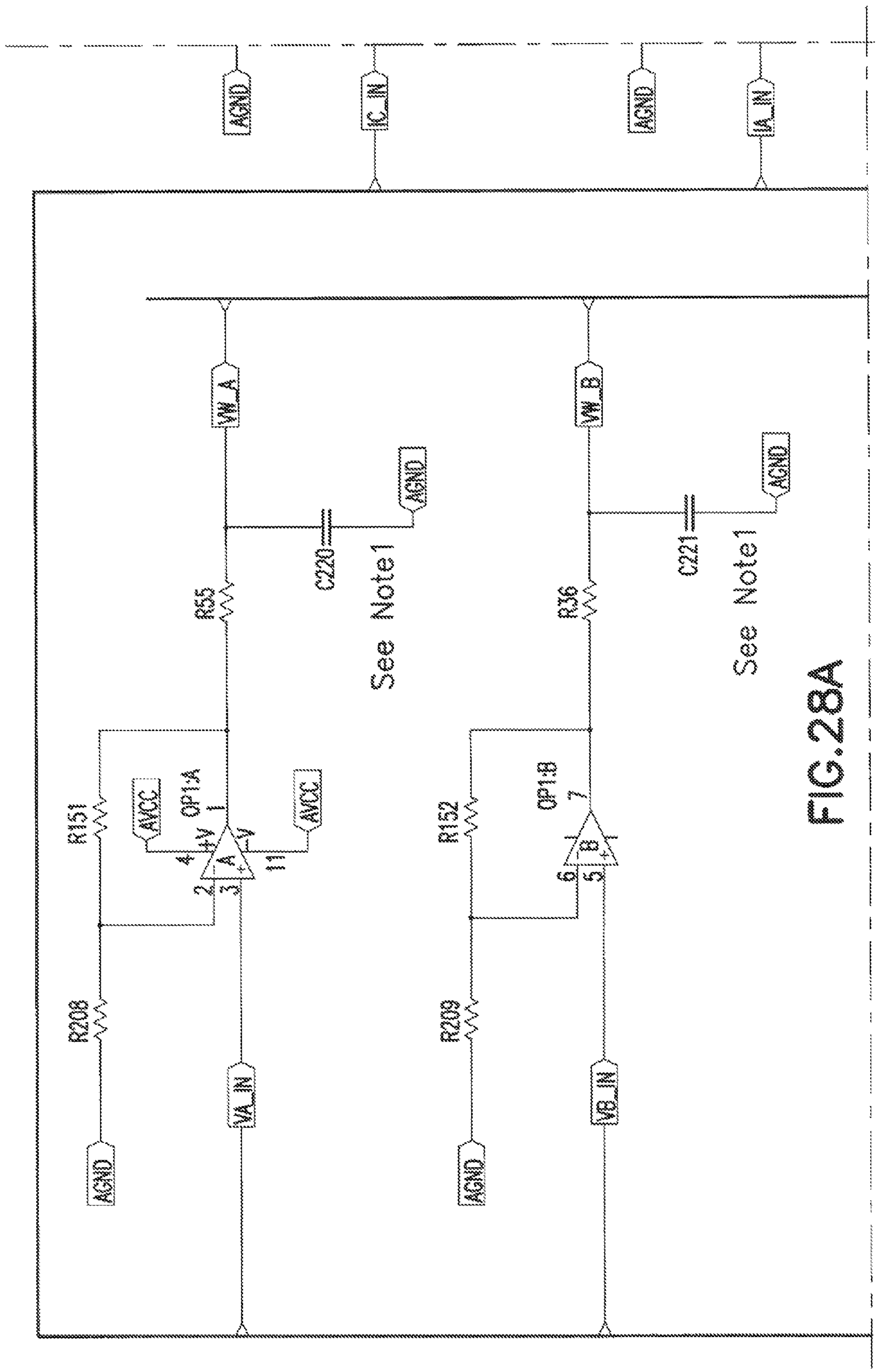
FIG. 28A is a schematic diagram showing a waveform capture voltage scaling and conditioning circuits and waveform capture current scaling and conditioning circuits.

FIG. 28A shows waveform capture voltage scaling and conditioning circuits, and waveform capture current scaling and conditioning circuits. The waveform capture circuits are routed in such a way to prevent crosstalk between waveform capture and revenue measurement circuits. This is done by assuring that a circuit does not overlap or lie in close approximation with part of another circuit, and each trace is properly separated from each other.

Figure 28B:
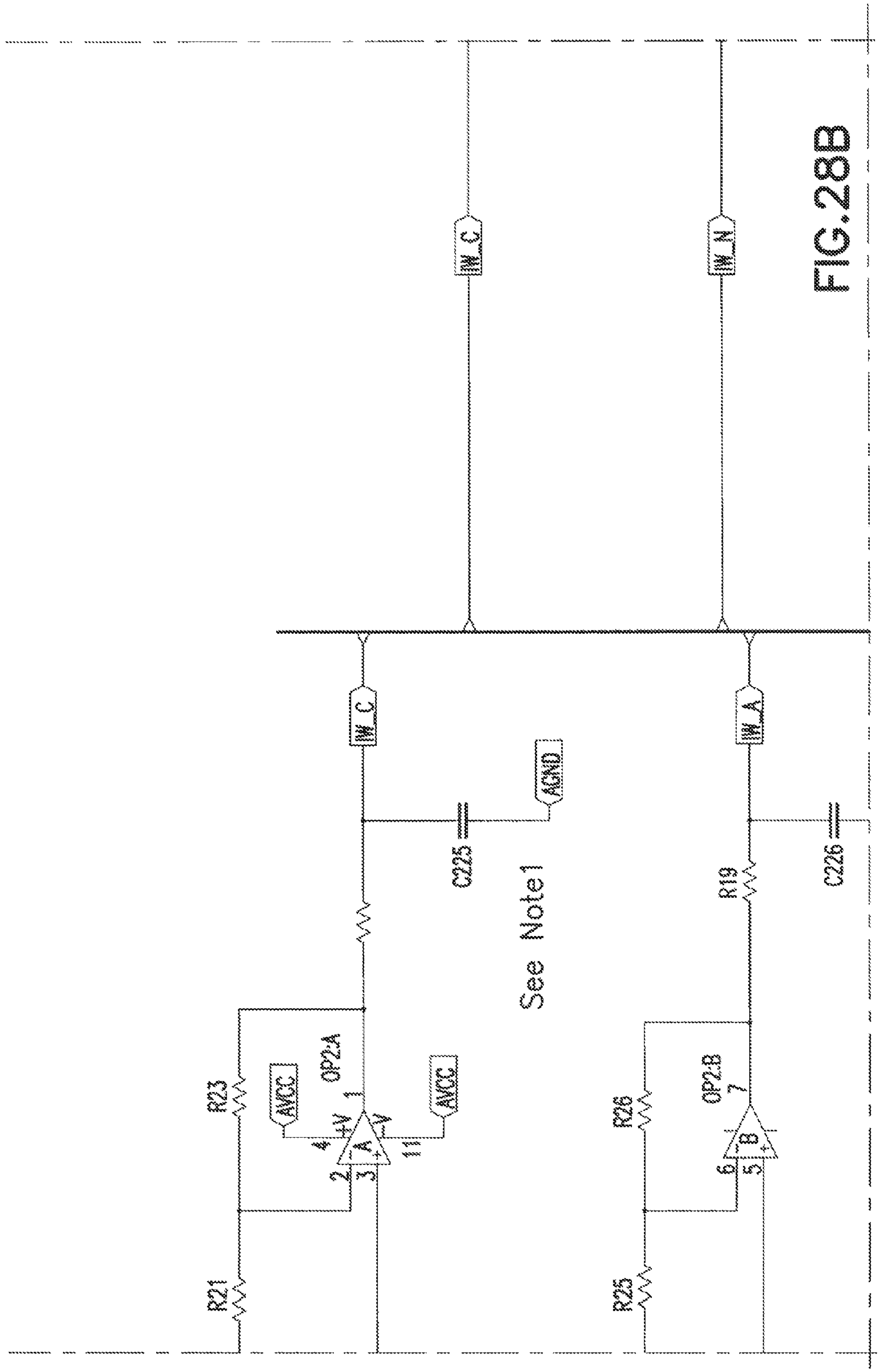
FIGS. 28B-28C is a schematic diagram showing additional buffer drivers to drive A/D inputs for waveform capture A/D.
Figure 28C:
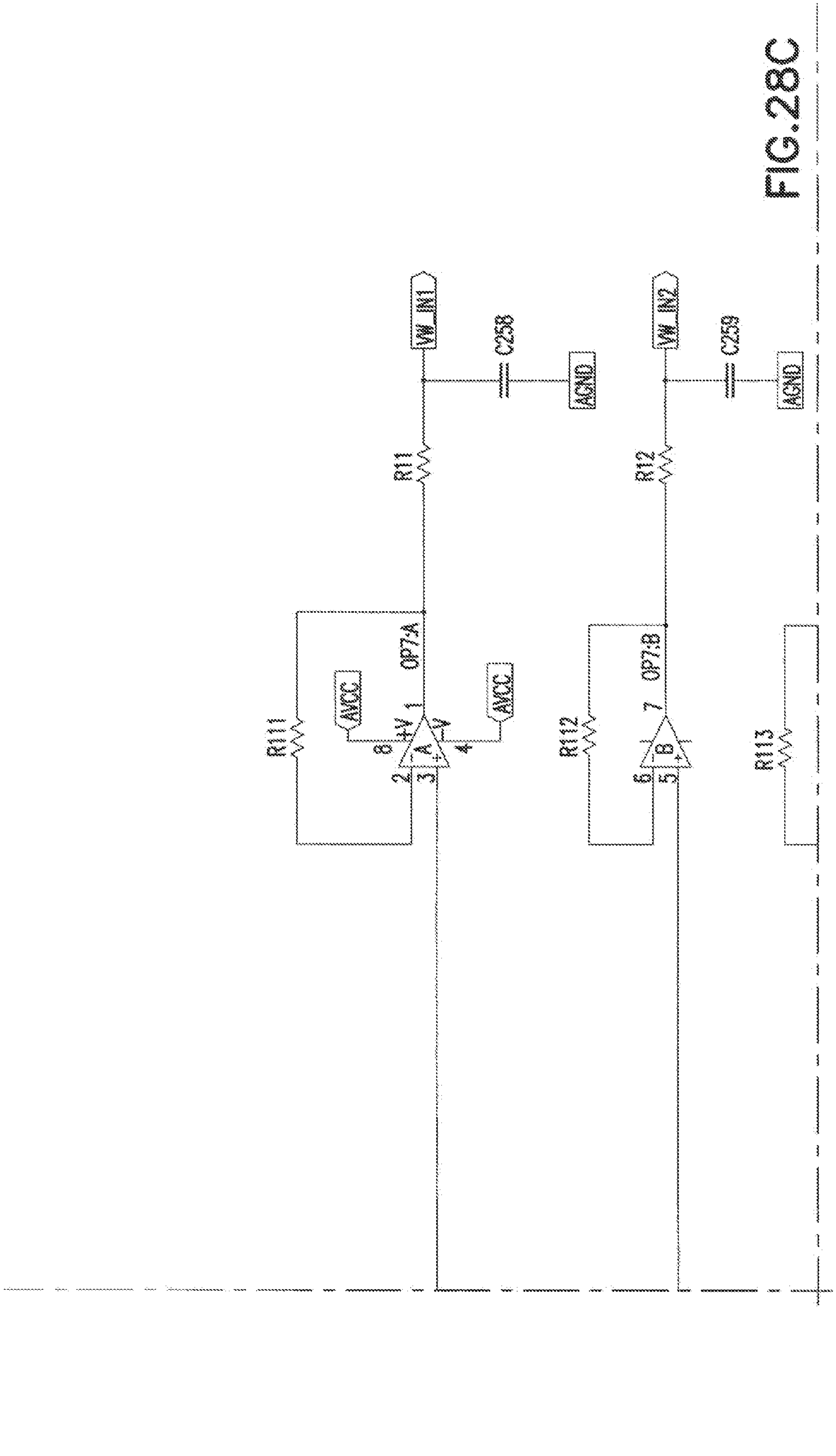
Figure 28D:
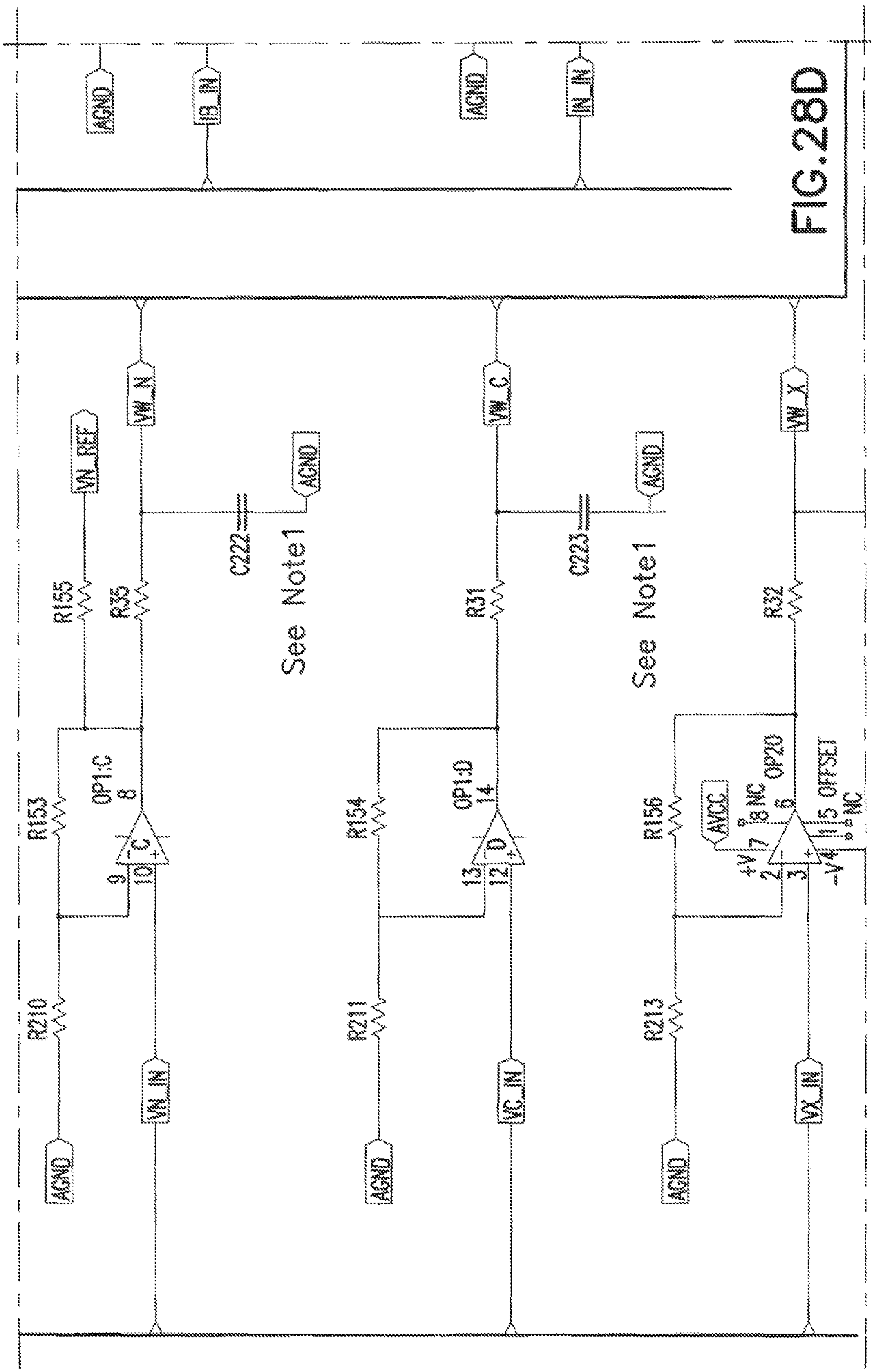
FIGS. 28D AND 28G is a schematic diagram showing additional waveform capture voltage scaling and conditioning circuits and additional waveform capture current scaling and conditioning circuits.
Figure 28E:
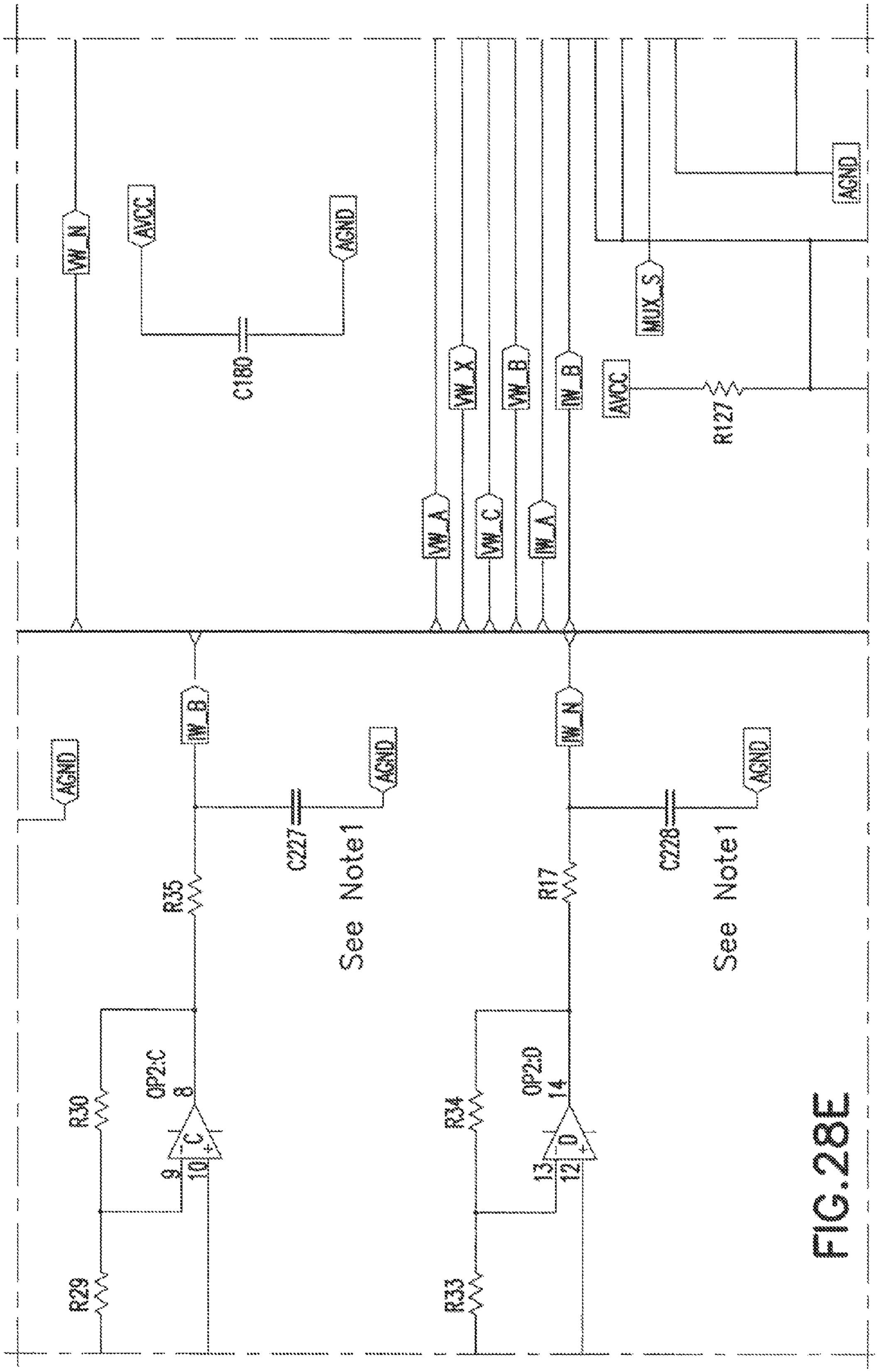
FIGS. 28E-28F AND 28H is a schematic diagram showing signal selection for A/D inputs for waveform capture circuit and buffer for A/D inputs for waveform capture A/D.
Figure 28F:
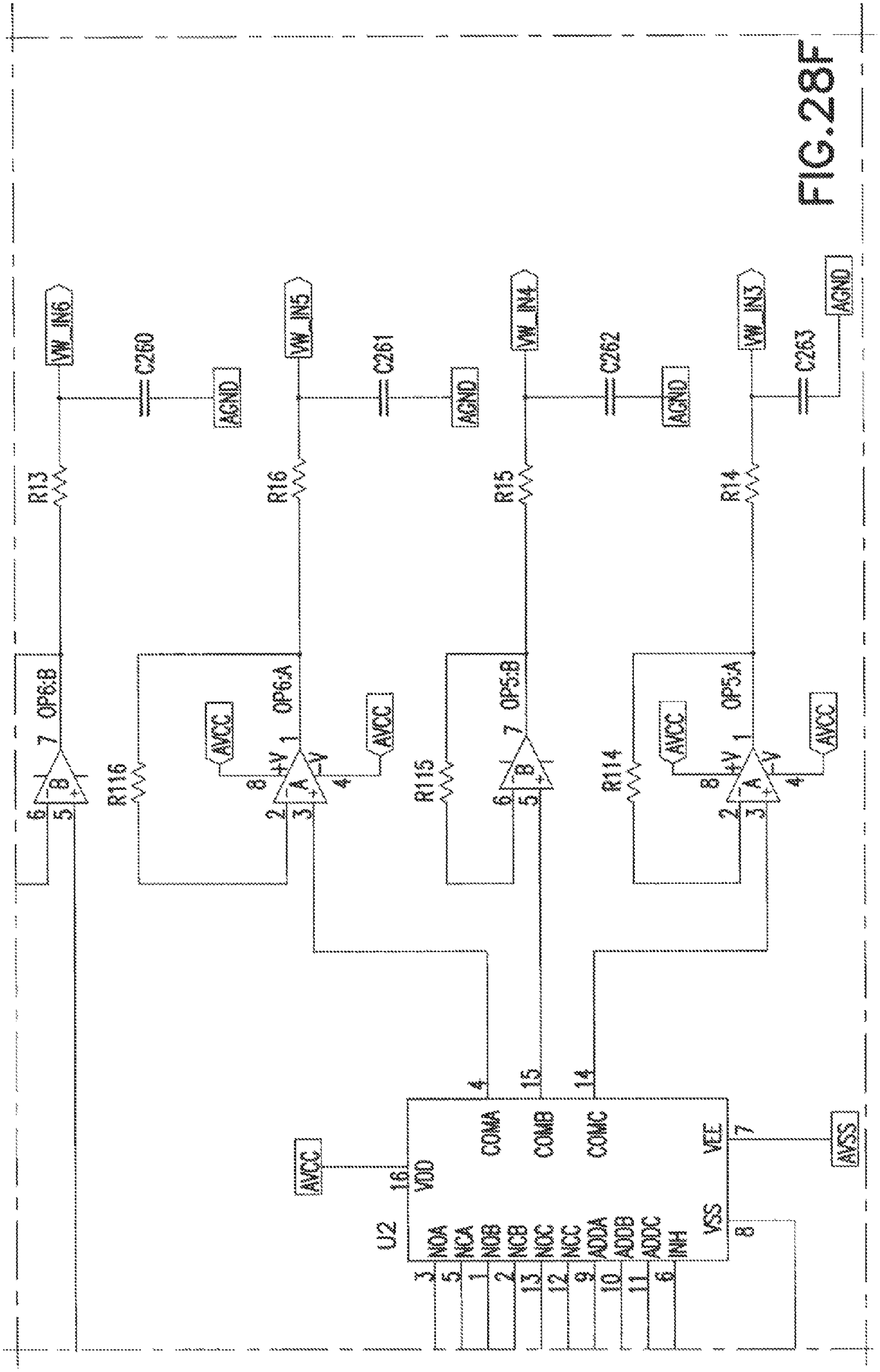
Figure 28G:
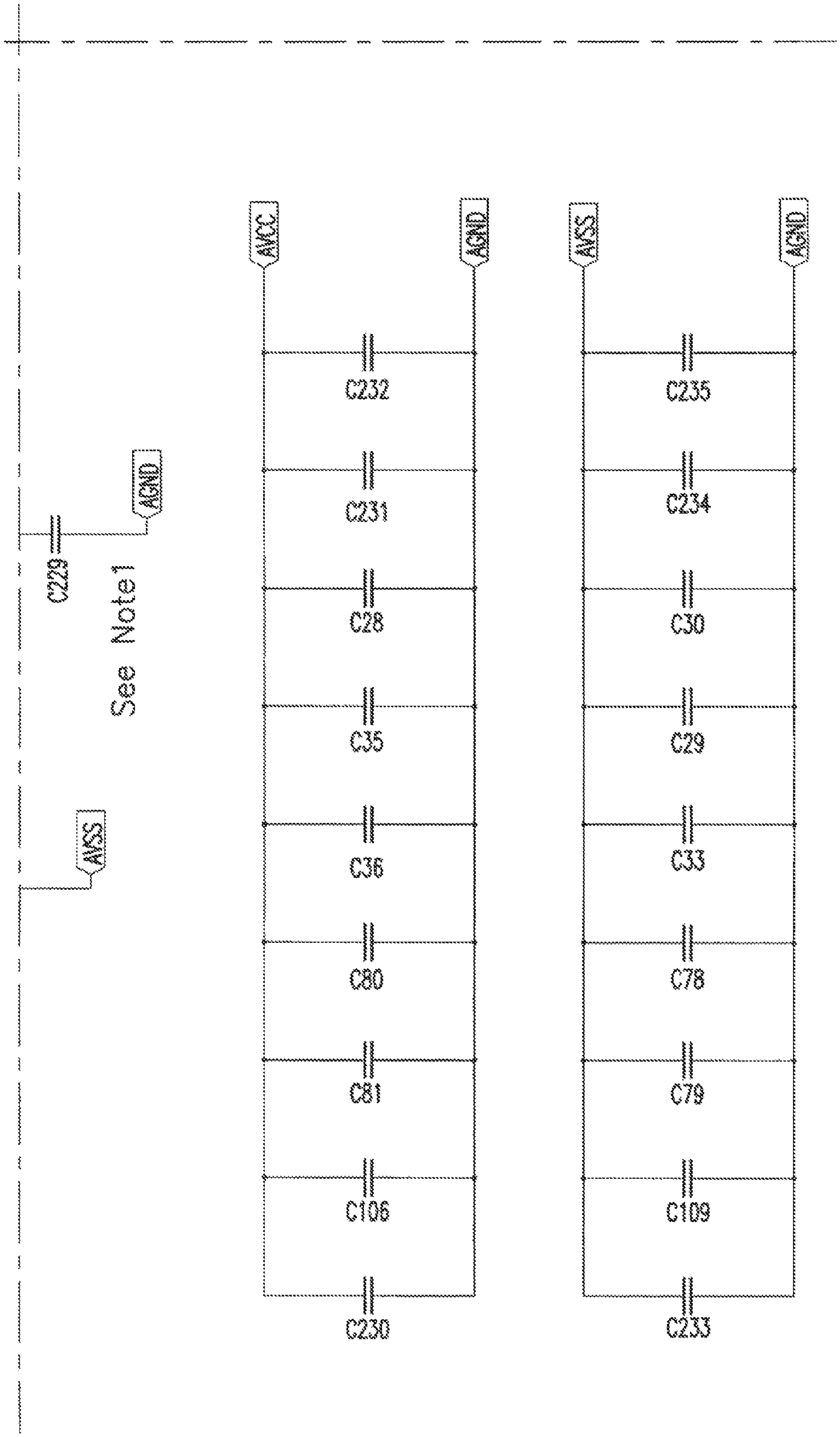

FIGS. 28D and 28G shows additional waveform capture voltage scaling and conditioning circuits, and additional waveform capture current scaling and conditioning circuits. Also shown are the voltage decoupling capacitors used to reduce noise.

Figure 28H:
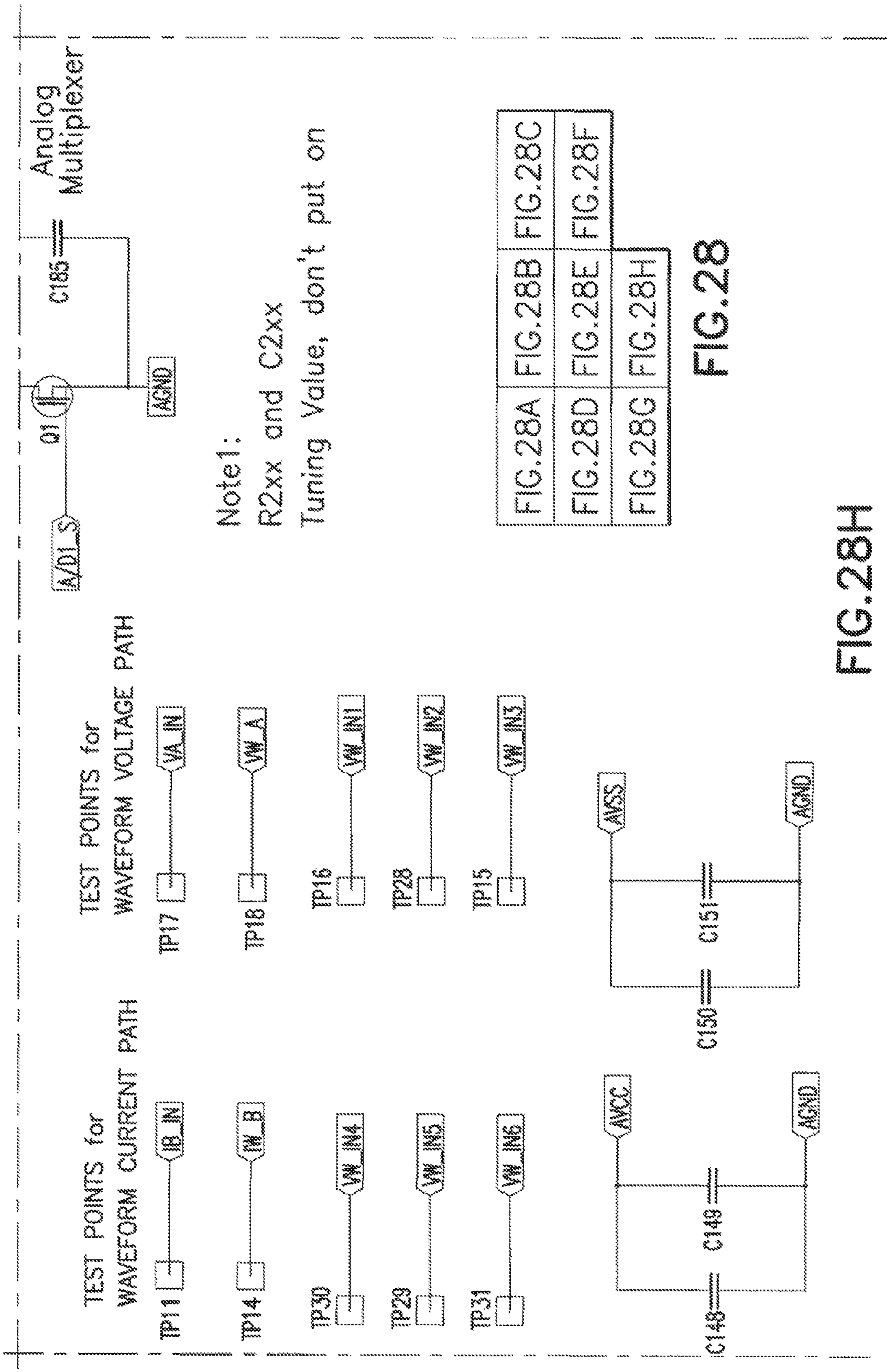

FIGS. 28E-28F and 28H shows a signal selection circuit for A/D inputs, under the control of FPGA 80, used for waveform capture; circuit and buffer for A/D inputs for waveform capture A/D, which is used for outputting digitized signals. Also shown are the voltage decoupling capacitors used to reduce noise.

FIGS. 28B-28C shows additional buffer drivers to drive A/D inputs for waveform capture A/D, which is used for outputting digitized signals. Also shown are the voltage decoupling capacitors used to reduce noise.

Figure 29A:
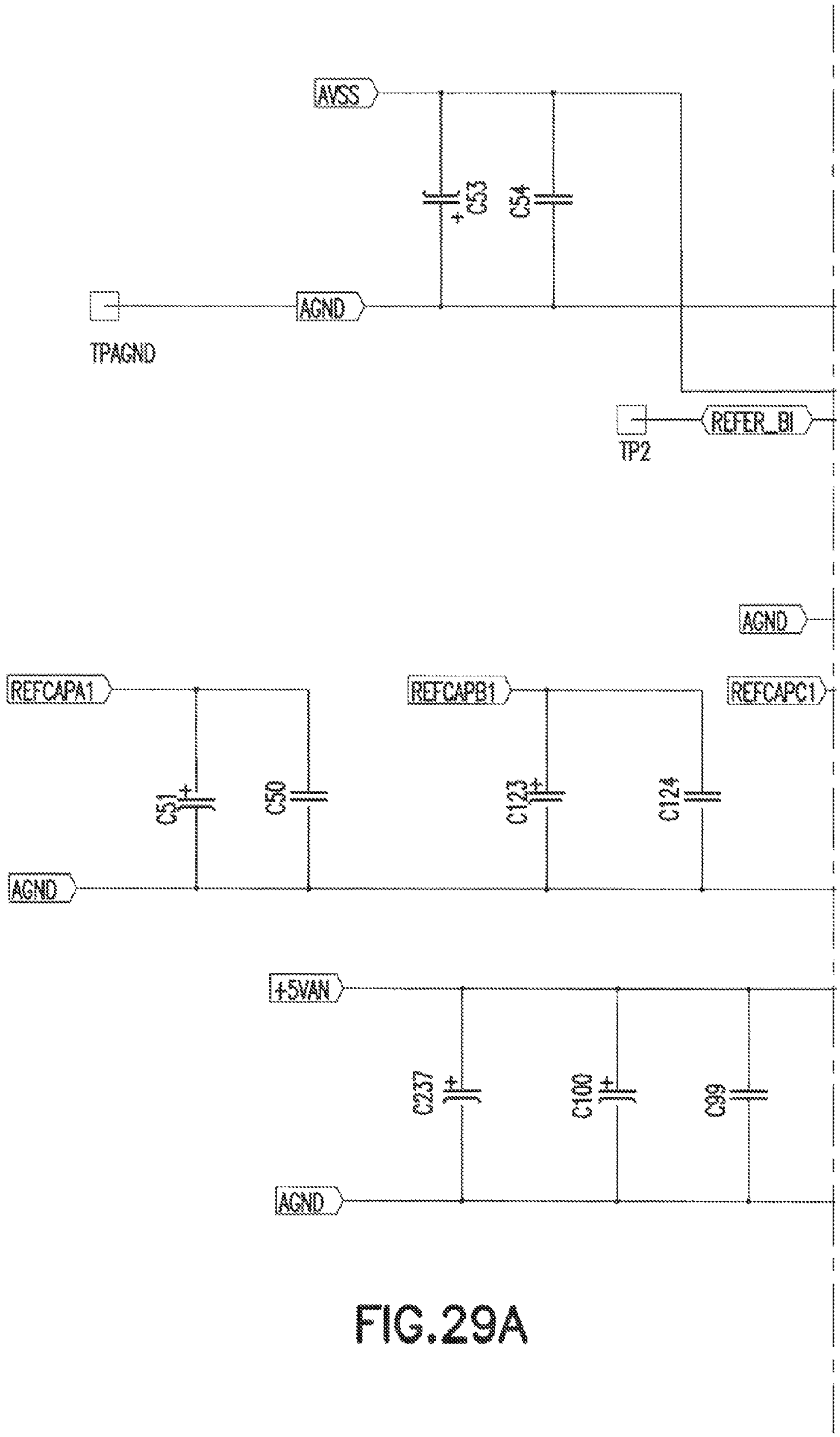
FIG. 29A-29C together show A/D circuit for measurement of revenue currents.
Figure 29B:
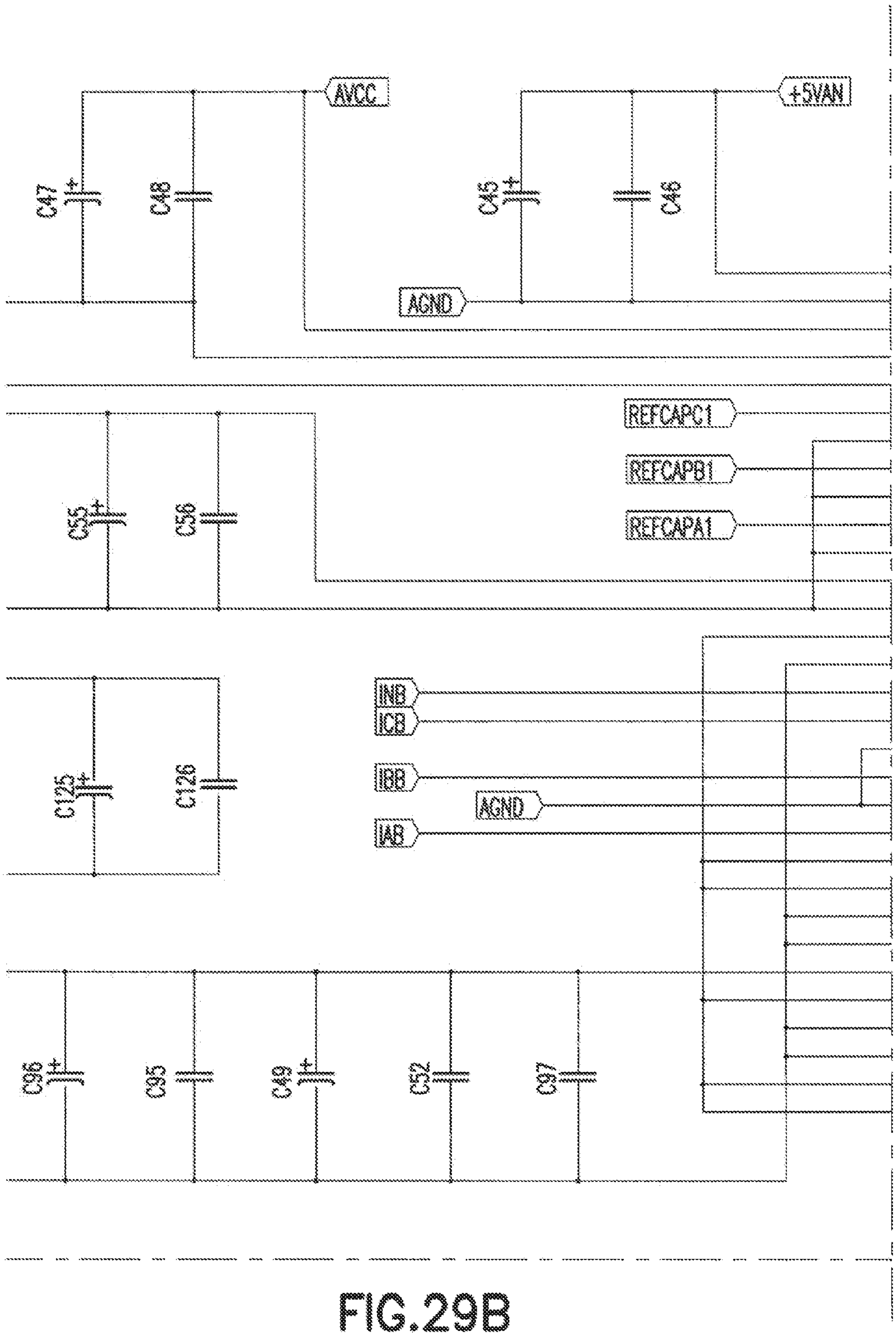
Figure 29C:
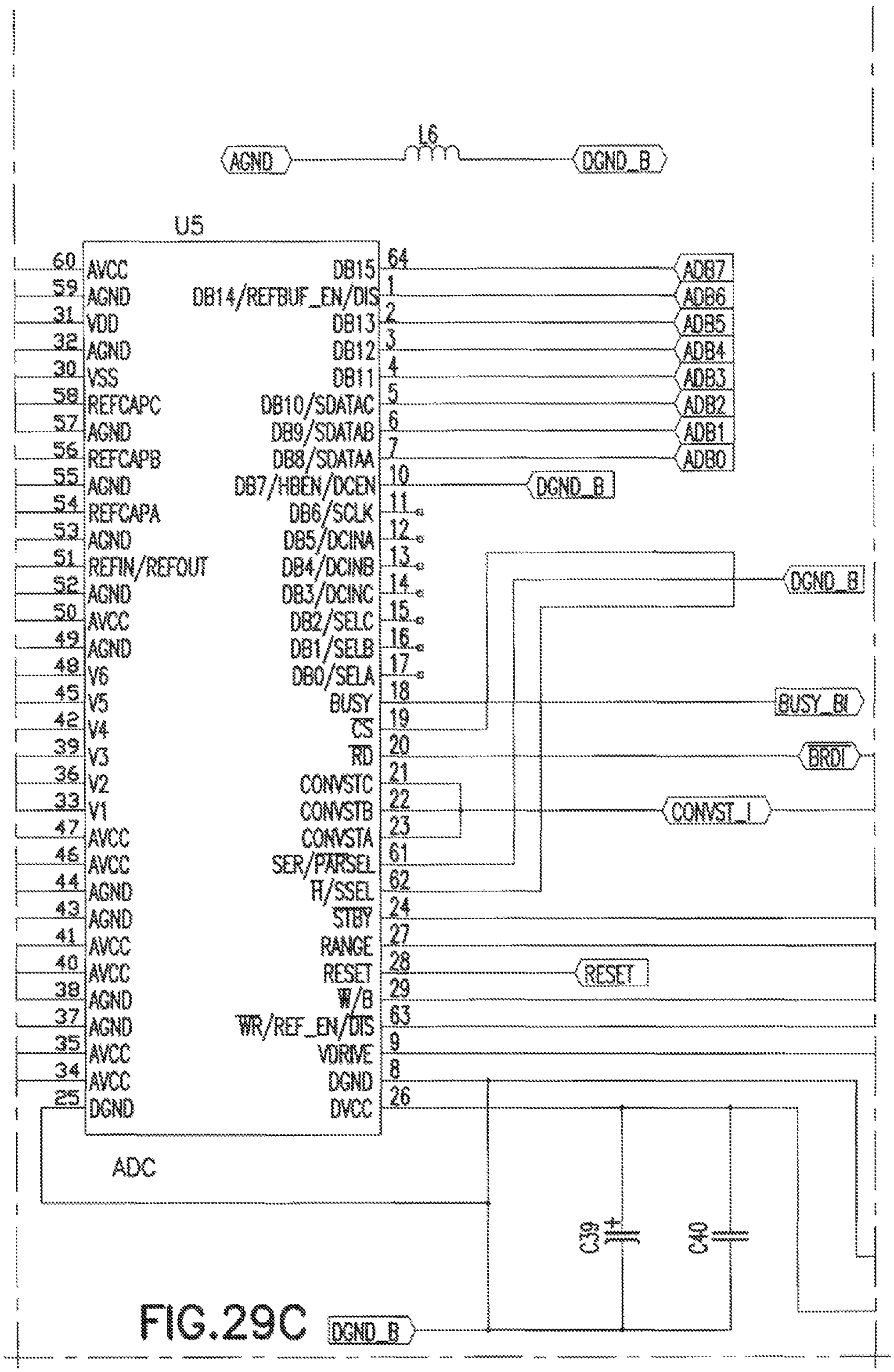

FIG. 29A-29C together show A/D circuit for revenue current measurements. The A/D circuit receives the current measurements and outputs digitized signals. Also shown are the voltage decoupling capacitors used to reduce noise.

FIG. 29E-29H show A/D circuit for measurement of revenue voltages and the zero crossing detection circuits. The A/D circuit receives the voltage measurements and outputs digitized signals. Also shown are the voltage decoupling capacitors used to reduce noise.

Figure 29D:
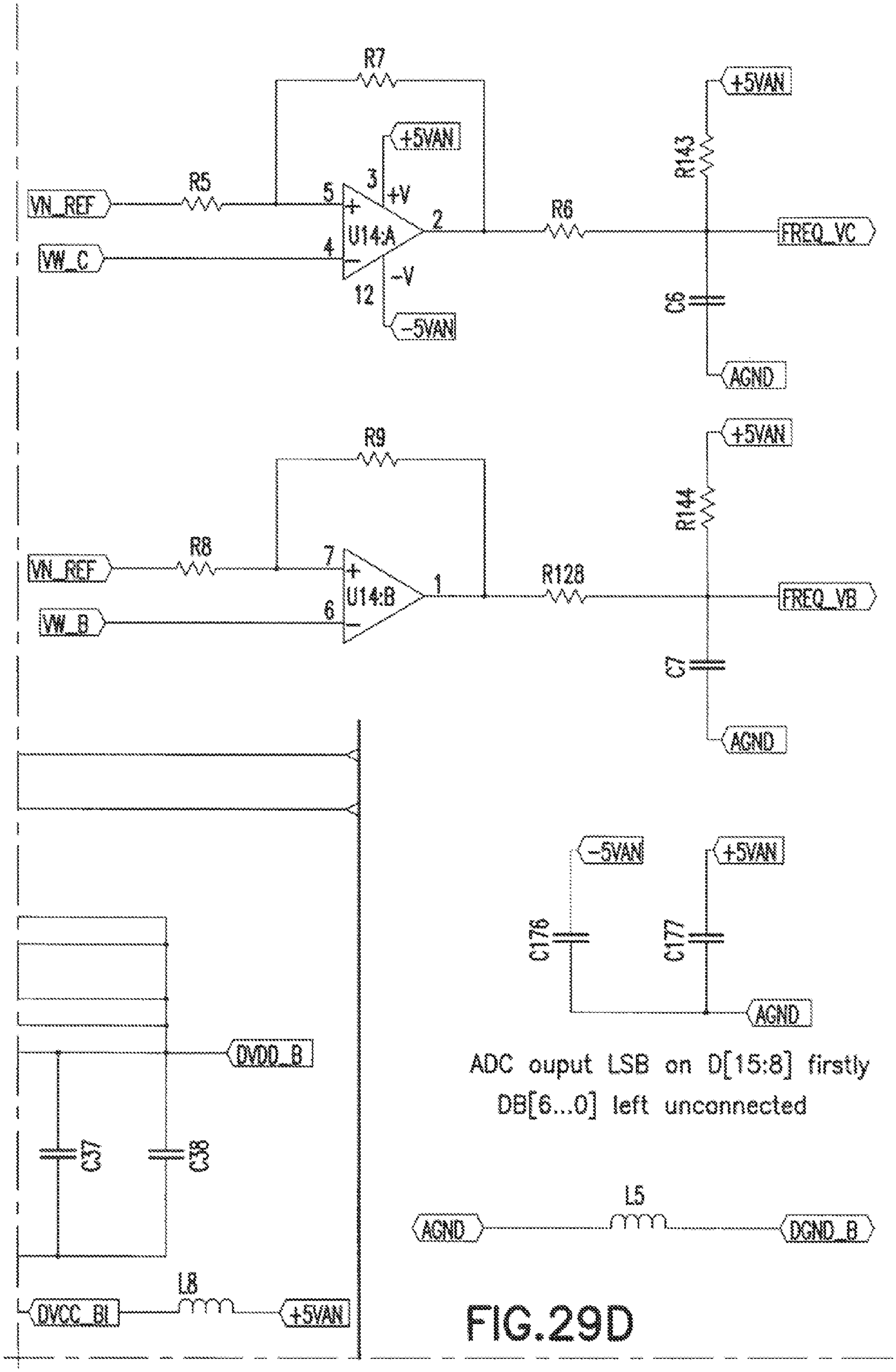
FIG. 29D is a schematic diagram showing the rest of the zero crossing circuit.
Figure 29E:
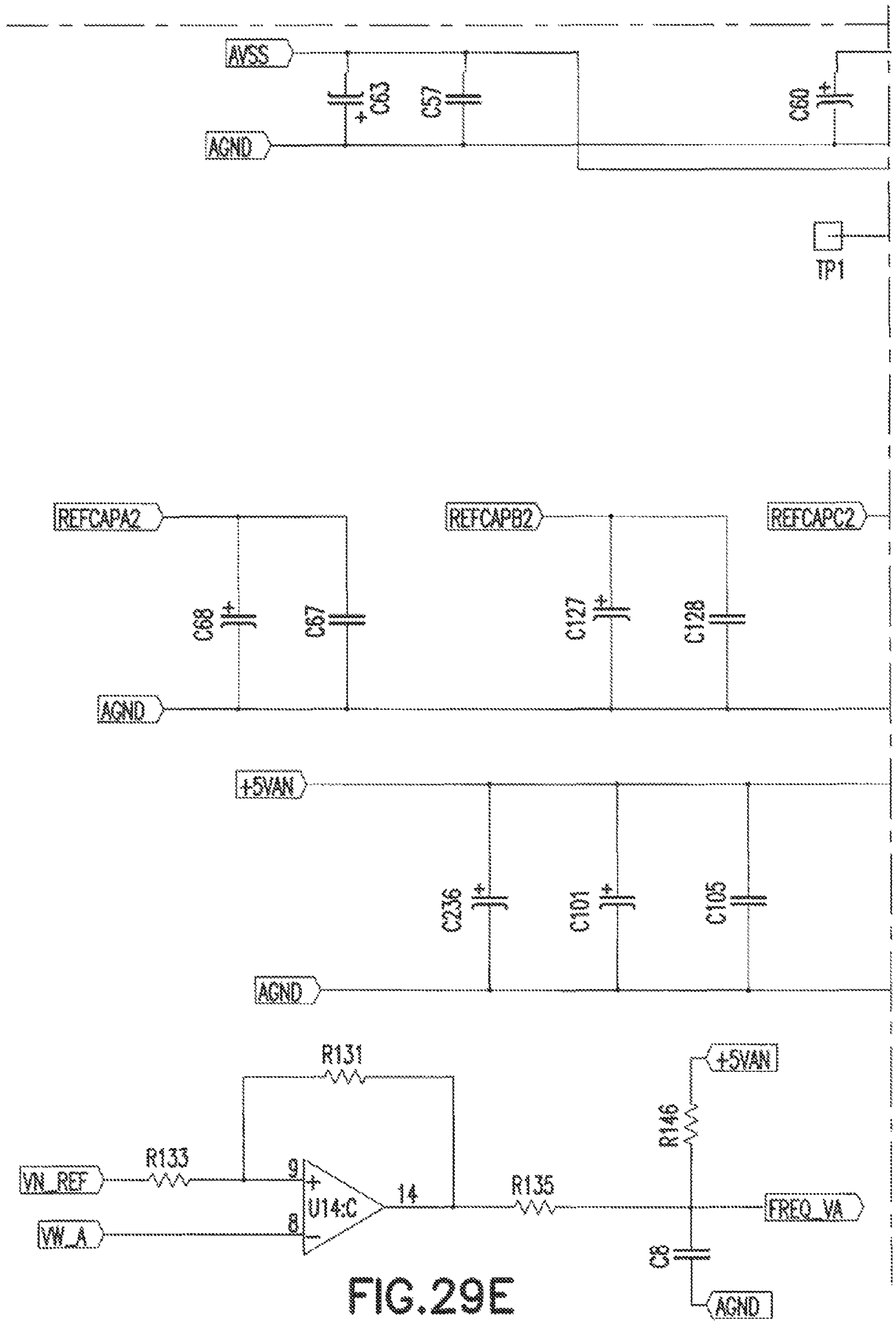
FIG. 29E-29H are schematic diagrams showing A/D circuit for measurement of revenue voltages and the zero crossing detection circuit Ds.
Figure 29F:
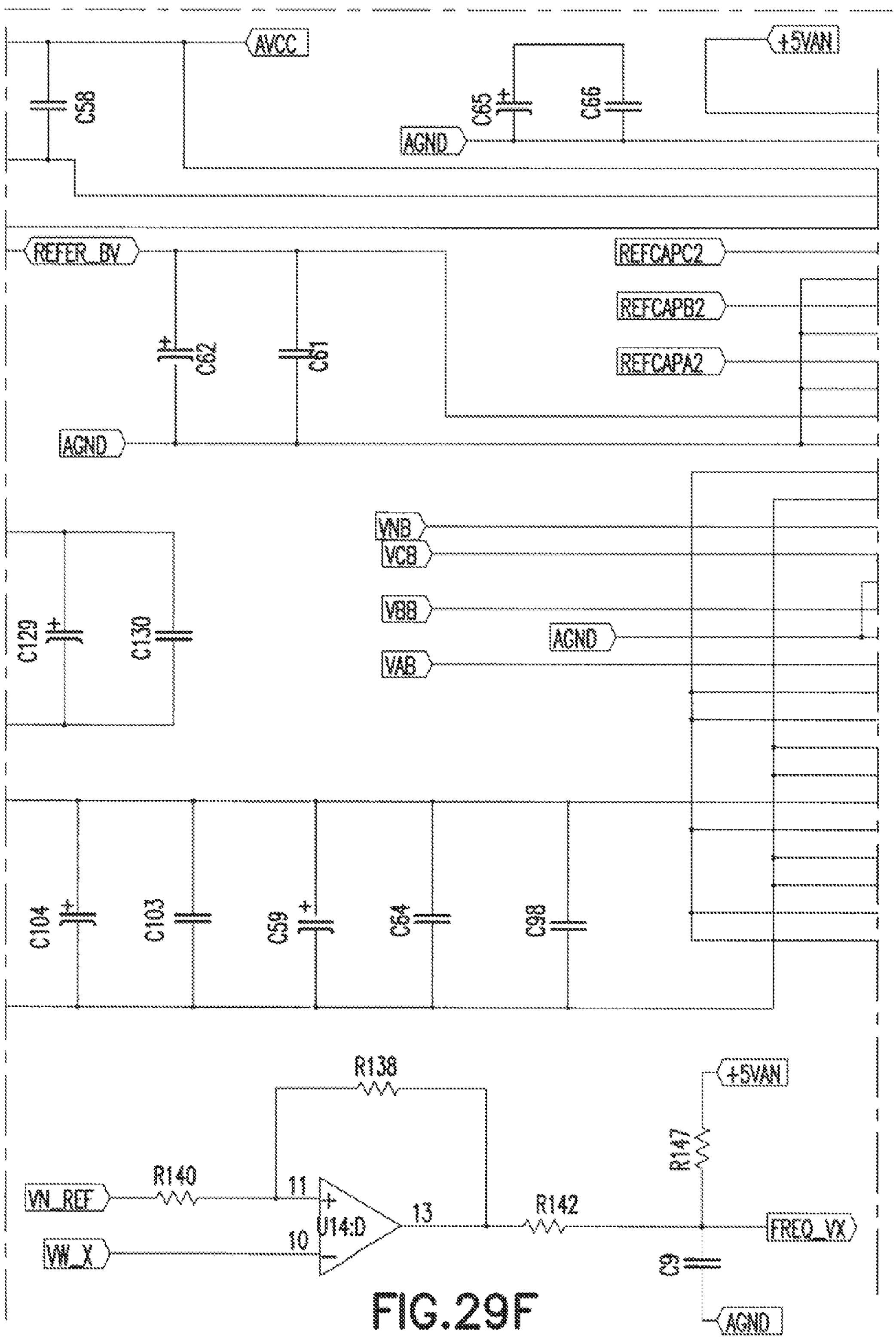
Figure 29G:
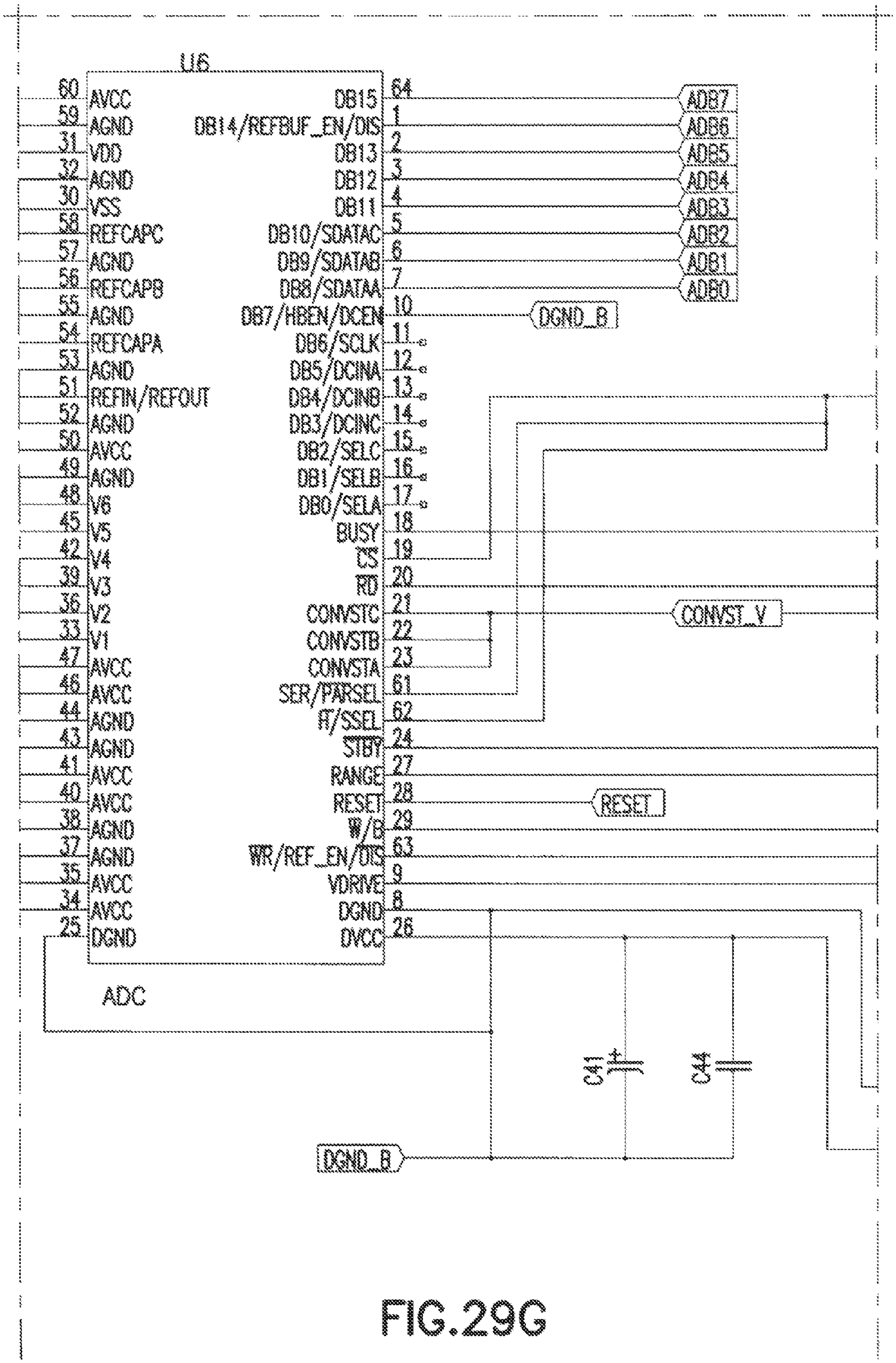
Figures 29, 29H:
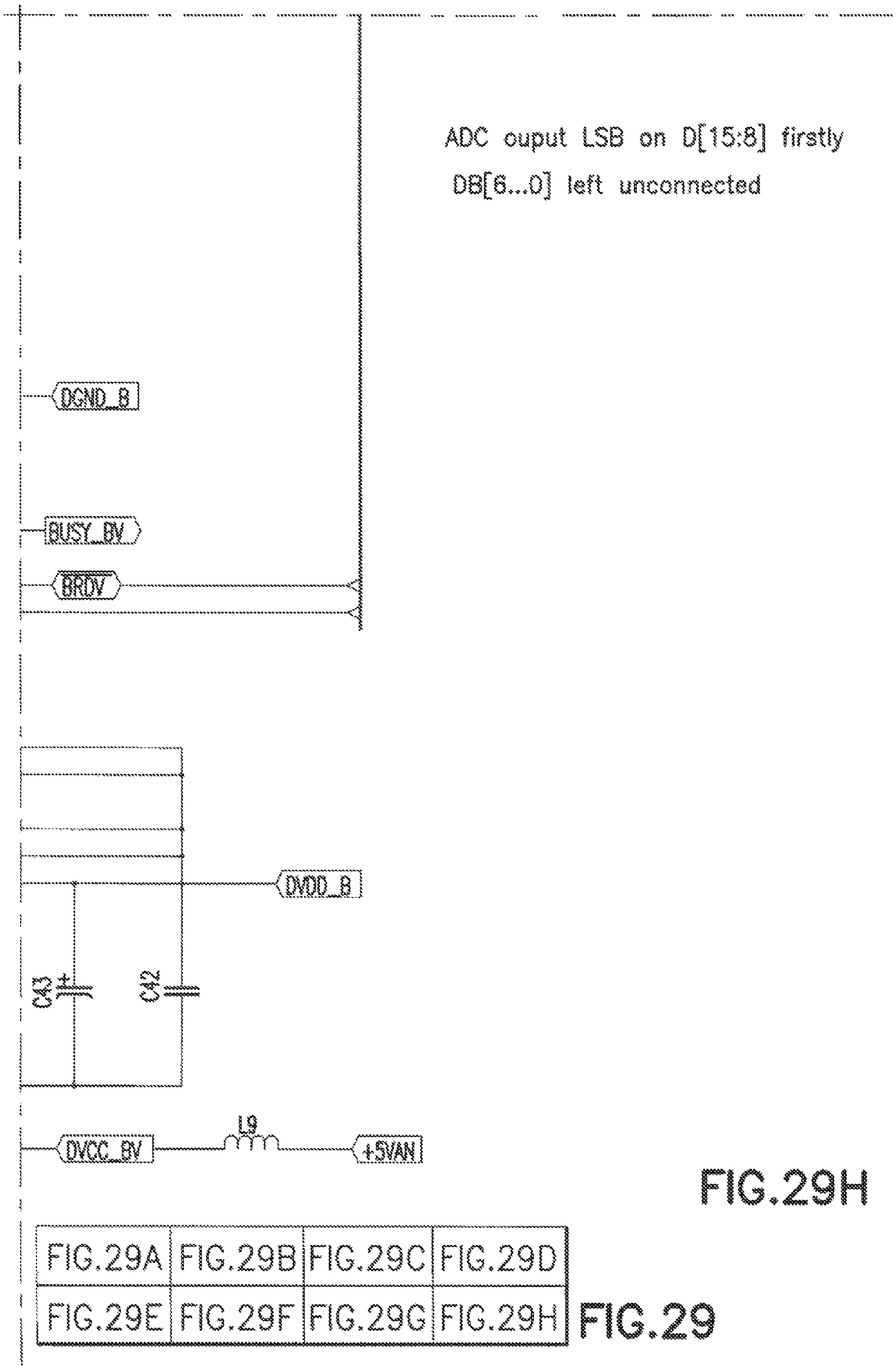

FIG. 29D also shows the rest of the zero crossing circuits.

Figures 30, 30A:
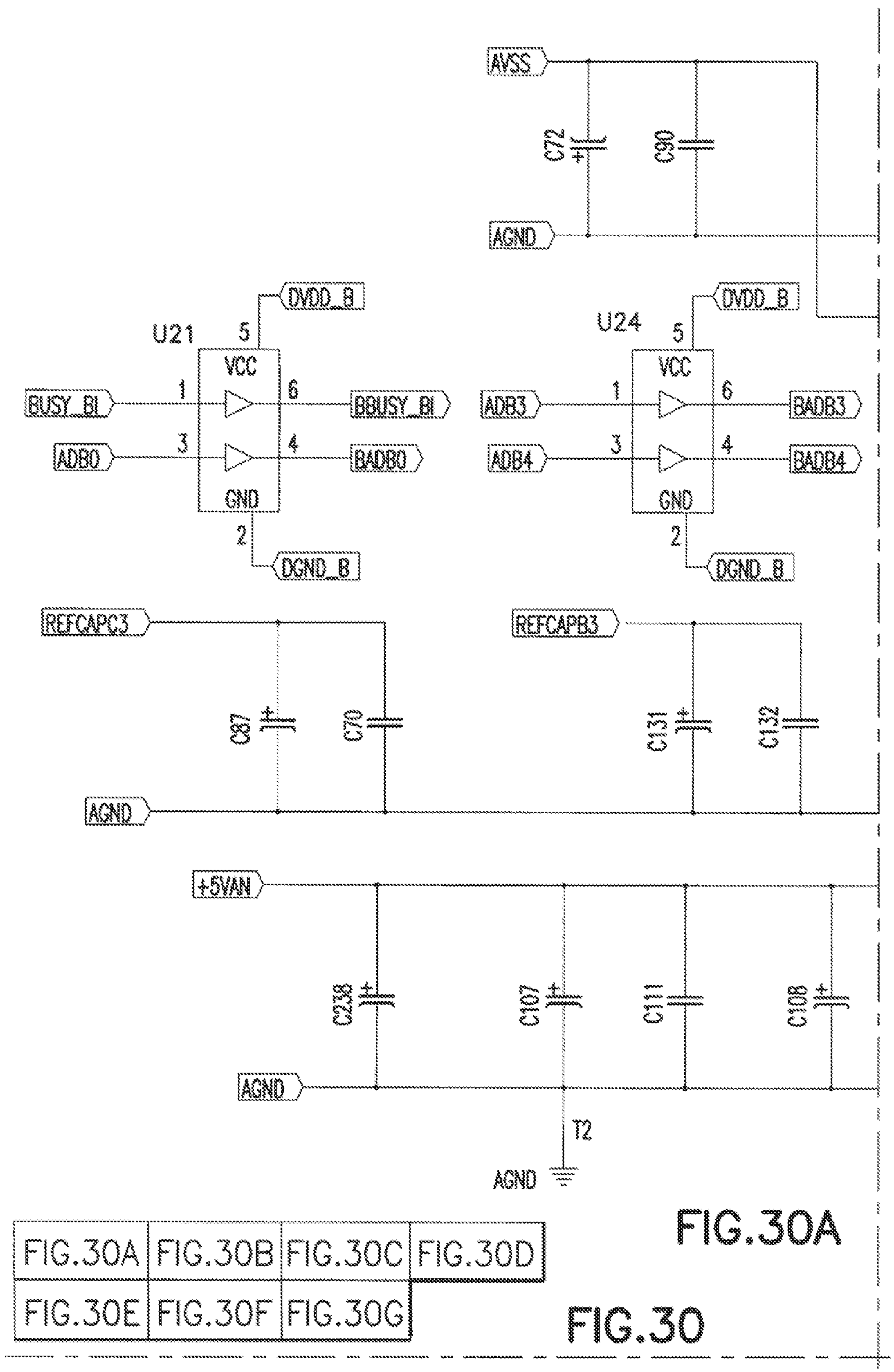
FIGS. 30A-30B is a schematic diagram showing part of voltage decoupling capacitor circuits.
Figure 30B:
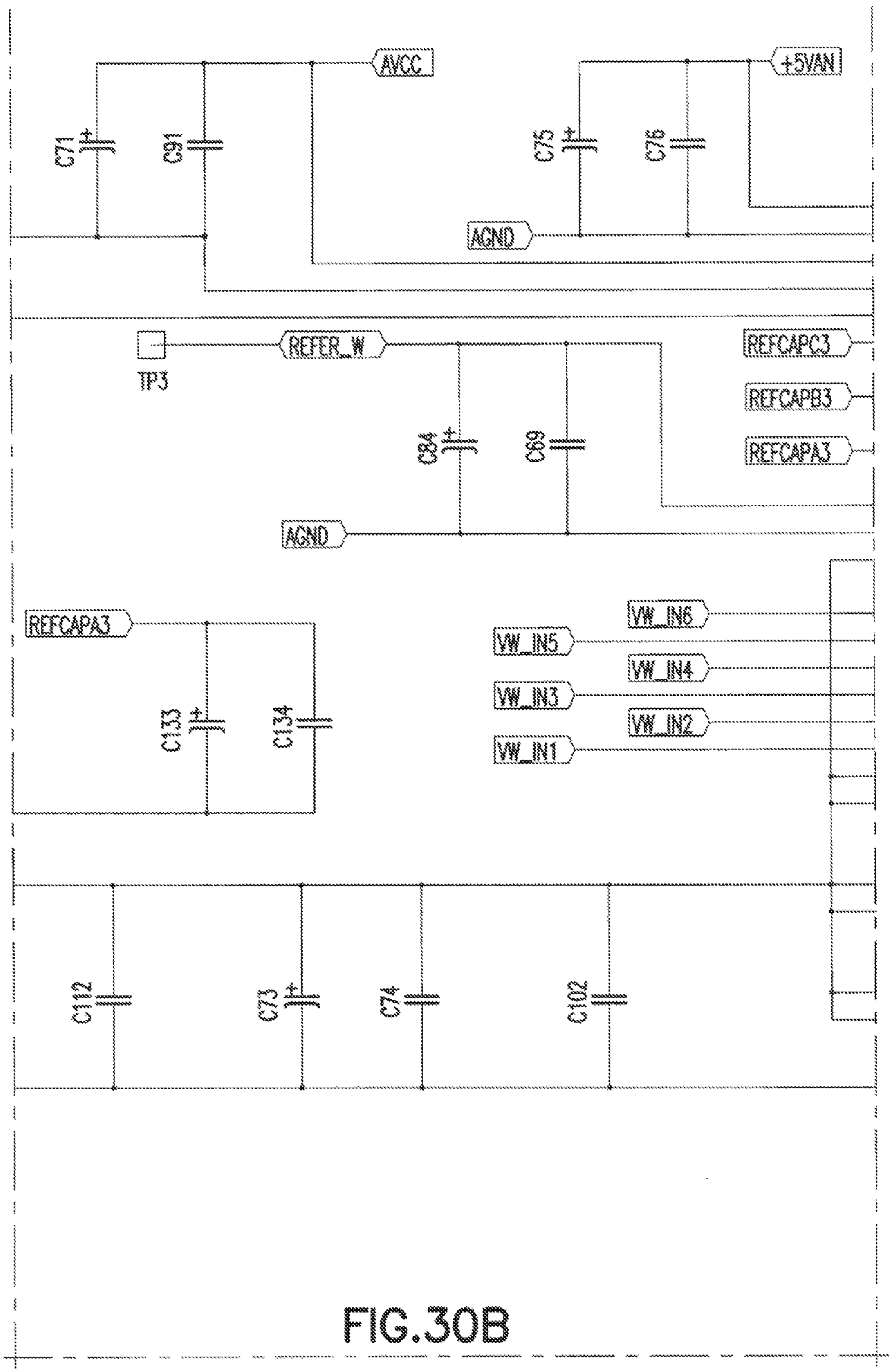

FIG. 30A-30B shows part of the voltage decoupling capacitor circuits used to reduce noise.

Figure 30C:
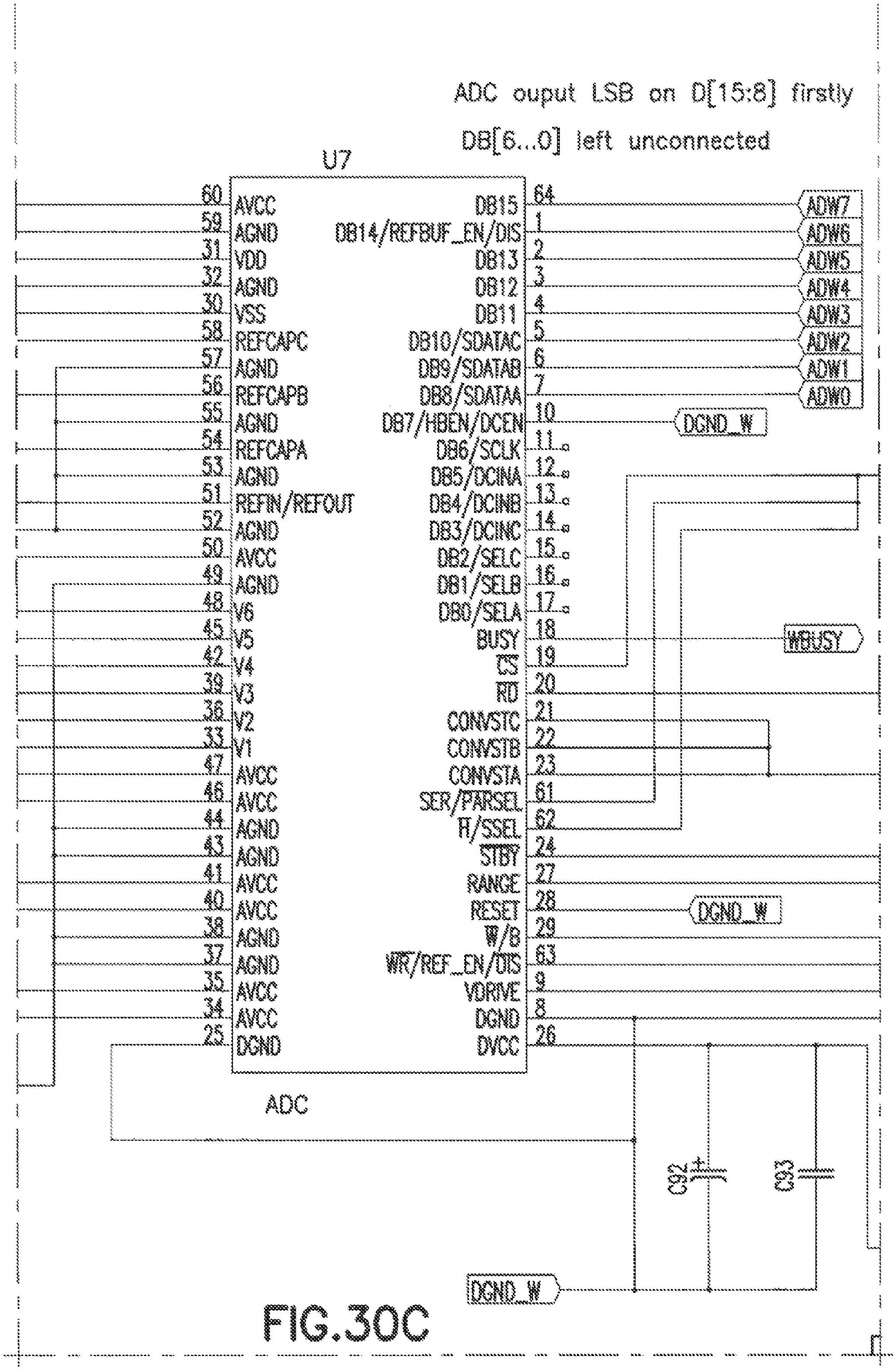
FIG. 30C-30D is a schematic diagram showing the waveform capture A/Ds and the digital output buffers for the waveform capture A/Ds.
Figure 30D:
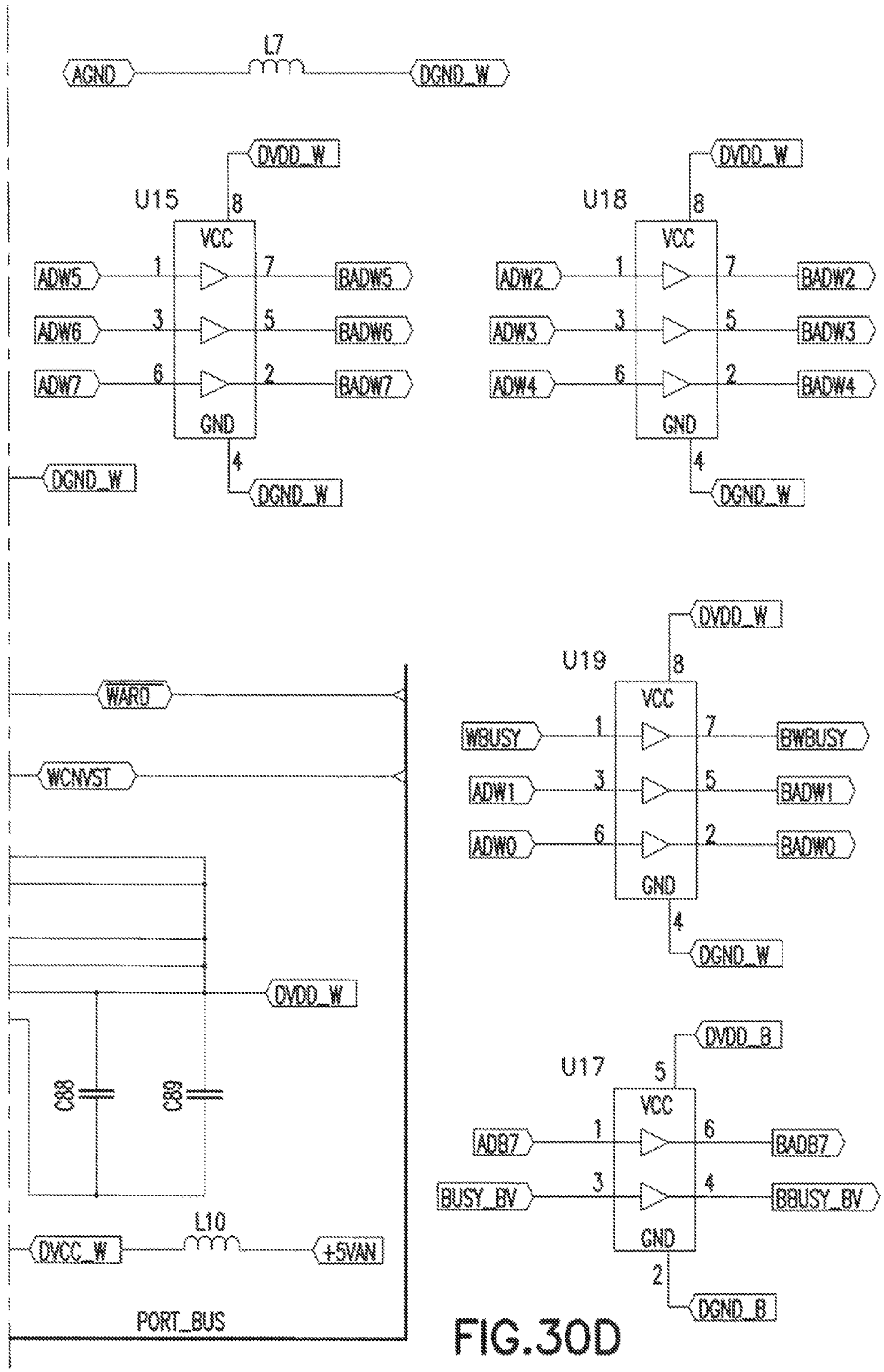
Figure 30E:
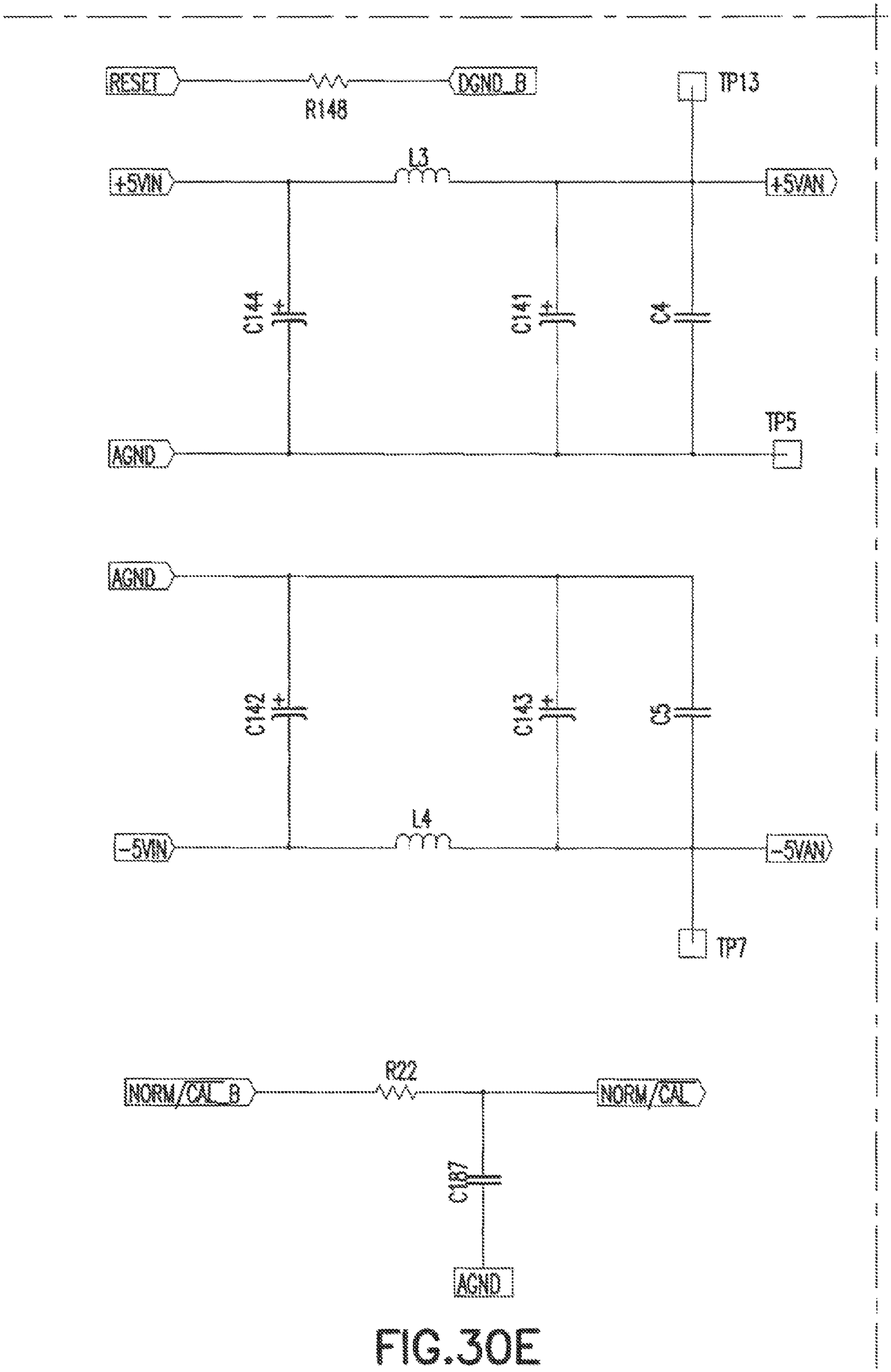
FIG. 30E is a schematic diagram showing additional decoupler circuits.

FIG. 30E shows additional voltage decoupling capacitors used to reduce noise.

Figure 30F:
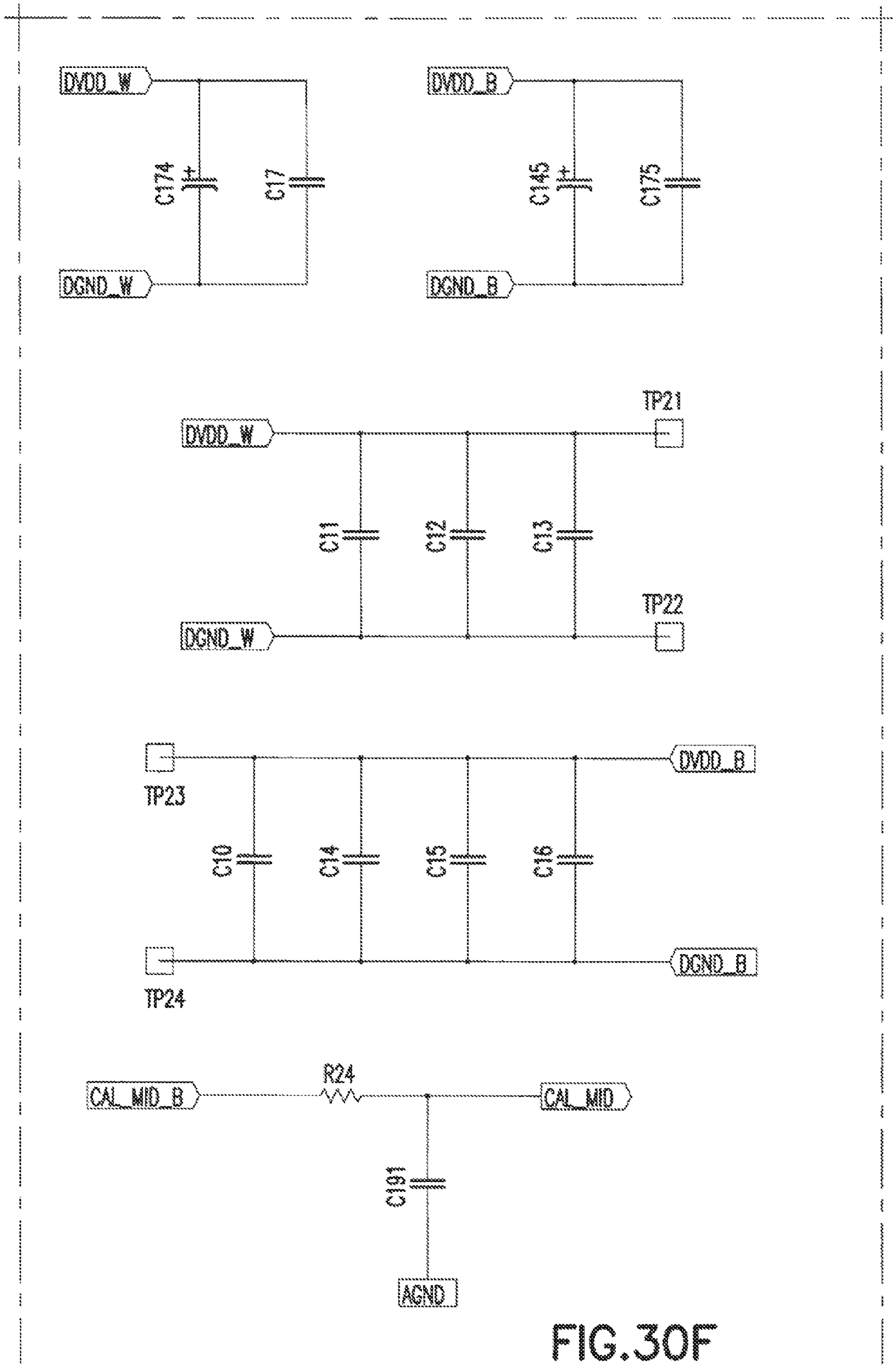
FIG. 30F is a schematic diagram illustrating I/O connectors and signals.
Figure 30G:
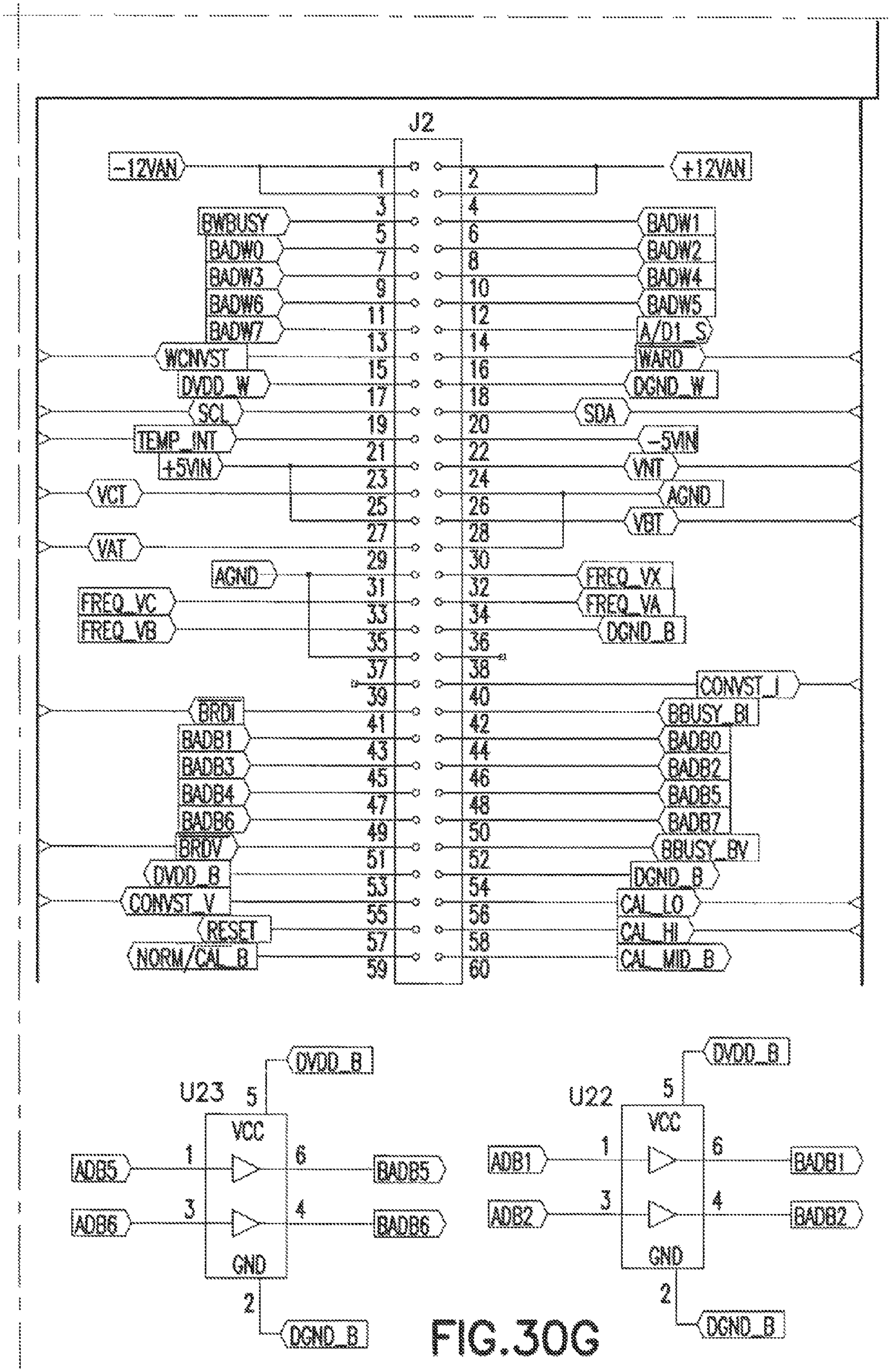
FIG. 30G is a schematic diagram showing digital output buffer of the A/Ds for the revenue measurement circuit.

FIG. 30F with FIG. 30G together show I/O connectors and signals that go between the analog board and FPGA 80. FPGA 80 routs the revenue measurement data to DSP 60 and the waveform capture data to DSP 70, for further processing. FPGA 80 can be reconfigured to rout the signal to any processing element so that load balancing can be performed.

FIG. 30G shows the buffers for the revenue measurement A/Ds for digitally outputting the revenue samples to FPGA 80.

FIG. 30C-30D shows the buffers for the waveform capture A/Ds for digitally outputting the waveform capture samples to FPGA 80.

While presently preferred embodiments have been described for purposes of the disclosure, numerous changes in the arrangement of method steps and apparatus parts can be made by those skilled in the art. Such changes are encompassed within the spirit of the disclosure as defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '__________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device (IED) for determining parameters of an electrical distribution system, the IED comprising:

at least one sensor for sensing the at least one input voltage and current channels of the electrical distribution system, at least one input channel for receiving AC voltages and currents from the at least one sensor including at least one analog to digital converter for outputting digitized signals, the at least one input channel including a first input channel for transient detection sampling, a second input channel for waveform capture sampling and a third input channel for revenue measurement sampling, the at least one analog to digital converter for each of the at least one input channels having a different sampling rate, a field programmable gate array (FPGA) coupled to each of the at least one input channels for routing the digitized signals to a processing system, the processing system including a first digital signal processor for processing the digitized signals from the transient detection sampling input channel, the waveform capture sampling input channel, and the revenue measurement sampling input channel and a central processing unit for processing data from the first digital signal processor, the field programmable gate array (FPGA) configured to incorporate a first dual port memory for transferring data between the first digital signal processor and the central processing unit.

2. The IED according to claim 1, wherein the field programmable gate array is further configured to perform load balancing.

3. The IED according to claim 2, wherein said load balancing further comprises: routing data in part to the central processing unit and routing data in part to the first digital signal processor to load balance calculations otherwise performed by the central processing unit or the first digital signal processors in isolation.

4. The IED according to claim 2, wherein said load balancing further comprises configuring the field programmable gate array as an array of configurable memory blocks, each of said memory blocks being capable of supporting a dedicated processor to create processor expansion.

5. The IED according to claim 4, wherein said array of configurable memory blocks are configured as one of a RAM memory, a ROM memory, a First-in-First-Out Memory or a Dual Port memory.

6. The IED according to claim 2, wherein said load balancing further comprises configuring the FPGA as an array of configurable memory blocks, each block capable of supporting multiple dedicated processors, to create processor expansion.

7. The IED according to claim 6, wherein said array of configurable memory blocks are configured as one of a RAM memory, a ROM memory, a First-in-First-Out Memory or a Dual Port memory.

8. The IED according to claim 1, wherein the field programmable gate array is further configured to assume processing tasks.

9. The IED according to claim 8, wherein said assumption of processing tasks, further comprises: programming the field programmable gate array to perform common processor functions, normally associated with any one of the central processing unit or the first digital signal processor.

10. The IED according to claim 1, wherein said data routing further comprises:

incorporating a frame counter into data blocks transmitted from the FPGA to the central processing unit and the first digital signal processor, wherein the frame counter is incremented in each transmitted data block, and comparing a currently received frame counter value with a previously received frame counter value, and determining if said currently received frame counter value is incrementally greater than said previously received frame counter.

11. The IED according to claim 1, wherein said FPGA is further configured to receive and execute program updates, wherein said updates are directed to new functionality to be incorporated into said IED in addition to originally intended functionality.

12. The IED according to claim 1, wherein the FPGA further includes at least two high-speed serial ports for transferring data from the FPGA to the first digital signal processor.

13. The IED according to claim 12, wherein at least two high-speed serial ports are dedicated channels.

14. The IED according to claim 13, wherein a first dedicated channel is dedicated to waveform data output from the second input channel for waveform capture sampling.

15. The IED according to claim 14, wherein a second dedicated channel is dedicated to transient A/D data output from the first input channel for transient detection sampling.

16. An intelligent electronic device (IED) for determining parameters of an electrical distribution system, the IED comprising:

at least one sensor for sensing the at least one input voltage and current channels of the electrical distribution system, at least one input channel for receiving AC voltages and currents from the at least one sensor including at least one analog to digital converter for outputting digitized signals, the at least one input channel including a first input channel for transient detection sampling, a second input channel for waveform capture sampling and a third input channel for revenue measurement sampling, the at least one analog to digital converter for each of the at least one input channels having a different sampling rate, a processing system including a first digital signal processor coupled to each of the at least one input channels for processing the digitized signals from the transient detection sampling input channel, waveform capture sampling input channel, and the revenue measurement sampling input channel and a central processing unit for processing data from the first digital signal processor, and a field programmable gate array (FPGA) configured to incorporate a first dual port memory for transferring data between the first digital signal processor and the central processing unit.

17. The IED according to claim 16, wherein the transient detection sampling input channel is further directly coupled to the FPGA.

18. An intelligent electronic device (IED) for determining parameters of an electrical distribution system, the IED comprising:

at least one sensor for sensing the at least one input voltage and current channels of the electrical distribution system, at least one input channel for receiving AC voltages and currents from the at least one sensor including at least one analog to digital converter for outputting digitized signals, the at least one input channel including a first input channel for transient detection sampling, a second input channel for waveform capture sampling and revenue measurement sampling, the at least one analog to digital converter for each of the at least one input channels having a different sampling rate, a processing system including a first digital signal processor coupled to the second input channel configured to capture waveforms from the sensed at least one input voltage and current channels and to calculate revenue measurements and a central processing unit for processing data from the first digital signal processor, and a field programmable gate array (FPGA) coupled to the first input channel configured to determine a transient from the sensed at least one input voltage and current channels, the FPGA further configured to incorporate a first dual port memory for transferring data between the first digital signal processor and the central processing unit.

* * * * *